United States Patent [19]

Kemper

[11] Patent Number: 4,536,706

[45] Date of Patent: Aug. 20, 1985

[54] MAGNETIC CURRENT SENSOR

[75] Inventor: Kyran B. Kemper, Mendham, N.J.

[73] Assignee: AT&T Bell Laboratories, Murray Hill, N.J.

[21] Appl. No.: 399,182

[22] Filed: Jul. 16, 1982

[51] Int. Cl.[3] .................... G01R 19/00; G01R 1/02; H04M 3/26

[52] U.S. Cl. .................... 324/117 R; 179/175.2 R; 324/130

[58] Field of Search .................... 324/117 R, 127, 244, 324/257, 260, 74, 130, 128; 330/8; 307/416, 417, 418; 361/45; 179/18 FA, 175.2 R

[56] References Cited

U.S. PATENT DOCUMENTS

| | | | |
|---|---|---|---|
| 4,274,051 | 6/1981 | Condon | 324/117 R |
| 4,278,938 | 7/1981 | Morris | 324/117 R |
| 4,303,880 | 12/1981 | Munt et al. | 324/130 |

OTHER PUBLICATIONS

Martin, R. L.; "Automation of . . . "; International Symposium on Subscriber Loops and Services; Conferences Pub. No. 137; May 1976.

Dale, O. B.; "The Evolution of the Automated . . . "; Conference Record of the International Symposium on Subscriber Loops and Services; Mar. 1978; pp. 63–68.

*Primary Examiner*—Ernest F. Karlsen

*Attorney, Agent, or Firm*—John T. Peoples; Robert O. Nimtz

[57] ABSTRACT

A mechanized system distributing the access, test and communication functions to the point of testing, typically the centralized switching facility serving the telephone loops and equipment to be tested. Computer (200) stores information about each subscriber loop in the geographical area served by a system. Front-end computers (220,221) interact with computer (200) to retrieve pertinent data regarding loops to be tested. Each switching facility in an area includes a loop testing system (e.g., 160) that implements the required functions. The communication functions residing in front-end computers (220,221) and loop testing systems (160,161) are coupled via a data communication network (140) in a manner that allows any front-end computer to communicate with any loop testing system. Users of the system control access and test from consoles having the capability of establishing independent communication paths over the national dial network for interactive tests on loops accessed through standard test trunks. Microprocessor-based circuitry is utilized for numerous system tasks such as signal generation, digital signal processing and controlling sensitive analog measurements. Signal generation includes digital generation of analog waveforms. Signal processing techniques incorporate various digital filters to analyze sample sequences derived from, for example, dial pulses and coin telephone signals. Sensitive analog measurements of loop characteristics are effected with a magnetic current detector that operates over broad current and frequency ranges. Frequency dependent measurements are converted to DC using synchronous demodulation techniques to enhance resolution.

10 Claims, 123 Drawing Figures

REGULAR OR MDF TEST ACCESS REQUEST MESSAGE

550

2060

RESET PROCESS

DATA ACCEPT SUBROUTINE

NMI PROCESS

MINI PROCESS

NMI PROCESS

FREQUENCY BIT WEIGHT VALUES

| 7 | 6 | 5 | 4 | 3 | 2 | 1 | 0 | BIT |
|---|---|---|---|---|---|---|---|---|
| 2048Hz | 1024Hz | 512Hz | 256Hz | 128Hz | 64Hz | 32Hz | 16Hz | F-hi |
| 8Hz | 4Hz | 2Hz | 1Hz | X | X | X | X | F-lo |

FIG. 94

| PROGRAM NAME | DATA BYTES | | | | | | | | | | | | | | | | |
|---|---|---|---|---|---|---|---|---|---|---|---|---|---|---|---|---|---|
| | 0 | 1 | 2 | 3 | 4 | 5 | 6 | 7 | 8 | 9 | – | – | – | – | – | – | m |
| GAIN | 0 | | | | | | | | | | | | | | | | |
| SAMPLE | 1 | PHASE-ℓo | PHASE-ne | PHASE-hi | | | | | | | | | | | | | |
| SINGLE FREQ | 2 | PHASE-ℓo | PHASE-ne | PHASE-hi | F-ℓo | F-hi | | | | | | | | | | | |
| BURST SINGLE FREQ | 3 | T-ON ℓo | T-ON hi | T-OFF ℓo | T-OFF hi | F-ℓo | F-hi | | | | | | | | | | |
| SEQUENCE SINGLE FREQ | 4 | M* | F-ℓol | F-hil | – | – | – | – | – | – | – | – | – | – | – | F-ℓom | F-him |
| FREQ SWEEP | 5 | INC-ℓo | INC-hi | F-ℓo | F-hi | | | | | | | | | | | | |
| MULTI-FREQ | 6 | F-ℓola | F-hila | F-ℓo2a | F-hi2a | | | | | | | | | | | | |
| SEQUENCE MULTI-FREQ | 7 | M# | T-ON ℓo | T-ON hi | T-OFF ℓo | T-OFF hi | F-ℓola | F-hila | F-ℓo2a | F-hi2a | – | – | – | – | F-ℓolm | F-hilm | F-ℓo2m | F-hi2m |
| BURST MULTI-FREQ | 8 | T-ON ℓo | T-ON hi | T-OFF ℓo | T-OFF hi | F-ℓola | F-hila | F-ℓo2a | F-hi2a | | | | | | | | |
| SANITY | 9 | | | | | | | | | | | | | | | | |

* 20 FREQUENCIES MAXIMUM
10 FREQUENCY PAIRS MAXIMUM

SINGLE FREQUENCY FUNCTION

T-ON SUBROUTINE

T-OFF SUBROUTINE

FIG. 104

| MEMORY BYTES | HEX ADDRESS |
|---|---|
| USER RAM | 000-03F |
| UNASSIGNED | 040-07F |
| PORT A | 080 |
| PORT B | 081 |
| PORT C | 082 |
| PORT D | 083 |
| UPPER LATCH | 084 |
| LOWER LATCH | 085 |
| NOT USED | 086-08A |
| UNASSIGNED | 088-08E |
| CONTROL REGISTER | 08F |
| UNASSIGNED | 090-7FF |
| +COSINE TABLE | 800-8FF |
| -COSINE TABLE | 900-9FF |
| PROGRAM TRANSFER TABLE LOW | A00-A09 |
| PROGRAM TRANSFER TABLE HIGH | A0A-A13 |
| INBYTE TABLE | A14-A1D |
| INITIALIZATION INDEX TABLE | A1E-A27 |
| RESET PROCESS | A2B-A5A |
| NMI PROCESS | A5B-B4D |
| GAIN PROGRAM | B4E-B60 |
| SAMPLE PROGRAM | B61-B72 |
| SINGLE FREQUENCY FUNCTION | B73-B92 |
| BURST SINGLE FREQUENCY FUNCTION | B93-BB6 |
| SEQUENCE SINGLE FREQUENCY FUNCTION | BB7-C10 |
| FREQUENCY SWEEP FUNCTION | C11-C8F |
| MULTI-FREQUENCY FUNCTION | C90-CCF |
| SEQUENCE MULTI-FREQUENCY FUNCTION | CD0-CFD |
| BURST MULTI-FREQUENCY FUNCTION | CFE-D27 |
| SANITY PROGRAM | D28-E7D |
| SINCOS SUBROUTINE | E7E-F0F |
| SINCOS2 ENTRY | E96-F0F |
| T-ON SUBROUTINE | F10-F28 |
| T-OFF SUBROUTINE | F29-F41 |
| DATA ACCEPT SUBROUTINE | F42-F50 |
| CONVERT FREQUENCY SUBROUTINE | F51-F7F |
| ZERO SUBROUTINE | F80-FA0 |
| UNUSED | FA1-FF9 |
| NMI VECTOR LOW | FFA |
| NMI VECTOR HIGH | FFB |
| RESET VECTOR LOW | FFC |
| RESET VECTOR HIGH | FFD |
| NOT USED | FFE |
| CHECKSUM STORAGE | FFF |

4000

MAGNETIC CURRENT SENSOR

REFERENCE TO A MICROFICHE APPENDIX

This application contains a microfiche appendix listing programs incorporated in the testing system comprising the subject matter of this disclosure. The total number of microfiche is 17 and the total number of frames is 1042.

CROSS-REFERENCE TO RELATED APPLICATIONS

The following U.S. applications, which are assigned to the same assignee as the instant application and filed concurrently therewith, have related subject matter. Certain portions of the system, processes and circuitry herein disclosed are inventions of the below named inventors as defined by the claims in the following patent applications:

(1) "Mechanized Testing of Subscriber Facilities", Ser. No. 399,177 of H. Rubin, since issued as U.S. Pat. No. 4,446,341 on May 1, 1984;

(2) "Data Communication Network", Ser. No. 399,186 of C. L. Coleman—H. Rubin;

(3) "Networks for Data Communication", Ser. No. 399,180 of H. Rubin;

(4) "Message Routing through Data Communication Networks", Ser. No. 399,187 of N. R. Fildes;

(5) "Parallel Bus Protocol", Ser. No. 399,171 of N. R. Fildes;

(6) "System for Accessing and Testing Subscriber Loops", Ser. No. 399,185 of H. Rubin, since issued as U.S. Pat. No. 4,438,298 on Mar. 20, 1984;

(7) "Switching Network for Interactive Access and Testing of Subscriber Loops", Ser. No. 399,188 of H. Rubin, since issued as U.S. Pat. No. 4,467,147 on Aug. 21, 1984;

(8) "Stored Program Controller", Ser. No. 399,175 of H. Rubin;

(9) "Programmable Tester for Measuring Network Characteristics", Ser. No. 399,172 of H. Rubin, since issued as U.S. Pat. No. 4,459,436 on July 30, 1984;

(10) "Programmable Network Tester with Data Formatter", Ser. No. 399,184 of K. B. Kemper—H. Rubin;

(11) "Programmable Gain Amplifier", Ser. No. 399,183 of K. B. Kemper;

(12) "Digital Signal Generator", Ser. No. 399,176 of H. Rubin;

(13) "Magnetic Current Sensor with Offset and Load Correction", Ser. No. 399,174 of J. M. Brown—K. B. Kemper;

(14) "Magnetic Differential Current Sensor", Ser. No. 399,173 of J. M. Brown;

(15) "Digital Filtering with Monitored Settling Time", Ser. No. 399,189 of H. Rubin;

(16) "Dial Pulse Measurement Circuitry", Ser. No. 399,181 of H. A. Miller;

(17) "Coin Telephone Measurement Circuitry", Ser. No. 399,178 of H. A. Miller;

(18) "Dual-port Random Access Memory Arrangement", Ser. No. 399,179 of H. C. Bond—E. H. McFadden—H. A. Miller;

TABLE OF CONTENTS

Technical Field
Background of the Invention
Summary of the Invention
Brief Description of the Drawing
Detailed Description
1. THE MECHANIZED LOOP TESTING (MLT) ARCHITECTURE
2. MLT IMPLEMENTATION
2.1 Data Communication Network (DCN)
2.1a Structure
2.1b Message Routing
2.1c Software Design
2.1d Software Operation
2.2 Loop Testing System (LTS)
2.2a Structure
2.2b LTS Operation
2.2.1 LTS Controller
2.2.1a Access Request Processing
2.2.1a.1 Regular Test Access and MDF Trunk Access
2.2.1a.2 Interactive Request Processing
2.2.1a.3 Callback Access Processing
2.2.1b Test Request Accessing
2.2.1c LTS Requests
2.2.1d LTS Controller Circuitry
2.2.2 Port Controller
2.2.3 Precision Measurement Unit (PMU)
2.2.3a Digital Signal Generator (DSG)
2.2.3b Magnetic Current Sensor
2.2.3c Signal Processing
2.2.3d PMU Controller
2.2.4 LTS Circuits For Establishing Loop Connections
2.3 Front End (FE) System
3. MLT CIRCUITRY AND PROGRAMS
3.1 ECN Implementation
3.1.1 Circuitry
3.1.2 DCN Programs
3.2.1 LTS Controller Implementation
3.2.1a LTS Main Controller Circuitry
3.2.1b LTS Universal Memory
3.2.1c LTS Serial Data Line Interface
3.2.1d LTS Programs
3.2.1e Test Sequences
3.2.2 Port Controller Implementation
3.2.3 PMU Implementation
3.2.3a DSG Circuitry
3.2.3a.1 DSG Software Considerations
3.2.3a.2 DSG Hardware Considerations
3.2.3b Magnetic Current Sensor Circuitry
3.2.3c Digital Processing and Control
3.2.3d Digital Processing Considerations
3.2.4 Loop Connection Circuitry
3.3 FE System Considerations

TECHNICAL FIELD

This invention relates generally to testing of telecommunication facilities such as telephone loops provided over multipair cables and, more particularly, to a stored program control system which directs a network of distributed processors to access and measure the facilities.

BACKGROUND OF THE INVENTION

In order to test telephone loops, whether for fault diagnosis, preventive maintenance purposes or even to compile statistical information about loop characteristics, three basic functions are required, namely: access, test and communication. These three basic functions can readily be identified for any manual or automatic testing system. For instance, within each system, there are mechanisms for gaining control of a loop to be tested, for connecting to it and for directing appropriate testing activities. Moreover, a two-way communication path exists between testing personnel or equipment interfaces so that selected test activities may be initiated, coordinated and the results collected for analysis. Oftentimes, an automated central controller determines the testing pattern and analyzes results via interpretive algorithms.

One such computer-based system has been described in an article entitled "The Evolution of the Automated Repair Service Bureau with Respect to Loop Testing", published in the *Conference Record of the International Symposium on Subscriber Loops and Services,* March, 1978, pages 64–68 as authored by O. B. Dale. The Automated Repair Service Bureau (ARSB), which supports loop maintenanace operations, includes the following maintenance functions: receiving trouble reports from customers; trouble report tracking; generating management reports; and real-time loop testing and fault diagnosis. Thus, within the ARSB framework, there is provided a rapid, convenient method for testing and analyzing test results automatically at the time of customer contact as well as on demand during repair procedures.

In order that the subject matter of the present invention may be elucidated, it is important to elaborate on the ARSB architecture and the capabilities of the above-mentioned testing arrangement within this architecture. The information presented by this overview is set forth in the above-mentioned reference as well as in an article entitled "Automation of Repair Service Bureau", Conference Publication No. 137 of the *International Symposium on Subscriber Loops and Services,* May, 1976 as authored by R. L. Martin. FIG. 1 indicates that the conventional ARSB comprises a tree-like structure with four major levels. At Level 1 of the tree is a data storage computer (200) which maintains a master data base of up to five million customer line records; the information on these records includes data as to equipment terminating the loop, loop composition, customer telephone number, and so forth. Level 2 is composed of an array of front end (FE) computers (220,221), each of which manages the bulk of the trouble report processing for about 500,000 lines. The users of the system, typically maintenance and craft personnel of the telephone company deploying the ARSB, interact with the system at this level. Level 3 is an array of control computers (240,241) that control access and testing and provide analysis of test results. Level 4 comprises loop testing frames (250,251) which perform the loop accesses and actual test measurements via test trunk connections to switching machines located in geographically-dispersed central offices.

Test requests from users are received and supervised by the FE computers and then performed by algorithm in the control computers and circuitry in the loop testing frames. The tests conducted are based on adaptive algorithms that compose test scripts in real time as a function of the electrical characteristics of the customer's equipment in the idle state. The data used are extracted from the data storage computer and then provided by the FE computers at the time the test request is generated. As testing on a customer's loop proceeds, the test script is continually being revised to reflect the knowledge of the loop which has been gained from the test results. The final test results and analysis are formatted for display to the user by the requesting FE computer. Varying levels of display detail, based on the technical sophistication of the user, are provided.

The loop testing subsystems of the ARSB were arranged to provide an area-based (about 1 million loops) system in order to expedite its introduction and mitigate cost to users. As a result, not all of the testing functions of the standard pre-ARSB facility, known as the Local Test Desk (LTD), were incorporated. For instance, the LTD continued to be used for interactive testing between testers at the LTD and field repair craft. The loop testing subsystem could not be utilized to maintain a connection to the loop under test for a prolonged duration, nor could field repair personnel be guided through a series of steps to diagnose, locate and correct a fault. In short, the loop subsystem was effective only in screening troubles and performing pre-dispatch and post-dispatch testing. Also, not every type of internal equipment could be tested. For instance, coin telephone features were precluded from testing. Moreover, because the LTD operated within the same environment as the ARSB, the LTD was considered a backup during temporary outages of ARSB so there was no need for redundancy or fail-soft operation in the testing system. Finally, the area-oriented system was not cost effective for single wire centers serving only a few thousand lines.

With the above background, the significant limitations and deficiencies of the conventional ARSB testing system, including those emphasized above, may be summarized as follows: (1) no interactive testing capability with field craft personnel nor customers; (2) inability to test coin telephone stations including such conditions as off-normal totalizers, stuck coin conditions, coin collect and coin return circuitry, and loop-ground resistance; (3) impossible to test and talk over the same test connection; (4) no single- and double-sided resistive fault sectionalization capability; (5) no ability to apply metallic or longitudinal pair identification tones; and (6) no capability to control and monitor concurrent testing operations from a single work station.

Besides the ARSB approach, numerous other automated, but less complex, approaches have been employed to effect loop testing. Typically these have focussed on specialized problem areas, such as rapid-scan procedures to verify the accuracy and quality of splicing operations or simplified checks on easily quantifiable loop parameters like loop insulation resistance or loop impedance at a given frequency for preventive maintenance purposes.

Other automated approaches, with a sophistication comparable to the ARSB approach, have been developed for the purposes of diagnostic testing. One representative prior art system is disclosed in U.S. Pat. No. 4,139,745 issued to Ashdown et al on Feb. 13, 1979. Broadly speaking, the system comprises control means having a programmed digital computer and associated memory, a line test network, at least one user station and an interface for interconnecting these elements and one or more telephone exchanges and the plurality of telephone lines extending from such exchanges.

The line test network is responsive to the digital computer and includes means for generating a plurality of signals for a test cycle. During a cycle, besides DC and noise measurements, AC signals are applied to the three-wire line comprising the tip-ring-ground conductors and longitudinal and metallic response signals are measured. The responses are utilized to provide an indication of the capacitive load across the line which, in turn, may be translated to produce parameters indicative of, for example, line length, type of termination and possible line faults.

However, this prior art system possesses the same shortcomings and limitations summarized above with respect to the ARSB. Moreover, since the system is not comprised of a data base for storing information about line composition, adaptive testing and interpretation of results in view of line configuration information is precluded. In addition, although many users may have access to the system, each testing operation is basically sequential and there is no suggestion that access and testing operations on many different lines within one exchange may be occurring concurrently.

It is clear from a perusal of the prior art portion of the ARSB set forth in FIG. 1 that each grouping of test trunks is served by only one FE computer. In the event of a FE computer outage, the Local Test Desk could, temporarily, satisy user test requests. However, such reliance reduces system throughput and is inapproprate in a fully automated testing environment. Such a shortcoming is obviated in an architecture that allows a plurality of FE computers to access any particular trunk.

To mitigate these and similar shortcomings, some distributed computer systems require that a cluster of controlling minicomputers communicate with remote entities that typically include microprocessor-based subsystems. However, when the number of such remote entities become large, a significant amount of minicomputer processing time must be devoted to these communication needs, and throughput is again reduced.

Also, packet switching networks may be used advantageously in some situations, but delay times through such networks and the cost of additional remote circuitry can render these solutions unattractive.

With the development of microprocessors, which function autonomously, it becomes feasible to decentralize switching functions and thereby offload many controller computer communication activities to the actual point of switching. Such an arrangement is discussed in U.S. Pat. No. 4,285,037 issued to H. Von Stetten on Aug. 18, 1981; this disclosure is selected as representative of numerous distributed processor switching networks configured for intercomputer communication. In these networks, all distributed processors, generally microprocessors, are connected to one another via a common bus. Communication of messages in the transmitting and receiving directions occurs between the processors in the form of information blocks having address information. A central clock is provided under whose control respective processors are cyclically connected for the emission of an information block and all other processors are connected to the common data bus in the receiving mode. Only the receiver having the specified address then receives the desired message. The processors comprising the system receive information from and transmit messages to associated peripheral or interface devices. For instance, some processors may be coupled to terminals or memories, whereas other processors may connect to communication lines having different baud rate capabilities.

The major shortcomings of such an arrangement include the utilization of a common bus which precludes alternative routing in case of a bus failure and the sequencing procedure allowing only one bus talker at a time. During peak message transfer periods, such as allocation procedure could lead to blocking situations with concomitant throughput delays.

Also, the standard communication sequences between a sender and receiver over a bus are usually replete with segments of no activity on the bus. For instance, after the sender transmits a message, the receiver computes a check word while the sender remains idle. The receiver then returns an acknowledge/negative acknowledge status message. Once the transmitted message is accepted, the sender then determines the next activity while the receiver is now inactive. Techniques have been devised to improve the efficiency of transmission in this simple sender-receiver situation. One such improvement utilizes the time the sender is idle (during check word computation) to effect a determination of the next activity.

The inefficiency is magnified in the situation of a talker communicating with many listeners. During the period in which one receiver is computing a check word, the remaining receivers are idle. If a retransmission is necessary, the inefficiency is compounded. Part of the difficulty occurs because the accept-reject status of a total message is also formulated as a message and returned over the data leads of the bus. Moreover, in situations exemplified by the MLT system, wherein the message propagate time is of the same order as a check word computation, the sender is idle for a significant portion of each transmission activity. This is in contrast to the situation wherein the messages are considerably longer than the check word computations, so the percentage of time the sender is idle is small.

As alluded to above in the summary of ARSB deficiencies, automated testing of coin telephone systems has, in the past, presented severe implementation problems because of the special nature of the coin equipment. Other special loop situations, such as analysis of dial pulses or measurement of nonlinear devices like thermistors, have also presented basically insurmountable implementation difficulties with conventional automated test procedures and equipment. Fortuitously, however, technological advances recently occurred which now make it possible to solve these problems and difficulties. Advances in microcomputing, digital signal processing and measurement technology have provided the motivation for the development of versatile digital signal generators and digital analysis techniques, including digital filtering, which produce rapid and accurate measurements. Unfortunately, however, the majority of subscriber lines to be tested are still analog in nature and parameters of interest relate to the frequency-dependent characteristics of the lines. Therefore, a suitable transponder for interfacing the analog lines to the sophisticated digital processing techniques is still a fundamental necessity.

One such transponder arrangement developed for sensitive line current measurements is disclosed in U.S. Pat. No. 4,274,051 issued to J. Condon on June 16, 1981. The invention set forth in this reference utilizes a pair of magnetic structures to produce an output signal when the current on the loop is other than zero. However, because the line currents undergoing measurement with this arrangement were large in magnitude, the errors caused by differences in the hysteresis characteristics between structures were negligible and could be ignored. Such errors, particularly when measuring differential currents, prove to be critical and require compensation to insure accuracy and resolution over the broad operating range expected of the transponder in the digital processing environment.

SUMMARY OF THE INVENTION

In accordance with the illustrative embodiment of the present invention, circuitry for sensing the value of a test current generated as a result of applying a test signal to a network port utilizes two matched toroidal cores to derive an output voltage proportional to the test current. The cores have substantially identical hysteresis characteristics and each core has line, control and sense windings. A control source provides a periodic control current to the control windings to drive the cores into saturation. The test current energizes the line windings to produce a magnetizing field aiding the saturation field on one core but a field opposing saturation on the other core. During flyback from saturation, a voltage is induced across the sense windings which is cumulatively integrated to produce an output voltage. During application of the control current, the output voltage supplies a feedback current to the sense windings to generate a field opposing the line winding fields. In steady-state operation, the feedback current is proportional to the test current, so the output voltage is a direct measure of the test current. To obtain improved measurement accuracy by compensating for differences in magnetic characteristics, an error correction circuit provides a correction current to the sense windings. The error correction circuit is periodically adjusted during a system calibration interval by disconnecting the network and test signal and measuring the output voltage. In this mode, the output voltage effects the calibrate voltage. A calibration current proportional to the calibrate voltage is then injected during flyback to offset the sensed voltage.

The invention is set forth with particularity in the appended claims. An understanding of this invention may be obtained with reference to the following detailed description taken in conjunction with the accompanying drawing.

BRIEF DESCRIPTION OF THE DRAWING

FIG. 32 depicts the parallel-input portion of a tier 3 circuit in block diagram form, whereas

FIG. 81 is a block diagram of the port interface associated with the port controller of FIG. 58; this diagram indicates that circuit details relating to the address decoder are given in FIG. 82 whereas

FIG. 94 indicates the number and order of transmission of bytes for the various output functions of the source generator.

FIG. 104 is a memory map for the various software routines utilized to implement the source generator of FIG. 17.

DETAILED DESCRIPTION

1. THE MECHANIZED LOOP TESTING (MLT) ARCHITECTURE

The overriding architectural consideration employed in the MLT system is to distribute the access, test and communication functions as closely as possible to the point of testing, which generally is the centralized switching facility serving the subscriber loops to be tested. The deployment of such a distributed architecture minimizes data flow in the system, increases testing accuracy and expands test capabilities.

Figure 1:
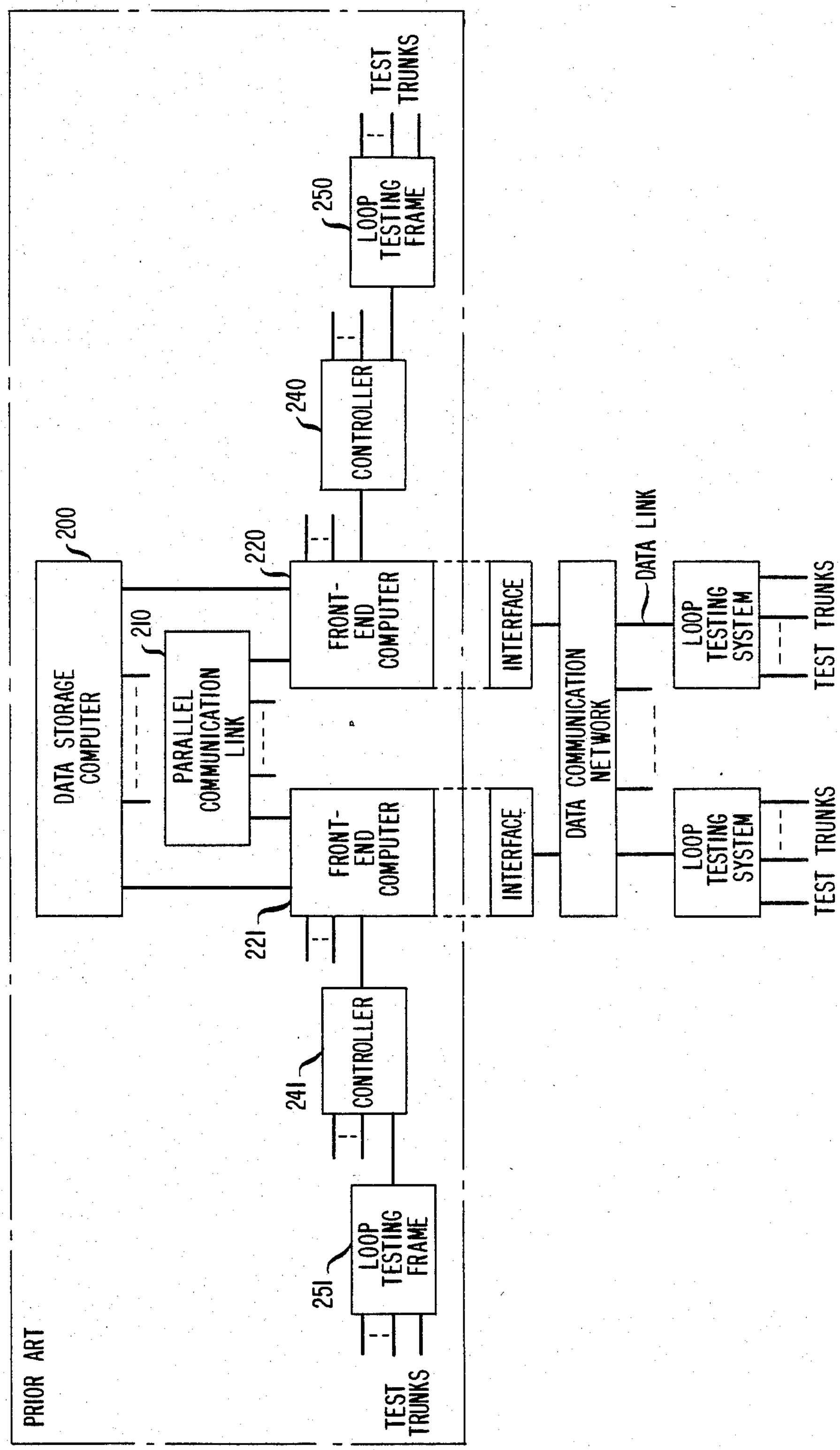
FIG. 1 indicates the architectural arrangement of one conventional automated testing system and, in accordance with an alternative embodiment of the present invention, an arrangement for integrating the distributed Mechanized Loop Testing (MLT) system within the conventional system to expand test capabilities.

To place in perspective the description that follows, FIG. 1 illustrates, in overlay fashion, one arrangement for integrating the distributed MLT system within the framework of the ARSB system discussed in the Background Section. In this depiction, it is clear that one embodiment of the MLT system serves as an adjunct to the testing system described earlier. However, the illustrative embodiment of the present invention is best elucidated as a stand-alone system and this arrangement is shown in FIG. 2.

Figure 2:
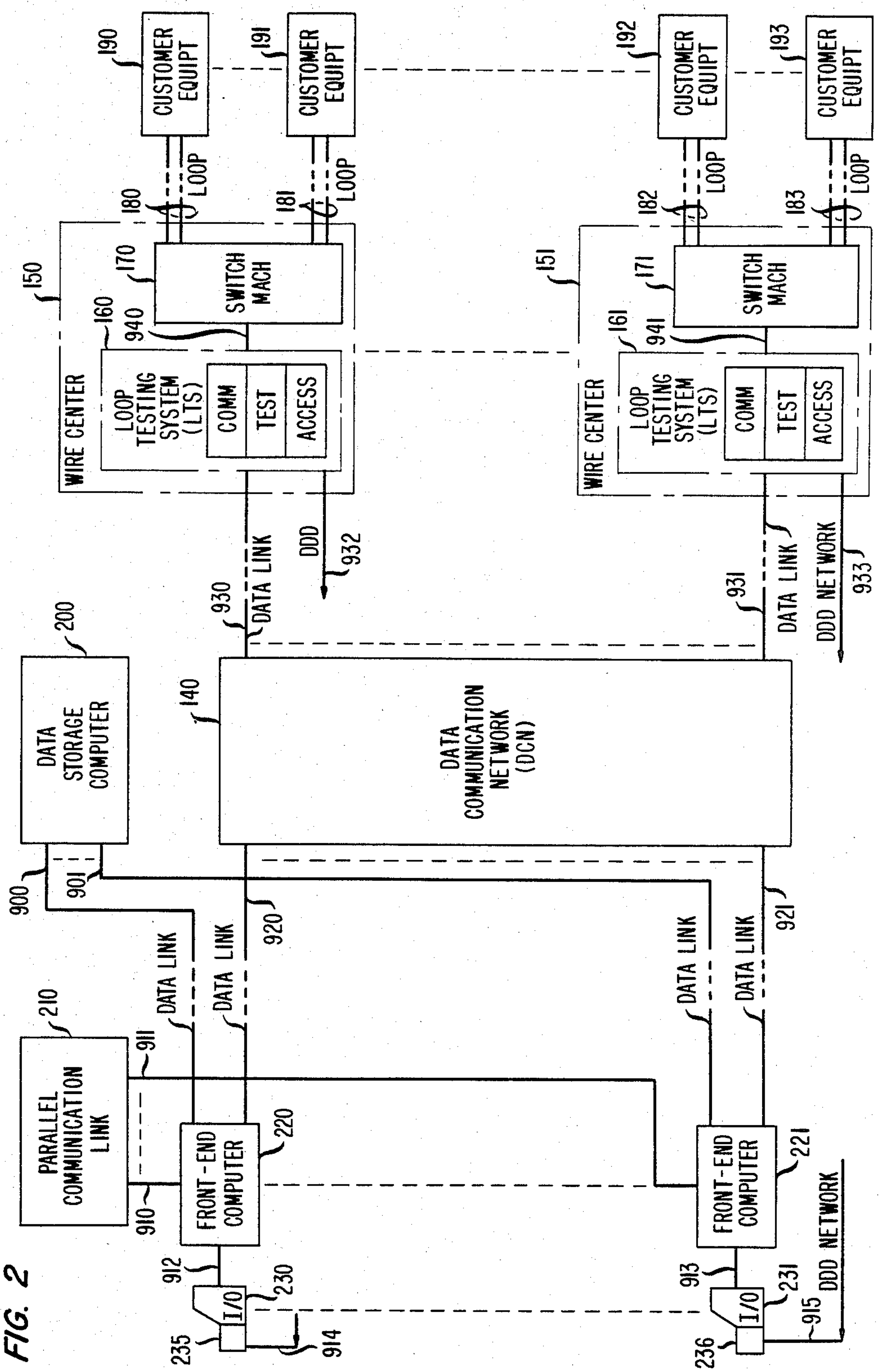
FIG. 2 depicts, in overview fashion, a block diagram of the major components comprising the stand-alone Mechanized Loop Testing system, as well as the interconnections among these components.

FIG. 2 depicts, in overview fashion, a block diagram of an illustrative embodiment of the MLT architecture arranged in accordance with the present invention. Data storage computer 200 stores information about each subscriber loop existing in the area to be served by the MLT system. For instance, typical types of information accessible in computer 200 include the composition of the subscriber loop, office equipment, outside plant equipment and terminating equipment associated with each loop.

The area served by a MLT system generally encompasses a number of geographically-dispersed wire centers 150 and 51 containing switching machines 170 and 171, respectively. Individual subscriber loops 180, . . . , 183, with associated customer equipment 190, . . . , 193, respectively, are served by wire centers 150,151 and connect to switching machines 170,171. Each wire center 150 or 151 served by the MLT system contains a collocated microprocessor-based Loop Testing System (LTS), 160 or 161, respectively, that also implements access, test and communication capabilities (shown pictorially as components of each LTS 160 or 161 in FIG. 2). The access portion of each LTS 160,161 is arranged with circuitry for establishing a transmission connection, under control of FE computers 220,221, over the national dial network, that is, the Direct Distance Dialing (DDD) network, via facilities 932 and 933 emanating from wire centers 150 and 151, respectively. Switching machines 170,171 are accessible from LTS 160,161 via test trunks 940,941, respectively.

Front-end (FE) computers 220,221 interact with storage computer 200 to retrieve pertinent data regarding subscriber loops to be tested. Since FE computers 220 and 221 are not necessarily collocated with computer 200, data links 900 and 901, respectively, are provided for intercomputer communication. Direct communication between FE computers 220,221 is accomplished via Parallel Communication Link (PCL) 210 and interposed busses 910,911, respectively.

The communication functions that reside in each LTS 160,161 and in each FE computer 220,221 are coupled via Data Communication Network (DCN) 140. DCN 140 allows any one of FE computers 220,221 to communicate with any LTS 160,161 in any wire center 150,151 served by the MLT system. DCN 140 is also a microprocessor-based distributed processing machine that offloads communication processing for all FE computers 220,221.

The architecture depicted in FIG. 2 allows any FE computer 220,221 to test any customer loop 180, . . . , 183 within the area served by the MLT system. To demonstrate this, the following describes, again in overview fashion, the operation of the illustrative embodiment of the MLT system.

A loop test is typically generated by a request from repair service bureau personnel, typically a maintenance administrator. This user has a console 230,231 with an input/output device, e.g., a keyboard and cathode-ray tube (CRT), for interfacing to a FE computer 220,221 via data links 912,913, respectively; the console also includes circuitry 235,236 for communicating over the DDD network via conventional facilities 914 and 915. Several types of CRT masks are available to enable the user to input data (e.g., a telephone number to be tested) and receive output (e.g., test results) from the MLT system. When the user determines a subscriber loop is to be tested, an MLT program resident on FE computer 220 or 221 requests that certain data base information be retrieved from storage computer 200 relating to the characteristics of a loop 180, . . . , or 183 to be tested. This information is utilized by an application process resident on FE computer 220 or 221 that initiates accessing of the loop and then guides loop testing. The application process may contain, for instance, an adaptive loop testing algorithm or it may contain commands to implement interactive test control and other functions similar to that performed with manual testing.

Because of the processing capability available in the microcomputers of LTS 160,161, only high level commands are generated by FE computers 220,221. The first command requests LTS 160 or 161 to access a specified telephone number and, if interactive testing is required, the command also provides the telephone number of the circuitry at the user's console so a call-back path may be established. The message compiled by the appropriate FE computer 220 or 221 to implement the command and transmitted over outgoing data link 920 or 921 contains a message field having a parameter that identifies which LTS data link 930 or 931 is to be utilized for intercomputer communication. Any message, including the first one, is routed from FE computer 220 or 221 to DCN 140 via incoming data links 920 or 921 and, after appropriate parsing and reassembly of the message, from DCN 140 to the preselected LTS 160 or 161 via outgoing data link 930 or 931. When access is completed, the response is rerouted through data link 930 or 931, DCN 140 and data link 920 or 921 to the FE computer 220 or 221 that requested the access. Subsequent message transactions that occur between FE computer 220 or 221 and LTS 160 or 161 involve high level requests for tests to be performed, followed by detailed responses containing raw test data (e.g., the amount of current that was measured on loop wires 180, . . . or 183 when a particular source was applied to the loop by LTS 160 or 161). These transactions may be prefaced with oral communications between the maintenance administrator at console 230,231 and the customer serviced by the loop or field craft personnel at a location along the loop. These communications are transacted over DDD callback path and are generally utilized in the interactive test mode to establish appropriate conditions on the loop for test purposes. For example, a craftperson may be requested to short the loop so a DC resistance measurement may be effected. The last request made by FE computer 220 or 221 is to have LTS 160 or 161 disconnect from loop 180, . . . or 183 under test. The number of loops that may be accessed simultaneously at any LTS site and the number of simultaneous tests that may be in progress at a given LTS are discussed in the sequel.

The above overview shows the basic design philosophy of the MLT system and illustrates one distributed processing approach to loop testing. Hardware and software functions are partitioned so that system complexity is reduced to the point where basically independently designed and maintained modules interact via high level commands. The following section describes the individual modules or components of the MLT system in somewhat more detail, but basically still in overview fashion, from both a hardware and software perspective. After this, another pass through each component will complete the detailed description.

2. MLT IMPLEMENTATION

2.1 Data Communication Network (DCN)

2.1a Structure

As indicated in FIG. 2 and alluded to in the foregoing discussion, DCN 140 is structured to route messages between any FE computer 220,221 and any LTS 160,161. The illustrative embodiment of DCN 140 to be described allows from one to twelve FE computers to exchange data with up to seven hundred and sixty eight (768) Loop Testing Systems. (This capacity is determined by anticipated user needs; the total capacity of the architecture of DCN 140, without bus extenders, is actually 1568 data links or, equivalently, 1568 Loop Testing Systems.)

Figure 3:
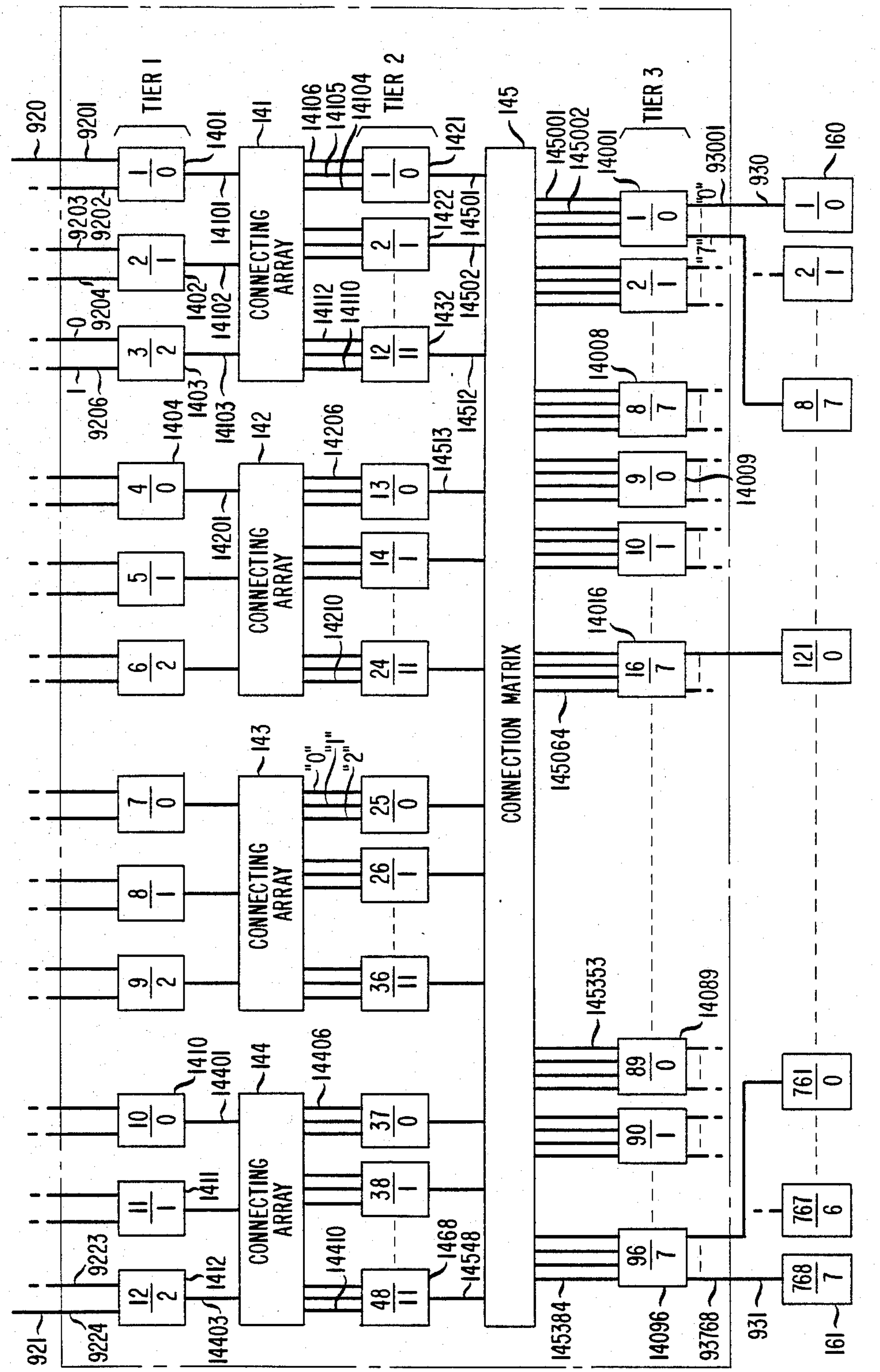
FIG. 3 depicts a three-tier multiprocessor realization of the Data Communication Network (DCN) shown in block diagram form in FIG. 2.

FIG. 3 shows a three-tiered multiprocessor realization of DCN 140. Tier 1 serial-in, parallel-out devices 1401, . . . , 1412 are arranged to accept incoming data links 9201, . . . , 9224 on a two data link-per-device basis. For instance, device 1401 in tier 1 interconnects to data links 9201 and 9202. Incoming data links 9201, . . . , 9224 originate from FE computers 220,221 of FIG. 2. In fact, internal data link 9201 is the same link identified as external data link 920, as depicted in FIG. 3. A similar identification may be made between links 921 and 9224.

Tier 3 parallel-in, serial-out processing circuits 14001, . . . , 14096 are arranged to provide outgoing data links 93001, . . . , 93768 on an eight data links-per-circuit basis. Outgoing data links 93001, . . ., 93768 terminate on LTS's 160,161 of FIG. 2. In fact, internal data link 93001 is the same link identified as external link 930, as depicted in FIG. 3. A similar identification may be made between links 931 and 93768.

Figure 4:
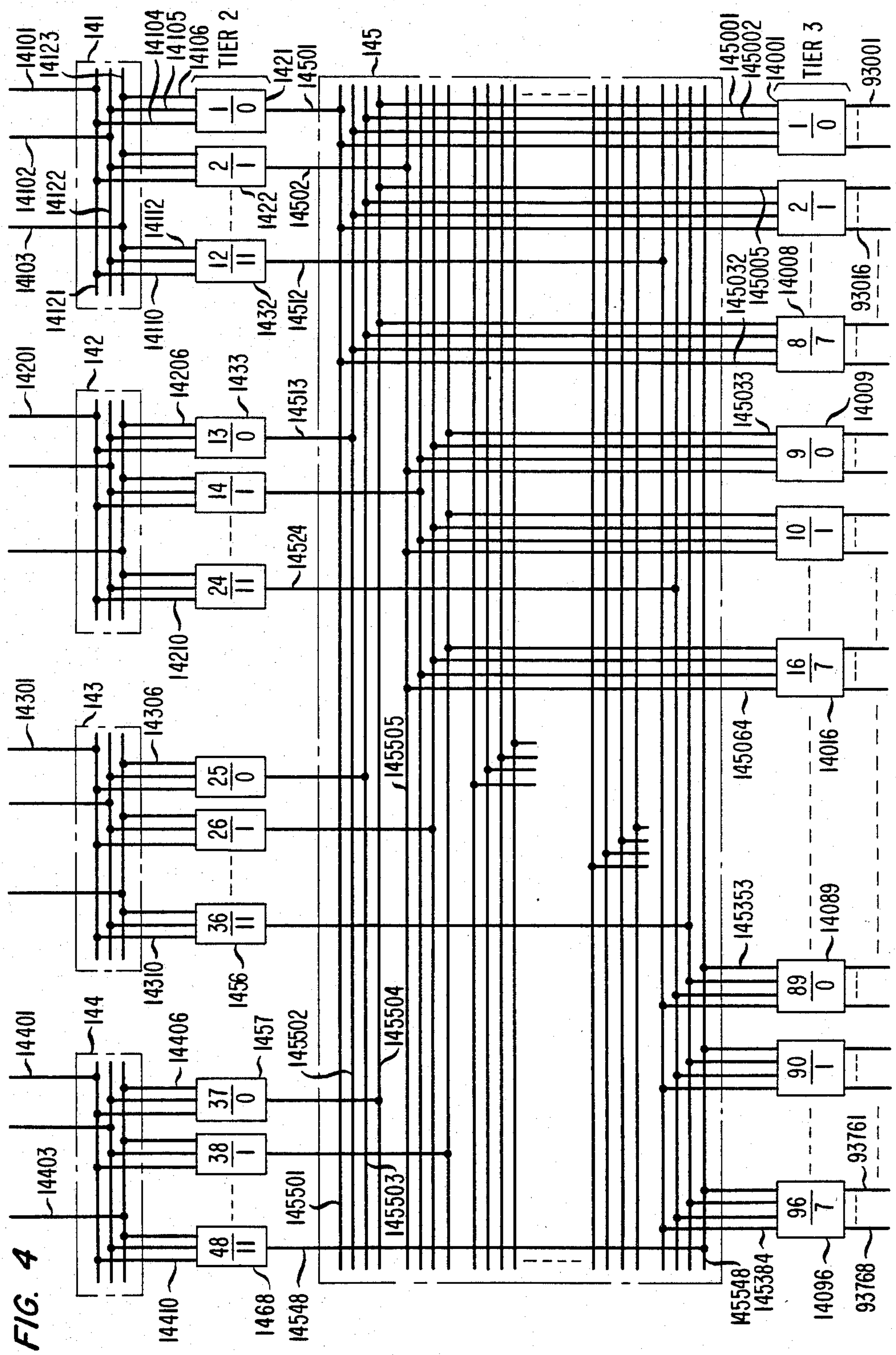
FIG. 4 illustrates the internal bus structures of the connection matrix and the connection arrays of the DCN.

Tier 2 parallel-in, parallel-out processing interfaces 1421, . . . , 1468 serve to interconnect first tier devices 1401, . . . , 1412 and third tier circuits 14001, . . . , 14096 by means of connecting arrays 141, . . . , 144 and connection matrix 145, shown in block form in FIG. 3. FIG. 4 depicts the actual arrangement of arrays 141, . . . , 144 and matrix 145.

With reference to FIG. 4, array 141 (arrays 142, 143 and 144 are substantially the same as array 141) comprises three similar, but independent busses 14121, 14122 and 14123. Each of these busses 14121, 14122, 14123 implements, in the preferred embodiment, the General Purpose Interface Bus (GPIB) protocol. This protocol is defined in IEEE Standard 488-1978 "Digital Interface for Programmable Instrumentation," a well-known standard in the art of digital communication. Matrix 145, comprising forty-eight similar, but independent busses 145501, 145502, . . . , 143348, also utilizes the GPIB protocol. The interconnections of the various busses are arranged to provide modularity and fail-soft operation of DCN 140, as now explained.

The twelve tier 1 devices 1401, . . ., 1412 of FIG. 3 are partitioned into groups of three devices-per-group. For instance, the first group contains devices 1401, 1402 and 403. The circuit elements representing these devices have been labeled '1', '2', and '3', respectively, within the pictorial representation of each element. Thus, device 1401 has been designated with a '1', device 1402 with a '2' and so forth. The numbers below '1', '2' and '3' in each pictorial representation, that is, '0', '1' and '2', are indicative of the logical addresses to be associated with the actual element numbers. These logical designations will be utilized to describe information flow through DCN 140. With the above terminology, it is clear that the second group of devices contains devices 1404, 1405 and 1406; these are actually the fourth ('4'), fifth ('5') and sixth ('6') devices having logical designations '0', '1' and '2'. Any actual designation ($A_1$) can be converted to a logical designation ($L_1$) via the relation $L_1 = \text{mod}\,(A_1 - 1, 3)$.

In the arrangement of FIG. 3, there are four groups of devices. The devices in each group serve as inputs to a corresponding connecting array 141, . . . , or 144. For instance, devices 1401, 1402 and 1403 of the first group are associated with array 141. Each device in tier 1 controls a unique means for transmitting information to and from its associated connecting array. For example, device 1401 controls transmission means 14101, which typically implements the GPIB protocol.

Uo to twelve tier 2 interfaces may be added per tier 1 group, and this maximum is shown in FIG. 3. Since there are four groups and twelve interfaces per group, a total of forty-eight interfaces are present in the architecture of FIG. 3. These interfaces are designated 1421, 1422, . . . , 1468 and correspond to actual interfaces '1' through '48', respectively. Actual interface designations ($A_2$) also have logical designations ($L_2$) '0' through '11' determined by the relation $L_2=\text{mod}(A_2-1, 12)$.

Each tier 2 interface has three input busses and generates an independent output bus. For instance, interface 1421 is served by busses 14104, 14105 and 14106 and controls bus 14501 on its output. The protocol on these busses is typically the GPIB. The input busses originate from one of the connecting arrays 141, . . . , 144 and the output bus terminates on connection matrix 145.

With the above description, the interconnection provided by arrays 141, . . . , 144 may be described according to the following tables.

TABLE I

| Array 141 | |
|---|---|
| Bus | Connects to busses |
| 14101 | 14104,14107,14110 |
| 14102 | 14105,14108,14111 |
| 14103 | 14106,14109,14112 |

TABLE II

| Array 142 | |
|---|---|
| Bus | Connects to busses |
| 14201 | 14204,14207,14210 |
| 14202 | 14205,14208,14211 |
| 14203 | 14206,14209,14212 |

TABLE III

| Array 143 | |
|---|---|
| Bus | Connects to busses |
| 14301 | 14304,14307,14310 |
| 14302 | 14305,14308,14311 |
| 14303 | 14306,14309,14312 |

TABLE IV

| Array 144 | |
|---|---|
| Bus | Connects to busses |
| 14401 | 14404,14407,14410 |
| 14402 | 14405,14408,14411 |
| 14403 | 14406,14409,14412 |

The processing circuits 14001, . . . , 14096 of tier 3 are arranged to have an equal association with all devices 1401, . . . , 1412 of tier 1. From one to eight tier 3 circuits are allowed per tier 2 interface; the arrangement of FIG. 3 shows the maximum limit. Consequently, the number of tier 3 circuits that appear is ninety-six, and these circuits are labeled '1' through '96' in the pictorial representations of circuits 14001 through 14096. Corresponding to the actual designations ($A_3$) '1' through '96' are logical designations ($L_3$) '0' through '7' which may be derived from the relationship $L_3=\text{mod}(A_3-1, 8)$. Also, each of the ninety-six tier 3 circuits 14001 through 14096 controls eight contiguous links comprising outgoing data links 93001 through 93768 coupled to LTS's having actual designations '1' through '768' in FIG. 3. Each LTS with an actual designation ($A_4$) of '1' through '768' has a logical designation ($L_4$) determined by $L_4=\text{mod}(A_4-1, 8)$.

FIG. 4 shows that circuits 14001 through 14096 are divided into twelve sets with each set containing eight circuits, and each circuit has four input busses and up to eight output data links. For instance, circuit 14001 is served by input busses 145001 through 145004 originating from matrix 145 and provides output links 93001 through 93008. All input busses 145001 through 145384 associated with circuits 14001 through 14096 implement a parallel protocol, typically the GPIB, whereas output links 930001 through 93768 are serial transmission links. The protocol on the serial links will be discussed later.

The function of matrix 145 is to interconnect busses 14501 through 14548 arriving at its input to busses 145001 through 145384 exiting its output. The data bus means depicted as matrix 145 in FIG. 4 accomplishes this function. Matrix 145 comprises forty-eight similar but independent busses 145501 through 145548 implementing the GPIB protocol. On the input side of matrix 145: incoming bus 14501 connects to internal bus 145501; incoming bus 14502 connects to internal bus 145505; incoming bus 14512 connects to internal bus 145545; incoming bus 145513 connects to internal bus 145502; and so forth.

On the output side of matrix 145: internal bus 145501 connects to outgoing busses 145004, 145008, . . . , 145032; internal bus 145002 connects to outgoing busses 145003, 145007, . . . , 145031; internal bus 145503 connects to outgoing busses 145002, 145006, . . . , 145030; internal bus 145505 connects to outgoing busses 145036, 145040, . . . , 145064; and so forth.

The interconnection arrangement of matrix 145 may be summarized with the aid of a shorthand notation, as follows: if interfaces 1421 through 1468 are represented by the notation i(1), i(2), . . . , i(48), respectively, and the twelve sets comprising circuits 14001 through 14096 by m, m=1, 2, . . . , 12, with m=1 corresponding to circuits 14001 through 14008, and so forth, then matrix 145 maps tier 2 interfaces and tier 3 circuits according to the relation $$i\,(m=12\,(n-1)),\; n=1,\,2,\,3 \text{ and } 4.$$

For example, with m=1, then interface devices i(1), i(13), i(25) and i(37), corresponding to actual devices 1421, 1433, 1445 and 1457, serve the set containing circuits 14001 through 14008.

2.1b Message Routing

Figure 5:
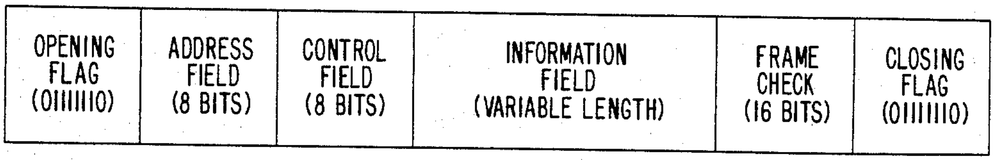
FIG. 5 shows the flag-field pattern for a representative conventional high level data link protocol and, in particular, the location of the INFORMATION field within the pattern.

With reference to FIG. 2, data links 920,921 arriving at the input to DCN 140 and outgoing data links 930,931 departing DCN 140 utilize a serial mode of transmission and a protocol that is bit oriented. Information is transmitted over these links in communication elements called frames. The bit pattern of a typical frame is shown in FIG. 5; this pattern is representative of conventional high level data link control type protocols. One example of a conventional link level (oftentimes designated Level II) protocol is the well-known synchronous data link control (SDLC) protocol. With these protocols, the components of a frame include:

(1) an eight bit OPENING FLAG field to indicate the start of a frame;

(2) an eight bit ADDRESS field identifying the receiving station that is controlled by the transmitting station;

(3) an eight bit CONTROL field used by the transmitting station to control the receiving station and by the latter station to respond to the former station;

(4) a variable length INFORMATION field containing the message that is to be transmitted without constraints on length or bit patterns;

(5) a sixteen bit FRAME CHECK field to detect transmission errors; and (6) an eight bit CLOSING FLAG field to indicate the end of a frame.

Of primary importance in the transmittal of messages within the MLT system is the data contained in the INFORMATION field. In general, MLT messages have the format shown in FIG. 6. The message comprises a HEADER portion and a DATA portion. The HEADER includes a number of bytes to indicate: whether the message is a request or response ('request_response'); routing procedure ('up_route' and 'down_route'); the processor which is the source ('up_circuit_type') and destination ('down_circuit_type'); the software task at the source ('up_task_id') and the destination ('down_task_id'); and other bytes to be discussed later. The DATA portion contains a variable number of bytes primarily indicating the type of tests desired and the raw data measured as a result of these tests. These DATA bytes will be discussed in detail later.

Particularly pertinent to message routing in DCN 140 are the 'down_route' and 'up_route' bytes. Whenever a message is sent from a FE computer 220 or 221 to a LTS 160 or 161, the 'down_route' parameter, comprising two bytes, must be parsed in order to guide the message through the three tiers of DCN 140.

As an example, it is supposed that a FE computer 220 or 221 is to interact with an LTS that has an actual designation of '121' in FIG. 3. The actual decimal designation is decremented by one to yield a decimal value of 120 and this is represented in 'down_route' by the following bit pattern:

| | | | | | | | | |
|---|---|---|---|---|---|---|---|---|
| bit position | 15 | 14 | 13 | 12 | 11 | 10 | 9 | 8 |
| value | 0 | 0 | 0 | 0 | 0 | 0 | 0 | 0 |
| bit position | 7 | 6 | 5 | 4 | 3 | 2 | 1 | 0 |
| value | 0 | 1 | 1 | 1 | 1 | 0 | 0 | 0. |

In general, bit positions 0, 1 and 2 are used by tier 3 circuits 14001 through 14096 to decide which one of its eight associated outgoing data links 93001 through 93768 will be used to transmit the INFORMATION field to the appropriate LTS ('121' in this example). Bit positions 3, 4 and 5 are used by tier 2 interfaces 1421 through 1468 to decide which one of its eight associated tier 3 circuits 14001 through 14096 will receive the INFORMATION field. Finally, bit positions 6, 7, 8 and 9 are used by tier 1 devices to decide which one of its twelve corresponding tier 2 interfaces 1421 through 1468 will receive the INFORMATION field. In this example, parsing of the 'down_route' two-byte parameter in conjunction with reference to FIGS. 3 and 4 indicates tht:

(i) tier 1 device 1401, 1402, . . . or 1412 (say 1403) receiving the frame passes the INFORMATION field to the tier 2 interface having logical address ($L_2$) of '1' (binary 0001 is equivalent to decimal 1);

(ii) tier 2 interface 1422, corresponding to logical address '1', receives the INFORMATION field and passes it to the tier 3 circuit having logical address ($L_3$) of '7' (binary 111 is decimal 7); and (iii) tier 3 circuit 14016, corresponding to logical address '7', passes the INFORMATION field, after reassembly into a data link protocol, to the LTS having logical address ($L_4$) of '0' (000 in binary is decimal 0). As indicated in FIG. 3, the LTS having logical address '0' at the output of actual tier 3 circuit 14016 is the LTS labeled '121', as requested.

Whenever any tier 1 device 1401 through 1412 receives a frame on its data link connection to FE computer 220 or 221, this is an indication that the INFORMATION field contained in the frame is to be propagated in the so-called DOWN direction through the MLT architecture of FIG. 2. The parameter in the HEADER portion of the INFORMATION field indicating the ultimate destination is 'down_circuit_type', which will be discussed later. The specific path through DCN 140 to this destination is found in 'down_route', as exemplified above.

A similar protocol is observed for messages traveling in the so-called UP direction of the hierarchy. In UP transmissions, the pertinent HEADER parameters are 'up_circuit_type' and 'up_route'. As a message is passed DOWN the hierarchy by DCN 140, appropriate return information is saved in 'up_circuit_type' and assembled in 'up_route' to allow for an orderly progression UP the hierarchy. The bit positions of 'up_route' are interpreted as follows: (1) bits 4 and 5 are employed by tier 1 devices to indicate the return path on one of two data links associated with each device 1401 through 1412; (2) bits 2 and 3 are used by tier 2 interfaces 1421 through 1468 to return on one of three busses connecting each tier 2 interface to its associated connecting array 141, . . . or 144; (3) bits 1 and 0 are utilized by tier 3 circuits 14001 through 14096 to return on one of four busses connecting each tier 3 circuit to connection matrix 145.

In the example given above for routing in the DOWN direction, it is supposed, as above, that tier 1 device 1403 received the frame under consideration on link 9206, as shown in FIG. 3. This link has logical designation '1'; in fact, the left-hand, incoming data link associated with each tier 1 device is the '1' link whereas the other link is designated '0', by convention. Before routing the INFORMATION field to tier 2 interfaces, the logical designation is converted to binary and bits 5 and 4 are filled with the binary representation—in this case 01. Tier 2 interface 1422 received the message on bus 14109 from array 141 (FIG. 4); this bus is designated by a logical '0'; in fact, the three busses entering a tier 2 interface from an array 141 through 144 are labeled '0', '1' and '2' starting with the right-most bus. Then, before sending the message to tier 3 circuit 14016, bits 3 and 2 are given the values 0 and 0, respectively ('0' in decimal converts to 00 in two-bit binary). Finally, since tier 3 circuit 14016 receives the message on its logical '3' bus from matrix 145 (again, the right-most bus is logical '0' and the left-most bus in logical '3'), bit positions 1 and 0 are filled with 1 and 1, respectively ('3' in decimal converts to 11 in binary). To summarize for this example, the LTS having actual address $A_4=121$ receives a frame with the 'up_route' parameter of HEADER filled as follows:

| bit position | 7 | 6 | 5 | 4 | 3 | 2 | 1 | 0 |
|---|---|---|---|---|---|---|---|---|

-continued

| bit | | | | | | | | |
|---|---|---|---|---|---|---|---|---|
| value | — | — | 0 | 1 | 0 | 0 | 1 | 1. |

(Bit positions 6 and 7 generally have values but are not pertinent to the immediate discussion and, therefore, have been shown without values).

As indicated in FIG. 3, each tier 1 device 1401, . . . , or 1412, receives two data links at its input. Since the typical MLT system is implemented with twelve on-line FE computers, each FE computer 220 or 221 supports two data links at its output. To provide a degree of redundancy for fail-soft operation, Fe computers 220,221 and tier 1 devices 1401–1412 are interconnected so that there are two possible paths between each FE computer 220 or 221 and DCN 140. For example, FE computer 220 supports the two data links 9201 and 9219 that terminate on tier 1 devices 1401 and 1410, respectively. Similarly, FE computer 221 implements two data links which terminate on devices 1412 and 1409. With such a FE-to-DCN connection arrangement, if one of the FE-to-LTS paths comprising the input data links 9201–9224 and DCN 140 fails during a transaction, it is possible to re-route the results from the given LTS to the appropriate FE computer over the alternate path. The folowing procedure implements the the alternate routing technique.

Figure 6:
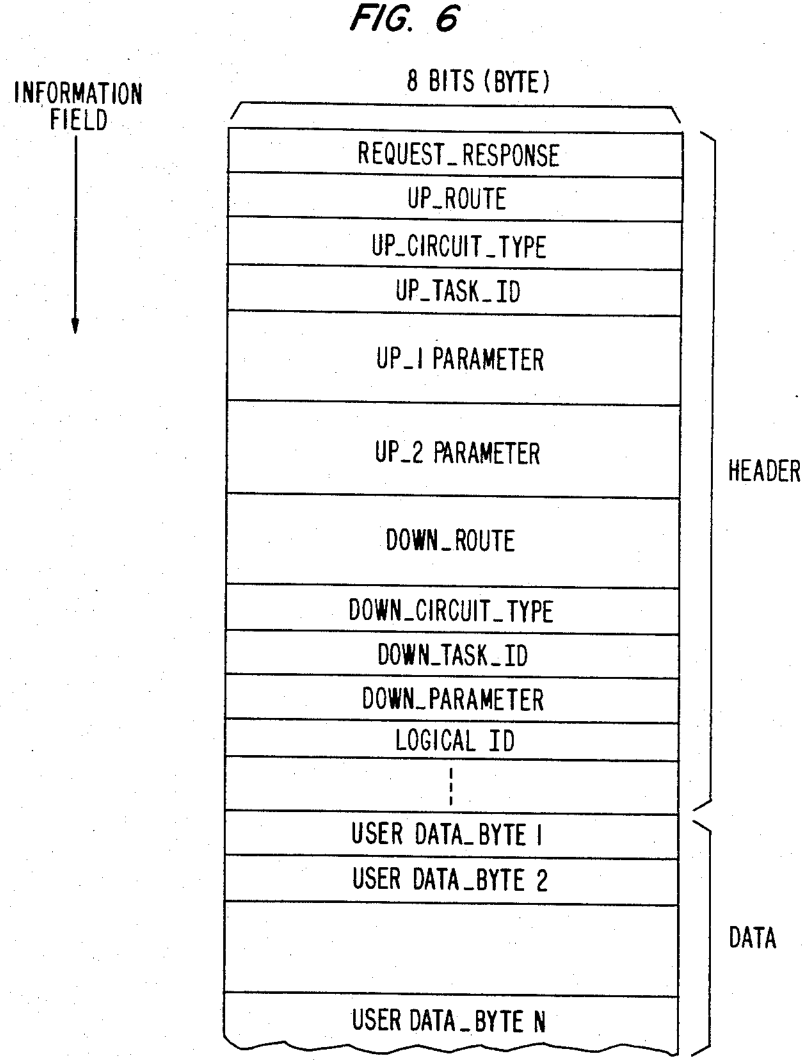
FIG. 6 indicates the composition of the INFORMATION field in terms of HEADER parameters and DATA bytes utilized by the MLT system in message routing, loop access and loop test.

Each FE computer 220,221 is initialized with a unique identifier. This identifier is stored as part of the 'logical_id' byte of the message HEADER, as depicted in FIG. 6, for all messages originated by the associated FE computer. The 'logical_id' is not related to the actual physical connection to DCN 140. Thus, if a FE computer fails and is replaced by a backup computer, the backup inherits the identifier of the FE computer being replaced.

As a message travels DOWN the hierarchy, information about the return path is stored in 'up_route', as described above. When the message reaches the designated one of the tier 3 circuits 14001–14096, the completed 'up_route' byte and associated 'logical_id' byte may be extracted. Each tier 3 circuit maintains a table containing the two most recently used upward paths for each 'logical_id'. Since the instruction routines controlling FE computers 220,221 generally distribute information transmissions equally through DCN 140, the table for a given FE computer, at any one time, will contain 'up_route' information to the two most recent paths needed to reach the particular FE computer in UP transmissions.

If an upward message connot reach the destination FE computer via its 'up_route' information because of a primary path blockage, the message is marked as failed and sent back to the originating Tier 3 circuit. The table entry for the same 'logical_id' is accessed and the 'up_route' information is replaced with the alternate or secondary 'up_route' path. If any subsequent failures occur, the message is then discarded.

In some situations, it is possible that the two most recent entries in the table do not correspond to the 'up_route' byte in the UP message. This occurs in situations where long-term craft activities are in progress, such as pair identification with an identifier tone provided by the MLT system. If a message fails to traverse the UP path on its first attempt, then either path in the table may be used as an alternate route.

2.1c Software Design

Each microprocessor executing within DCN 140 runs under supervision of its own ROM-based operating system. However, each separate operating system is identical, so only this one operating system, designated OS, requires explanation.

The OS provides a multitasking environment so that the operations performed by individual modules comprising the three-tiers of DCN 140 can be partitioned into a series of suboperations called "tasks". Each task is dedicated to handling a specialized activity. The OS is arranged to insure that the appropriate task gains control of its associated microprocessor and commences execution of its programmed sequence when a particular activity is requested. For example, one task resident in DCN 140 is designed to handle GPIB activity; this task executes whenever a bus transfer is required over any one of the numerous GPIB-type busses embedded within DCN 140. Whenever a bus transfer is completed and no other transfers are required, the bus transfer task relinguishes control of its microprocessor, and other scheduled tasks are now free to execute and satisfy requests for other activities. If no activities are scheduled, the OS is in its wait state, testing for a flag; a flag is set whenever a particular activity, and its associated task, await execution.

Figure 7:
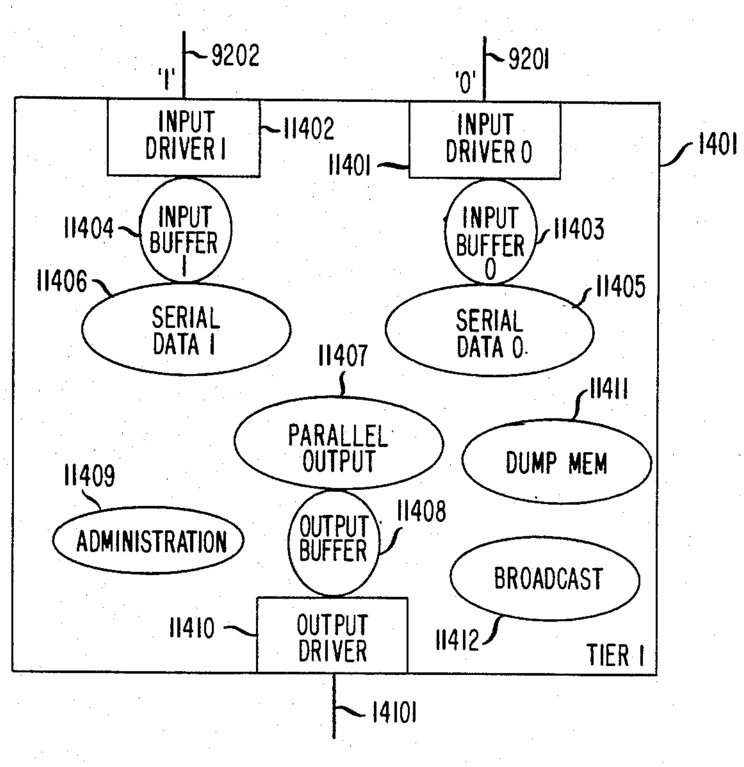
FIGS. 7, 8 and 9 show the microcomputer software architecture, in pictorial form, for tiers 1, 2 and 3, respectively, of the DCN. These illustrations are pictorial in the sense that they indicate a logical situation in terms of the number of copies of software utilized to implement the various system tasks.
Figure 8:
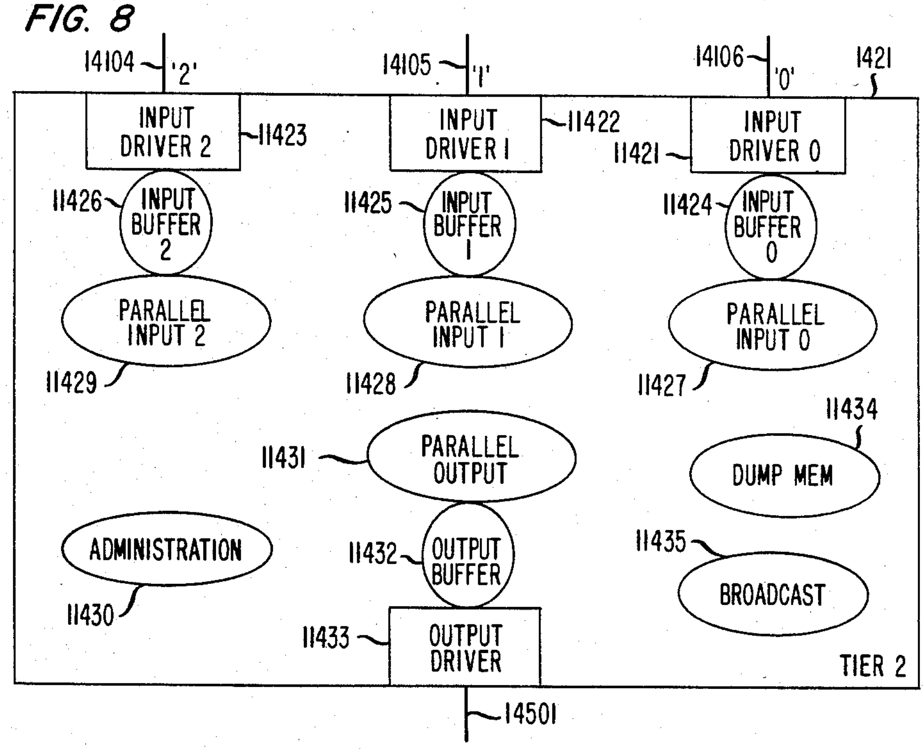
Figure 9:
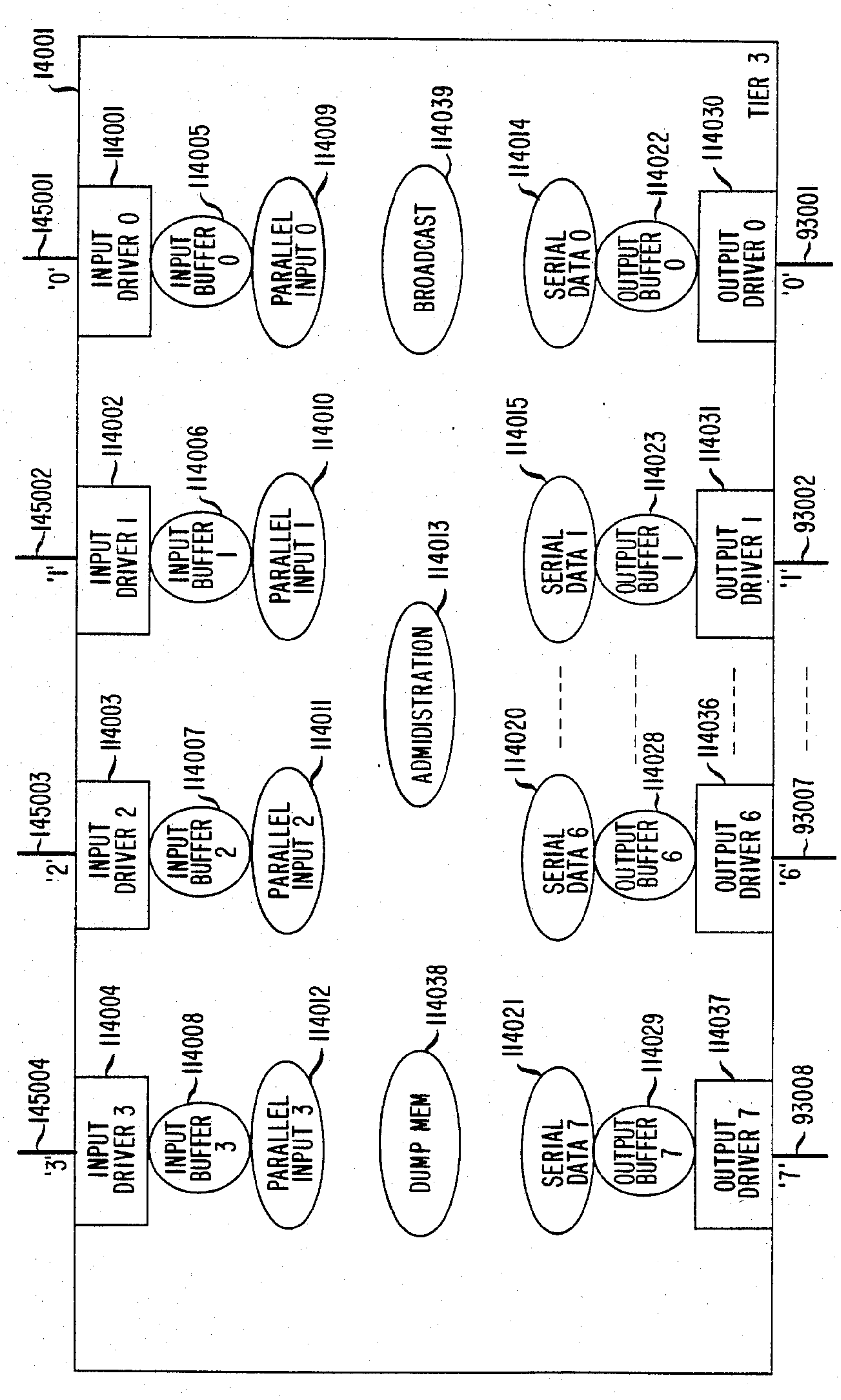

The microcomputer architecture, in pictorial form, for each tier of DCN 140 is shown in FIGS. 7, 8 and 9 for tier 1, tier 2 and tier 3, respectively. There are, at most, six types of tasks implemented by any particular microcomputer within the hierarchy of DCN 140.

Five of these tasks are shown in FIG. 7, which depicts the architectural arrangement for tier 1 device 1401 (the remaining tier 1 devices 1402 through 1412 have essentially the same architectural arrangement as device 1401 and, therefore, device 1401 is taken as respresentative). The task designated SERIAL DATA within elements 11405 and 11406 of FIG. 6 controls the activity associated with information transfer over serial data links 9201 and 9202, respectively. This task (i) parses incoming frames (FIG. 5) received over a data link 9201 or 9202, extracts the contents of the INFORMATION field, and stores the contents in a buffer memory within the controlling microprocessor that is accessible to other tasks; and (ii) performs the inverse to parsing on outgoing frames, that is, constructs a frame for transmission by extracting the contents of buffer memory to form the INFORMATION field of the frame and augments this field with the other fields (FIG. 5) needed for the serial protocol on links 9201 and 9202.

The task labeled PARALLEL OUTPUT within element 11407 controls the transfer of information over parallel-oriented bus 14101 and, when required, serves as the bus master. Information requiring transfer is extracted from or stored in buffer memory accessible by other tasks.

The ADMINISTRATION task, represented by element 11409, performs all non-operational functions required in the local environment. For instance, ADMINISTRATION controls sanity and diagnostic testing and the reporting of trouble. With reference to FIG. 6, ADMINISTRATION utilizes 'up_circuit_type', 'down_circuit_type', 'up_task_id' and 'down_task_id' for communicating with other MLT microcomputers to synchronize testing among the various modules.

The DUMP MEM task, represented by element 11411, waits a certain period after a reset or restart operation and determines if a snapshot of tier 1 memory is to be sent to a FE computer 220 or 221.

The BROADCAST task, depicted by element 11412, replicates a message for transmission in parallel to tasks having a plurality of appearances within a particular tier or, in this case of tier 1, to SERIAL DATA tasks 11405 and 11406. Replication reduces throughput time by allowing several slow serial transfers to proceed in parallel.

Tasks are defined so that the programs executing in the microcomputers of DCN 140 are relatively independent of the hardware they control. To accomplish this, generally each hardware component having input or output (I/O) capability has both a hardware driver and a software buffer that accompany the sole task controlling that I/O capability. Upon system initialization, a unique memory block is defined for each I/O hardware component; this block is known only to the hardware driver and software buffer associated with each I/O request. To service an I/O request, the buffer routine fills the appropriate memory block with control parameters and signals the driver to start I/O processing. The I/O operation is completed by the driver at interrupt level.

Whereas the only connection between the hardware driver and buffer software is the common memory block, the only connection between the driver and the associated task is a flag or semaphore that is set by the driver when its activity requires execution. The task awaits the occurrence of the semaphore, after which the task is scheduled by OS. In this manner, a task never communicates directly with a hardware driver.

With reference to FIG. 7, the driver and software buffer functions associated with the incoming links 9201 and 9202 and outgoing bus 14101 may be identified. For instance, INPUT DRIVER 11401 and INPUT BUFFER 11403, interposed between incoming data link 9201 and SERIAL DATA task 11405, perform the desired buffering on incoming link 9201. To transmit a message between SERIAL DATA task 11405 and BUFFER 11403, the task makes a function call and passes appropriate parameters (e.g., the memory address of the assigned memory block and the address of the completion semaphore) to the function. The function that is called is referred to as the buffer routine, and it is this routine that is represented pictorially by element 11403 in FIG. 7.

From FIG. 7 it may also be observed that INPUT BUFFER 11404 and INPUT DRIVER 11402 serve to interface SERIAL DATA task 11406 and incoming data link 9202, whereas OUTPUT BUFFER 11408 and OUTPUT DRIVER 11410 service PARALLEL OUTPUT task 11407 and parallel-oriented bus 14101.

The one task remaining to be defined is the PARALLEL INPUT task represented by elements 11427, 11428 and 11429 in FIG. 8; this figure pictorially represents tier 2 interface 1421 (the remaining tier 2 interfaces 1422 through 1468 have essentially the same architectural arrangement as interface 1421 and, therefore, interface 1421 is taken as representative). The PARALLEL INPUT task organizes message transfers across the parallel-input busses 14104, 14105 and 14106 via the individual taks 11427, 11428 and 11429, respectively. These three PARALLEL INPUT tasks run under control of PARALLEL OUTPUT task 11407 of FIG. 7, which is the bus master. INPUT DRIVER and INPUT BUFFER pairs 11421,11424; 11422,11425; and 11423,11426 serve basically the same function as INPUT DRIVER and INPUT BUFFER pairs 11401,11403 (or 11402,11404) of FIG. 7, that is, they indirectly couple PARALLEL INPUT tasks 11427, 11428 and 11429 to incoming parallel busses 14104, 14105 and 14106, respectively. The primary difference lies in the parallel bit orientation of busses 14104, 14150 and 14106 as contrasted to the serial protocol of links 9201 and 9202.

ADMINISTRATION task 11430, PARALLEL OUTPUT task 11431, DUMP MEM task 11434 and BROADCAST task 11435 of FIG. 8 are the equivalent of ADMINISTRATION task 11409, PARALLEL OUTPUT task 11407, DUMP MEM task 11411 and BROADCAST task 11412 of FIG. 7.

FIG. 9 depicts, in pictorial fashion, the architecture of tier 3 within DCN 140. The four elements labeled 114009 through 114012 represent the PARALLEL INPUT task associated with incoming, parallel-oriented busses 145001 through 145004, respectively. Each PARALLEL INPUT task performs in essentially the same manner as each PARALLEL INPUT task 11427, 11428 or 11429 of FIG. 8. In addition, each PARALLEL INPUT task is indirectly coupled to its associated hardware via an INPUT DRIVER and INPUT BUFFER, as depicted by element pairs 114001,114005; 114002,114006; 114003,114007; and 114004,114008. These pairs operate basically the same as INPUT DRIVER and INPUT BUFFER pairs 11421,11424; 11422,11425; and 11423,11426 of FIG. 8.

The eight elements designated 114014 through 114021 represent the SERIAL DATA task associated with outgoing, serially-oriented links 93001 through 93008, respectively. These eight tasks are equivalent to SERIAL DATA task 11405 and 11406 of FIG. 7. Also, each SERIAL DATA task is buffered from its associated hardware via an OUTPUT DRIVER and OUTPUT BUFFER, as depicted by the eight element pairs 114022,114030; . . . ; 114029,114037. These eight element pairs are the counterpart to INPUT DRIVER and INPUT BUFFER pairs 11401,11403 and 11402,11404 of FIG. 7.

Finally, ADMINISTRATION task 114013, DUMP MEM task 114038 and BROADCAST task 114039 of FIG. 9 serve to control tier 3 microcomputers in a manner equivalent to tasks 11409, 11411 and 14112 of FIG. 7 or tasks 11430, 11434 and 11435 of FIG. 8.

FIGS. 7, 8 and 9 are pictorial in the sense that they indicate a logical situation in terms of the number of copies of software utilized to implement the tasks. For example, the tier 3 architecture of FIG. 9 indicates there are four distinct PARALLEL INPUT tasks 114009 through 114012 and eight distinct SERIAL DATA tasks 114014 through 114021. Actually, there is only one copy of the PARALLEL INPUT program and one copy of the SERIAL DATA program stored in microcomputer 14001. There are four distinct read/write (R/W) memory regions or stacks dedicated to PARALLEL INPUT tasks and eight distinct R/W stacks dedicated to SERIAL DATA tasks. The state of each task is kept in the appropriate stack. The OS retains parameters indicating where, within each stack, the task should commence execution of an activity request.

The environment described immediately above basically defines the concept of a multitasking operating system. In terms related to tier 3 interfaces, multitasking obtains because four independent PARALLEL INPUT programs are executed from within four distincts environments by the central processing unit of each microcomputer, namely, the four PARALLEL INPUT tasks 114009 through 114012. Similar remarks apply to the eight SERIAL DATA tasks 114014 through 114021 of FIG. 9.

2.1d Software Operation

To understand how each of the microcomputers embedded in DCN 140 operates in terms of an unfolding sequence in time, processing circuit 1401 of FIG. 7 is considered as exemplary. As previously discussed, there are six application tasks and their interaction with the OS to consider. However, the concepts may be readily conveyed by presenting the interaction of a subset of these tasks, namely, SERIAL DATA, PARALLEL OUTPUT and ADMINISTRATION, as now discussed. At system startup, the OS commences execution by: (i) initializing its associated internal random-access memory; (ii) organizing memory blocks to serve as message buffers and placing these buffer locations onto a list called the FREE buffer list; (iii) scheduling each task to run according to a preselected priority; and (iv) shifting execution to the SCHEDULER program. Since the only tasks that have been scheduled to this point in the execution are those arranged in preselected order, the SCHEDULER finds that the first task, designated Task 0, is READY to RUN. Task 0 controls the incoming data link having logical designation '0', so with reference to FIG. 7, Task 0 is identified as SERIAL DATA task 11405 and its associated data link is line 9201.

Just prior to transferring execution to Task 0, the SCHEDULER identified the stack to be associated with Task 0. Once the stack location is identified, execution of Task 0 commences from the first program statement. Since Task 0 controls a serial data link (link 9201 having logical designation '0' in FIG. 7), the task begins by making a system call to OS to obtain an unused message buffer from the FREE list of buffers and then sets up data link INPUT BUFFER 0 program (element 11403 of FIG. 7) to receive data into the now allocated buffer. Task 0 then initializes link 9201 by arranging and sending a data link start-up message. Task 0 finally relinguishes control of the central processing unit (CPU) of its associated microcomputer by making a system call to OS.

The OS SCHEDULER program is entered again and, since the initialization program of OS has made all tasks READY to RUN, Task 1, having the next highest priority, is READY to RUN. The CPU is arranged to execute in the stack environment of Task 1, and control is then passed to Task 1. Task 1 begins to execute from the first statement in its program.

Since Task 1 controls data link '1', (link 9202 in FIG. 7), it executes essentially the same program as did Task 0, the only difference being that the stack areas in memory have different locations. A view of the stack associated with Task 0 at this point in the execution of Task 1 indicates a wait state in which data link 9201 is set up to receive data and a data link start-up message has been transmitted. In contrast, the stack of Task 1 indicates that link 9202 is quiescent. However, upon relinquishment of the CPU by Task 1, its associated stack is also primed in the wait state.

The SCHEDULER program finds Task 2 READY to RUN. This task is the one depicted as PARALLEL OUTPUT task 11407 of FIG. 7 and controls parallel-oriented bus 14101. Basically the same program sequencing occurs in Task 2 as in the prior task executions. The CPU is arranged to operate in the stack environment of Task 2, and begins by executing from the first statement in the so-called GPIB program since bus 14101 is presumed to implement the GPIB protocol. A message buffer is obtained from the OS, and the OUTPUT DRIVER-OUTPUT BUFFER interface is arranged for message transmission or reception. Task 2 then relinquishes control of the CPU.

Since Task 3 is READY to RUN, the SCHEDULER program sets up the CPU to execute in the stack environment of Task 3. In FIG. 7, Task 3 may be identified with ADMINISTRATION task 11407. The instructions of Task 3 call OS to arrange for OS to schedule an execution of the so-called ADMIN program only when certain events occur. Task 3 also arranges for a timeout of about 15 seconds to schedule the ADMIN program for execution. ADMIN resets a timer whenever timeout occurs. If this timer signal is not reset in this manner, the tier 1 device 1401 is considered to have lost its sanity and a RESET of the microcomputer occurs upon expiration of the timer interval.

Figure 10:
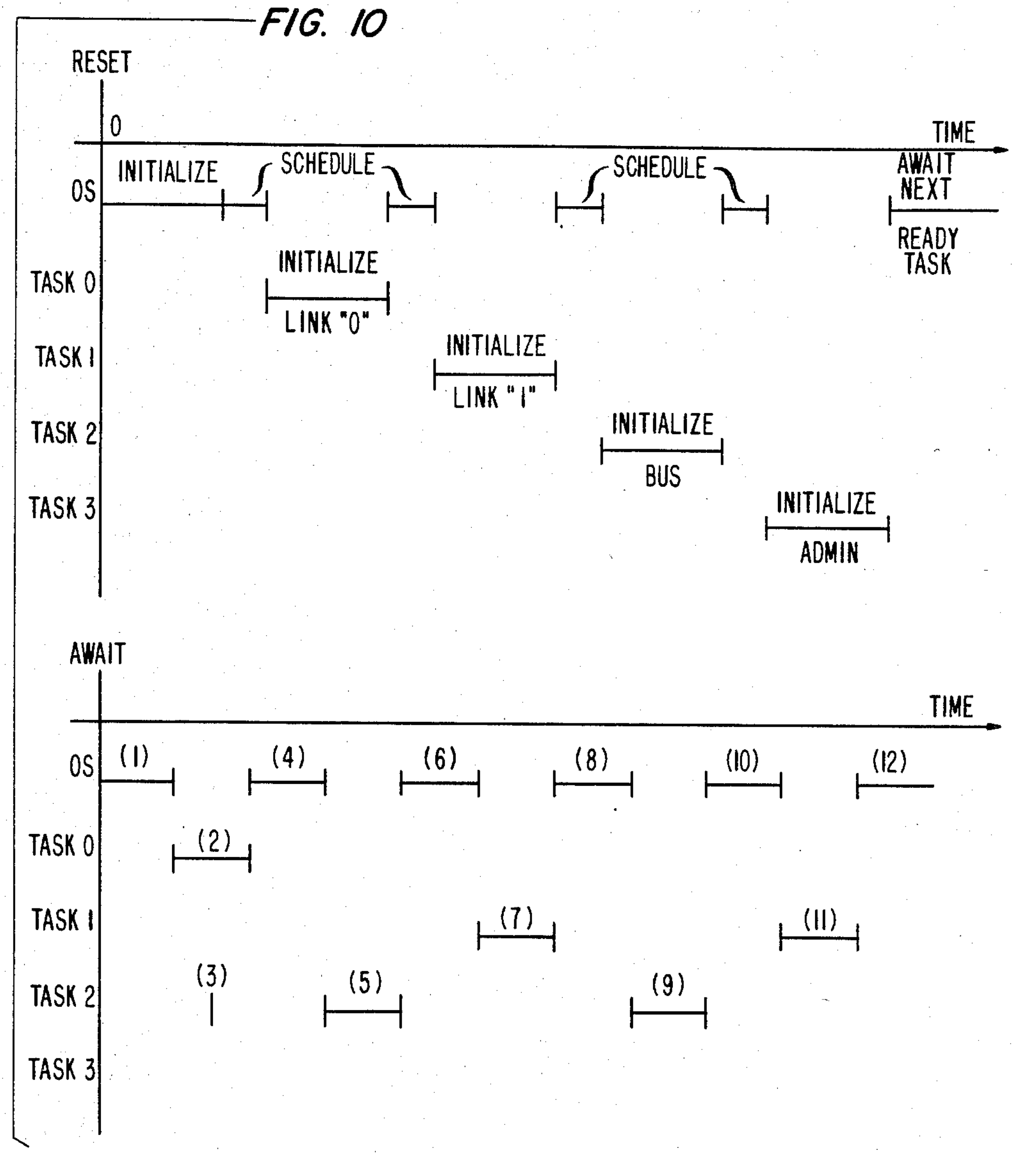
FIG. 10 depicts the priority of execution of tasks within any of the microcomputers of the DCN. Both the initialization execution (top portion of FIG. 10) and execution with external event interrupts are illustrated.

As suggested above, the task numbers indicate the order of priority in execution, with Task 0 having the highest priority and Task 3 the lowest. The execution of tasks in the sequence described above presumes no external event interrupted the progression through task executions, and the time diagram in the top half of FIG. 10 depicts such a sequence. It is possible, however, to have an external event interrupt the top-down sequencing. For instance, if data link 9201 had a message to send in the DOWN direction prior to the execution of Task 3, then Task 0 would execute before Task 3 even executed for the first time.

As an example demonstrating external event interrupts and one that is exemplary of the typical operation of a tier 1 device, it is supposed that the four tasks discussed in the above example have RUN and the OS is in the state of awaiting the posting of a flag to indicate a task is READY to RUN (i.e., the rightmost state in the top diagram of FIG. 10). It is futher supposed a message is now received over data link 9201 for transmission to LTS 161 (FIG. 3). With reference to the bottom time diagram of FIG. 10 and the numerals associate with the various periods of execution of the individual tasks, the following sequencing occurs:

(1) A message is received over data link 9201 or '0', and INPUT DRIVER 11401 signals OS that Task 0 should execute.

(2) Task 0 begins to execute to verify the message via the high level protocol acceptance technique.

(3) An interrupt level, a message is received across bus 14101. Task 2 is made READY to RUN, but execution is precluded until Task 0 relinquishes control of the CPU. The message on bus 14101 is headed UP the hierarchy, say over link 9202.

(4) At the completion of the verification phase and message reception by Task 0, the message is sent to Task 2 since the 'down_circuit_type' field in the HEADER indicated a LTS was the ultimate message destination. During this interval, the OS SCHEDULER begins execution. Now Task 2 has the highest priority that is in the READY to RUN state, and control is passed to Task 2.

(5) Task 2 processes the message sent to it by Task 0, and begins sending output over GPIB bus 14101 to the tier 2 interface indicated in the 'down_route' field of HEADER. Now the message previously received for UP direction transmission may be processed by Task 2 before relinquishing control of the CPU. A signal is sent so that Task 1 may be made READY to RUN, and control is passed to OS.

(6) The SCHEDULER sees that Task 1 is the highest priority task that is READY to RUN, and passes control to Task 1.

(7) Task 1 processes the message available through Task 2 and sends the message, properly formatted, over data link 9202. Control is passed back to OS.

(8) The output previously initiated over bus 14101 is now completed so Task 2 is made READY to RUN and OS passes control to Task 2.

(9) Task 2 effects follow-up processing by freeing the message buffer for use elsewhere by the microcomputer and relinquishes control of the CPU.

(10) No task is presently READY to RUN until the interrupt handler for data link '1', via INPUT DRIVER 11401, signals OS that transmission UP link '1' is now complete, whereupon Task 1 should be executed. Control is passed to Task 1.

(11) Task 1 performs clean-up operations for its recent transmission over data link '1'. OS is again given control.

(12) The SCHEDULER continues to execute until another I/O activity in the microcomputer indicates that a particular task should RUN.

By way of a shorthand notation, which is similar to the actual high-level language utilized to program the tasks, the routing algorithms realized in device 1401 may be summarized as follows:

```
(i)   Routing Algorithm for Task 0 and Task 1:
      if ('down_circuit_type' = DCN_1){
      pass message to local ADMINISTRATION
      task;
      }
      else { destination = bits 6, 7, 8 and 9
      of 'down_route';
      set 'up_route' bits 4 and 5;
      pass message to PARALLEL OUTPUT
      task;
      }
(ii)  Routing Algorithm for Task 2:
      if ('up_circuit_type' = DCN_1){
      pass message to local ADMINISTRATION
      task;
      }
      else { if ('up_route' bits 4, 5 = 00 {
      pass message to SERIAL DATA 0;
      }
      else { pass message to SERIAL
      DATA 1;
      }
  }
```

In each of these routing algorithms, the symbolic notation DCN_1 has been utilized. As alluded to earlier in this section, generators of messages can indicate not only the destination ('down_route' and 'up_route') but also the microcomputer type within the hierarchy of the MLT system. DCN_1 is one type and refers to tier 1 devices of DCN 140. Other types that may be referenced in bytes 'down_circuit_type' or 'up_circuit_type' include: MLT_CNTLER for FE computer 220 or 221; DCN_2 for tier 2 interfaces and DCN_3 for tier 3 circuits of DCN 140; LTS_CNTLER for the LTS controller, PORT_CNTLER for port controller and PMU_CNTLER for precision measurement unit controller; these latter three controllers are found in LTS 160 or 161.

As indicated in Section 2.1a with reference to FIG. 4, the busses serving as inputs to and outputs from connecting arrays 141–144, as well as the array busses themselves, implement the GPIB protocol. Similarly, the input and output busses associated with matrix 145 utilize the GPIB protocol. In the case of an array 141, . . . , or 144, it is evident from FIG. 4 that each tier 1 device controls an output GPIB bus that has twelve talker/listeners. For instance, bus 14101 is controlled by tier 1 device 1401 and the twelve T/L networks on bus 14101 serve as inputs to interfaces 1421–1432, respectively. Within this GPIB framework, it is necessary to provide an embedded protocol for connecting a plurality of T/L networks to a controller on the same GPIB bus so that messages may be transmitted efficiently and message overhead is mitigated in return of message accept/reject status information. The particular PARALLEL OUTPUT task and the associated PARALLEL INPUT task accomplished the embedded protocol. Further discussion of this second-level protocol is held in abeyance until GPIB circuitry and software are presented.

2.2. Loop Testing System (LTS)

2.2*a* Structure

Referring again to FIG. 2, it is shown pictorially that wire-center based LTS 160 (LTS 161 is substantially the same) performs communication, loop access and loop testing functions. LTS 160 is actually an arrangement of loosely coupled microprocessors organized to perform these functions. The term "loosely coupled" is used herein to denote an organization of processors that share no common memory but communicate by passing messages over serial or parallel oriented channels.

Figure 11:
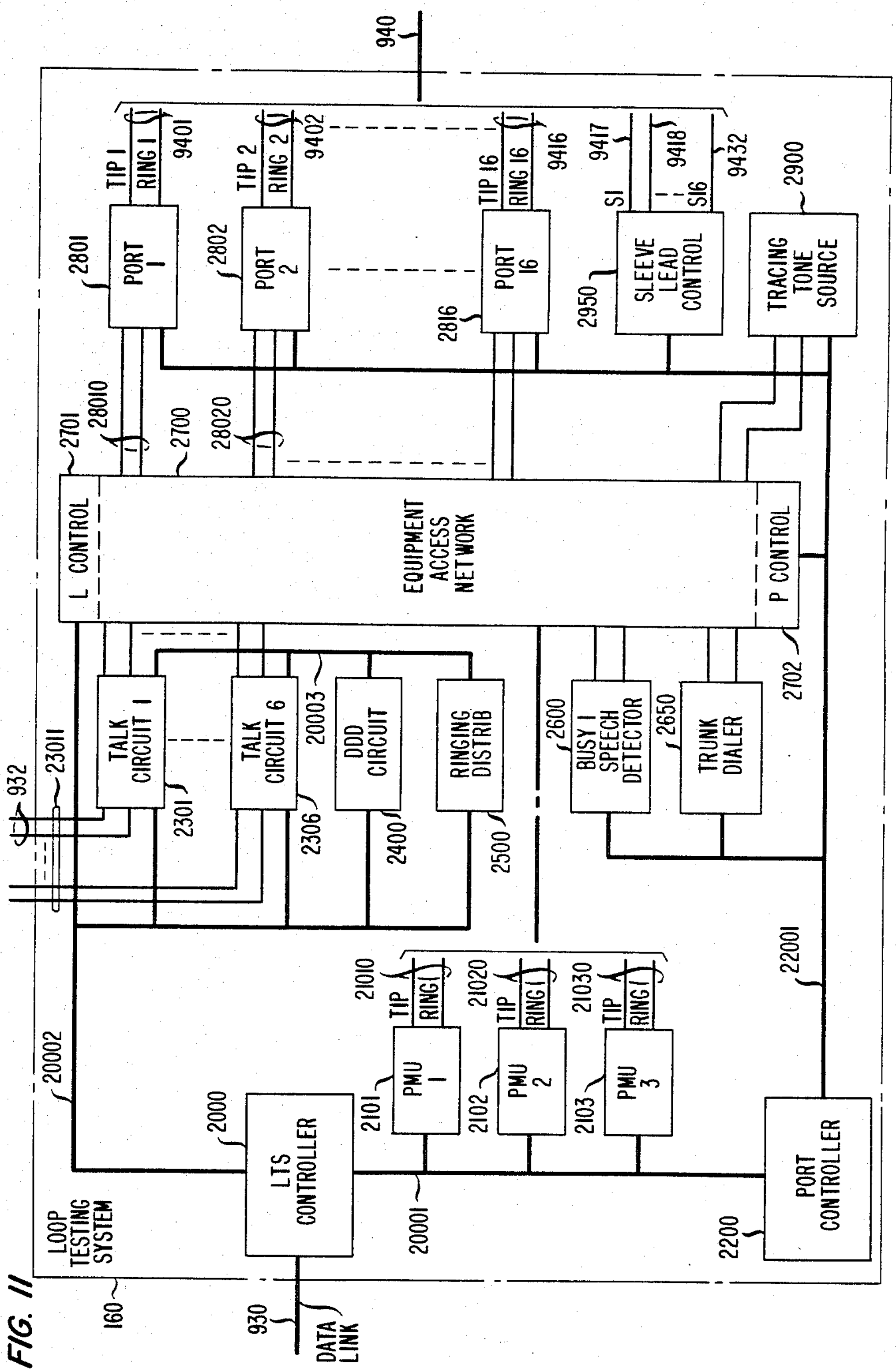
FIG. 11 depicts, in block diagram form, a realization of the Loop Testing System (LTS) shown pictorially in FIG. 2.

FIG. 11 shows a block diagram of LTS 160. LTS controller 2000 is responsible for communications with DCN 140 (FIG. 2), via serial data link 930, and for local control of other LTS subcomponents, including: precision measurement unit (PMU) 2101, 2102 and 2103; port controller 2200; talk circuits 2301 through 2306; direct distance dialer (DDD) circuit 2400; ringing distributor 2500; and portions of equipment access network (EAN) 2700. Each of these subcomponents is explained as the discussion proceeds.

LTS controller 2000 and post controller 2200 are linked with interconnect bus 20001, which typically supports a parallel-oriented protocol such as the GPIB. Port controller 2200 is responsible for the loop access function in that it provides tip, ring and sleeve control for connections to so-called "no-test" trunks 940 that enable the MLT system to interface to switching machine 170 (FIG. 2). A no-test trunk is one that provides the ability to interconnect to any customer line 180 or 181 in a bridging mode. One such test trunk is shown as TIP 1 - RING 1 pair 9401 with its corresponding sleeve lead S1 lead 9417 in FIG. 11.

PMU's 2101 through 2103 are also interconnected to LTS controller with bus 20001. Each PMU 2101, 2102 or 2103 is a general purpose testing circuit that is used to make measurements on customer loops 180 and 181. Each LTS 160 may contain from one to three PMUs. The maximum number is depicted in FIG. 11. PMU 2101 (PMU 2102 or 2103 is similar) accesses a customer loop 180 or 181 through a serial arrangement comprising, for example: wire pair 21010 emanating from PMU 2101; equipment access network 2700; wire pair 28010 serving as the input to port device 2801; and port device 2801, which is an interface to no-test trunk pair 9401. EAN 2700 serves to interconnect any PMU 2101, 2102 or 2103 to any port device 2801, . . . or 2816 under control of both LTS controller 2000, via bus 20002, and port controller 2200, via bus 22001. The L CONTROL 2701 portion of EAN 2700 connects to bus 20002, whereas the P CONTROL 2702 portion of EAN 2700 connects to bus 22001.

LTS controller 2000, port controller 2200 and PMUs 2101 through 2103 are each self-contained microprocessor modules. Because of the relative independence of these microprocessor modules, the MLT system is modular so that wire centers (150 or 151 of FIG. 2) ranging from one thousand to one hundred thousand customer loops can be served by augmenting the basic system. Thus, as a wire center grows, more PMUs can be added (up to three per LTS), up to sixteen port circuits can be accommodated (the maximum of sixteen is shown in FIG. 11 as circuits 2801 through 2816), and EAN 2700 can be expanded. Hence the largest size LTS can have up to sixteen loops simultaneously accessed for testing and can time share three identical PMUs to perform requested tests. The separation of the testing function, access function and communication function allows for the simultaneous operation of these functions, thereby maximizing throughput for a given testing traffic load.

2.2*b* LTS Operation

With reference to FIG. 11, LTS controller 2000 implements a serial-oriented protocol function on incoming data link 930. Received messages, in the form shown in FIG. 5, are parsed to obtain the INFORMATION field as shown in FIG. 6, and then interrupted in LTS controller 2000. An access request is typically the first message received, as indicated in the 'down_task_id' byte of the HEADER by the binary equivalent of ACCESS and in the 'request_response' byte as REQUEST in binary representation. This message causes LTS controller 2000 to initialize an area of its RAM to track and time the request as well as to generate a parallel-protocol message for passage over bus 20001 to port controller 2200. The information utilized to construct this latter message is found in the DATA portion of the INFORMATION field of FIG. 6. For instance, the first byte (byte 1) may be, symbolically, 'ACC_NOTEST'. This indicates that the type of access desired is a connection to a "no-test" trunk. Another byte would indicate the 'switch_type' to inform port controller 2200 of the type of switching machine (e.g., an electronic central office or a cross-bar office). The next several bytes list the telephone number of the customer loop to be accessed. Based on message content, port controller 2200 proceeds to access the loop specified in the message by attaching trunk dialer 2650 (see FIG. 11) to a free port 2801 through 2816, dialing the telephone number, and attaching busy/speech detector 2600 to determine whether the loop is idle.

Presuming loop access is obtained, post controller 2200 sends a response across GPIB 20001. This response proceeds in the UP direction and, accordingly, appropriate INFORMATION field bytes must be filled. With reference to FIG. 6, the 'request_response' byte has the entry RESPONSE in binary form placed in the HEADER. In the DATA portion, byte 1 has an entry that echos the test code which, in this case, is 'ACC_NOTEST'. This is to indicate that the completed request conforms to the desired request. The second byte (byte 2) indicates the 'status' of the request and the third byte (byte 3) indicates the 'port_number'. For the instant example, these bytes might read, symbolically as 'ACC_COMPLETE' and 'PORT_1' to indicate that port 2801 of FIG. 11 has a connection established to the loop associated with the telephone number sent in the DOWN direction.

At this point in the operation, the loop is accessed, and LTS 160 awaits subsequent requests, typically to effect testing. Most test requests require the services of one PMU 2101, 2102 or 2103. However, some requests can be satisfied by either LTS controller 2000 or port controller 2200 and their associated circuitry. Test requests are coded so that LTS controller 2000 can determine which LTS circuits can satisfy the request. LTS controller 2000 therefore acts as a resource manager for the entire LTS 160.

In order to proceed with the operational description of LTS 160, it is necessary to discuss its component parts in some detail. Attention is focussed first on LTS controller 2000, followed by port controller 2200 and PMU 2101 and, finally, the remaining circuitry of LTS 160 shown in FIG. 11.

2.2.1 LTS Controller

LTS controller 2000 is a microcomputer-based system also running under the same operating system (OS) as DCN 140. Again, the software controlling the microcomputer is partitioned into tasks, and tasks communicate with each other by signaling each other or by sending messages to one another via facilities provided by OS. In LTS controller 2000, the tasks are as follows:

(a) SERIAL DATA task controls data link 930 and implements a high level data link protocol on all messages passing onto or coming from physical data link 930. All tasks that must transmit data over link 930 do so by sending the data as a message to the SERIAL DATA task. This task is equivalent to the SERIAL DATA task 114014 of FIG. 9 associated with DCN 140. All messages entering LTS 160 and destined for a specific task in LTS controller 2000 must pass through SERIAL DATA.

(b) PARALLEL DATA task controls the transmission and reception of messages over parallel-oriented bus 20001 shown in FIG. 11. All tasks that must transmit data over bus 20001 to port controller 2200 or to PMU's 2101–2103 do so by sending the data as a message to the PARALLEL DATA task. Similarly, data received from controller 2200 or units 2101–2103 pass through the PARALLEL DATA task. This task is equivalent to the PARALLEL OUTPUT task 11407 of FIG. 7 associated with DCN 140.

(c) ACC task processes requests for access to trunks 9401 through 9416 of FIG. 11 and requests for establishment of callback paths via the national direct distance dialing (DDD) network as implemented by DDD circuit 2400. The processing of requests for loop access includes the formatting of messages to port controller 2200, where the access is actually performed, and the setting up of a timeout over the access activity in port controller 2200. The ACC task indirectly sends a message for loop access to port controller 2200 by sending the message to the PARALLEL DATA task. Requests to DDD circuit 2400 are transmitted over bus 20002.

(d) TST task controls the processing of test requests on a given port, selected from one of the ports 2801 through 2816, once that port has accessed a loop for testing. There are sixteen TST tasks, one for each possible port 2801, . . . , 2816. The TST tasks are not bound to a particular port number in a fixed manner, but may be assigned to any individual port 2801–2816 over a long period of time. For example, for the duration of a given loop access, TST 7 task may be assigned to port 2803. When the access to port 2803 is dropped, TST 7 task may be assigned to port 2801. Once the assignment is made, it is fixed for the duration of the loop access. This dyanmic assignment allows processing priority to be evenly distributed among ports 2801–2816. TST task software either performs the test request itself or arranges for the test to be performed by either port controller 2200 or PMU's 2101–2103. TST task also provides a timeout function for the request.

(e) TCD task controls the dialing for talk circuits 2301–2306. This task can manipulate DDD circuit 2400 and thereby arrange a callback to, typically, a craftsperson at the facility designated the Maintenance Center which contains the I/O terminals 230,231. The callback feature is required to implement the combined talk/test procedures of the MLT system whereby a craftsperson can be in speech communication with either a customer or another craftsperson over a loop accessed for testing. The maintenance administrator at the Maintenance Center can enter a test request as a MLT system user, have that test run by LTS 160 while the talk path is broken, and when the test is completed, have the talk path restored by LTS 160. These are two TCD tasks in LTS controller 2000 software so that two dialing operations may be concurrently in progress.

(f) ADMINISTRATION task provides all administrative functions in LTS 2000. These functions include: sending to FE computer 220 or 221 a request for data base download when LTS 160 is reset and processing this downloaded data base; responding to echo messages from ADMINISTRATION task of DCN 140; and providing an interface during self-diagnostic checking.

(g) DIAGNOSTICS task provides self-testing capabilities that are used to diagnose LTS controller 2000 hardware problems. DIAGNOSTICS task interfaces to ADMINISTRATION task, via the OS message passing facility, to request and receive the reservation of LTS 160 hardware for use in conducting self-tests.

(h) DUMP MEM task arranges for the transmission of a snapshot of LTS controller 2000 memory when a malfunction occurs.

At system startup or when a system reset occurs, operating system OS initializes its tables, places all message buffers on a "free queue" of buffers, initilizes all system semaphores or inter-task signals, and makes each task READY to execute (RUN). The OS then calls a hardware and software initialization function. Tables are kept in permanent memory and define the state of the equipment configuration to be associated with the particular LTS 160. For instance, the number of PMU's 2101–2103 configuring the particular MLT system is one such table parameter. These tables are accessed for initialization. Next, the task scheduling function, again called the SCHEDULER, is executed. Program execution in LTS 160 is similar to that of the DCN 140 once the SCHEDULER is called. Thus, execution is transferred from the SCHEDULER to the highest priority task which is READY to RUN. At startup, all tasks are READY, and the SERIAL DATA task has the highest priority. Execution of SERIAL DATA enables the hardware receiver associated with link 930 and causes a transmission of a data link start-up message to DCN 140 in the high level protocol format. The SERIAL DATA task then relinquishes control of the CPU in LTS controller 2000. The OS is now free to select another task for execution.

The PARALLEL DATA task has the next highest priority and executes so as to enable its associated hardware for two-way communication on bus 20001. Control is again passed to the OS once the task is initialized.

All the other tasks eventually RUN and initialize themselves and their associated hardware. The task then await some activity requiring their specialized services. Usually they wait to receive a message buffer or for a semaphore to be posted. It may also be that a particular task is waiting for a timeout to occur before regaining control of the CPU. For example, ADMINISTRATION waits for about seven seconds before gaining control after its initialization; this task then sends a data base download request to FE computer 220 or 221 by passing the message to SERIAL DATA for transmission over data link 930.

The download data messages from FE computer 220 or 221 pass through the SERIAL DATAL task and are routed accordingly to data in the INFORMATION field. Download messages have LTS_CNTLER (LTS controller) names in 'down_circuit_*type*' *byte and ADMINISTRATION task in the* '*down*_task_id' byte. Consequently, the routing function in LTS controller 2000 realizes that the INFORMATION field is to be processed in LTS controller 2000 itself and sends the message, via OS, to ADMINISTRATION task. This task processes the message by passing the data that appears in the DATA portion of the message. Download messages identify the number of equipment types installed at the particular LTS 160 site and the present status of the equipment (AVAILABLE, OUT_OF_SERVICE, and so forth). These messages also organize ports 2801–2816 into trunk groups, specify dialer types associated with talk circuit 2301–2306, and so on. After configuration information has been downloaded, LTS 160 is prepared to process access and test requests.

2.2.1*a* Access Request Processing

Access request messages have LTS controller 2000 specified in the 'down_circuit_type' of the message header symbolically as LTS_CNTLER and the ACC task in the 'down_task_id' symbolically as ACC. The SERIAL DATA task routing function transmits the access message to the ACC task.

Figure 12:
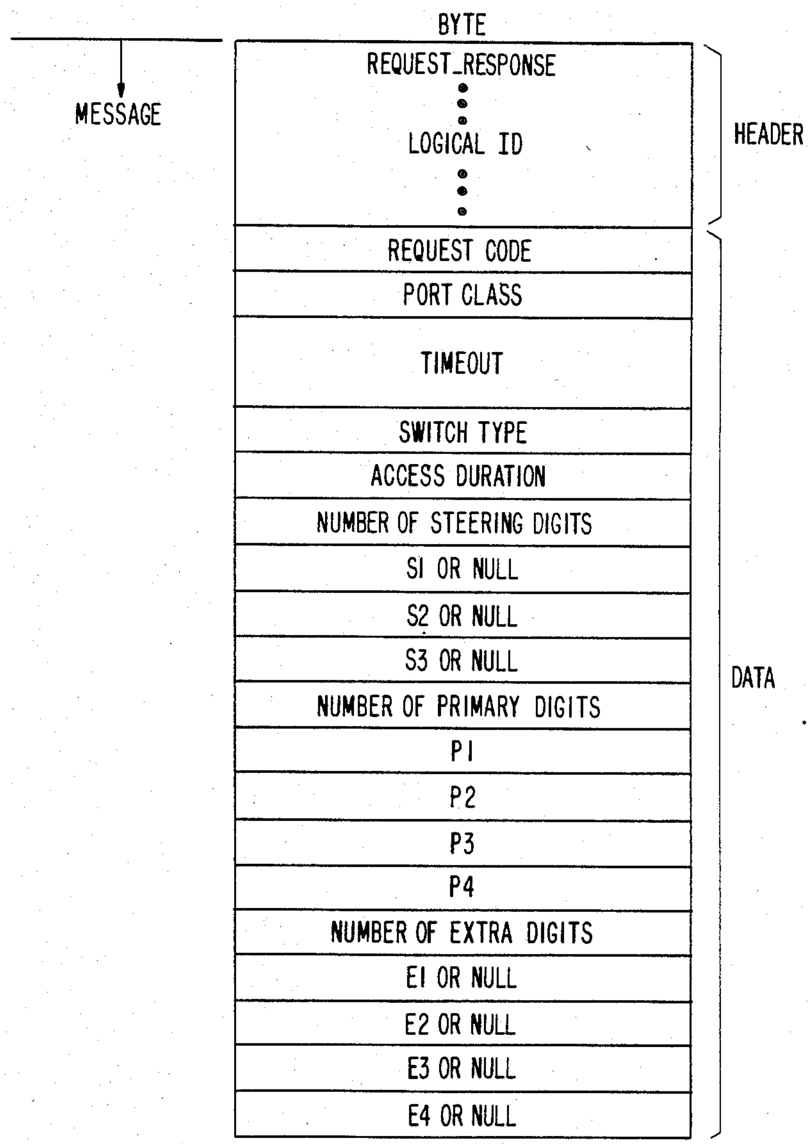
FIG. 12 illustrates the DATA bytes in the INFORMATION field for the regular or main distributing frame access request message as routed through the LTS of FIG. 11.
Figure 13:
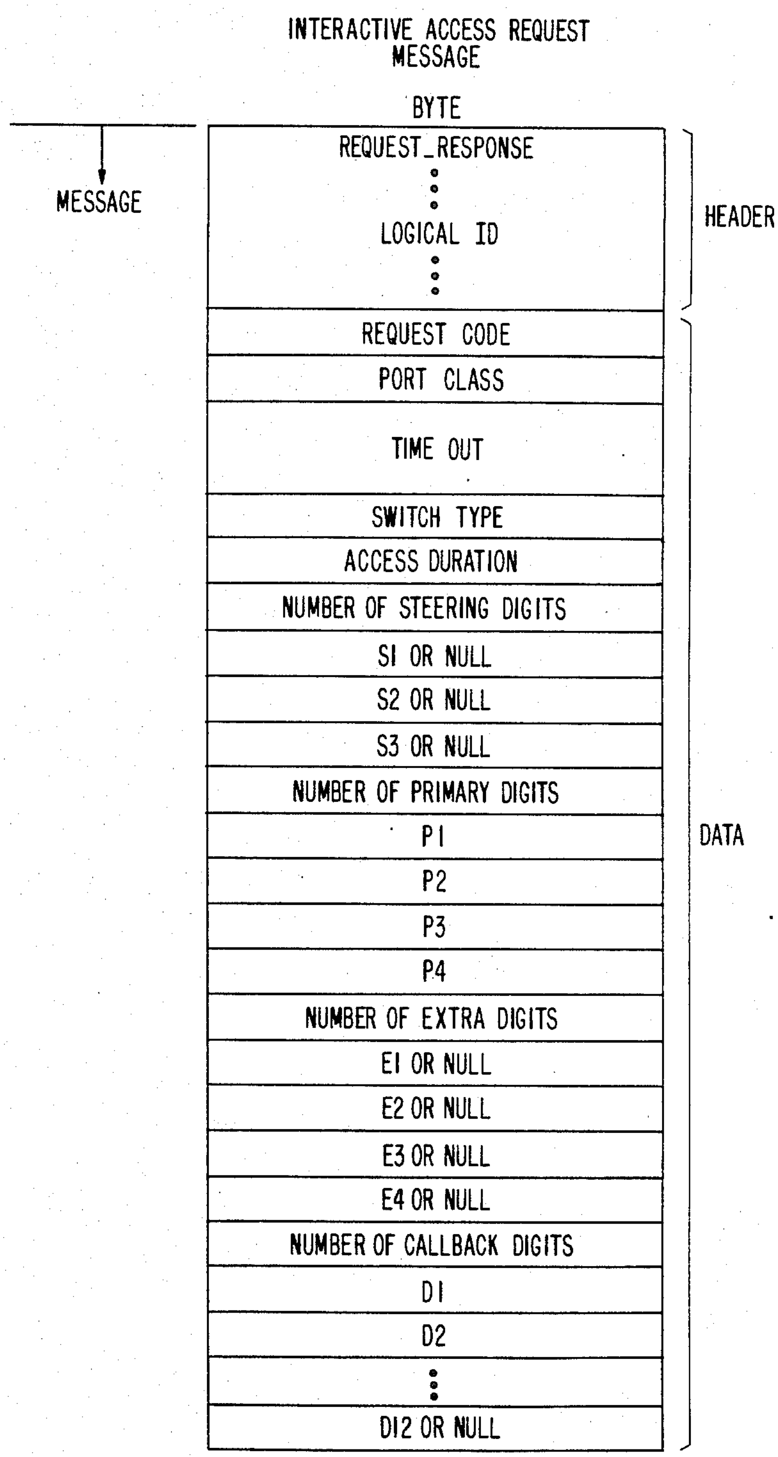
FIG. 13 illustrates the contents of an interactive request message when both a loop access and a talk path of the Maintenance Center are to be established.

The format of the DATA portion of the INFORMATION field of FIG. 6 has two possible arrangements depending on the type of access desired. Four types of access are allowed:

(i) a regular test access of customer loop 180, . . . , 183; the INFORMATION field is exemplified in FIG. 12;

(ii) a main distribution frame (MDF) trunk access as also exemplified by FIG. 12;

(iii) a regular test access plus a callback to the Maintenance Center; the INFORMATION field is exemplified in FIG. 13; and (iv) a callback of the Maintenance Center that is to be associated with a specified test access already in effect at LTS 160 site; FIG. 13 also depicts the corresponding INFORMATION field.

Processing for each of these types of access is covered next.

2.2.1a. 1 Regular Test Access and MDF Trunk Access

Regular test access requires that circuitry and equipment within switching machine 170 be manipulated according to the type of central office (e.g., cross-bar or electronic). MDF trunk access requires only that local memory tables be updated with entries disclosing, in effect, that the trunk circuit is being attended to by craft personnel. MDF trunks are not automatically connected to a customer loop, but require interaction and manipulation by a craftsperson located at the MDF.

The ACC task begins to RUN when a message is sent to it. In the immediate case, the message is a REQUEST for either a test trunk or MDF trunk access. A memory table is used to store pertinent information about the REQUEST; such information includes the address of the REQUEST message, memory locations for the storage of the address of a RESPONSE message, and whether a callback is required for this REQUEST. The access code (regular, designated by NOTEST access, or MDF access), the switching machine type, the trunk group containing the loop under test and the telephone number of the customer are placed as data in the message buffer. The address of the original REQUEST message and the address of the table used to store information about the REQUEST are also placed in the message HEADER, in the 'up_1 parameter' and 'up_2 parameter' locations, so that the response of port controller 2200 can be identified with the present REQUEST. The message is then sent to PARALLEL DATA task for transmission to port controller 2200. A timeout is started on the activity of port controller 2200 and ACC task relinquishes control of the CPU.

Figure 14:
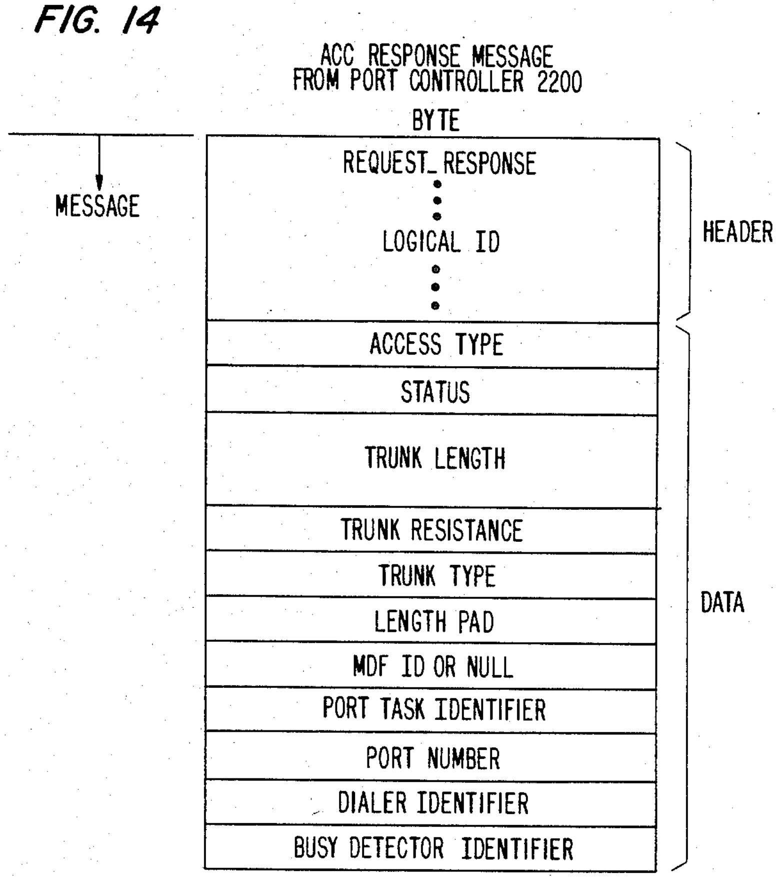
FIG. 14 depicts the message returned from the port controller of FIG. 11 in response to an access request message.

When port controller 2200 completes its processing of the access request, it returns a RESPONSE message to ACC task by sending the message across the PARALLEL DATA task. ACC task is identified in the 'up_route' of the message HEADER and the routing function in PARALLEL DATA task sends the message to ACC task. ACC task associates the RESPONSE message with the original request message by checking for the address of the original request message and of the temporary storage table used for the request. The access response message has the format shown in FIG. 14. The 'status' byte indicates whether the access was successful or not. If it was unsuccessful or if LTS controller 2000 had timed out on port controller 2200 request, a RESPONSE message is formed and sent to SERIAL DATA task for transmission UP the hierarchy. The temporary table used to store data for the failed request is now made available for use with another access REQUEST that may have arrived.

If port controller 2200 passes a RESPONSE that indicates an access has been obtained, ACC task attempts to close a relay embedded within equipment access network (EAN) 2700 (FIG. 11) to one of the ports 2801-2816 selected for loop access. If this operation fails, trouble counters are stroked against the selected port 2801-2816 and EAN 2700 and the aforementioned failure sequence is followed again. If relay closure is successful, ACC task selects an idle TST task to control testing on the selected port, arranges to have a memory space called the port control table filled with information about the access, and makes the chosen TST task READY to execute. Port control table information includes the address of the original request message, the address of the results buffer received from port controller 2200, whether the access is of long or short holding time, a timeout value to be used to timeout the access before it is automatically dropped, the logical identifier of the FE computer that requested the access, and an identifier that allows the FE computer to associate the access with a results buffer internal to the FE computer. ACC task is now finished with its processing of this access request, and makes its temporary table available for use with a new access request. The return of a RESPONSE message is the responsibility of the TST task, and will be covered in a later section. This convention has been adopted because the original REQUEST message may have a test REQUEST appended to the access REQUEST.

2.2.1a.2 Interactive Access Request Processing

Figure 15:
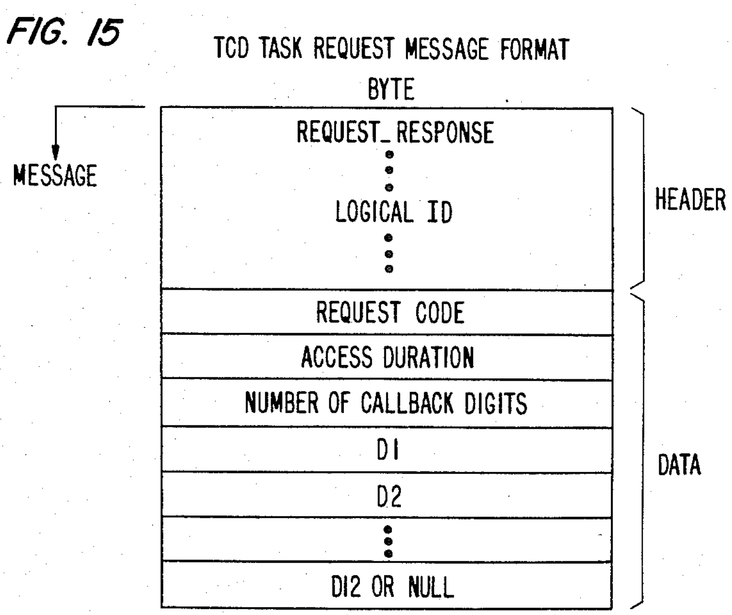
FIG. 15 illustrates those DATA bytes extracted from the message format of FIG. 14 which are then utilized by the TCD task of the LTS controller of FIG. 11 to establish the actual callback path.

The interactive access request message of FIG. 13 is used when a loop access is desired together with a talk path to a craftsperson in the Maintenance Center. The request message format is basically the same one used for a regular test access, as per FIG. 12, except that a callback telephone information has been appended and the 'request_code' is symbolically designated ACC_INTR (as contrasted to ACC_NOTEST or ACC_MDF of FIG. 12). The ACC task processes the so-called "regular loop portion" of the message as outlined above. However, besides formatting and sending a message to port controller 2200, a message is also sent to one of the TCD tasks. This latter message contains the callback telephone number appearing in the original DOWN route REQUEST message as is shown in FIG. 15. The ACC task now waits to receive two RESPONSE messages, namely, one from port controller 2200 and one internally from TCD task. A timeout is started on these activities.

The TCD task starts to RUN as soon as it can be scheduled after ACC task relinquishes control of the CPU. TCD task receives messages sent to it and begins to execute its dialing algorithm. The task also attempts to acquire one of talk circuits 2301-2306. If no circuit 2301-2306 is available, the callback sequence fails and a message to this effect is sent to ACC task. If one of the circuits 2301-2306 is available, TCD task attempts to acquire either a dial pulse dialer or in-band dialer for use with the available talk circuit. The dialer is represented in FIG. 11 by DDD circuit 2400. The dialer type depends on the central office equipment used to terminate the talk circuit, which appears to the central office switching machine as a station set on a customer loop. The dialer type is a parameter contained in the download data sent from the FE computer to LTS 160 as part of the startup sequence discussed above. If there is no dialer circuit 2400 available, either because it is presently in use or out of service, the callback sequence is terminated, the selected talk circuit is released and made available for use on another callback request, and a failure message is sent to ACC task.

If dialer circuit 2400 is acquired, the callback digits D1, D2, . . . , D12 are passed to a dialing program, and the digits are dialed. The dialing occurs at the interrupt level since dialing takes between 1 and 10 seconds to complete and, consequently, TCD task gives up control of the CPU for the dialing interval at least. When dialing is complete, an interrupt handler posts a semaphore to signal TCD task that is should return and continue its processing. Before having reliquished control of the CPU, TCD task started a timeout on the dialing activity. If this timeout expires before notification of dial completion, TCD task arranges to free its associated equipment, namely, one of the talk circuits 2301–2306 and dialer 2400, and generates a failure message for ACC task.

If dialing successfully completes, TCD task frees dialer 2400 circuitry, and enables the allocated talk circuit 2301–2306 for the detection of a handshake signal called "KEY-ZERO". The craftsperson at the Maintenance Center is required to depress the "0" key on the in-band signaling pad of the telephone set to signal LTS 160 that the callback has been successfully received at the Maintenance Center. The TCD task starts a timeout for the reception of the KEY-ZERO signal by the talk circuit hardware, and if the timeout expires before the signal is received, the callback is aborted, and the failure procedure outlined above is initiated. If the KEY-ZERO signal is detected by the talk circuit, the callback sequence is completed, and an indication of this is formatted and returned to ACC task. The message contains information identifying the talk circuit 2301, . . . , or 2306 utilized.

The ACC task can receive RESPONSE messages from TCD task and port controller 2200 in either order since the activities of callback and loop access are asynchronous with respect to each other. After both responses arrive, ACC task completes its processing of the access request by checking 'status' results and either sending a message to FE computer 220,221 or by connecting the allocated port from ports 2801–2816 and the selected talk circuit from circuits 2301–2306 through EAN 2700. If the loop access failed, or if the attempt to connect the allocated port fails, a failure message is returned to the corresponding FE computer, and LTS 160 equipment on the failed arrangement is relinquished. If the connect attempt fails for the allocated talk circuit, the talk circuit equipment is freed, trouble counters are strobed, and a TST task is selected for loop access in the manner described above. If the callback attempt is successful, the loop access is successful, and the connection through EAN 2700 is successful, a TST task is selected to oversee testing on the loop, and ACC task completes its processing with basically the same procedure as described above for the "loop access only" case.

2.2.1*a*.3 Callback Access Processing

There are instances when a Maintenance Center administrator needs to talk to either a customer or to an outside repair person after the customer loop has been successfully accessed for testing. In these instances, LTS 160 receives basically the same message of FIG. 13 except that the 'request_code' is, symbolically, ACC_DDD and the port 2801–2816 to be associated with the callback in the 'down_parameter' byte of the HEADER.

The ACC task begins to execute when this message is received. It formats a message for TCD task as outlined above for the interactive test case, sends the message and waits for a RESPONSE. A timeout is started to time the callback request. The TCD task processes this message exactly as described above, and returns its response to ACC task. No message from port controller 2200 is expected in this case, so ACC task proceeds to send a message to the FE computer associated with the ACCESS request or to attach one of talk circuits 2301–2306 to the specified port, depending on the 'status' returned from the callback activity.

The description to this point in this section has covered in some detail the action of ACC task and TCD task. It should be recalled that these software functions operate in a multitasking environment, and that at any instant, ACC task can be processing several access requests that are in different states of completion. However, TCD task is designed to process one dialing request at a time. To insure efficient throughput, there are two TCD tasks within the software of each LTS controller 2000. Consequently, two dialing activities can be going on in LTS controller 2000 concurrently. Since there are two dialer types, namely, dial pulse and an in-band, in LTS 160 for dialing over the national telephone network, two TCD tasks insures that maximum dialing activity may occur.

2.2.1*b* Test Request Processing

An active TST task has a private memory table that it uses to control testing on a given port. Entries in this table include the address for a request message or addresses for a series of messages and the corresponding address or addresses for the responses. TST task is first activated by the action of ACC task, which attaches both a request buffer and a response buffer to the table. Then TST task begins a timeout of the loop access; if the timeout expires before the loop access is dropped by request, the loop access is automatically dropped by LTS controller 2000. This timeout prevents the loss of use of LTS 160 circuitry such as talk circuits 2301–2306 and ports 2801–2816 in cases where FE computer 220 or 221 failures occur. One of the requests that can be made of TST task is that of restarting the timeout activity on a loop under test so that any access may be held for longer than the initial timeout value if required.

After initiating the timeout activity on loop access, TST task processes any request message in the table as follows. A 'current count' variable that has been preset by ACC task has a value equal to the number of bytes taken by the access request data. In addition, each message buffer has a field called 'nbytes' that contains a count of the number of bytes of meaningful data contained in the buffer. If 'current count' equals 'nbytes', the message contained only the ACCESS request, and TST task arranges to send the response message associated with the intial ACCESS request in the UP direction. If, however, current count is less than 'nbytes', then test requests have been included with ACCESS request, and TST task proceeds to process those other requests. This processing activity is described in the subsequent paragraphs. For each test request found in the request message, TST task arranges for the request to be performed, collects the response in the associated response message buffer, and when the last request has been processed, returns the response message to the FE computer 220 or 221 making the requests. If the last request processed was not one to drop the test access, TST task then waits for the arrival of a new message containing test requests. In this way, the FE computer guiding the testing can request tests to be performed, analyze results and determine the next test to be performed according to its embedded adaptive test algorithms.

Whenever the associated FE computer 220 or 221 transmits a new message of test reguests DOWN the hierarchy for a loop already accessed via a particular LTS port 2801–2816, that message is received by the SERIAL DATA task and routed to the appropriate TST task. The HEADER portion 'down_parameter' byte contains the port identifier, and a dynamic table in LTS controller 2000 is used to determine the specific TST task governing activity on a specific port.

Figure 16:
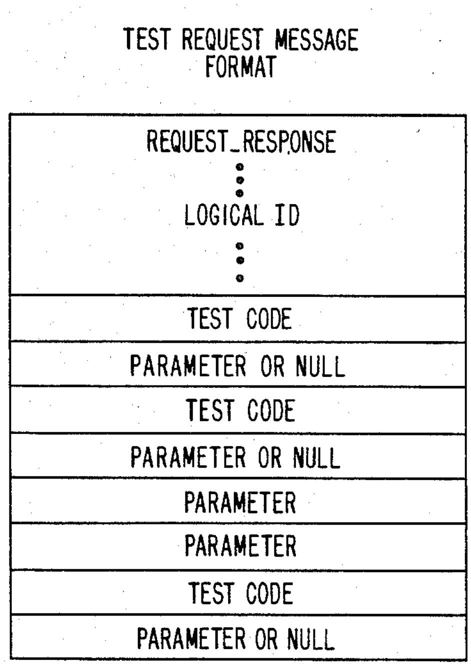
FIG. 16 is a depiction of the message format for a test request.

The TST task is scheduled to RUN when the new request message is sent to it. The TST task attaches the message to the temporary table referred to above, and sets 'current count' equal to the size of the message HEADER. Consequently, 'current count' has a offset of the first byte after the message HEADER, which is the first request in the present message. This is depicted in FIG. 16. A message buffer is now obtained from OS, attached to the table, and used to accumulate responses to the requests specified in the REQUEST message.

Before processing any test requests, TST task determines if a DDD callback is associated with the loop under test. If so, the callback path is placed in the so-called HOLD mode so that testing can be performed on the loop while the callback path is still held up. The talk circuit 'mode' (either HOLD, TALK or MONITOR) is saved for restoration upon completion of test request processing. In this way, tests are performed on a loop with an associated callback, and the loop is subsequently restored to the callback state that existed prior to receipt of the request message. The callback state can be changed by a request in the message that simply causes LTS controller 2000 to change the value of the remembered state. When the remembered state is restored, a new state is actually effected for the callback path.

The TST task divides test requests into two categories, namely, those that can be performed by either LTS controller 2000 or port controller 2200, and those that require the services of one PMU 2101–2103. If the request is to be performed by a PMU 2101–2103, TST task attempts to have allocated to it an idle PMU. If no PMU is available, a 'status' of BUSY is set for the test request, no further processing of requests is carried out for the current request message, and the accumulated responses are returned to the FE computer supervising the testing. If, however, a PMU is allocated to the TST task, a message buffer is obtained from OS, the PMU request is formatted in this buffer, and the buffer is sent to PARALLEL DATA task for transfer to the PMU. A timeout is started on the request. If the timeout expires before the PMU returns the test results, a timeout failure status is recorded in the results buffer, further processing of requests in the present buffer is terminated, and the accumulated results are returned to the supervising FE computer. If the PMU returns the test results within the time limit, the status and results data are stored in the associated results buffer, 'current count' is incremented by the number of bytes required for the just processed test, and TST task determines if the request message contains another test request. This determination is made by comparing 'current count' with the 'nbytes' field in the request message. Since 'current count' is incremented with each request processed, it eventually equals or exceeds 'nbytes', and processing for the present request message is terminated; the buffer of the accumulated responses is returned to the proper FE computer.

If the request is determined to be one that LTS controller 2000 can respond to directly, it does so, and accumulates the response in the associated response buffer. 'Current count' is incremented appropriately. If the request requires the services of port controller 2200, a new message buffer is obtained from OS, a request message is formatted for port controller 2200, and the message is sent to PARALLEL DATA task for transfer to port controller 2200. A timeout is initialized by PARALLEL DATA task, and if it expires before the response from port controller 2200 is received, the timeout sequence is executed, as outlined above for the timed-out PMU request. If the response is received within the time limit, the response buffer is undated with the results, 'current count' is incremented by the appropriate amount, and processing continues for the next test request, if any.

The above discussion shows that LTS controller 2000 is capable of processing concatenated test requests received in a single request message. The only restriction is that the responses to all requests must fit into the response message buffer. As each message is processed, a PMU 2101–2103 is attached to TST task, if necessary. This PMU remains associated with TST task for the duration of processing of the present request message, but is freed for use by another TST task for servicing another loop accessed on another port when processing is completed for the present request message.

As mentioned earlier, LTS 160 can be equipped with up to sixteen ports 2801–2816 and therefore can support concurrent testing on sixteen loops. Sixteen instances of TST task allow this processing to occur, and OS is the multitasking support for the simultaneous testing.

The timeout mechanisms described in the above paragraphs of this section serve to insure that resources of LTS 160 are not lost to the system in cases where errors occur. For example, without a timeout facility, if a PMU should reset in the middle of a test request, the loop access, the associated port equipment and any associated talk circuit would be permanently stuck awaiting a response that could never occur. All this equipment would be unavailable to the MLT system in the sense that it could not be used again because of its permanent BUSY status. The timeout facility overcomes errors of this sort by causing error routines to execute and free associated equipment. The overall timeout on the loop access, started by TST task as soon as loop access is completed, overcomes the error condition that prevails when TST task is awaiting the next request message for the FE computer, but that computer fails. Since the knowledge of the FE computer regarding accesses prior to system failure is most likely lost, the next message may never arrive. LTS 160 resources are likewise lost in this case without the timeout mechanism because this equipment cannot be used by other FE computers, or indeed, by one that failed and is now back on-line.

2.2.1c LTS Requests

With the presentation of the above structure and operation and the introduction of certain nomenclature, it is now appropriate to present a list of requests, including other access or test types, processed by a typical LTS 160. The list shows the subsystems, that is, PMU 2101–2103, LTS controller 2000 or port controller 2200, that actually performs the request, and indicates the level of activity, where appropriate, required to respond to the request.

1. DROP ACCESS—drop the loop test access and also any DDD callback associated with the loop. The port controller is required to perform this request. A signaling algorithm is executed to alert the test trunk circuit that access is to be dropped. The LTS controller needs to free all equipment associated with the access.

2. DROPDDD—drop the DDD callback connection and free the associated talk circuit. Relays are activated on the appropriate talk circuit, and the switching machine appearance of the callback line is opened to indicate "off-hook". This request is performed by the LTS controller.
3. TALK—put the associated DDD callback path into the mode that allows the Maintenance Center administrator to talk to the customer or craft at the end of the loop under test. The LTS controller causes relays to be operated on the talk circuit.
4. HOLD—put the associated callback connection into the mode that allows testing to be carried out, but which keeps the callback path connected. Talk circuit relays are operated by the LTS controller.
5. MONITOR—put the associated callback connection in the mode that provides a high impedance bridge connection, so that the Maintenance Center administrator can listen on the tested loop. Talk circuit relays are operated by the LTS controller.
6. MON_TEST—keep the high impedance monitor mode on the callback connection while the next test is performed, so that the Maintenance Center administrator can listen on the tested loop while the test is being performed. Talk circuit relays are operated by the LTS controller.
7. RING—attach ringing distributor circuit 2500 to the loop under test, and apply ringing voltage according to the ON-OFF code contained in the request message. Also, monitor for the ring-trip (customer off-hook) indication, and connect a gain amplifier to the callback path, if required. Relays are operated by the LTS controller on both the talk circuit and on the ringing distributor circuit.
8. GAIN—allocate an amplifier circuit to the loop under test, and connect the amplifier to the associated callback connection. Talk circuit relays are operated by the LTS controller.
9. NOGAIN—remove the gain amplifier associated with the callback connection. Talk circuit relays are operated by the LTS controller.
10. DELAY—wait for the specified time interval before executing the next test request. The function is provided by the LTS controller, using the OS timeout facility.
11. KEEP_EQT$_{13}$ SETUP—terminate processing for the present request message, but do not free the PMU now allocated for testing the given loop. This feature is provided by the LTS controller.
12. SHRT_DETECT—monitor the loop for a short condition (less than 30K ohms) between either conductor and ground, or between the two loop conductors. This feature is provided by the port controller, and requires that a DC source be applied to the loop, and that the loop current be monitored for state changes.
13. TTA—manipulate sleeve lead current to activate the central office in-band signaling circuit, so that a test of the customer's key pad can be performed by the port controller. A source is applied to the sleeve lead.
14. TRACING_TONE—apply a continuous tone from tracing tone source 2900 to the loop under test, so that craft personnel can locate the pair under test in the outside plant. The continuous tracing tone source voltage of the LTS is applied to the loop under test in either a metallic or longitudinal mode, as per the request parameter.
15. The following five requests deal with sleeve lead control circuit 2500, and are used for signaling the central office equipment to attach certain equipment or to perform some service. All sleeve lead manipulation is done by the port controller by applying a DC source to the sleeve lead circuit 2500.
    a. HI_NEG_SLEEVE—high sleeve current with negative battery
    b. LO_NEG_SLEEVE—low sleeve current with negative battery
    c. OPEN_SLEEVE—open circuit the sleeve lead
    d. HI_POS_SLEEVE—high sleeve current with positive battery
    e. LO_POS_SLEEVE—low sleeve current with positive battery
16. HAZ_POT_STATUS—check for the existence of a hazardous potential on the loop under test (port controller) by querying a thresholding circuit.
17. AUX_CONNECT—connect two loops to a single PMU to allow double-sided resistive fault sectionalization tests to be performed. The LTS controller performs this operation by operating relays.
18. CALL—by manipulating relays and circuitry on the associated talk circuit, place a low impedance across the line circuit of the loop under test, so that a Maintenance Center administrator can simulate customer dialing action. This facility is provided by the LTS controller.
19. EXTEND_TO—change the overall timeout on the loop access to the value specified in the present message (LTS controller).
20. CON_TP_SLV—connect tip to sleeve in order to diagnose test trunks. The port controller provides this feature by operating relays in the port circuit.
21. DCON_TP_SLV—disconnect tip and sleeve (similar to the above request).

The following test requests are performed only by the Precision Measurement Unit 2101, 2102 or 2103; the listing is exemplary of the type of testing effected by a PMU.

1. AC3TY—apply AC sources and measure resultant current to produce values that yield a Thevenin equivalent circuit for the loop at the applied frequency.
2. ACDC_I—short circuit the loop conductors to ground, and measure the resultant current flows.
3. BAL—apply a balanced AC source to the loop, and measure the resultant loop longitudinal balance.
4. DCT—produce only the DC portion of the DC3TY test summarized below.
5. DC3TY—apply both DC and AC sources to the loop, and measure the resultant currents used to calculate an AC and DC Thevenin equivalent circuit for the loop.
6. DTA—draw dial tone from the central office, and measure the characteristics of the dial tone signal sent over the customer loop.
7. FREQ_DETECT—measure the signal level at the frequency specified in the request data.
8. THEV—execute a special DC measurement sequence for generating current measurements in cases where a Thevenin equivalent circuit is to be obtained for a circuit known to have low resistance values.

9. OCFEMF—measure open circuit foreign voltage present on the loop under test.
10. PBX3TY—execute a special DC and AC test algorithm for generating data used to determine the Thevenin equivalent circuit for PBX equipment. The PBX attendant is not alerted by the application of testing voltages.
11. PBXDCT—same as PBX3TY, but for a DC characterization only.
12. RCNT—determine the number of ringers present on the loop under test by making a series of AC current measurements when sources of various frequencies are applied to the loop.
13. RDA—alert the customer to start dialing a digit zero on the dial, and measure the dial parameters.
14. ROH_RLS_TNK—execute an algorithm that causes release of a permanent signal circuit so that the receiver-off-hook test can be performed.
15. ROH_SPUR—measure the presence of spurious signal energy at the frequencies used in the receiver-off-hook measurement.
16. ROH_TEST—apply the receiver-off-hook test signal, and measure loop currents at harmonic frequencies.
17. ROH_VFB—apply a source voltage and measure the resultant loop current in order to approximate the length of a loop with a TIP-RING short.
18. SOAK—apply a sequence of DC sources to the loop, and measure resultant current flows.
19. THERM—apply a high level AC voltages to the loop, and measure the resultant current flows to detect a thermistor.
20. SSRFAULT—execute the single-sided resistive fault sectionalization measurement algorithm.
21. CN_DTF—totalizer detection for a coin-first coin telephone set.
22. CN_TOT_DTF—totalizer homing function for a coin-first coin telephone set.
23. CN_CF—detemine the resistance of the coin circuit totalizer so that proper current can be applied to home it.
24. CN_*L TOT*_CF—home the coin circuit totalizer, and monitor for current flow.
25. CN_RDET—measure the resistance of the coin relay in order to determine the proper source for the coin return function.
26. CN_RCR—apply sources to proper polarity in order to collect or return a coin in a coin telephone set.
27. CN_GRFV—measure the resistance of the ground path in a coin set.

2.2.2d LTS Controller Circuitry

Each controller within LTS 160, namely, LTS controller 2000, port controller 2200 and a controller embedded within each PMU 2101-2103 (to be discussed in a later section), is implemented with basically the same circuit topology; it comprises a microprocessor device and ancillary support devices. This topological arrangement is now presented with reference to LTS controller 2000. Because of its similarity to the other two controller types, the description applies to the latter two controllers with variations easily recognized by those skilled in the art.

LTS controller 2000 is composed of a microcomputer-based CPU, read-only memory (ROM), random access memory (RAM) and input/output facilities (I/O). Also provided is an interrupt structure allowing asynchronous events to be recognized and acted upon in an order-of-priority manner as well as suitable system timing.

The CPU is implemented with an 8-bit microprocessor having a 16-bit address bus, thereby allowing access to 64K bytes of memory. The microprocessor has a memory-mapped I/O structure that allows for allocating a portion of the memory address space for I/O device selection. For LTS controller 2000, 8K of the upper address space is allocated to I/O (as contrasted to 6K for port controller 2200 and 4K for the PMU controller).

Of the remaining memory associated with LTS controller 2000, 16K is provided by RAM and 40K by ROM. Of the latter memory, 20K is common to all software operations, and 20K is bank switched so that one of three different segments may be operational during a given processing sequence. (For port controller 2200, the memories implemented comprise 18K of RAM and 40K of ROM, the latter having two 24K switched segments. For the PMU controller, 16K of RAM is augmented with 48K of ROM, 16K of which is switched from one of four banks). Actually, address decoding in the 64K byte addressing space is ROM programmable, thus allowing memory allocation and I/O functions to be placed in any segments desired, so the above allocations describe but one illustrative embodiment.

One I/O function requires communication via the GPIB protocol, and this is typically implemented with a standard GPIB adapter device. Another required I/O function is communication in a serial, bit-oriented mode required by the high level data link protocol. Again, an appropriate commercially-available device interfaces to the memory-mapped space. Finally, an interface is provided for standard direct memory access (DMA) devices to provide handshake conditioning for the high-speed data channels if an increased throughput rate is required.

Two programmable devices complete the basic implementation of LTS controller 2000; these include a programmable interrupt controller (PIC) and a programmable interval timer (PIT).

The PIC device typically supports eight vectored interrupts with either a fixed or rotating priority. Each input can be individually masked via software control. Two of the interrupt are used in conjunction with GPIB and PIT devices. The latter input provides a crystal controlled, timed-interval interrupt that allows real-time clock applications such as system time-out functions.

The PIT contains three independent 16 bit counters. Each counter has operational modes to provide various counter/timer functions such as event counting, square-wave generation and software controlled stroking. The clock input to the clock divider circuit is provided by a 4 MHz crystal. The output clocks range from 15.625 kHz to 2 MHz and one may be selected to drive the CPU microprocessor.

2.2.2 Port Controller

Port controller 2200 is also a microcomputer-based system running under the same operating system (OS) as DCN 140 and LTS controller 2000. In port controller 2200, the following tasks may be identified:

(a) PARALLEL DATA task controls the transmission and reception of messages over bus 20001, which typically implements the GPIB protocol. It communicates with the corresponding task in LTS controller 2000 and is similar in structure and operation, the main difference being that the PARALLEL DATA task in LTS controller 2000 serves as the bus master.

(b) ACCESS/TEST task executes the access algorithm for NTT and MDF access. This includes control of the following devices: (1) port circuits 2801–2816 and corresponding sleeve circuits 2817–2832 to connect to the appropriate no-test trunks 9401–9416 and to control the magnitude and polarity of sleeve current; (2) trunk dialer 2650, of either the dial pulsing or multifrequency type, depending on the central office switch type; (3) busy/speech detector 2600 to determine DC busy and speech busy conditions; (4) tracing tone source 2900 for long term application of pair identification tones for the loop; and (5) P CONTROL section 2702 of EAN 2700 to guide access and then connect the above-identified devices to the accessed pairs when required. There are a maximum of sixteen active ACCESS/TEST tasks, one for each port/sleeve circuit. However, the task-to-port assignment is not fixed, but rather dynamically allocated depending on the number of active accesses.

(c) ADMINISTRATION task performs all administrative functions in port controller 2200, including energizing the internal timer periodically so as to preclude a system reset as well as accepting data base downloads at system initialization. Again, the task structure is similar to the ADMINISTRATION task of LTS controller 2000. The system reset is transmitted DOWN bus 20001 from LTS controller 2000 to all LTS 160 components once a reset request is initiated UP the hierarchy.

(d) DUMP MEM task is activated after a microprocessor malfunction and is arranged to provide for transmission of blocks of memory to LTS controller 2000; the memory snapshot focuses on the task that was active when the malfunction occurred.

(e) DIAGNOSTICS task provides self-test capabilities for the hardware controlled by port controller 2200 as well as interfacing to self-tests for LTS controller 2000 and PMU's 2101–2103.

Further discussion with respect to port controller 2200, particularly task processing, is deferred to Section 2.2.4 so that the description relating to PMU's 2101–2103 may be integrated into the operational description.

2.2.3 Precision Measurement Unit (PMU)

Figure 17:
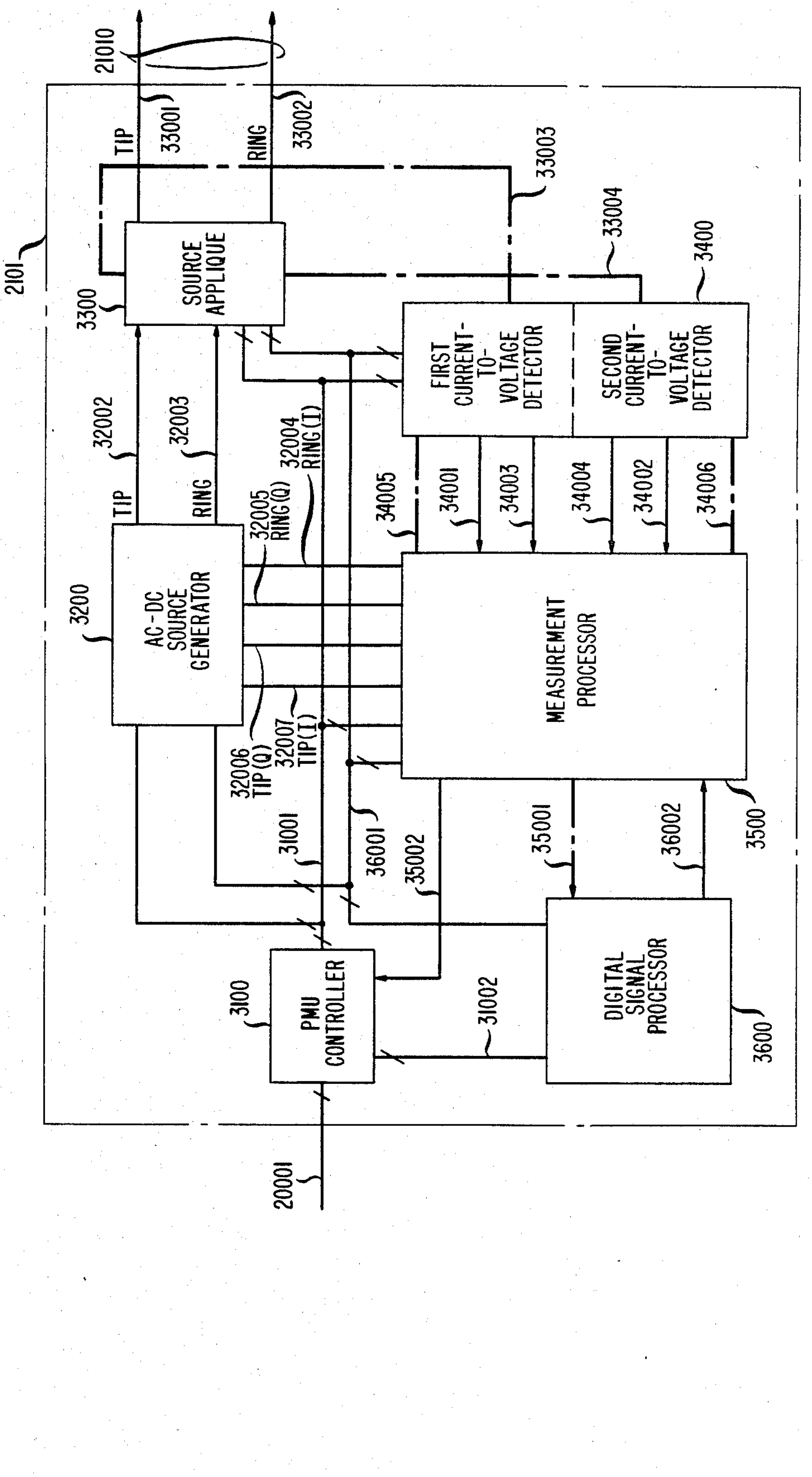
FIG. 17 depicts, in block diagram form, the circuitry comprising one Precision Measurement Unit (PMU) of FIG. 11.

FIG. 17 depicts, in block diagram form, the structure of PMU 2101 (PMU 2102 and PMU 2103 of FIG. 11 are essentially the same as PMU 2101 so it is taken as representative). PMU 2101 is microprocessor controlled, general purpose test instrument in that no part of PMU 2101 is dedicated to performing any particular test and this unit serves as the primary means for measuring the electrical parameters of the subscriber loop under test. The following interrelated subsystems comprise PMU 2101: PMU controller 3100; source generator 3200; source applique 3300; detector 3400; measurement processor 3500; and digital signal processor 3600. Subsystems 3200 and 3300 are connected in cascade and this cascade arrangement serves to generate and couple the requisite signals needed for testing to subscriber loops (180 or 181 of FIG. 2). Detector 3400, in conjunction with applique 3300, serves to detect currents on the loop under test and to convert these currents to corresponding voltages. Subsystems 3500 and 3600 comprise a series combination which processes these voltages and formats the processed signals for transmission, ultimately, to FE computer 220 or 221 (FIG. 2). In the local PMU environment, PMU controller 3100 receives test requests from LTS controller 2000 (FIG. 11) over parallel-oriented bus 20001, sets up the test by interfacing to the various subsystems via its busses 31001 and 31002, and transmits the results of testing across bus 20001 upon completion of testing.

Figures 18, 24:
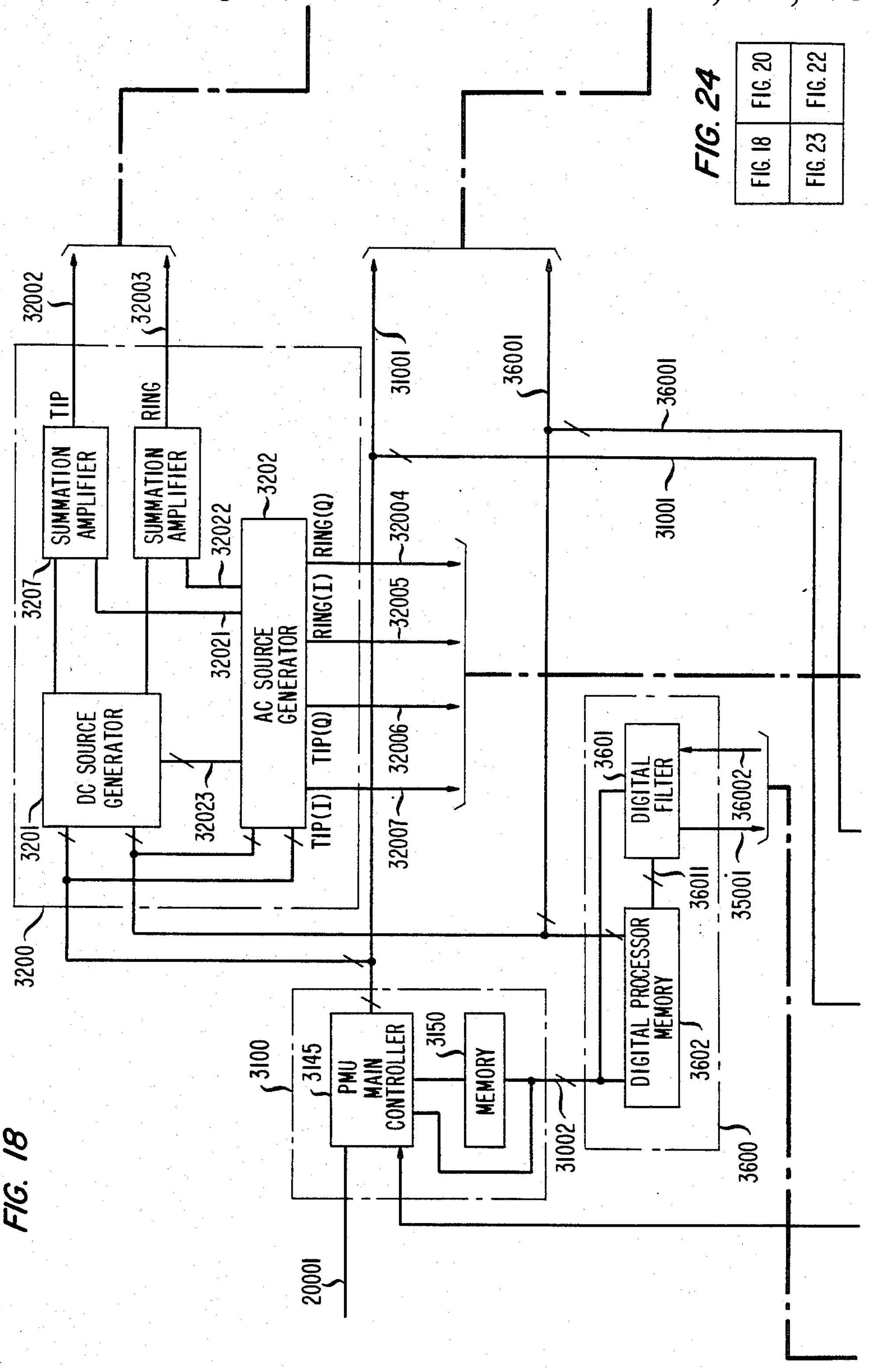
FIG. 18 is a more detailed representation of the PMU controller, AC-DC source generator and digital signal processing portions of the block diagrams of FIG. 17.
FIG. 24 indicates the manner in which FIGS. 18, 20, 22 and 23 may be arranged to form a composite representation of FIG. 17.

Source generation subsystem 3200, depicted in block diagram form in FIG. 18, produces (i) the requisite AC and DC signals that are applied to loop 180 or 181 via TIP lead 32002 and RING lead 32003, and (ii) demodulating signals, on leads 32004 and through 32007, necessary to drive measurement processor 3500. Generator 3200 is adapted to provide composite AC-DC signals simultaneously to TIP lead 32002 and RING lead 32003. To insure resolution of fault conditions within predetermined tolerances, generator 3200 is arranged to produce:

(a) a single AC signal having a frequency from 1 Hz to 3200 Hz in 1 Hz steps at voltage levels from 0.0 v to 12.75 v rms in 0.05 v steps and from 12.8 v to 95.6 v rms in 0.4 v steps. The accuracy is ±0.1 v rms or 3%, whichever is greater;

(b) a DC signal at a level from 0 to ±51 v in 0.2 v steps and from ±51.15 v to ±135.3 v in 0.55 v steps. The accuracy is ±0.1 v or 2%, whichever is greater;

(c) a swept frequency signal where the starting frequency, stopping frequency and frequency increment may be specified within broad limits;

(d) a pulsed tone whose rate and duty cycle may be specified over a broad range;

(e) a signal comprising the sum of two AC signals having the same relative amplitude; and (f) a signal formed by sequencing through 10 tone pairs each of whose frequencies may be specified over the range from 1 Hz to 3200 Hz and whose durations and silent intervals may be specified.

Besides producing the aforementioned signals (a)–(f), generator 3200 may also be configured so that different DC levels may be applied to TIP and RING leads 32002 and 32003, respectively, at the same time or that the applied AC signals have the same amplitude but are phase-shifted 180 degrees relative to each other. Moreover, combinations of an AC signal and a DC signal, as defined in items (a) and (b) above, may be provided as long as the peak value of the composite signal is less than 135.3 volts.

Source generator 3200 typically comprises a set of microcomputers (not shown in FIG. 17). Each of these microcomputers generates digital samples via a table lookup technique. For AC signals, these digital samples are converted to analog form by means of digital-to-analog (D/A) converters embedded within generator 3200. Composite signals are formed by combining the outputs of the D/A converters with a DC level.

The MLT performs mainly admittance measurements. In order to test subscriber loop 180 or 181 of FIG. 2, the signal voltage present on output leads 32002 and 32003 emanating from generator 3200 are applied, via source applique 3300, to TIP and RING leads 33001 and 33002, respectively. The resultant longitudinal-mode current flowing in leads 33001 and 33002 are each independently detected in applique 3300 by means of a magnetic sensing circuits (not shown). The outputs of the magnetic circuits are signals proportional to the detected currents and these signals appear on multiple leads 33003 and 33004 emanating from applique 3300. Detector 3400 receives and than converts these signals to voltages proportional to the sensed currents. Output leads 34001 and 34003 from detector 3400 carry voltages proportional to TIP current in the usual measurement mode, whereas output leads 34002 and 34004 have voltages proportional to RING current. There is also a measurement mode wherein applique 3300 and detector 3400 can be configured to produce voltages proportional to a longitudinal current and the metallic current associated with the loop under test.

The signal processing section of PMU 2101 comprises: measurement processor 3500, with circuitry including multipliers, analog multiplexers, analog-to-digital (A/D) converters and sample-and-hold (S/H) circuits; and digital signal processor 3600. In-phase (TIP(I) and RING(I)) and quadrature (TIP(Q) and RING(Q)) waveforms at precisely the frequency applied to the loop under test represent one arrangement of signals present on leads 32007, 32005, 32006 and 32004, respectively. These waveforms may be produced in generator 3200 as the counterparts to the signals applied to the loop under test and these four waveforms are used to synchronously demodulate the voltages produced by detector 3400 on leads 34001 and 34002. Analog multipliers embedded within processor 3500 perform the demodulation. For instance, the output of one multiplier is a signal formed by multiplying the first detector voltage, on lead 34001, by the in-phase component of the signal on the TIP TIP(I)) appearing on lead 32007. If the voltage on lead 34001 is the result of current flow on the TIP of the loop under test, then the signal from this multiplier is proportional to the real part of the admittance-to-ground of the TIP conductor.

Anticipated phase shifts both within circuitry of PMU 2101 or due to external circuitry can be accounted for and accommodated simply by phase shifting the demodulator signals appearing on leads 32004 through 32007 relative to the sources applied to the loop via leads 32001 and 32002. In addition, harmonics of the frequencies applied to the loop under test can be generated within source 3200 and used to detect nonlinearities in the loop admittance by searching for DC components in the outputs of the multipliers. The use of two signal conditioning channels (34001 and 34002) and four demodulating signals (on leads 32004 through 32007) allows PMU 2101 to make multiple measurements simultaneously. In the embodiment, the results of all measurements are DC values, either initially or after the demodulation process.

Measurement processor 3500 is used to select from among the various outputs appearing simultaneously from the multiplier outputs and detector leads 34001 through 34004. The signals so selected, typically in pairs, are fed to S/H and A/D circuits contained within processor 3500. The digital samples, emanating from processor 3500 on one conductor of multiconductor 35001, serve as input to digital signal processor (DSP) 3600. DSP 3600 implements several digital filtering programs, one of which includes a dynamic settling algorithm that is utilized to decide when a final value has been obtained from a measurement. Test results are passed from DSP 3600 to PMU controller 3100 over bus 31002.

As indicated by the foregoing discussion, PMU 2101 effects, within predetermined voltage and frequency limits, measurements to characterize a three terminal network, including those of a distributed parameter nature exemplified by a two-wire, shielded transmission line (that is, the customer loop).

2.2.3a Digital Signal Generator (DSG)

The procedure used to generate cosinusoidal waveforms with generator 3200 of FIG. 17 involves accessing signal values that have been stored within its read-only memory. The values that are selected according to the technique to be described are transformed into a cosinusoidal waveform via a digital-to-analog converter and low-pass filter means.

The values stored within the memory of generator 3200 are, basically, magnitude samples of cos $\theta$ for the first and third quadrants. Although symmetry of a cosine wave would permit its reproduction from samples of one quadrant only, higher frequency signals are effected by providing two sets of samples to reduce transformation time in matching the samples to a form acceptable to the digital-to-analog converter.

The values for each quadrant are accessed with an eight-bit address, so 256 memory locations per quadrant are stored. The memory for the first quadrant stores $+\cos\theta$ over the range 0 to 90 degrees with $\theta$ having a spacing of 0.3516 degrees (90 degrees/256), whereas the other memory stores $-\cos\theta$ with the same spacing.

Each of the values stored in the memory is contained within an eight-bit word. Each value is an integer representation of the decimal number obtained by evaluating the cosine with the foregoing spacing. Thus, if c(n) represents the nth value, the integer stored at the nth address is $$c(n) = 256\, I\left[\cos\frac{(2\pi n)}{1024}\right] \quad (1)$$

where I[.] designates an integer truncation operation to 8 bits and n is such that $0 \leqq n \leqq 255$. The multiplicative factor 256 in equation (1) basically left-shifts the decimal values resulting from truncation. (If the memory word-size is, in general, K, and the number of addressable locations in memory is $2^L$, then equation (1) has the form $$c(n) = 2^K\, I\left[\cos\frac{2\pi n}{2^{L+2}}\right],$$

for $0 \leqq n \leqq 2^L - 1$, which reduces to equation (1) for $K = L = 8$).

The $-\cos\theta$ table, that is, the values in memory associated with third quadrant samples, is the 2's complement version of the $+\cos\theta$ table. The complementary relationship of these two tables saves execution time that would be needed to generate the complementary values if only first quadrant values were stored. Since the particular embodiment of the present invention utilizes a digital-to-analog converter requiring an offset binary code to produce a four quadrant waveform, any table value requires only the insertion of the proper quadrant sign value to complete the offset binary code.

Figure 19:
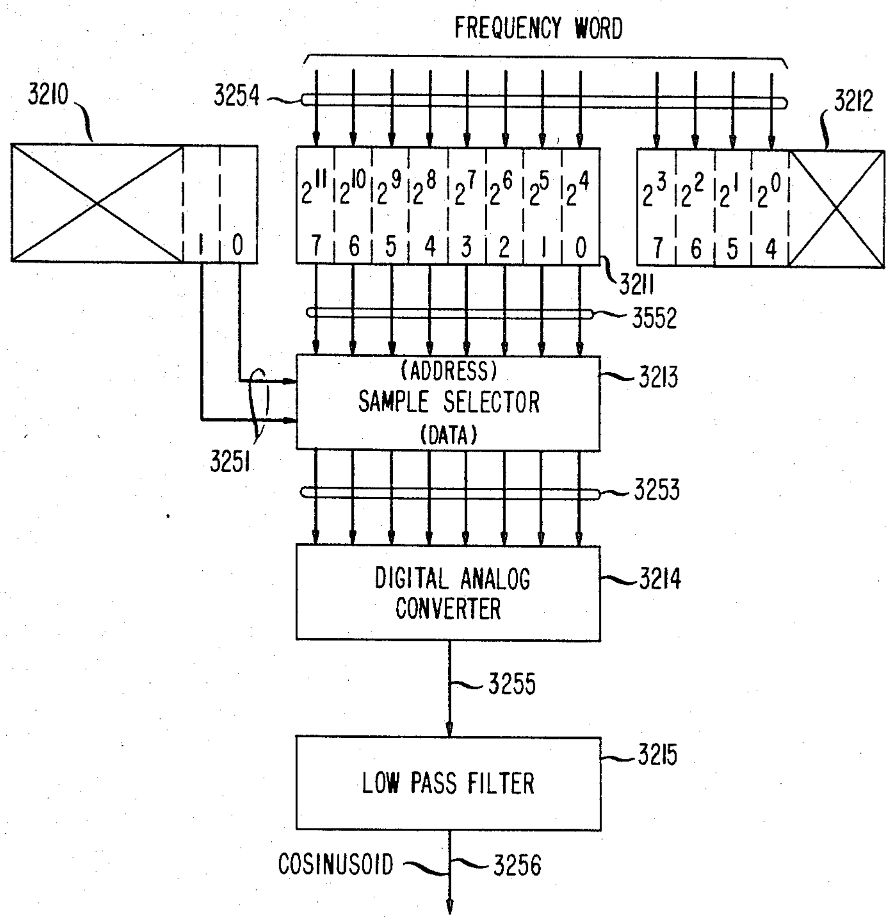
FIG. 19 illustrates the arrangement of memory bytes to realize the accumulator of the digital signal generator within the AC-DC source generator of FIG. 17.

Besides the $+\cos\theta$ table, generator 3200 utilizes an accumulator to obtain a sample index and quadrant pointer. With reference to FIG. 19, the accumulator comprises registers 3210, 3211 and 3212 which, typically, represent three contiguous bytes (8-bit words) in memory. The boundaries for these three bytes are chosen such that bits 0 and 1 of the high byte (register 3210) contain quadrant information in the form of a quadrant pointer. For instance, if these two positions had the binary values '0' and '1', respectively, then third quadrant values are required. The quadrant information is passed to sample selector 3213 on lead 3251. The entire middle byte, comprising register 3211, provides the address of the sample to be selected by selector 3213. This address, called the sample index, is passed to selector 3213 via parallel-oriented bus 3252. Bits 4 through 7 of the low byte (register 3212) contain the four least significant accumulator bits.

Frequency generation is accomplished by the binary addition of a 12-bit frequency word, arriving on bus 3254, to the 12 least significant bits of what is, in effect, a 14-bit accumulator. The frequency word on bus 3254 is indicative of the frequency of the cosine to be generated, as explained shortly. The addition occurs at a fixed rate, designated $f_s$ (Hz), which is typically at least twice the highest frequency cosinusoid to be provided by generator 3200.

In general, as the frequency word is added to the accumulator at the rate $f_s$, the bits of register 3212 eventually overflow into register 3211. In turn, register 3211 eventually overflows into register 3210. After each addition, the two bits of register 3210 are checked for phase information and all bits of register 3211 are passed to selector 3213. A cosine magnitude value is appropriately extracted from the $\pm\cos\theta$ tables stored within selector 3213. A polarity sign is supplied to the value, and the now completed encoded value is passed to digital-to-analog converter 3214 via bus 3253.

In view of the foregoing discussion, if a cosinusoidal frequency of 1 Hz (having a frequency word representation of 00000000 0001 in binary) is to be generated, then it would require sixteen additions to the accumulator (initialized to 00 00000000 0000) before register 3212 overflows into register 3211. This means that for one complete cycle, wherein the tables will be indexed exactly 1024 times, one table value is accessed sixteen consecutive times, another value sixteen consecutive times, and so forth. Thus the same encoded cosine value is loaded into converter 3214 sixteen times before a new encoded value becomes available. However, if a frequency word of 00000001 0000, representing 16 Hz, is added to the accumulator, then 1024 sample indices are still produced, but a new and different encoded cosine value is loaded into converter 3214 after every addition. To reiterate, if the frequency represented by the frequency word is small (<16 Hz), the cosine magnitude values do not change rapidly, that is, they become "dwelled" on for a period of time, whereas for a longer frequency word (≧16 Hz), the cosine samples change rapidly.

The result of this generation technique is a cosinusoidal wave synthesized by stepping through a look-up table, small steps for low frequencies and large steps for high frequencies. The frequency spectrum for a wave synthesized in this manner contains the desired fundamental frequency plus its harmonics. Also present is the sampling frequency $f_s$ and its harmonics. Moreover, the desired frequency and its harmonics are centered about $f_s$ and its harmonics. To reduce distortion due to aliasing, $f_s$ is at least twice as great as the highest frequency to be produced. In addition, a low-pass filter, designated as filter 3215 in FIG. 19, removes frequency components above $f_s/2$, thereby providing a smoothing operation.

Besides the frequency components discussed above, there are undesired frequencies due to dwelling on table values during the generation of low frequencies and the finite precision of converter 3214. These frequencies are subharmonics and filter 3215 cannot remove them since they fall within the passband. Fortuitously, however, the amplitudes of the subharmonic components are small due to minor differences in adjacent table values and for converter precision on the order of eight bits per sample; therefore, the harmonics are tolerable without further processing.

22.3b Magnetic Current Sensor

As briefly discussed above with reference to FIG. 17, source applique 3300 and detector 3400 combine to detect appropriate conductor currents, typically longitudinal mode currents in both the TIP and RING of the loop under test, and then to convert the detected conductor currents to voltages suitable for processing.

Figure 20:
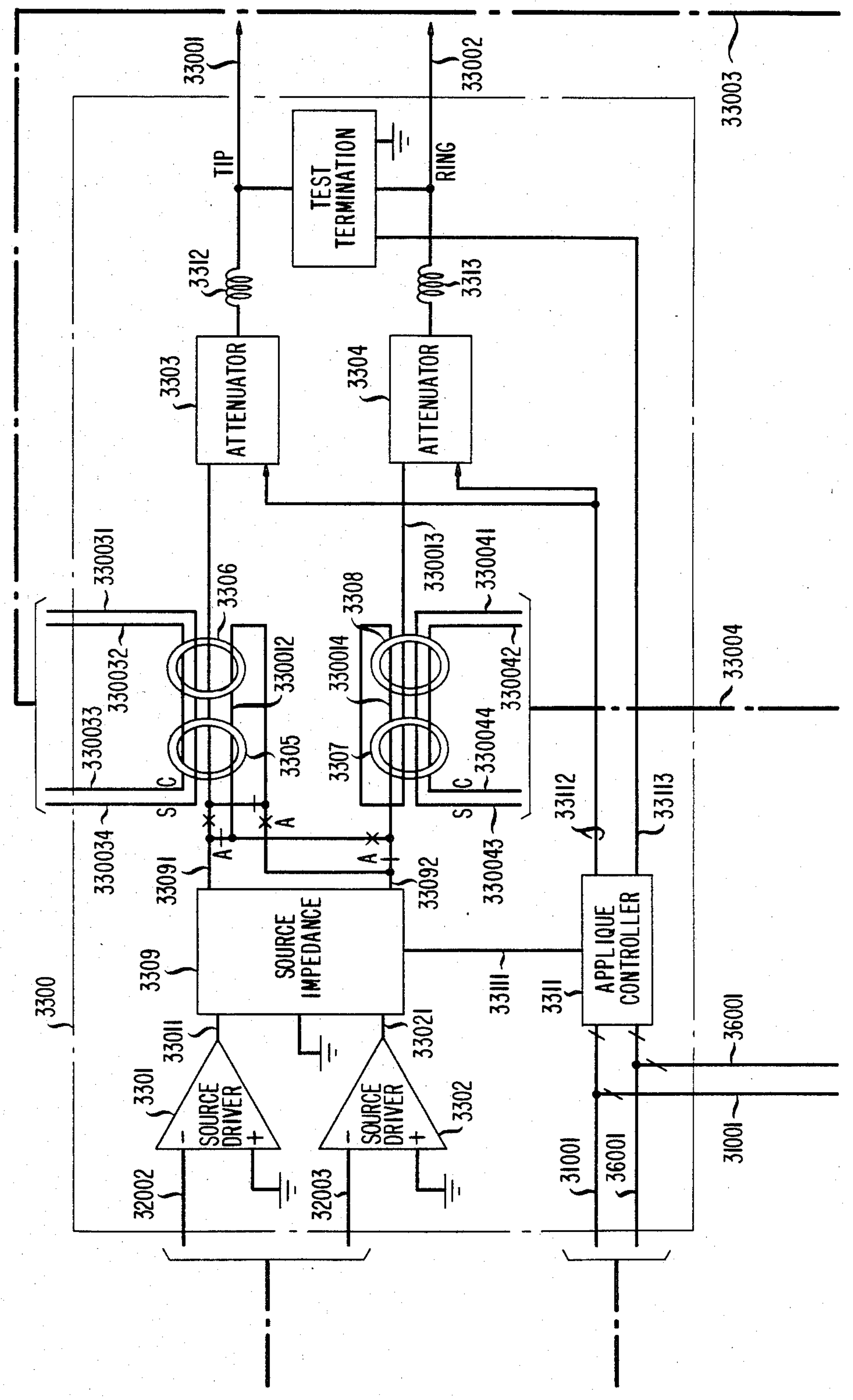
FIG. 20 is a diagram, partly in schematic and partly in block form, showing one implementation of the source applique of FIG. 17.

A more detailed block diagram of source applique 3300 is shown in FIG. 20. Signals transmitted from source generator 3200, via leads 32002 and 32003, serve as inputs to TIP source driver 3301 and RING source driver 3302, respectively. Drivers 3301 and 3302 provide high impedance buffering to the input signals and suitably level shifted output voltage or current signals to energize output TIP lead 33001 and RING lead 33022, respectively. Source impedance values presented to the TIP and RING are effected by impedance network 3309 coupling drivers 3301 and 3302 to leads 33001 and 33002, respectively. Drivers 3301 and 3302 and network 3309 provide a high degree of testing flexibility. Voltages from 0 to ±135.3 V peak and currents up to 125 ma can be delivered through a variety of source impedances. The choice of impedances ranges from a short circuit up to 100K ohms in series with both TIP and RING or each separately. Moreover, TIP and RING can be shorted or capacitively coupled. Applique controller 3311 signals network 3309, via lead 33111, as to the desired coupling impedances. Controller 3311 operates in response to signals transmitted over busses 31001 and 36001.

Magnetic core pair 3305,3306 associated with TIP lead 33001 and core pair 3307,3308 accompanying RING lead 3302 detect flux changes induced by current carrying conductors which are wound through the core apertures. For instance, with the relay contacts of relay A in the make and break positions shown in FIG. 20, the TIP lead current on conductor 33001 forms a two-turn winding on each core 3305 and 3306; similarly, the RING lead current on conductor 33002 penetrates the apertures of core pair 3307,3308 twice with same orientation. However, if relay A (which is embedded within applique controller 3311) is energized, then core pair 3305,3306 encompasses the TIP lead only once and the current in the RING lead is also routed through core pair 3305,3306, but in a sense opposing TIP lead current. In effect, core pair 3305,3306 detects a differential between the individual currents flowing in the TIP and RING leads 33001 and 33002, respectively. Thus, the two operating modes of relay A determine the desired routing of current carrying paths through core apertures. More complex relay arrangements enable numerous measurement modes as well as fault location procedures for a variety of loop fault conditions. Loop fault detection and location methodology which utilizes the foregoing current routing arrangement is the subject matter of U.S. patent application Ser. No. 308,417, filed on Oct. 5, 1981, by J. M. Brown, since matured as U.S. Pat. No. 4,424,479 on Jan. 3, 1984 and assigned to the same assignee as the instant application. A synopsis of this loop fault locating methodology will be presented in Section 3.2.1d wherein the MLT system tests are defined.

Core pairs 3305,3306 and 3307,3308 are typically matched ferrite cores; matching is required to minimize offset drift as ambient conditions, particularly temperature, vary. With the core pairs and accompanying circuitry of the illustrative embodiment, currents from 1 ua to 500 ma in the DC to 3200 Hz frequency band may be measured with an accuracy of ±1 ua or ±1% for the anticipated ambient conditions.

Figure 21:
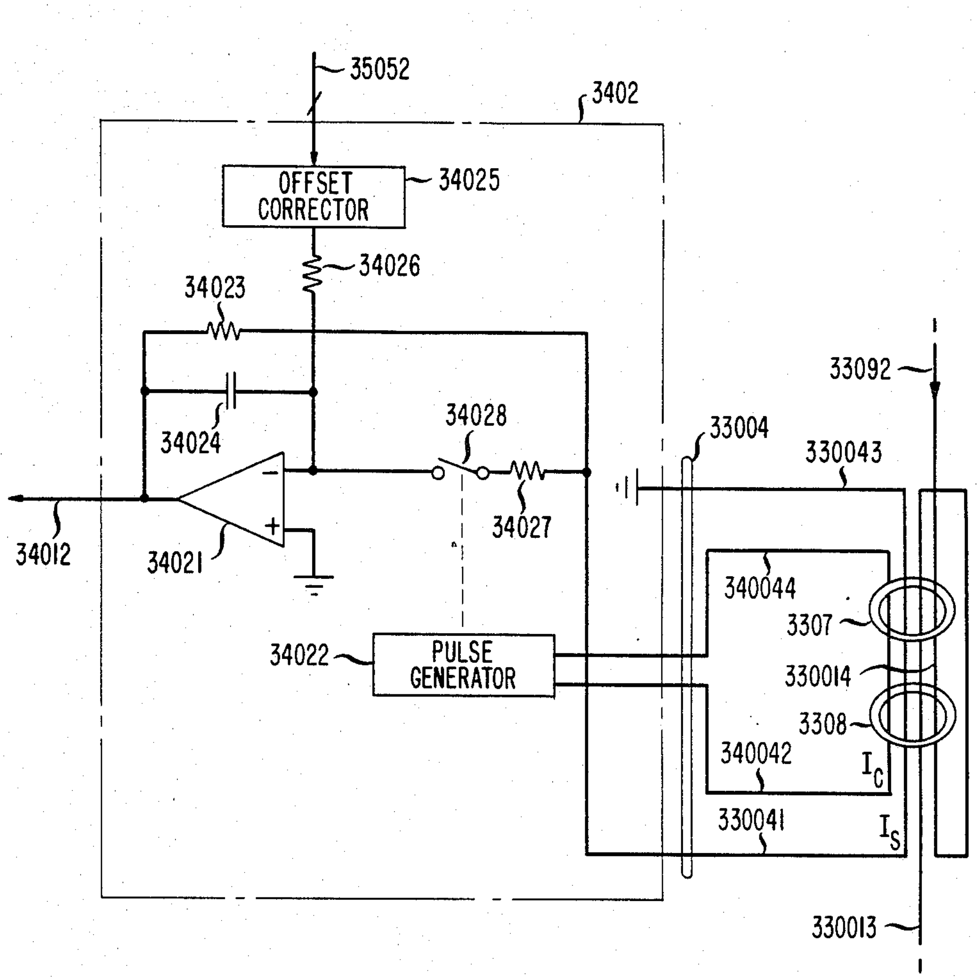
FIG. 21 indicates essential portions of magnetic current sensor circuitry of the detector portion of FIG. 17 whereby loop currents are transformed to equivalent voltages.

A brief description of the operation of one core pair arrangement is presented with reference to FIG. 21. Each core 3307 or 3308 has basically three windings. One winding, designated the line winding, comprises conductor 330013 in series with conductor 330014; these conductors are considered to form one winding because each provides a series aiding field excitation. The conductor having ends 330041 and 330043 forms a sense winding, whereas the conductor having ends 330042 and 330044 comprises a control winding on each core 3307 and 3308. With the currents $I_L$, $I_C$ and $I_S$ flowing in the line, control and sense windings, respectively, and having the flow direction shown in FIG. 21, the line winding and control winding on core 3307 provide series-aiding magnetizing fields whereas the fields are series-opposing on core 3308, and each sense winding provides series-opposing fields to the line winding fields.

Operational amplifier 34021 and capacitor 34024 form an integrator which acts to feed back current $I_S$ through the sense winding on each core to cancel magnetic flux caused by the current $I_L$ in the line winding. In steady-state operation, that is, after line current transients have dissipated, the voltage on output lead 34012 is proportional to the current $I_L$ on lead 330013 (or 330014). In order to determine if $I_S$ is of sufficient strength to cancel $I_L$, pulse generator 34022 periodically drives cores 3307 and 3308 into saturation through the separate control winding of each core. During the interval that cores 3307 and 3308 are driven into saturation with current $I_C$, switch 34028 remains open. When the saturation pulse is removed, switch 34028 is connected to the inverting (−) input of amplifier 34021, through resistor 34027, in order to sense the presence of an error voltage generated by collapsing flux, that is, flyback from saturation. If the net flux caused by fields induced by $I_S$ and $I_L$ current is zero, the voltage generated on each sense winding is equal and opposite and, consequently, the error voltage is zero. However, if the net flux is not zero, the nonzero error voltage is integrated and stored by capacitor 34024. During the next pulse cycle, the stored voltage furnishes current $I_S$, through resistor 34023, to the sense windings and, accordingly, forces the net flux to zero.

If cores 3307 and 3308 are not preferably matched, primarily because their characteristics do not track during changing ambient conditions, a nonzero error voltage may be generated even if the line winding current is zero. To partially correct for core offset, a compensating offset current is fed into integrator amplifier by offset voltage corrector 34025 in series with resistor 34026. After offset correction, the output voltage on lead 34012 substantially tracks the line current. In the illustrative embodiment, automatic offset correction achieves a two orders of magnitude improvement in detection performance as compared to the circuitry without offset compensation; automatic correction occurs periodically, although for the most sensitive measurements, a correction is made immediately prior to a measurement. Offset corrector 34025, which is typically a digital-to-analog converter, receives a correction voltage from PMU controller 3100 on bus 35052. The voltage supplied by PMU controller 3100 results from a test measurement, with zero loop current, performed on the periodic basis.

Figure 22:
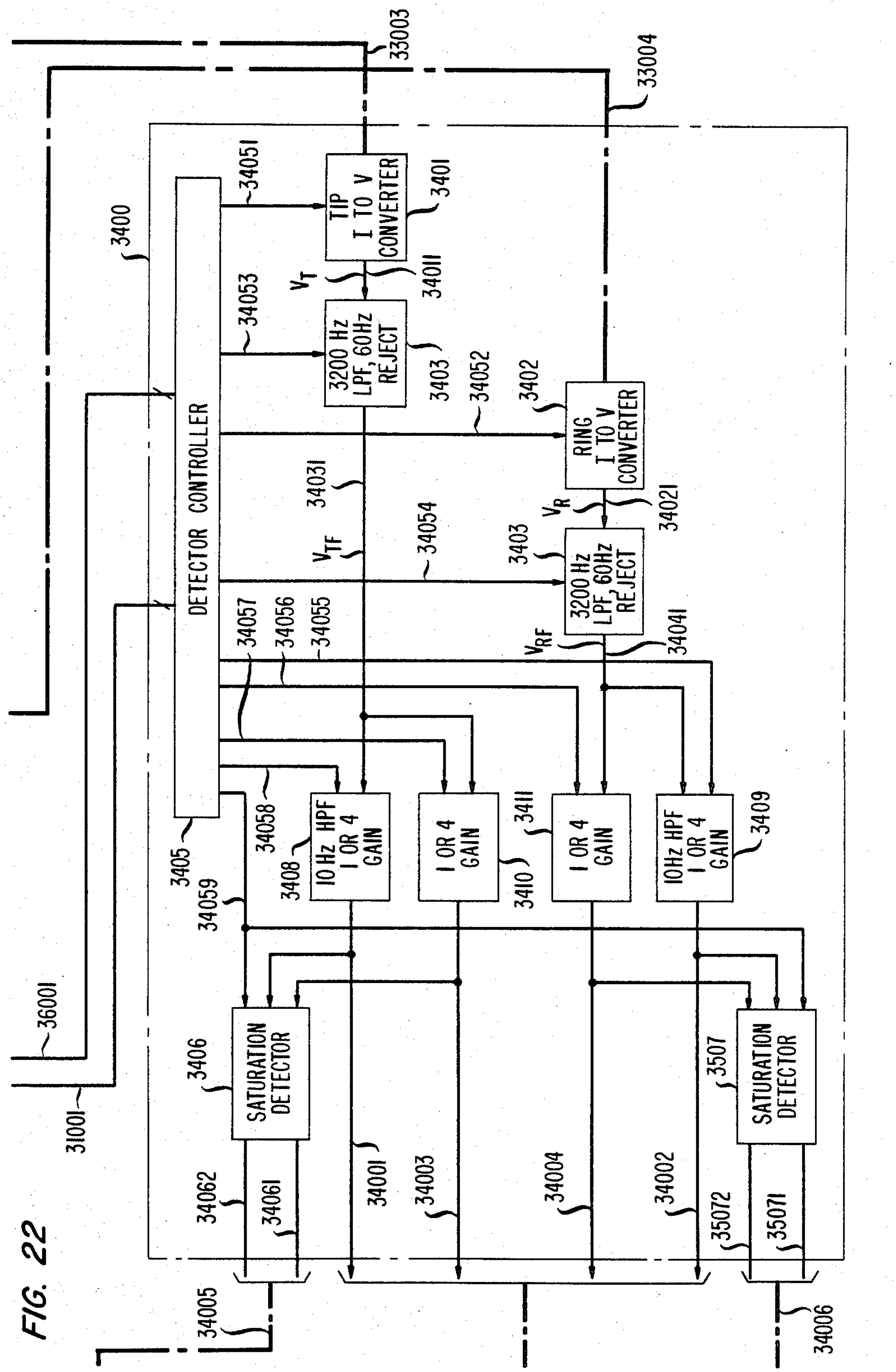
FIG. 22 depicts the processing circuitry of the detector of FIG. 17 utilized to filter and scale the equivalent voltages.

FIG. 21 depicts the essential circuitry of ring I-to-V converter 3402 of FIG. 22. As shown in FIG. 22, ring I-to-V converter 3402 has a corresponding counterpart in tip I-to-V converter 3401 which performs basically the same operation on core pair 3305,3306 of FIG. 20. The output voltages proportional to TIP and RING lead currents appear on leads 34011 and 34021, respectively, of FIG. 22. In that each voltage signal is processed in basically the same manner with the remainder of the circuitry embedded in detector 3400, only processing of the output voltage signal appearing on lead 34011 of tip converter 3401 is described in the following.

The voltage on lead 34011 is band-limited to 3200 Hz by filter 3403. For some measurements, particularly in a high 60 Hz noise environment, filter 3403 also can provide 60 Hz band elimination filtering. Filter 3403 operates under control of detector controller 3405, via lead 34053; in turn, detector controller 3405 receives instructions from PMU controller 3100 on bus 31001 and DSP 3600 on bus 36001. The filtered voltage signal appears on lead 34031 and serves as an input to gain units 3408 and 3410. Gain unit 3408 provides either a gain of four or no gain as well as filtering with a 10 Hz high-pass filter; the signal at the output of gain unit 3408, on lead 34001, basically comprises only AC components. On the other hand, the output of gain unit 3410, on lead 34003, represents a composite AC-DC signal amplified by either a factor of four or directly coupled without gain. To determine which gain factor to apply, the outputs of gain units 3408 and 3410 serve as inputs to saturation detector 3406. Initially, both gain units 3408 and 3410 are set to the maximum gain of four. If the signal at one or both outputs is above a preselected threshold, saturation detector 3406 interrupts PMU controller 3100. Interrupt as a result of AC overload appears on lead 34061, whereas composite signal overload is transmitted over lead 34062. Appropriate gain adjust signals are returned to gain units 3408 and 3410 from PMU controller 3100 via detector controller 3405 and, particularly, leads 34058 and 34057. If saturation is still detected, then an input attenuator is switched into the current path associated with TIP lead 33001. The attenuator, depicted by element 3303 in FIG. 20, provides a 4:1 current reduction. The signals thus appearing on AC-only lead 34001 and broadband lead 34003 at the output of detector 3400 represent suitably scaled analog signals proportional to the currents flowing on the loop conductor arrangement under test.

Figure 23:
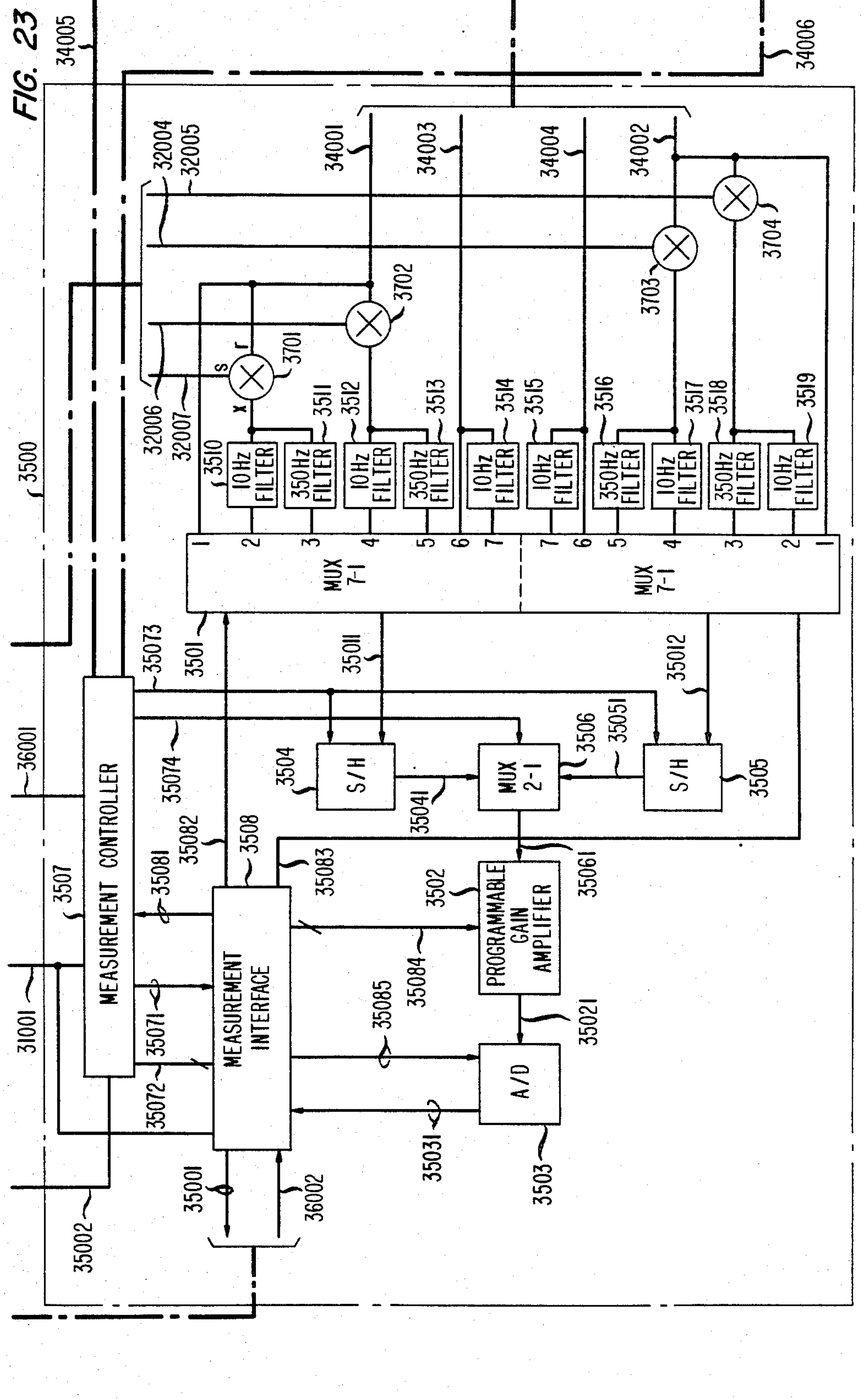
FIG. 23 shows a block diagram representation of the measurement processor of FIG. 17.

Now with reference to FIG. 23, additional processing is effected by the measurement processor 3500 to prepare the analog signals for digital filtering in processor 3600 (FIG. 17).

The signal on AC-only lead 34001 is presented to 7-1 MUX, that is, the upper half of multiplexer 3501, on five parallel paths. The first path directly couples lead 34001 to multiplexer 3501 so that broadband AC signals may be measured. To obtain the signal on the second path, in-phase synchronous detection is effected by multiplying the voltage signal on lead 34001 with the TIP (I) signal on lead 32007 in four-quadrant multipler 3701. Synchronous detection of the AC-only signal frequency shifts the information bearing components to DC for efficient filtering. Aliasing is mitigated with 10 Hz antialiasing filter 3510 interposed between multiplier 3701 and multiplexer 3501. The fourth path signal is obtained in a manner substantially equivalent to the second path processing technique, the only difference being that a quadrature signal (TIP(Q)) serves as an input to multiplier 3702, via lead 32006. The DC components emanating from the second and fourth processing paths represent typically the real and imaginary parts of the admittance with respect to ground of the loop conductor arrangement under test, typically the TIP-to-ground path.

Oftentimes it is necessary to measure a current signal produced by a voltage arising outside the MLT system for which the exact frequency is not known; in this case, synchronous demodulation is effected with an average frequency. For instance, dial tone provided to a telephone set is known to be in the 300 to 1000 Hz band. Synchronous in-phase and quadrature detection with a 650 Hz frequency, followed by filtering with 350 Hz low-pass filters 3511 and 3513, respectively, results in signals indicative of the presence of dial tone. The quadraturely-related signals are delivered to multiplexer 3501 via multiplier filter pairs 3701,3511 and 3702,3513, respectively, on paths three and five.

Finally, path six directly presents the broadband, composite AC-DC signal to multiplexer 3501 and the signal on path seven results from low pass filtering the signal on lead 34003 with 10 Hz filter 3514. This latter path is used primarily to measure the DC in the composite AC-DC signal.

The seven TIP paths just described are duplicated by similar processing on the RING lead side and are received in the lower-half of multiplexer 3501. The signals on all fourteen paths are present simultaneously. Analog multiplexer 3501 is used to connect one of the seven TIP paths and a corresponding one of the RING paths to sample-and-hold (S/H) devices 3504 and 3505, respectively. Since programmable gain amplifer (PGA) 3502 is capable of processing only one input at a time, multiplexer 3506 performs time division multiplexing on the outputs of S/H devices 3504 and 3505 and channels the desired signal to gain amplifier 3502 during appropriate time intervals. Lead 35011 couples the upper-half 7-1 MUX of multiplexer 3501 to S/H 3504, and lead 35041 couples S/H 3504 2-1 Mux 3506. Similar functions are performed by leads 35012 and 35051, respectively. Finally, multiplexer 3506 and gain amplifier 3502 are coupled with lead 35061.

The output of gain amplifier 3502 serves as an input to twelve-bit A/D unit 3503; coupling is via lead 35021. Gain amplifier 3502 provides gain from 1 to 256 in steps of 2. To determine the correct gain setting for each sample presented to A/D unit 3503, two measurements are made per sample. For the first measurement, PGA 3502 is set at unitary gain. The number of leading zeros in the 12-bit digital output on lead 35031 are counted. For each leading zero, the gain is increased by a factor of two up to a maximum gain of 256 or eight leading zeros. The signal is again measured and converted to a 12-bit digital signal. This two-step measurement procedure ensures that the full conversion range of converter 3503 is utilized for maximum measurement accuracy. The 12-bit measured signal is combined with the setting on PGA 3502 to produce a signal requiring a maximum of 20 bits for complete representation. Digital signal processor 3600 is arranged to operate on these 20-bit signals, as will be discussed shortly.

Because of the parallel processing arrangement of multipliers 3701 through 3704 and time division multiplexing available with multiplexer 3501, a number of analog signals resulting from a typical loop measurement can be proceeded essentially simultaneously. For instance, one measurement in the standard set of requests is the DC three terminal admittance (DC3TY). With this measurement, both AC and DC sources are applied between each loop conductor and ground, and the resultant currents are used to calculate an AC and DC Thevenin equivalent circuit of the loop. For instance, it is supported that the AC voltage is applied at 24 Hz. At a sampling rate of 100 Hz, the real and imaginary components of the 24 Hz signal are processed on paths two and four and the DC current on path seven for both the TIP and RING conductors, resulting in a total of six measurements from basically one source signal.

Measurement controller 3507 provides the required timing information to synchronize operation of multiplexer 3501, S/H devices 3404 and 3405 and multiplexer 3506 to insure that the selected analog signals are available for A/D conversion in element 3503. In addition, controller 3507 generates a progression of timing signals that activate, for example: the first measurement with A/D converter 3503; the circuitry to count leading zeros in data from the first measurement; the gain selection in PGA 3502 as determined by these zeros; the second A/D measurement; and the transmission of the 12 bits representing a sample to measurement interface 3508. Controller 3507 is dependent, initially, on information transmitted over bus 31001 from PMU controller 31001. Once activated, however, controller 3507 produces timing information basically independent of PMU controller 3100, although interrupts and reset requests may override and disable state timing.

Measurement interface 3508 serves a two-fold purpose, namely, (i) to temporarily store the results of the first and then the second A/D measurements and (ii) to format the 12-bit data obtained from the second measurement for transmission to DSP 3600. DSP 3600 manipulates 20-bit, two's complement data with the presumption that the least significant bit arrives first on its serial-oriented input port. In the present situation, this input port is connected to one conductor from channel 35001 emanating from measurement interface 3508. Formatting is required since data is transmitted serially between interface 3508 and A/D converter 3503 on one conductor of lead 35031 with the most significant bit arriving first. In formatting the data generated by the second measurement, account is taken of the gain of PGA 3502, the polarity of the sampled signal and whether an extra gain, called "pseudo-gain", is to be implemented. The purpose of this extra gain is to reduce inherent error in processing for low level signals due to a digital processing phenomenon called a "limit cycle" caused by finite word length effects.

FIG. 24 depicts how FIGS. 18, 20, 22 and 23 may be grouped to form a composite of FIG. 17.

2.2.3c Signal Processing

The final stage in the processing of the detected TIP and RING signals is effected by DSP 3600 of FIG. 17. DSP 3600 is controlled by PMU controller 3100 via bus 31002. PMU controller 3100 downloads the required processing algorithm into DSP 3600 via memory bus 31002 and receives results back over this same bus. This downloading feature allows DSP 3600 to perform a wide variety of filter functions even through DSP 3600 has a limited memory size. Nine different filtering functions are presently implemented in PMU 2101; these include:

(1) A DC-to-5 Hz low-pass filter function with 20 Hz attenuations of 40, 80 and 120 dB. The amount of attentuation is selected on the basis of interference encountered in a particular measurement. The attenuation is selected in real time by a dynamic settling algorithm which releases the measured data as soon as it has settled within prescribed limits, typically five consecutive measurements within one percent of each other.

(2) A DC-to-5 Hz low-pass filter without settling with 120 dB attenuation at 20 Hz. The value of the output is provided upon demand by PMU controller 3100 as often as desired.

(3) A DC-to-5 Hz low-pass filter in which an inphase/quadrature pair is converted to a magnitude-squared value by a square and add operation. Results are provided as demanded by PMU controller 3100.

(4) A DC-to-5 Hz low-pass filter used for detection of asynchronous tones such as dial tone and in-band signaling. This filter program provides the current filter output as often as it is requested by PMU controller 3100.

(5) A 5 Hz low-pass filter with peak detection. The peak value of the signal is provided once on demand by PMU controller 3100.

(6) A broadband filter with mean-squared output using either 10 Hz to 3200 Hz flat weighting or C-message weighting. Filter output is provided by DSP 3600 on demand.

(7) A program which counts the number of samples for which the input signal is above the given threshold and the number of samples for which it is below the same threshold. Counting begins on the first high-to-low transition of the input or on the first low-to-high transition depending on a parameter transmitted by PMU controller 3100. A count is returned on each transition so that rotary dial pulses may be analyzed.

(8) A program which detects the voice-frequency range tone bursts from coin phone totalizers as well as the DC current flowing in the loop associated with the coin phone. An indication is sent to PMU controller 3100 after each tone burst is received. The value of the DC current is returned after the last burst is received. Test timing is also included in this program to identify continuous tones, no tones and test timeout.

(9) A program which performs self-diagnostic testing on DSP 3600, including its internal memory.

FIG. 18 indicates that DSP 3600 comprises basically two circuit elements, namely, digital filter 3601 and memory 3602. Digital filter 3601 is implemented in the illustrative embodiment by a programmable signal processor especially developed for digital filter-type applications requiring rapid multiplications and additions and the capability of mitigating the effects of finite word length arithmetic. This programmable processor, however, has only 1024 addressable locations in memory, which is the memory depicted by element 3602. Digital filter 3601 views this space as ROM and obtains its instructions and data from this ROM space. On the other hand, PMU controller 3100 views memory 3602 as RAM. This allows PMU controller 3100 to store numerous programs in its own ROM (depicted as memory 3150 in FIG. 18), and by selecting one of the stored programs and loading it into DSP memory 3602, PMU controller 3100 can effectively perform any necessary filtering or processing functions. Programs are downloaded from PMU controller 3100 utilizing the address and data portions of bus 31002 and the results of processing operations in filter 3601 are passed back on the data portion of bus 31002. Internal communication between filter 3601 and memory 3602 occurs over bus 36011. Control signals, status bits, enable information, set and reset conditions, and so forth are communicated between PMU controller 3100 and DSP 3600 via bus 31002. Data from measurement processor 3500 (FIG. 17) on multiple lead 35001 and information for processor 3500 on lead 36002 link processor 3500 and DSP 3600. Bus 36001 originating from DSP 3600 carries system reset and enable signals controlling event monitors within DSP 3600.

2.2.3d PMU Controller

PMU controller 3100 is a microcomputer-based system also running under the same operating system (OS) as DCN 140, LTS controller 2000 and port controller 2200. In PMU controller 3100, the tasks are as follows:.

(a) PARALLEL DATA task controls the transmission and reception of messages over parallel-oriented bus 20001 shown in FIG. 11. A message is received by PMU controller 3100 on an interrupt driven, byte-by-byte basis. When a full message has been received, OS runs the PARALLEL DATA task to determine where the buffer memory storing the message is to be sent for processing. The PARALLEL DATA task also formats full buffers for transmission UP to LTS controller 2000. The PARALLEL DATA task is similar to PARALLEL OUTPUT task 11407 of FIG. 7 associated with DCN 140.

(b) ADMINISTRATION task runs several diagnostic functions, including the handling of illegal instruction traps from system malfunctions and periodic software checks on critical, RAM-stored tables. This checking is implemented as a cyclical redundancy check and is performed in lieu of hardware parity checking.

(c) DUMP MEM task arranges for transmission of blocks of memory to LTS controller 2000 upon request or upon detection of an error condition in the circuitry of PMU 2101.

(d) PMU task configures and energizes the circuitry of PMU 2101, collects data and formats the data for transmission UP the hierarchy. The particulars of this task are now discussed with reference to the tests defined in Section 2.2.1c and in view of FIGS. 25 and 26.

Figure 25:
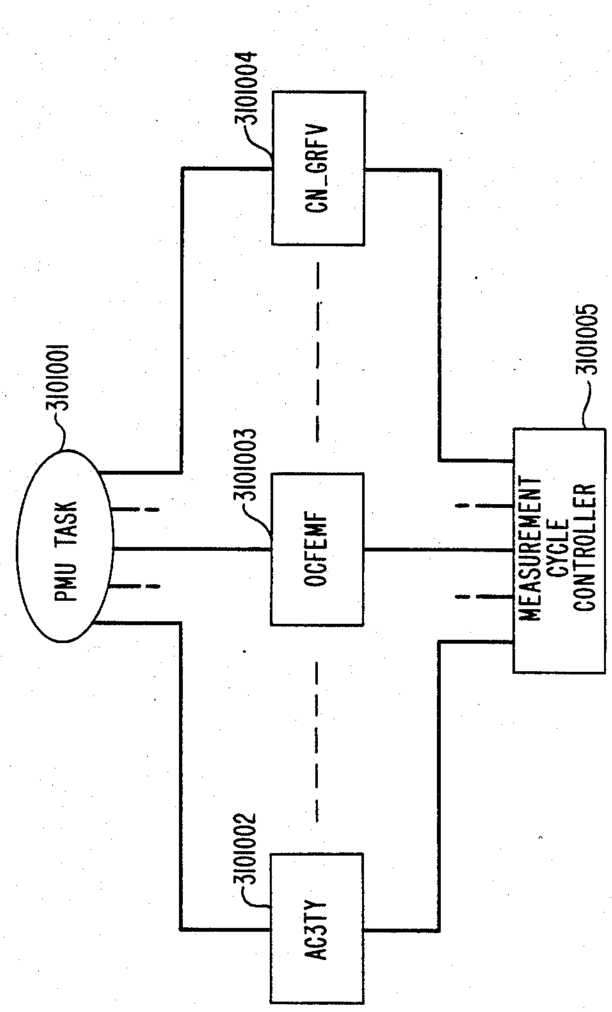
FIG. 25 indicates that the PMU task provides data to specify which of the many possible test requests is to be selected and, accordingly, appropriate parameters are passed to the measurement cycle controller.

The PMU task, represented by element 3101001 in FIG. 25, receives buffer information as transmitted by the PARALLEL DATA task. Entries in the buffer specify which test is to be performed. The data specifies which of the many possible test requests summarized in Section 2.2.1c is to be selected; three such requests, depicted by elements 3101002–3101004 in FIG. 25, include AC3TY, OCFEMF and CN_GRFV. In each case, control is passed to measurement cycle controller 3101005, which is a software routine that causes the same basic functions to be performed each time, regardless of the particular test request. The functions differ only in their handling and formatting of the data returned by DSP 3600.

Figure 26:
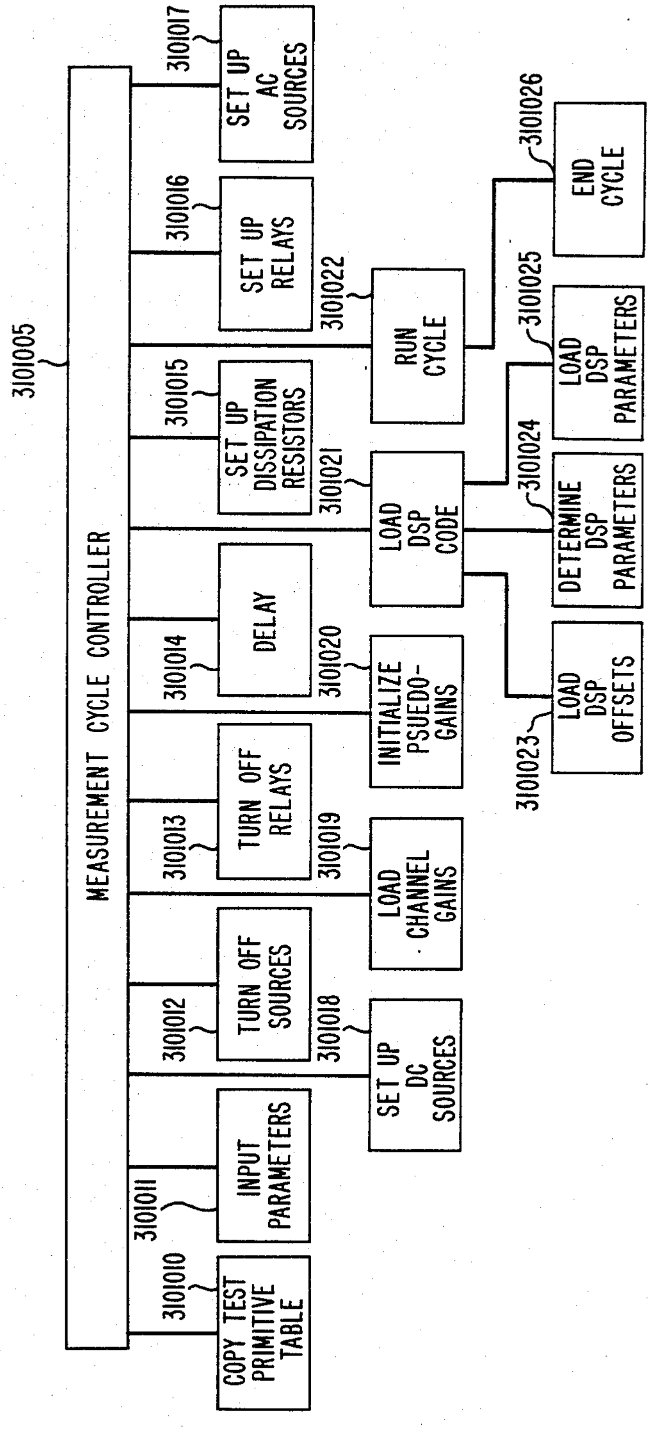
FIG. 26 depicts the sequencing of the measurement cycle controller for each configuration of PMU circuitry.

Measurement cycle controller 3101005 provides direct control of PMU circuitry as depicted in the structure chart of FIG. 26. The software of controller 3101005 operates sequentially from left-to-right and top-to-bottom in FIG. 26. Each test request (3101002-3101004 of FIG. 25) calls this software as many times as is necessary to obtain the required measured currents on the loop under test. For instance, the OCFEMF test request requires cycle controller 3101005 to operate three different times with a different circuit configuration each time. The operation of cycle controller 3101005 for each repetition is set forth in the following with reference to FIG. 26.

First, a so-called primitive table, stored in ROM of PMU controller 3100, is copied into a RAM copyspace via routine 3101010. Each test request is completely specified by its primitive table. Parameters specified in the table include: settings for various system relays that configure, for example, routing of TIP and RING through the apertures of the magnetic current sensing cores; the type of signal to be measured (AC or DC); the DSP filtering algorithm that is to process measured data; and the reference frequency to be used for synchronous demodulation. In fact, approximately forty bytes of memory are needed to completely specify each PMU test request. In addition, a dedicated memory area is established into which variable data parameters specified in the buffer sent from LTS controller 2000 may be stored. These variable parameters typically replace default parameters built into each primitive table. Thus, if the primitive table has been defined to allow modification, routine 3101011 transfers the data from the dedicated memory area and makes the appropriate changes, if any. The AC and DC source generators comprising circuit 3200 are deenergized to guarantee that overloads do not cause PMU failures as the PMU configuration is changed. Likewise, a delay routine is entered after all relays are transferred to a quiescent state to allow for energy dissipation.

Next, in preparation for the application of AC voltage to the loop under test, dissipation resistors within source drivers 3301 and 3302 are selected and applied to preclude voltage-overload failures. Then the entries in the primitive table corresponding to memory-mapped peripherals are sequentially written into memory by routine 3101016; in particular, the writes energize PMU relays to establish the various measurement paths required of the present test request. AC and DC source generators within circuit 3200 are then enabled by the next two routines. The application of the test signal to the loop is now complete and the remaining routines in measurement cycle controller 3101005 focus on collecting the measured data.

The various channels through detector 3400 and measurement controller 3500 utilized in processing detected currents each have different responses to applied signals. At system start-up these responses are measured and stored as "calibrate" values. When a loop is measured, the calibrate values of the channels must be taken into account. The routine labelled 3101019 retrieves the values from memory and copies these factors for the channels into an array where they may be easily referenced in order to adjust the measured signals. In addition, routine 3101020 initializes psuedo-gains which likewise must be accounted for when the final detected current values are calculated.

Next, routine 3101021 downloads the required processing program into DSP 3600. The downloading occurs in three steps. First, after the basic processing program is downloaded, measurement channel offsets are copied into an array from memory for ready reference. The offset correction is similar to the calibrate value adjustment in that offsets will be used to convert actual measurements into corrected measurements. However, offset correction occurs via a subtraction operation whereas calibrate factor adjustment is via multiplication. The second step involves examining the primitive table to determine if any parameters in the basic processing program are to be modified, such as current thresholds. If so, the third step makes the required changes in primitive table values via routine 3101025.

The penultimate routine 3101022 runs the measurement cycle. The sample rate passed to measurement controller 3500 operates a system measurement timer. The rate is determined by a number of factors, including the digital filter to be used in DSP 3600 and the number of channels to be measured. This run cycle continues until the digital filter settles, the test times out or an interrupt occurs. Assuming a successful completion, routine 3101022 collects the measured current data from DSP 3600 and makes required adjustments. Finally, routine 3101026 resets PMU 2101, thereby completing the measurement cycle.

Control of the circuitry of PMU 2101 then passes to the test request routine of FIG. 25 overseeing the test run. Depending upon the stage of operation, reconfiguration may be initiated to collect additional data or the collected data may be transmitted to LTS controller 2000.

As indicated in the above discussion, calibration is an important part of the overall operation of PMU 2101. Besides the three calibration procedures already identified, that is, (a) offset correction on magnetic current sensor cores, (b) gain factor values determined from applying known, high level signals and measuring responses and (c) DC offsets determined from responses without any input signals, one other calibration procedure is utilized. Oftentimes, the precise values of the real and imaginary parts of the loop admittance provide valuable fault diagnosing information. To obtain these values, it is necessary to correct for phase offsets within subsystems 3300, 3400 and 3500. Phase offsets are determined by a three-step process. First, a termination within element 3310 of FIG. 20 having a known phase shift at the frequency of interest is applied across the TIP and RING leads. Then the actual phase shift is measured. By comparing the expected phase shift to the measured phase shift, the phase shift through the various channels may be determined. Digital signal generator 3200 may then compensate for the individual phase shifts by selecting appropriate table values from the $\pm\cos\theta$ tables as the starting points during signal generation.

2.2.4 LTS Circuits for Establishing Loop Connections

To describe the functions of the remaining LTS circuits of FIG. 11 not explicitly referenced or discussed in some detail to this point, a typical sequence of operations involving most of these circuits is described. Variations on the sequencing presented are also identified where appropriate, and others may then be readily identified by those skilled in the art in view of the foregoing discussion. The circuits to be discussed include talk circuits 2301–2306, DDD circuit 2400, ringing distributor 2500, busy/speech detector 2600, trunk dialer 2650, equipment access network 2700, ports 2801–2816, sleeve lead control unit 2950 and tracing tone source 2900. The operations to be discussed indicate how a talk circuit is established between a Maintenance Center administrator and a customer.

Access to the customer's loop through EAN 2700 commences with the transmission of the access request from LTS controller 2000 to port controller 2200, as elaborated upon in the preceding sections, particularly Section 2.2.1a. As a first step in the sequence, port controller 2200 selects, from among the sixteen ports 2801–2816, a free port having a test trunk 9401, . . . , or 9416, and a corresponding sleeve lead 9417, . . . , or 9432, associated with the telephone number of the customer's loop. (Trunk groups in a central office environment are associated with a subset of the set of accessible telephone numbers. Thus, another accessing possibility is that of having a switching arrangement to connect any port to a trunk from the trunk group servicing the desired telephone number. This adds another degree of freedom, but one that is not essential to the immediate discussion.) For the sake of clarity of presentation, it is presumed that port 2801, trunk pair 9401 and sleeve lead 9417 satisfy the request. Assuming also that the selected trunk pair does not exhibit hazardous voltages, the next step is to connect trunk dialer 2650 through EAN 2700 to port 2801. To understand the technique for accomplishing this, reference is made to FIG. 27.

Figure 27:
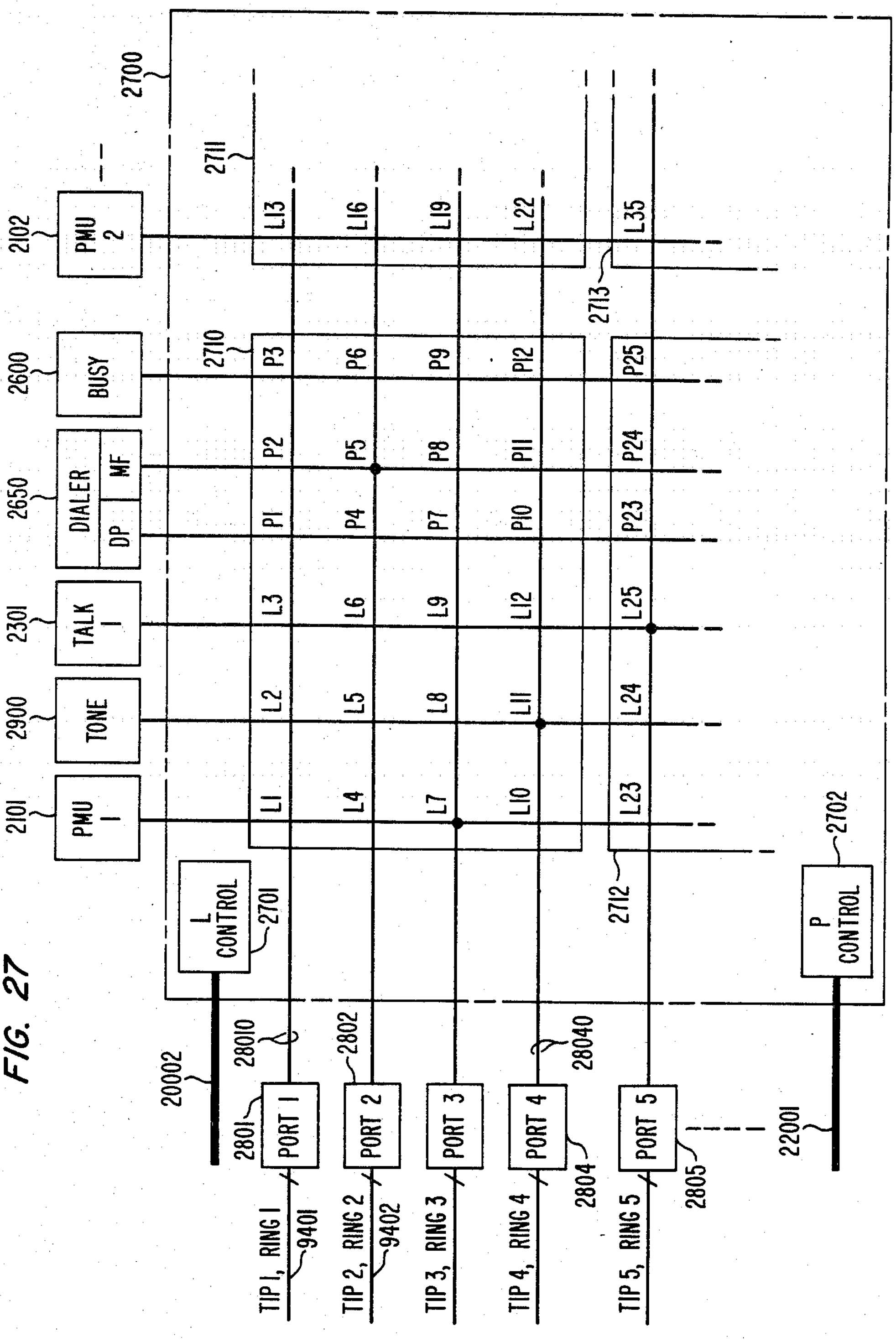
FIG. 27 illustrates the switch matrices comprising the equipment access network of FIG. 17 as well as the arrangement of various access and test circuits of FIG. 17 at the ports of the equipment access network.

As depicted in FIG. 27, EAN 2700 is comprised of an array of 4×6 switch matrices 2710–2713. Focusing on matrix 2710, four horizontal leads 28010, . . . , 28040 originate from ports 2801–2804, respectively; each lead actually represents both the TIP and RING served by the corresponding port. The six vertical leads, also representing a pair of conductors, connect to the following six elements: PMU 2101; tracing tone source 2900; talk circuit 2801; the dial pulsing (DP) portion of trunk dialer 2650; the multifrequency (MF) dialing portion of dialer 2650; and busy/speech detector 2600. The three leftmost vertical leads are controlled by L control section 2701 of EAN 2700, and each lead forms one lead of a unique, switchable crosspoint (L1–L3 for the first vertical lead, L4–L6 for the second, and so forth), the other lead in each case being provided by one of the four horizontal leads. Similarly, P control section 2702 operates crosspoints P1–P12 in matrix 2710. As FIG. 27 depicts, EAN 2700 is modular and may be expanded vertically to include more ports or horizontally to include more elements such as precision measurements units, talk circuits and busy/speech detectors. The main limitation on the expansion characteristics is set by constants fixed within the software design; these constants are derived from memory considerations, timing constraints and throughput rate.

Continuing with the example, it is supposed that dial pulses must be applied to trunk 9401 for proper operation; this information is typically stored in the memory section of port controller 2200. P control section 2702 then closes switch point P1 in matrix 2710 to access the dial pulsing portion of dialer 2650. A signal, typically a low impedance placed metallically across the trunk pair by dialer 2650, notifies the office switch that dialing is planned. The office equipment responds, usually with a TIP-RING reversal, to acknowledge the request and then manipulates the sleeve lead; the type of manipulation depends on the central office type. For instance, with one office type, providing a high sleeve current seizes trunk 9401 and prepares it to accept dial pulses. Concurrent with sleeve lead manipulation, port controller 2200 loads dialer 2650, via bus 22001, with the telephone number upon reception of the TIP-RING reversal; once loaded, dialing commences. At the completion of dialing, another TIP-RING reversal effected by the circuitry of trunk 9401 indicates that the customer's loop is now accessed in a bridging or monitor mode.

Since it is possible that the subscriber is utilizing the loop, crosspoint P2 is opened to disconnect dialer 2650 and crosspoint P3 is closed to attach busy/speech detector 2600. Two basic tests are performed by detector 2600. First, the loop is checked for DC voltage on the TIP and RING. If a loop is found to be DC busy, speech detection is performed by monitoring the line for bursts of energy that are characteristic of speech. The status of the loop is returned to port controller 2200. If it is presumed that the looop is idle, LTS controller 2000 is notified that port access is complete and detector 2600 is disconnected. In addition, trunk parameters determined at system calibration, including trunk type, length and resistance, are returned with the response message.

Since a customer-administrator connection involves a callback mode of operation, an access utilizing an idle talk circuit 2301, . . . , or 2306 is progressing concurrently with port access. LTS controller 2000 commences this access directly via bus 20002. Presuming talk circuit 2301 is the idle talk circuit seized, the DDD dialer circuit 2400 is connected to talk circuit 2301 via channel 20003. Talk circuit 2301 then draws dial tone over one of the DDD pairs comprising cable 23011 by placing a low impedance across the pair. DDD dialer 2400, which was loaded with the callback digits when it was allocated, now dials or outpulses the number of the telephone to be used by the maintenance administrator. When the administrator answers the call, the "0" digit (KEY ZERO) on the multifrequency pad is pushed; in turn, talk circuit 2301 detects the frequencies assigned to the "0" digit and LTS controller 2000 is signalled accordingly. LTS controller 2000 indicates to L control section 2701 that crosspoint L3 is to be closed, thereby interconnecting port 2801 with talk circuit 2301 (presuming loop access is completed).

The customer may now be contacted, and this is accomplished by LTS controller 2000 sending appropriate information to ringing distributor 2500, such as the particular talk circuit that requires ringing and the type of ringing (single party, two-party, and so forth). Ringing is applied, in this case, through talk circuit 2301 by ringing distributor 2500. Customer acknowledgment of the ringing, typically by the receiver going off-hook, trips ringing distributor 2500. Talking battery is supplied to the loop by talk circuit 2301 since a no-test trunk normally does not supply DC to the loop.

At this point in the description, the desired customer-administrator contact has been achieved. To carry the example a few steps further, it may be that the customer is asked to dial a certain digit so that a dial pulse analysis may be effected. The crosspoint L1 would be closed to connect PMU 2101 to port 2801 and crosspoint L3 would be opened for the duration of the test.

If a craftsperson is engaged in loop testing at a field location, it may have the craftsperson that was contacted by the above procedure, rather than a customer. If the craftsperson requires a tracing tone, say for TIP- RING identification, crosspoint L2 is switched and tone source 2900 is now connected to the loop. Tone is applied from source 2900, and not PMU 2101, since a tone usually is required for an extended duration and it is inefficient to relegate PMU 2101 to a low-level operation.

Once the tone is applied, the ACCESS/TEST task of port controller 2200 continues to monitor the status of the loop. When the craftsperson locates the loop having the tone applied, a disconnect signal can be generated by a TIP-RING shorting operation performed by that craftsperson. The monitoring task detects this state change and sends a "status changed" message UP the hierarchy. However, the tone is maintained until another message is received to either DROP the connection or until a timeout occurs. The status changed message notifies the maintenance administrator of the on-going field activity and alerts the administrator that other test activity may be forthcoming.

2.3 Front End (FE) System

The description to this point has focused, primarily, on the capabilities of DCN 140 and LTS's 160,161 within the MLT system framework. One important subsystem, namely, the FE system, including FE computers 220,221 and user interface devices 230,231, requires elaboration. This aspect of the description focuses on how to access and utilize the system capabilities described in the foregoing sections.

The MLT system must provide operational data to at least two types of users: Repair Service Attendants (RSA), who are in contact with the customers, and Repair Service Bureau (RSB) personnel, who analyze troubles and dispatch repair craft. The needs of these two users are similar, but not identical.

The RSA requires access and test requests with rapid responses and a test summary that provides insight to the reported trouble in a global way. For example, is a trouble confirmed? Is it a central office trouble, a loop trouble, a station trouble? The test should be performed automatically when the trouble report is taken and the results are needed promptly so that an appropriate repair commitment may be provided to the customer.

The RSB needs detailed test results and the ability to perform tests on demand, sometimes while the repair craft is at the location of the trouble. Thus, the RSB needs a menu of tests, some designed to duplicate the tests performed when the trouble was reported, and some tailored to provide data on only a subset of all possible problems.

For both users, it is necessary to interpret the test results in view of recorded office, loop and station or customer equipment, as extracted from storage computer 200, and to be somewhat tolerant of incorrect or absent record data.

These diverse user requirements are satisfied by FE software that can be divided into basically three categories: a terminal interface process; a test interface process; and a test supervision and control process. These processes appear in each FE computer 220,221 and are partitioned so that MLT related (DOWN) software communicates with data base (UP) software across an interface boundary, as illustrated pictorially in FIG. 1.

The terminal interface process receives test transactions from user terminals 230,231, performs data validation, formats processing requests and forwards those requests to the test interface process on the FE computer actually containing the particular line record data. If the line record data is not on the same FE computer the user is connected to, the request is forwarded via high speed parallel communications link 210 to the appropriate FE computer. This arrangement is important because it enables organization of loop maintenance operations in a manner that is reasonably independent of how the FE computers are organized.

The test interface process obtains the line record data from the FE computer storage. The line record data and the original request data are forwarded to the test supervision and control process on the FE computer chosen to perform the test, that is, either the FE now containing the line record data or the FE to which the user is connected. When the requested tests and analysis are completed, the results are forwarded to the terminal interface process where they are formatted and presented to the user.

In order to enable the user to input data and receive output in a uniform manner, several types of so-called masks may be called into view of user device 230,231, typically a cathode ray tube (CRT) display. The display below is an empty Trouble Verification (TV) mask which is used by repair personnel for all normal testing needs in an interactive testing mode. The asterisks indicate where a user is to make entries.

| | | | | | | |
|---|---|---|---|---|---|---|
| TV | EC* | PRTR* | REQ BY* | | CB* | date,time |
| | | | | | SW: | OE: |
| TN* | | L#* | CMT* | CA* | | CO: |
| REQ* | | TEMP (F.)* | | PR* | OVER* | OSP: |
| | | | | | | TERM: |

The fields have the following meanings:

EC—employee code.

PRTR—results of a TV request will also be sent to the designated printer.

REQ BY—(Requested by) identifier for printer output.

CB—(Callback) normally a 10 digit telephone number of the telephone accessible to the CRT user. Many of the TV requests (for instance, RING, TALK and so forth to be set forth below) require a connection between this callback number and the customer's telephone equipment number; pressing KEY-ZERO ("0" on the keypad) acknowledges the answer to the callback.

TN—(Telephone Number) normally the entry in the TN field is the number of the equipment terminating the loop for which no-test access is required. However, it can also be used to specify the particular MDF trunk group for MDF access.

REQ—(Request) any valid TV request is entered into this field; if this field is blank, the last entry is used as the current one.

CA—(Cable) an optional entry that is useful for documenting the mask. An entry does not change the line record information. This field is typically employed whenever it is believed the line record information is incomplete or inaccurate and a remainder to this effect is desired, particularly on a display directed to the printer.

PR—(Pair) a field serving the same function as CA.

L#—(Line number) this entry refers to a line in the status section of the TV mask (discussed below). For example, if a test was run on telephone number 362-5111, this number might be displayed as line 1 in the status section. To test 362-5111 again, a "1" may be entered in this field instead of typing the full phone number. A L# always overrides a TN entry.

CMT—(Comment) seven alphanumeric characters may be entered for display on the status section of the mask associated with the telephone number. A typical entry might be the repairperson's name that is working on a loop fault.

TEMP(F)—(Temperature-Fahrenheit) an entry is made here when resistive fault locating with LOC1 and LOC2 requests described below.

OVER—(Override) certain line record data can be ignored during testing, as follows: C overrides CO equipment; O overrides outside plant (OSP) equipment; T overrides termination (TERM) equipment; P overrides service protection (SP) records; Y overrides all records. Moreover, there is the possibility of substituting equipment for CO, OSP and TERM line record data. Substitution is accomplished by entering one of the following in OVER field: C#, O# or T#. For example, an "054" in the OVER field indicates an outside plant repeater (specifically an E6 repeater) is placed at the CO end of the loop. These override options only temporarily change the line record data for a single request; no permanent alteration occurs.

After the fields are filled with the appropriate entries, the TV request mask is transmitted, that is, sent to the associated FE computer for processing. For a request that keeps access to a subscriber loop, the following information is returned.

1. User entry area—The telephone number remains in the TN area, and all others are blank.

2. A line record area—The extracted line record data is summarized on the display. The line record information is entered into the areas shown by SW, OE, CO, OSP and TERM in the TV mask displayed above, presuming a 10 digit number in the TN field. The CO, OSP and TERM fields have been described above with respect to OVER. SW (Switch) refers to the CO switching equipment type. The possibilities include: SXS (Step-by-step); XBAR-1 and XBAR-5 (Crossbar offices); ESS-1, ESS-2, ESS-3, ESS-5 (Electronic switching offices); PANEL; and DMS10 (Digital switch). OE (Originating equipment) refers to the location of the subscriber loop at the switch.

The entries in the CO, OSP and TERM areas are especially important because the equipment they represent influence the outcome of the MLT system tests. Whenever a test is made on a line with special equipment on it, that equipment is taken into account when analyzing results. For example, if a test is effected on a loop that has a Loop Signaling Extender, a DC resistance TIP-to-RING of 90K ohms or higher is expected. Normally, a value of resistance this low would indicate a TIP-RING short, and this would be reported to the user via a results section (described below). In this situation, however, the message reports a good loop given the special equipment. The entry LOOP SIG EXTENDER is entered in the CO area to explain why the DC resistance in the detailed results section is low. Because of this capability, the MLT system algorithms are considered to be adaptive in nature in that test signatures of numerous equipment types and locations are accounted for during testing and presentation of output information to the user.

3. Status section—This section provides new data on the display and it appears only if at least one telephone number is presently being accessed. The information is shown as a numbered line under these headings:

TN MDF STATUS CB TIME FR CA/PR CMT The headings have the following definitions:

TN—(Telephone Number) as filled-in by the user in making the request.

MDF—(Main Distributing Frame) upon a MDF access to a trunk, the number identifying the trunk to the frame attendant is returned.

STATUS—some TV requests remain on a loop for a prolonged period, but do not require a callback path. They stay on the loop for a predetermined period or until removed by the user. One of the following entries is returned: TONE or TONE+ if that request was made; 1SIDED or 2SIDED if a LOC request was entered and the bad pair has a one-sided or two-sided resistive fault, respectively; GOODPR or REFPR if a request of the type LOCGP is made and a good pair or marginally good pair is located, respectively; (blank) for all other TV requests.

CB—(Callback) on a callback between a subscriber's telephone number and the administrator or user's test position, a reminder is returned to indicate a long-term connection is maintained and the request which established the connection. For instance, such entries as TALK for a TALK or RING request or MON for a MON request or a RING request to a busy loop are possible entries.

TIME—the number of minutes elapsed since loop access is displayed, or if TONE is requested, the number of minutes since the tone has been applied is shown.

FR—(Frame) the telephone number of the frame serving the number placed in the TV area.

CA/PR—(Cable/Pair) reflects information entered by the user prior to transmission of TV request.

CMT—(Comment) the comment entered on the last request to this status line is displayed.

The status section can hold up to five accesses at a time. Dropping of a loop access causes an automatic renumbering of status lines following the dropped loop.

4. Results section—The results for the particular TV request are displayed. The testing accomplished by the MLT system varies as a function of the request. The requests may be classified and briefly described as follows:

(a) Information Requests
- HELP—Provides a list of all TV requests
- (REQ)?—Provides a description of whatever request is substituted for REQ
- INFO—Provides general information such as frame phone numbers, assignment phone numbers, and so forth TR(#)—Permits transfer of work between user devices (b) MDF Requests
- MDF—Access an MDF trunk for subsequent requests
- MDF(GR)—Access a trunk from a certain MDF trunk group
- MDF(#)—Access a specific MDF trunk (c) Test Requests
- FULL—Performs a standard test series on inside and outside portions of the loop
- LOOP—Performs the standard test series on the outside portion only
- CO—Performs tests on the Central Office
- QUICK—Performs a quick test series that measures AC and DC characteristics and loop length
- RINGER—Identifies the number and configuration of standard ringers on the loop SOAK—Identifies swinging resistance conditions (d) Callback Requests RING—Ring a line R(#)—Ring a specific party on a multiparty line T—Talk over the subscriber's loop MON—Monitor a subscriber's loop CALL—Make a call using the subscriber's line circuit (e) Subscriber Interaction Requests DIAL—Test a subscriber's rotary dial REV—Identify in-band signaling instrument for polarity reversals TT—Test subscriber's in-band signaling pad (f) Craft Interaction Requests TONE—Places a metallic tone on a loop for pair identification TONE+—Same as TONE with increased amplitude tone TONECA—Places a tone longitudinally on loop LOOK—Monitor for an interntional fault LOCATE—Initiates the resistive fault measurement strategy; recommends single- or double-sided procedure LOC1—Determines distance to a single-sided fault LOC2—Determines distance to a double-sided fault LOCGP—Verifies the condition of a good pair for double-sided fault detection (g) Drop/Keep Access Requests X—Drop all testing equipment from loop XCB—Drop a callback path XTONE—Drop a tone from a loop KEEP—Extend timeout of a no-test or MDF trunk access (h) Coin Requests COIN—Perform a FULL test series on a coin loop CSET—Check totalizer and relay in coin set CHOME—Home coin totalizer CCOL—Operate coin relay to collect coins CRET—Operate coin relay to return coins LRM—Measure loop resistance of coin loop GRM—Measure ground resistance of coin loop Rather than describing each of the requests in detail, one request is selected as exemplary and the user-request interaction is discussed below. Applicability of this description to the other TV requests, particularly in view of the high-level language program listings presented later, will be apparent to one possessing ordinary skill in the art.

The particular request chosen to exemplify the TV requests is the FULL test request. This test request provides a series of tests to comprehensively analyze the entire telephone loop of a particular subscriber. It provides detailed results and a summary of the condition of both the inside (central office) and outside portions of the loop under test. The following tests, briefly described in Section 2.2.1c, are completed: OCFEMF, DC3TY, AC3TY, BAL, THERM, DTA, SOAK, RCNT and ROH_TEST.

The display for the FULL request including the status and results section, has the following format:

| | | | | | | |
|---|---|---|---|---|---|---|
| TV EC PRTR | | REQ BY | CB | date,time | | |
| TN | MDF | STATUS | CB TIME | FR | CA/PR | CMT |
| 1. 9995559898 | | | | 0 | 555-7432 | 534-7611 |
| TN 9995559898 | | | SW:SXS | OE:8829-128 | | |
| REQ L# CMT | | CA | | CO: | | |
| TEMP(F.) | | PR | | OSP: | | |
| FULL | | | | TERM: SIN. PARTY | | |

-continued

| | | | | | | |
|---|---|---|---|---|---|---|
| VER. 22: HARD SHORT T-R | | | | | | |
| CRAFT: DC SIG. | | MLT:DC SIG. | | AC SIG. | | |
| KOHMS | VOLTS | KOHMS | VOLTS | KOHMS | | |
| 7 | T-R | 7.76 | T-R | 10 | T-R | |
| 1750 | 0 T-G | 3500 | 0 T-G | 550 | T-R | |
| 1750 | 0 R-G | 3500 | 0 R-G | 560 | R-G | |
| CENTRAL OFFICE | | | | | | |
| LINE CKT | OK | | | | | |
| DIAL TONE | OK | | | | | |

The newly appended areas form the results section. In this section, it is indicated that there is a short on the loop. This conclusion is presented with the aid of a VER (verification) code number (22 is this case) and the summary message HARD SHORT. The MLT system has numerous VER codes and summary messages available for selection and display to help in diagnosing any trouble. Besides the brief summary area, a detailed results area displays all the test results. Here, a low T-R DC resistance value of about 7 kohms caused the HARD SHORT diagnosis. The T-G and R-G DC resistance values are high so there is no ground condition. The AC signature is typical of a standard telephone providing the end-of-line termination, so no fault condition is detected by the AC portion of the test. All DC and AC voltages are zero indicating that there is not a cross with another voltage source. Finally, the central office equipment is not faulted. No loop length, balance or ringer information is displayed since accurate results cannot be produced for a shorted line (or other faults which mask the tests). If these values were displayed, they would appear in the area to the right of the CENTRAL OFFICE area.

3. MLT CIRCUITRY AND PROGRAMS

3.1 DCN Implementation

3.1.1 Circuitry

Figure 28:
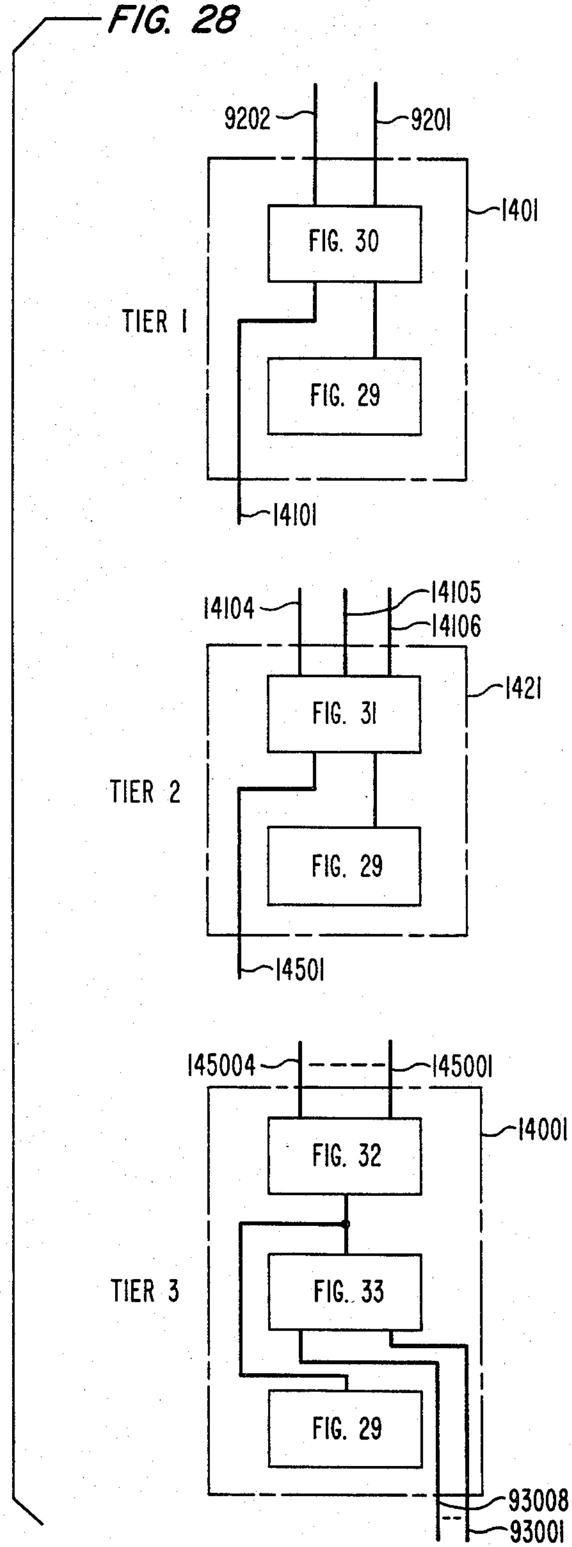
FIG. 28 indicates that: a tier 1 device in the DCN is composed of the circuitry depicted in FIGS. 29 and 30; a tier 2 interface is formed from the circuitry of FIGS. 29 and 30; and a tier 3 circuit comprises the circuitry of FIGS. 29, 32 and 33.
Figure 29:
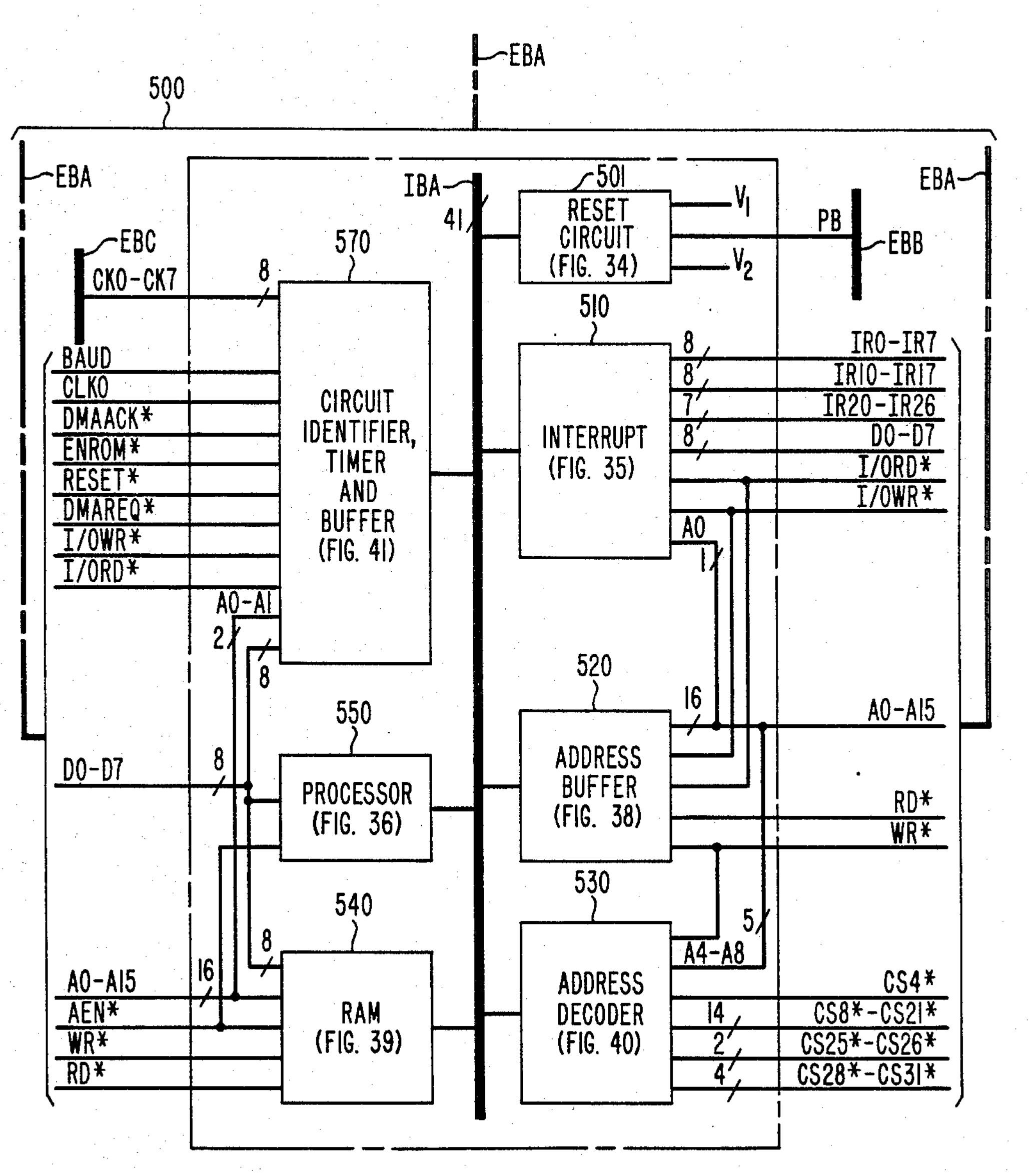
FIG. 29 is a block diagram representation of the CPU circuitry utilized by the three tiers of the DCN.
Figure 30:
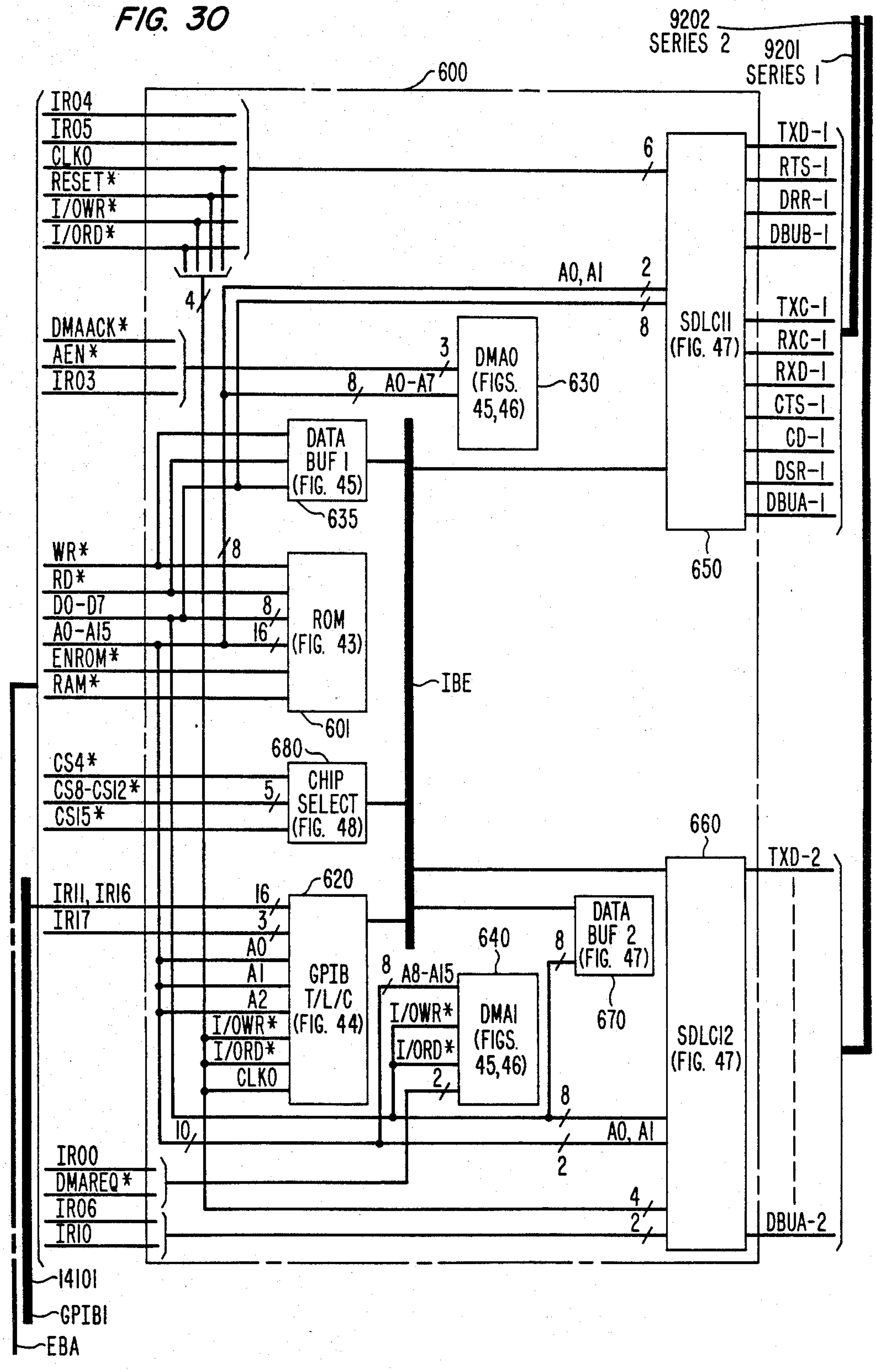
FIG. 30 is a block diagram illustration of the serial-input, parallel-output communication circuitry of a tier 1 device.

With reference to FIG. 28, tier 1 device 1401 (FIG. 3), which is also representative of devices 1402–1412, comprises basically two networks, namely, the CPU circuitry of FIG. 29 and the I/O circuitry of FIG. 30. In fact, as indicated by the block diagrams relating to tier 2 and tier 3 in FIG. 28, the CPU circuitry of FIG. 29 is general purpose microcomputer circuitry used by all three tiers of DCN 140.

Referring now to FIG. 29, CPU 500 is composed of: reset circuit 501; interrupt circuit 510 having 24 vectored priority interrupts; address buffer 520; address decoder 530 providing 32 decoded chip-select signals; RAM 540 providing 16 Kbytes of static memory; processor 550 containing the microcomputer; and system timer, buffer and circuit identifier 570. Illustrative embodiments of these circuits as well as their interconnections will be described below.

As a preliminary, it is important to note that the bus designated IBA is an internal bus having paths that both originate from and terminate on circuits comprising FIG. 29. On the other hand, a bus prefaced with an 'EB', for example, bus EBA, is a bus having path originations or terminations external to the circuits of FIG. 29. In addition, a signal in capital letters followed by an asterisk (e.g., RESET1*) indicates that a low TTL level activates the corresponding function.

Figure 34:
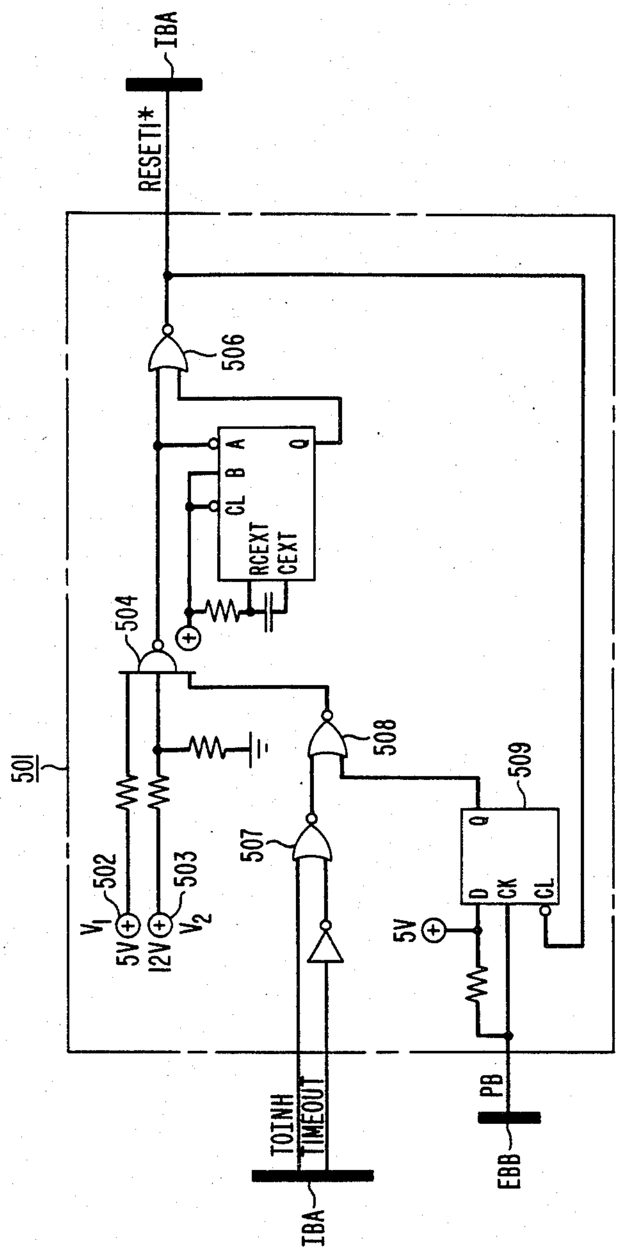
FIGS. 34 through 36 and 38 through 41 are schematics of the various subsystems comprising the CPU circuit of FIG. 29 and include, respectively: the reset circuitry; the interrupt structure, the microcomputer-based processor; adress buffer; random access memory; address decoder; and timer, buffer and circuitry identifier arrangements.

The first circuit considered is reset circuit 501; its circuit details are shown in FIG. 34. Reset circuit 501 disables, via RESET1* lead, processor 550 until DC supplies 502 and 503 are within operating limits; supply levels are sensed by the cascade combination of NAND circuit 504, one-shot multivibrator 505 and NOR gate 506. Once the voltage conditions are met, one-shot 505 maintains the disable condition for an additional 5 to 10 sec. interval before allowing an enable condition. Processor 550 is then disabled upon occurrence of: (i) loss of supplies 502 or 503; (ii) a manually generated reset signal transmitted by D flip-flop 509 and NOR gate 508 from the PB* lead, or (iii) a signal on the TIMEOUT lead, propagated by NOR gates 507 and 508, indicating, for example, a hardware failure or a software loop. The origin of the TIMEOUT inhibit (TOINH) feeding gate 507 is discussed below.

Figure 35:
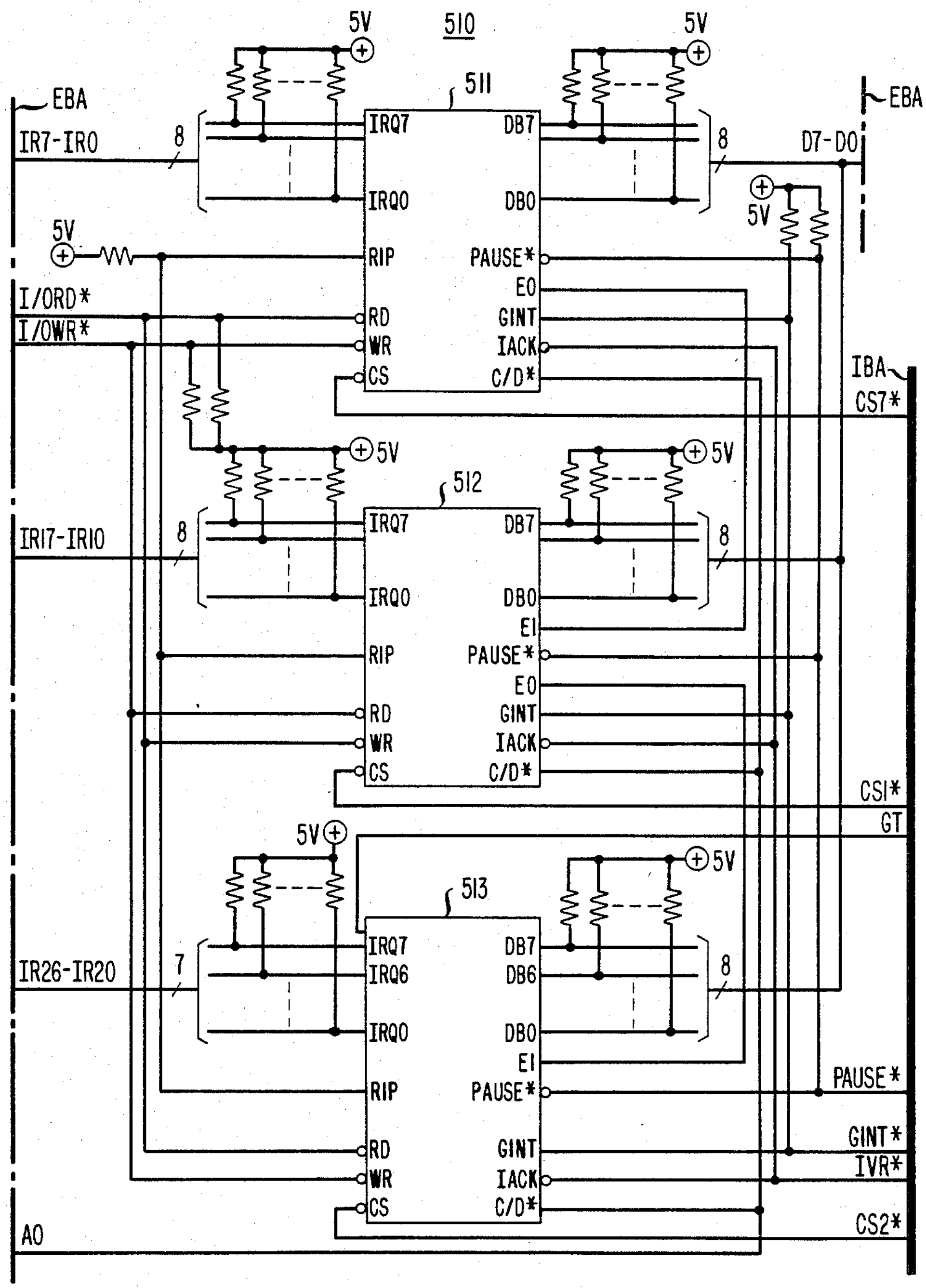

The circuitry of interrupt controller 510 is shown in FIG. 35. Three Advanced Micro Devices AM9519A priority interrupt controllers (PIC) 511–513, each of which provides eight interrupts, form the basis of the implementation. Each controller is programmed via the I/ORD* and I/OWR* leads as well as CS7*, CS1* and CS2*, respectively. When one or more interrupt requests IRO–IR7, IR10–IR17 or IR20–IR26 appear at the inputs to one or more PIC's, the GINT* signal is pulled low, requesting an interrupt from processor 550. When processor 550 acknowledges the interrupt, it issues a read from a predetermined memory location which causes the IVR* lead to be pulled low. In response to IVR*, each PIC holds its PAUSE* lead low for up to three cycles to determine which PIC has the highest priority. Finally, the PIC that services the highest priority interrupt will output the interrupt vector byte, on leads D0–D7, and release the PAUSE* lead.

Figure 36:
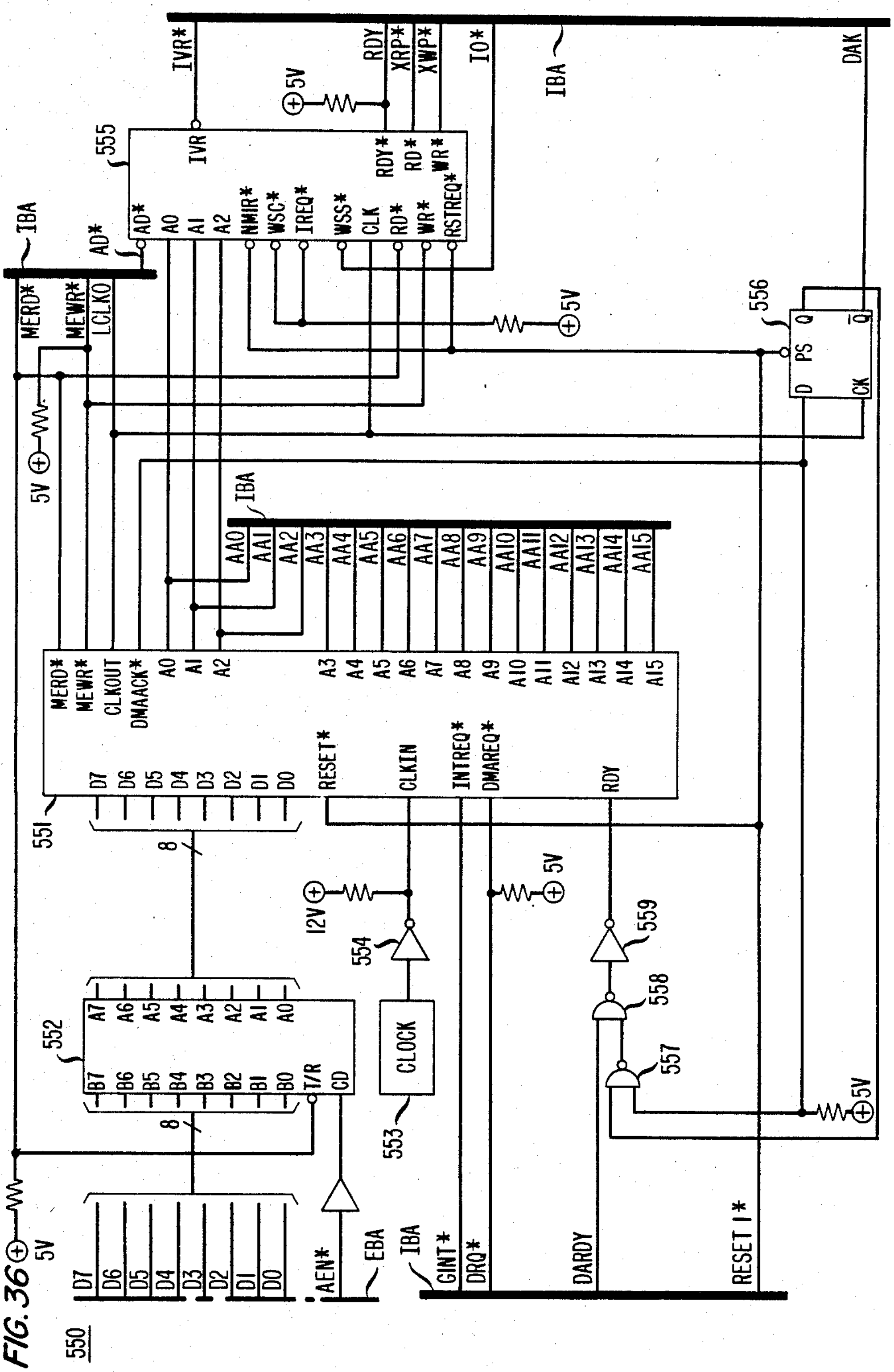

Processor 550, depicted in FIG. 36, comprises: microprocessor device 551, with its associated clock 553 and timing generator device 555; data buffer 552; and RDY (ready) line circuit incorporating devices 556–559.

Microprocessor 551 is, in the preferred embodiment, a BELLMAC-8 microprocessor furnished by the Western Electric Company. (BELLMAC is a trademark of the Western Electric Company). Device 551 is described basically in the article entitled "MAC-8: A Microprocessor For Telecommunications Applications", *The Western Electric Engineer,* at page 41 et seg., July 1977 by Herbert H. Winfield. From this article, the basic architecture and operational characteristics of device 551 may be deduced.

Figure 37:
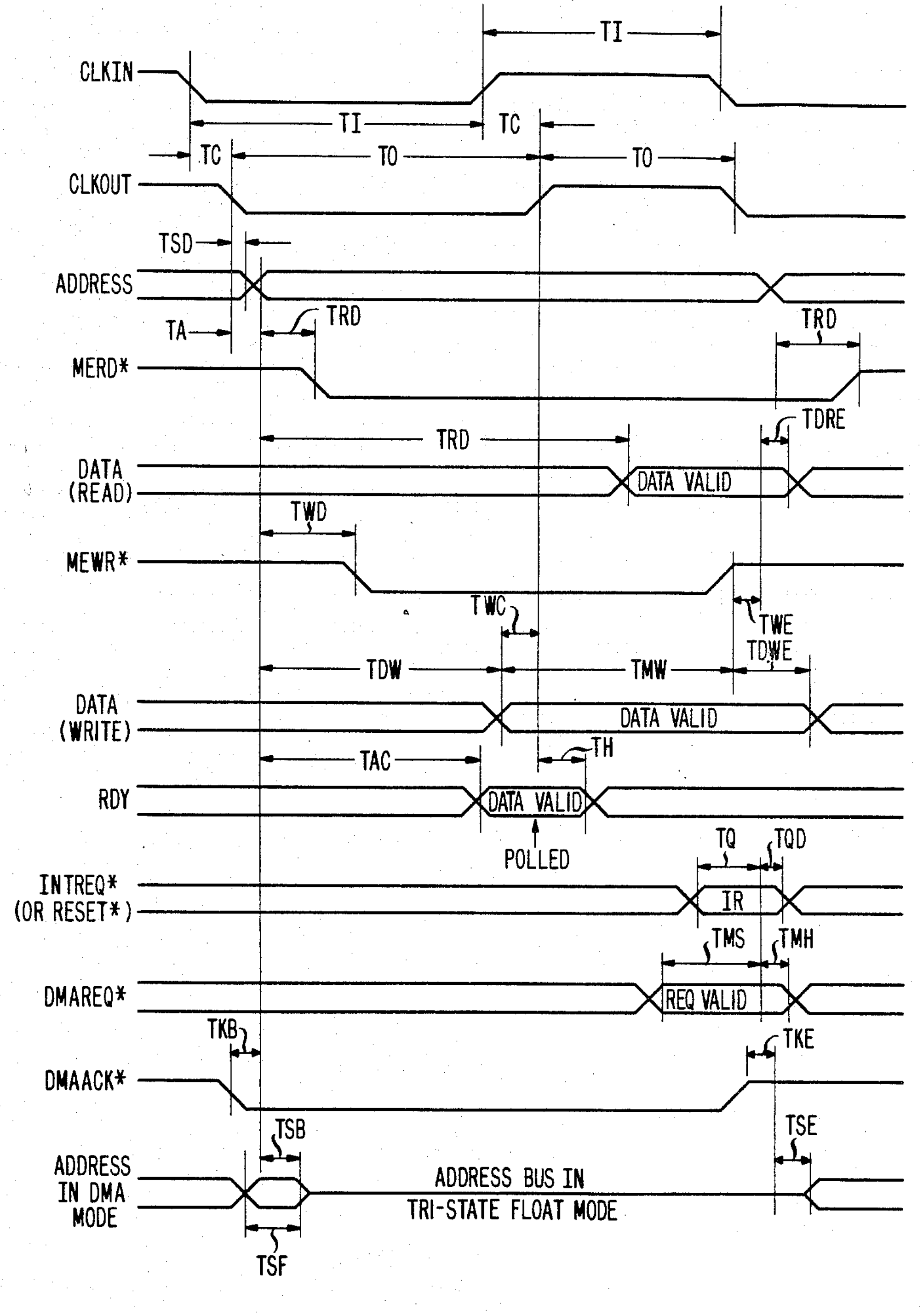
FIG. 37 is a timing diagram indicating the levels of the ports of the microcomputer relative to the input clock.

For instance, it is evident that microprocessor 551 is a 40-pin device having an 8-bit data bus and a 16-bit address bus so the addressable memory space is 64K bytes, that RAM and ROM are provided externally and that a portion of RAM contains user-defined registers. Moreover, device 551 comprises five major circuit blocks: an address arithmetic unit; an arithmetic logic unit; an arithmetic unit control array; an instruction control logic array; and an internal register array having a program counter, a stack pointer and a condition register. Other device details necessary to teach one skilled in the art the subject matter of the present invention will be provided as the description proceeds. To this end, the following describes the function of and timing on the externally accessible ports depicted in FIG. 36 for device 551:

(1) A0–A15 (Input/Output 3-State Address Bus)—For a typical bus loading of 20 pf, the address is valid 60 ns after the start of each cycle. This is depicted in FIG. 37 as time TA on the line labeled ADDRESS; the clock cycle is started when the CLKOUT signal makes a high-to-low transition.

(2) CLKIN, CLKOUT—Device 551 utilizes either an internal clock generator or an external clock applied to the CLKIN port. CLKOUT provides a clock output signal corresponding to CLKIN for external device timing. At the highest operating rate, the time labeled TI on the CLKIN line is about 250 ns; correspondingly, time TO of CLKOUT ranges between (TI+10) ns and (TI+110) ns. The delay between the clocks, shown as TC, does not exceed about 200 ns. Clock 553 in FIG. 36 provides a 2 MHz square-wave TTL level signal which is converted to the level required by CLKIN of device 551 via inverter 554 and its associated pull-up resistor.

(3) D0–D7 (Input/Output 3-State Data Bus)—This 8-bit bus is used for memory or I/O transfers. The MERD* (memory read), MEWR* (memory write) and RDY (data ready) ports control such transfers. Data bits on the external bus EBA, which are buffered by buffer transceiver 552, an 8304 furnished by National Semiconductor, are strobed into an internal latch at the end of a read cycle. In a write cycle, the bus data is valid at mid-cycle. The RDY signal must be at a high logic level when checked at mid-cycle for a data transfer to occur on a MERD* or MEWR* operation. The time labeled TRD on the line shown as MERD* in FIG. 37 represents the maximum delay time in read cycle transitions; this is typically 85 ns. A similar time for MEWR* is shown as time interval TWD on the MEWR* diagram; TWD ranges between about 50 and 220 ns. The time period designated TDR on the DATA (READ) line indicates the time allocated for an external memory access to prepare the data for a read operation and is typically (2TI−100) ns. Similarly, the time shown as TDN on the DATA (WRITE) line indicates the delay to stabilize data for a write operation and this time is not in excess of 235 ns. The time available for an external memory write is shown as TMW and this period is always greater than (2TI−290) ns. The interval shown as TWC depicts the time between when CLKOUT goes high and the data is valid for a write operation; this interval is always positive. Three trailing-edge time intervals, namely, TDRE, TWE and TDWE, associated with DATA (READ), MEWR* and DATA (WRITE), respectively, have the following specifications: (i) TDRE≧0 ns; (ii) 5 ns≦TWE≦125 ns; and (iii) TDWE≧15 ns. Regarding the RDY line of FIG. 37, the time TAC, denoting the time allowed for a data ready input, is never less than (TI−100) ns, and the time shown as TH, denoted the hold time after CLKOUT goes high, is always positive.

With respect to the RDY port, this port is polled at mid-cycle. If the signal supplied by the answering device is ready for data transfer on a MERD* or MEWR* operation, indicated by a high logic level, the MERD* or MEWR* pulse terminates at the end of the cycle. On the other hand, if RDY is low, the MWRD* or MEWR* signal remains active until the next mid-cycle check when the process is repeated.

(4) INTREQ*—A low logic level signal input at this port indicates that an external device is requesting an interrupt. The INTREQ* port is polled during the last clock cycle of each instruction cycle. The request is accepted whenever the interrupt enable is set. To acknowledge the interrupt, the interrupt enable is cleared, certain registers are saved, and memory location 0×FFFF is addressed. Then the data byte 0×dd, which the interrupting device supplies, is read; this byte is used to form the interrupt vector 0×00dd pointing to the low (0 through 255) bytes in memory. Referring now to FIG. 37, the time interval TQ on the line labeled INTREQ* indicates the interrupt setup time, which may not exceed 80 ns. The hold time TQH depicted on the same line is a minimum of 200 ns.

The RESET* request has a pulse shape and time durations similar to that required for an INTREQ*. A low level causes device 551 to be reset. A RESET* request is acknowledged by a request for a read of data at address 0×FFFF. After clearing various internal counters and clearing the RESET* request, instruction execution starts at location 0×0000.

(5) DMAREQ* and DMAACK*—An active DMAREQ* lead indicates that an external device requires the data bus for the DMA operation. The DMAREQ* port is polled at the end of each clock cycle to determine if an active state has been established. If the port is low and RDY is high, that is, device 551 is not in the so-called wait state, then DMAACK* becomes active at the beginning of the next internal cycle. This acknowledgement passes master bus control to the requesting device and the address bus, data bus and control leads are raised to the high-impedance tri-state mode. Again with reference to FIG. 37, the times denoted TMS and TMH on the line labeled DMAREQ* indicated the request setup and hold times and are such that TMS≦200 ns and TMH is nonnegative. In addition, the time periods called TKB and TKE on the DMAACK* line represent on and off acknowledge delays, respectively. Both are less than about 100 ns. Finally, the four time durations designated TSD (on the ADDRESS line), TSB, TSE and TSF represent, respectively; the transition time between CLKOUT and low ADDRESS (TSD≧0); ADDRESS bus delay to achieve off and on low-impedance modes (TSB≦160 ns and TSE≦160 ns); and beginning of float or high impedance mode on ADDRESS bus (TSF≧0 ns).

The above information about signals required by or produced by device 551 at its ports is now incorporated into the description of the circuitry of FIG. 36. In particular, timing generator 555, a 129CY device furnished by the Western Electric Company, provides several support functions for device 551, including: wait-state generation; provisioning of the RDY lead so that it remains active during a system reset; generation of the peripherical control signals I/ORD* and I/OWR*; and decoding of the interrupt-acknowledge signal IVR*. Device 555 permits device 551 of the preferred embodiment to be used with a variety of other commercially available I/O devices which typically are not adapted to utilize the raw signals from the BELLMAC-8 microprocessor.

As indicated earlier, the RDY signal causes device 551 to go into a wait state when low. There are three events which require wait states, namely, interrupt acknowledge cycles, peripheral I/O cycles and the first memory cycle after a DMA transfer. The wait state during interrupt acknowledge occurs when PIC's 511–513 pull down their PAUSE* leads. This signal is propagated through gate arrangement 538 (FIG. 40) to NAND gate 558 and inverter 557 to the RDY port. Gate arrangement 538 of FIG. 40 prevents PIC's 511–513 from causing a wait-state during reset. (Moreover, gate arrangement 537 and D flip-flop 536 of FIG. 40 insure a wait-state does not occur until software initialization generates a write (WR*) to chip-select location 27 (CS27*)).

The wait state during peripheral I/O is generated whenever timing generator 555 detects an IO* signal at its WSS* port. Its RDY port is asserted low and, after inversion, is also propagated through gate arrangement 538 of FIG. 40.

The wait state during the first cycle after a DMA transfer is provided by a pulse from D flip-flop 556 and NAND gate 557 as a result of a DMAACK* acknowledge from microcomputer 551 of FIG. 36.

Focusing now on the signal provided to the RESET* port of device 551, a processor reset occurs whenever the RESET1* signal from reset circuit 501 is received. During reset, with reference to FIG. 34, TIMEOUT is disabled via the TOINH lead supplied to NOR gate 507. The signal on TOINH is generated by D flip-flop 536 of FIG. 40. A write (WR*) to the location associated with CS27* will enable TIMEOUT, and this write should be performed after PIC's 511–513 and programmable interval timer 527 of FIG. 41 have been initialized.

Figure 38:
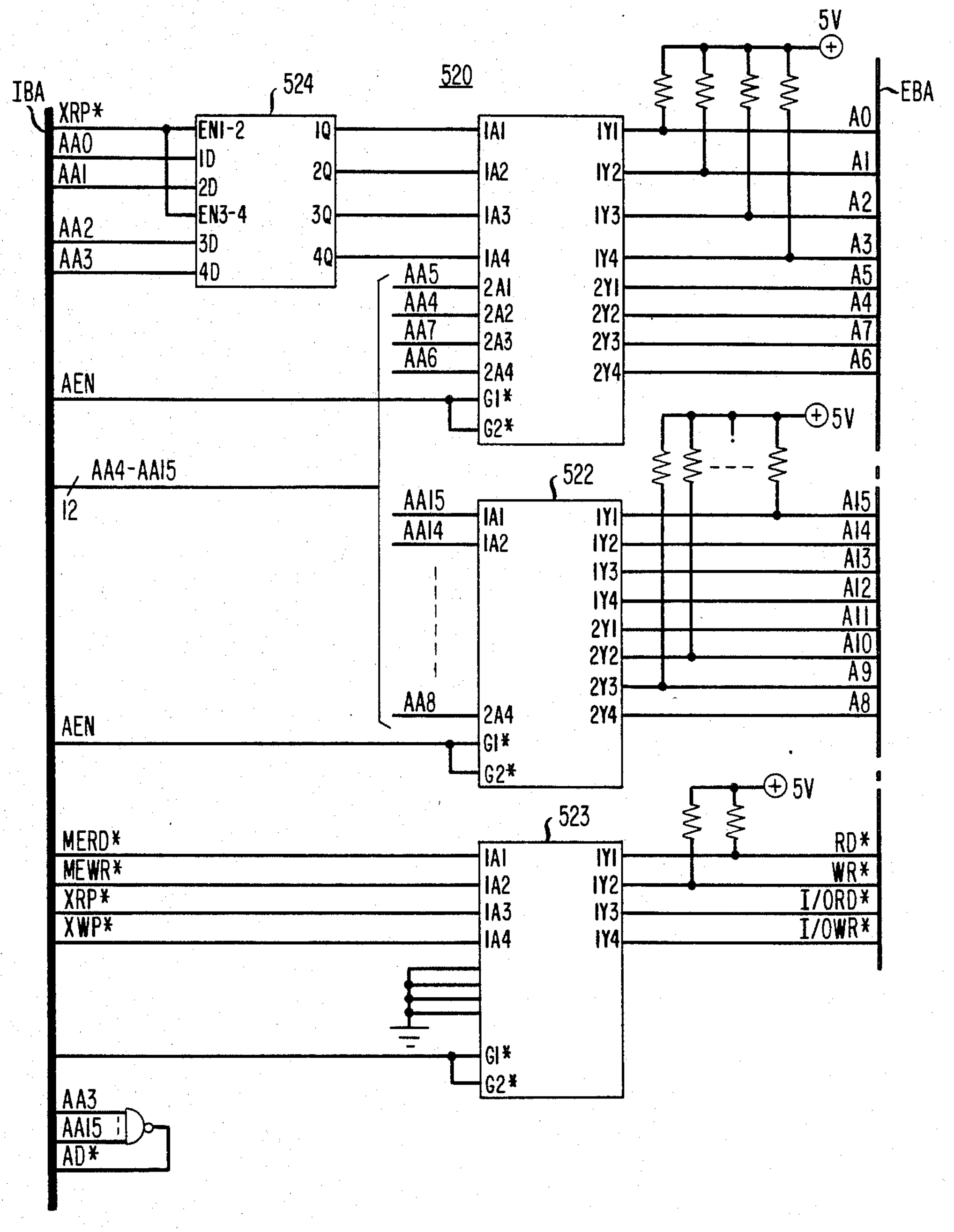

With reference to address buffer 520 of FIG. 38, buffering is provided by line drivers/receivers 521 and 522, type S244 devices furnished by Texas Instruments. Address signals appearing on leads A0–A3 are latched in bistable latch 524, a LS75 device supplied by Texas Instruments. Latching is necessary to insure low address leads remain stable at the end of the read cycle so as to insure compatibility with various peripheral devices. The address, data and control buffers are disabled during DMA by the AEN signal so external peripherals can assert the signals needed for DMA. The control signals RD*, WR*, I/ORD* and I/OWR* on bus EBA are buffered by another S244 type device 523 to obtain MERD*, MEWR*, XRP* and XWP*, respectively.

Figure 39:
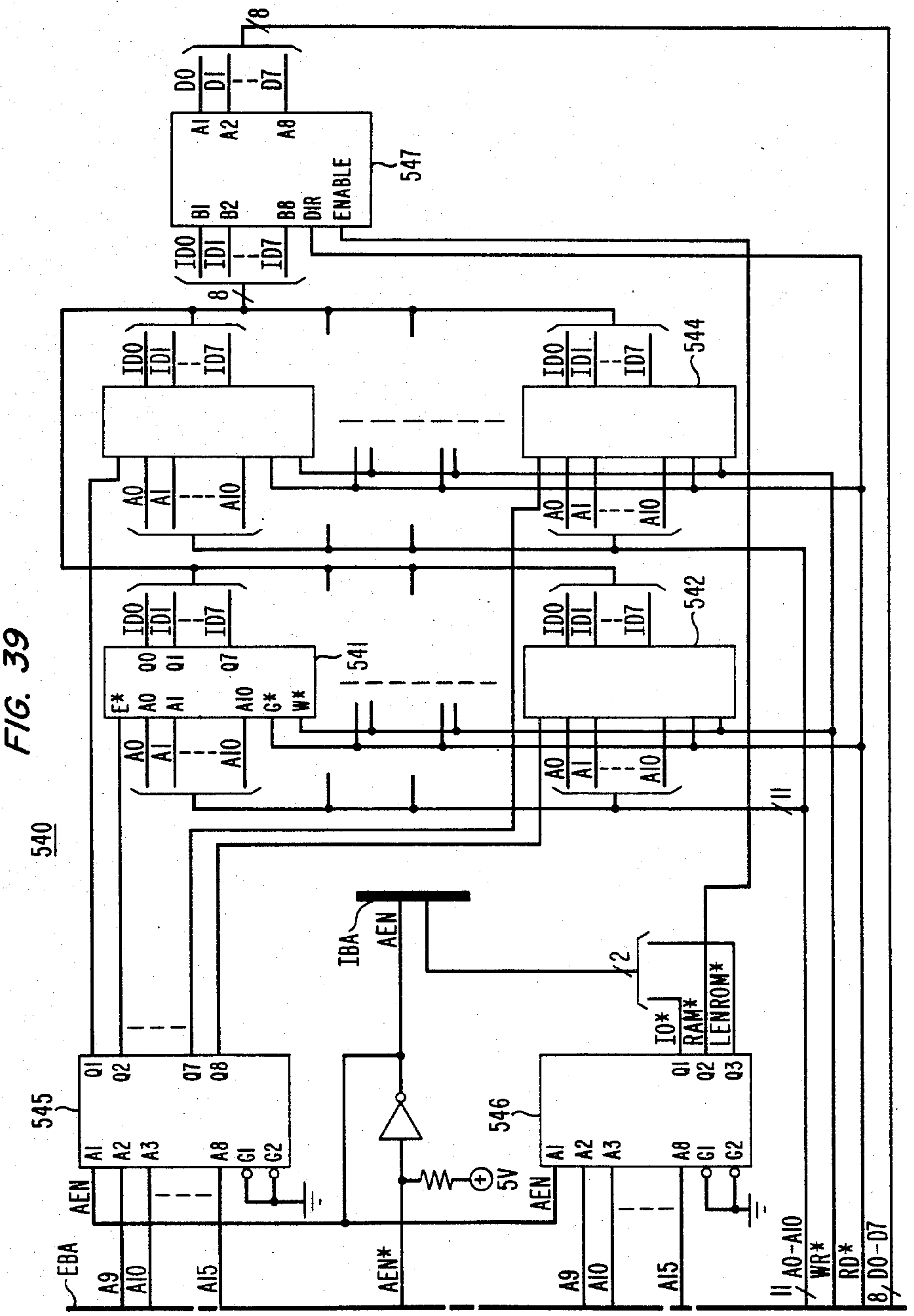

RAM circuit 540 of FIG. 39 has eight 2K×8 static RAM's 541–544, bidirectional buffer 547 and two fusible link bipolar PROM's 545 and 546. Buffer 547 is bidirectional type LS245 supplied by Texas Instruments, whereas PROM's 545 and 546 are type 28L22 supplied by Texas Instruments and RAM's 541–544 are type 61A manufactured by the Western Electric Co. PROM's 545–546 decode address leads A9–A15 to provide eight RAM selects, one for each 2K×8 RAM, as well as control signals LENROM*, RAM* and IO*, which indicate whether the current address is in, respectively: external memory range (0×0000–0×BFFF); RAM range (0×C000–0×FDFF); or I/O range (0×FE00–0×FFFF).

Each PROM 545 or 546 is 256 words by 8 bits. PROM 545 is programmed so that all addresses up through 0×BF contain 0×FF. The next fifty-six addresses (0×C0–0×F7) are equally divided into eight address segments containing, respectively: 0×FE; 0×FD; 0×FB; 0×F7; 0×EF; 0×DF; 0×BF and 0×F7. The final eight address 0×F8–0×FD contain 0×F7 in the first six locations and 0×FF in the last two locations. PROM 546 is programmed so that addresses 0×00–0×BF contain the hexidecimal data 05, whereas addresses 0×C0–0×FF contain 0×09, except for address 0×FE which has stored 0×0E. Buffer 547 is enabled by RAM* and its direction is determined by the RD* signal. The complete address map of the circuitry of FIG. 29, including areas asserted by the chip select signals to be discussed next may be summarized as follows:

| Start Address | End Address | Selected Memory or Chip Select |
|---|---|---|
| 0x0000 | 0xBFFF | External Memory |

-continued

| Start Address | End Address | Selected Memory or Chip Select |
|---|---|---|
| 0xC000 | 0xFDFF | Internal RAM |
| 0xFE00 | 0xFE0F | CS1* |
| 0xFE10 | 0xFE1F | CS2* |
| 0xFE30 | 0xFE3F | CS4* |
| . | . | . |
| . | . | . |
| . | . | . |
| 0xFF40 | 0xFF4F | CS21* |
| 0xFF80 | 0xFF8F | CS22* |
| . | . | . |
| . | . | . |
| . | . | . |
| 0xFFE0 | 0xFFEF | CS31* |

Figure 40:
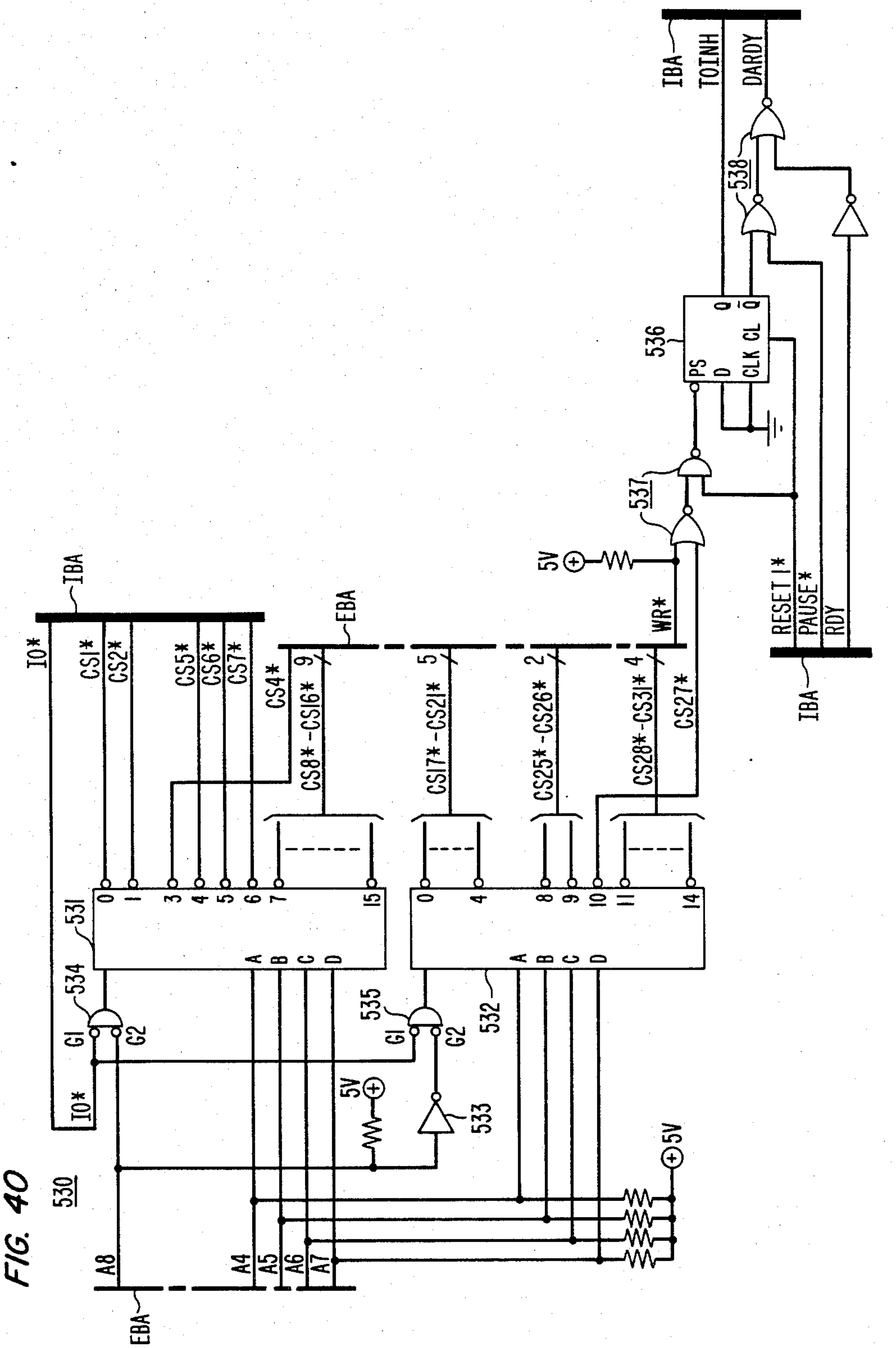

FIG. 40 depicts address decoder 530 which is composed of two Texas Instruments 74LS154 one-of-sixteen selectors 531 and 532, gates 534 and 535 and inverter 533, thereby providing 32 possible chip-selects. Leads A8 and IO* determine if one of the selectors should be enabled. If selected, the decoders use address leads A4–A7 to determine which of sixteen possible outputs should be asserted. The above map also summarizes the areas of memory enabled due to chip-select assertions.

Figure 41:
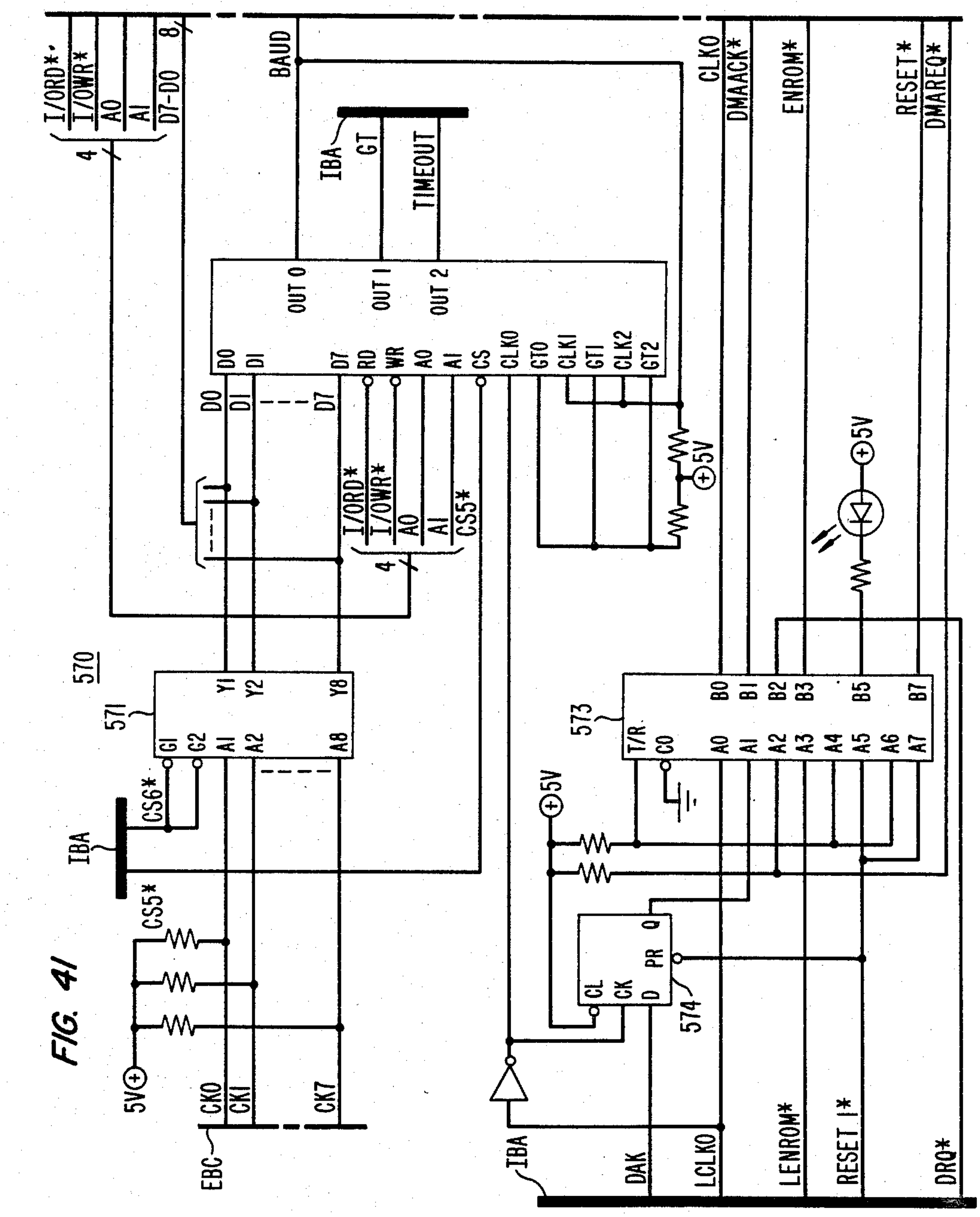

System circuit 570 is depicted in FIG. 41 as comprising device 572, which is an Intel 8253 Programmable Interval Timer (PIT). Device 572 is programmed via CS5*, I/OWR* and I/ORD*. Address leads A0 and A1 access the registers internal to the PIT. There are three individually programmable timers within PIT 572. The first timer (OUT0) is driven by LCLKO (which is provided as an output from processor 550 of FIG. 36) and is connected to the other two timers. Timer two (OUT1) provides interrupt lead GT to device 513 of FIG. 35 and serves as a system clock interrupt at programmable intervals. Timer three (OUT2) is used to generate a heartbeat timer such that if the timer is not updated by the system software within its programmed interval, a hardware reset will occur. Timer 1 also provides the BAUD signal for use with external circuitry FIG. 41 also provides a circuit device 571 as a circuit identifier. Eight external leads CK0–CK7 may be interrogated under software control to implement user-selectable options. When CS6* is asserted, device 571, which is type S244, gates the signals from leads CK0–CK7 onto D0–D7. An 8304 bidirectional transceiver 573 buffers external bus signals relating to DMA transfers, reset, ROM enable and external clock to the internal bus IBA. D flip-flop 574, when combined with flip-flop 556 of FIG. 36, guarantees a minimum of one clock cycle from the time DMAREQ* is asserted until DMAACK* is asserted.

Figure 42:
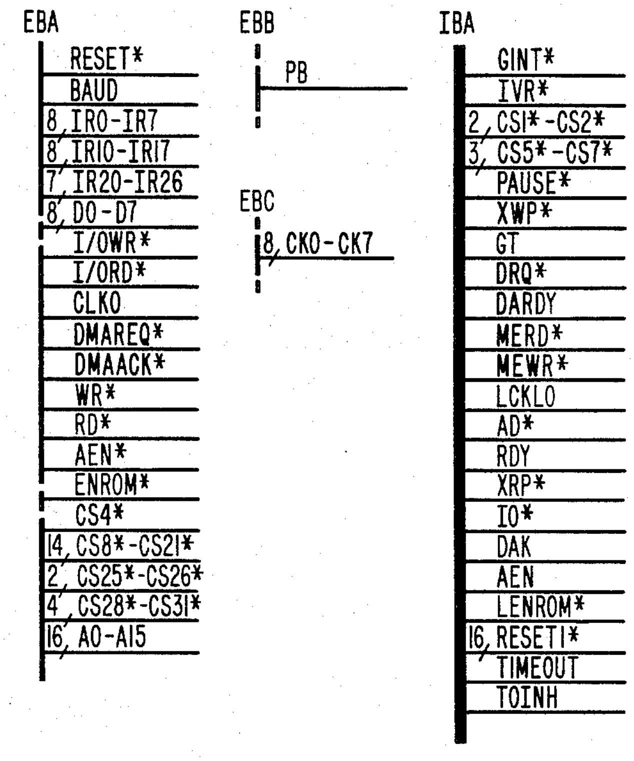
FIG. 42 depicts the signal leads comprising the three external busses and the internal bus shown in FIG. 29

FIG. 42 depicts the signals appearing on internal bus IBA as well as external busses EBA, EBB and EBC. The following table summarizes the external busses in terms of function and description.

| Designation | Function | Description |
|---|---|---|
| A0–A15 | I/O | tri-state address bus bits 0–15 |
| AEN* | I | address enable |
| BAUD | O | local baud rate clock |
| CK0–CK7 | I | circuit identifier straps |
| CLK0 | O | processor clock |
| CS4* | O | chip select |
| CS8*–CS21* | O | chip selects |
| CS25*–CS26* | O | chip selects |
| CS28–CS31* | O | chip selects |
| D0–D7 | I/O | tri-state data bus bits 0–7 |
| DMAACK* | O | processor DMA acknowledge |
| DMAREQ* | I | DMA request |
| ENROM* | O | external ROM enable |
| I/ORD* | I/O | tri-state I/O read |
| I/OWR* | I/O | tri-state I/O write |
| IR00–IR07 | I | interrupt requests |
| IR10–IR17 | I | interrupt requests |
| IR20–IR26 | I | interrupt requests |
| PB | I | manual reset button |
| RD* | I/O | tri-state read |
| RESET* | O | reset signal |
| WR* | I/O | tri-state write |

With reference to FIG. 30, the second tier 1 network, namely I/O circuit 600, comprises: ROM 601 providing up to 48 Kbytes of memory; bus circuit 620 providing a GPIB talker/listener/controller (T/L/C) interface; two high-speed DMA circuits 630 and 640 with accompanying data buffer 635; two high-speed data link interfaces 650 and 660, and associated buffer 670, implementing the synchronous data link control (SDLC) protocol; and chip selector 680.

Figure 43:
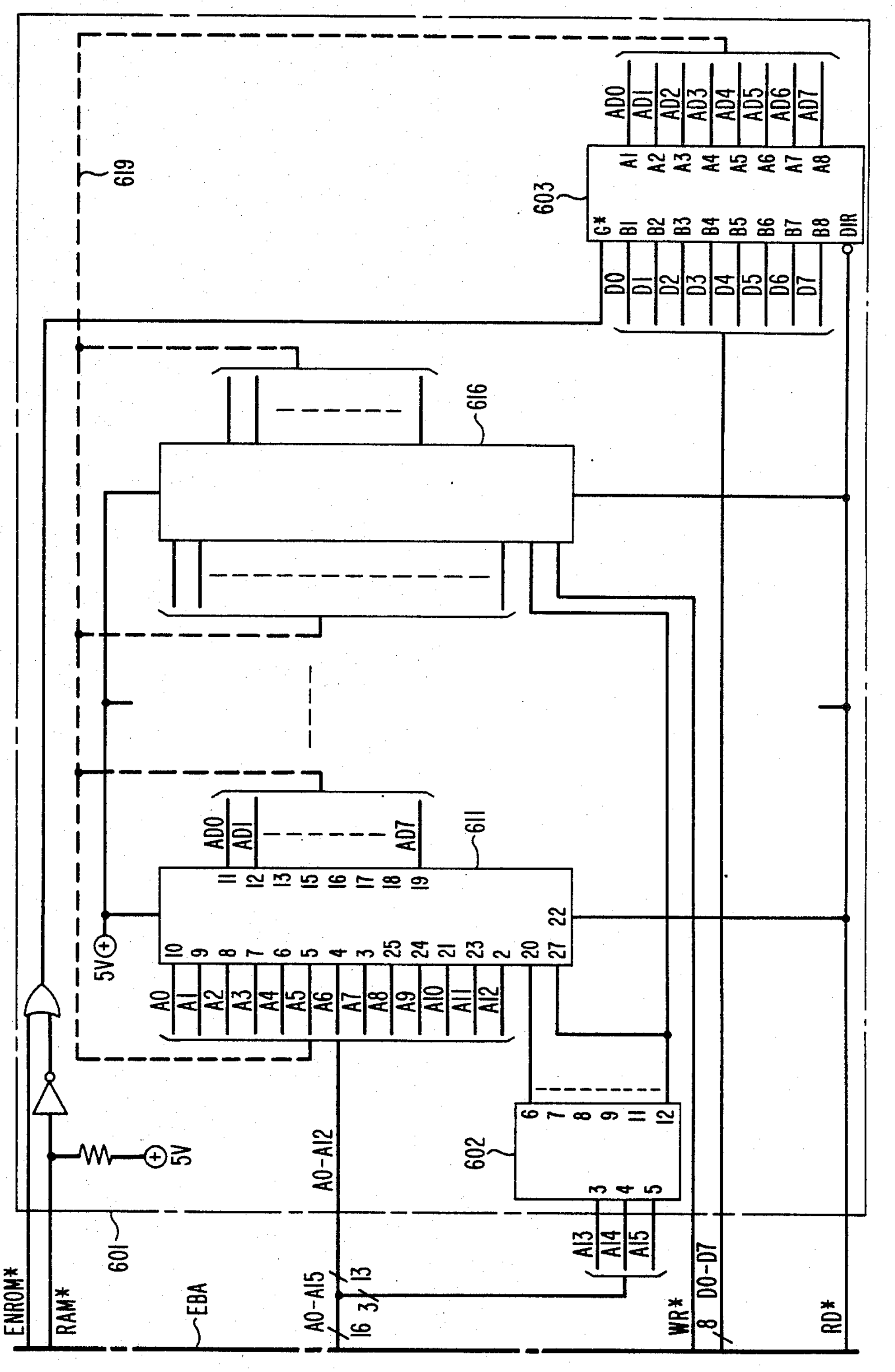
FIGS. 43 through 48 are schematics of the different subsystems comprising the serial-to-parallel portion of a tier 1 device shown in FIG. 30 and include, respectively: read-only memory; talker/lister/controller interface; direct memory access circuits with accompanying data buffer; data link protocol interfaces with associated buffer; and chip select circuitry.

Memory circuit 601, shown in detail in FIG. 43, accommodates six 8K×8 Intel 2764-type EPROM devices 611–616. Fusible-link, bipolar PROM 602, which is a type 28L22, decodes address leads A13–A15 and produces chip-selects for each of the six devices 611–616. The following table shows how PROM 602 is programmed (device 611 typically provides the lowest 8 Kbyte memory segment and device 616 the highest 8 Kbytes):

| A15 | A14 | A13 | Device Enabled |
|---|---|---|---|
| 0 | 0 | 0 | 611 |
| 0 | 0 | 1 | 612 |
| 0 | 1 | 0 | 613 |
| 0 | 1 | 1 | 614 |
| 1 | 0 | 0 | 615 |
| 1 | 0 | 1 | 616 |

Device 603, a type LS245, isolates memory data bus 619 from data bits D0–D7 on bus EBA. The direction of device 603 is determined by the RD* lead and is enabled when the ENROM* signal is asserted (although when RAM* is asserted, buffer 603 may not be enabled).

Figure 44:
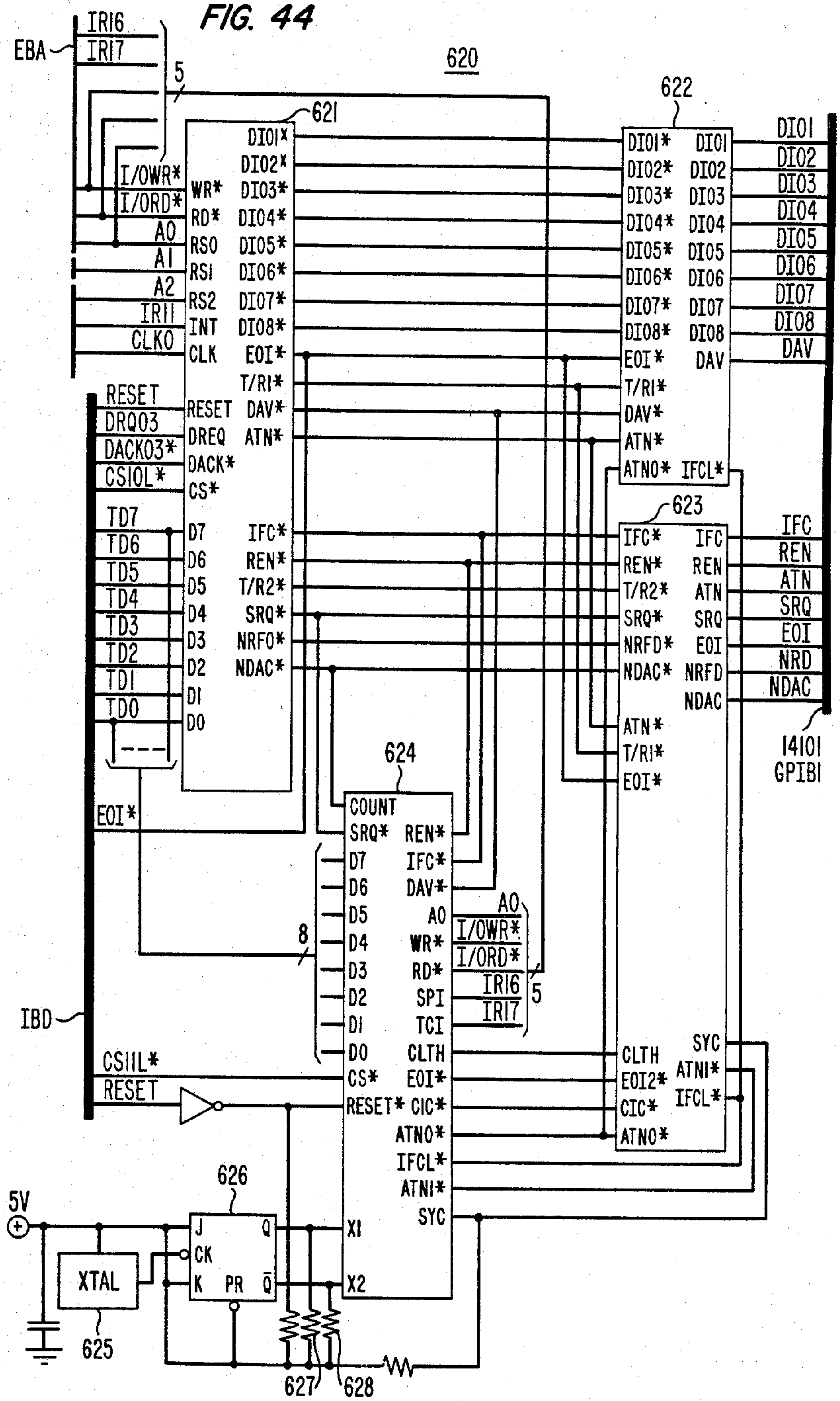

The GPIB talker/listener/controller circuit 620 shown in FIG. 44 comprises an Intel 8291 Talker/Listener (T/L) device 621, two GPIB buffers 622 and 623 of the type 8293 supplied by Intel, and an Intel 8292 GPIB Controller device 624. This latter device is a microcomputer that performs standard GPIB bus control operations on the sixteen leads DI01, DI02, . . . , DI08, DAV, . . . , NDAC appearing on bus 14101. Device 624 utilizes a two-phase 6 MHz clock generated by 12 MHz crystal 625 and J-K flip-flop 626. Resistors 627 and 628 are pullup resistors used to meet the rise-time requirements of device 624. Two types of interrupts are provided by device 624, namely, "task complete" and "special event", and these are sent to interrupt circuit 510 (FIG. 29) via leads IR17 and IR16, respectively. Buffer 622 is arranged to operate in IEEE standard implementation Mode 3 whereas device 623 is energized as per Mode 2.

Figure 45:
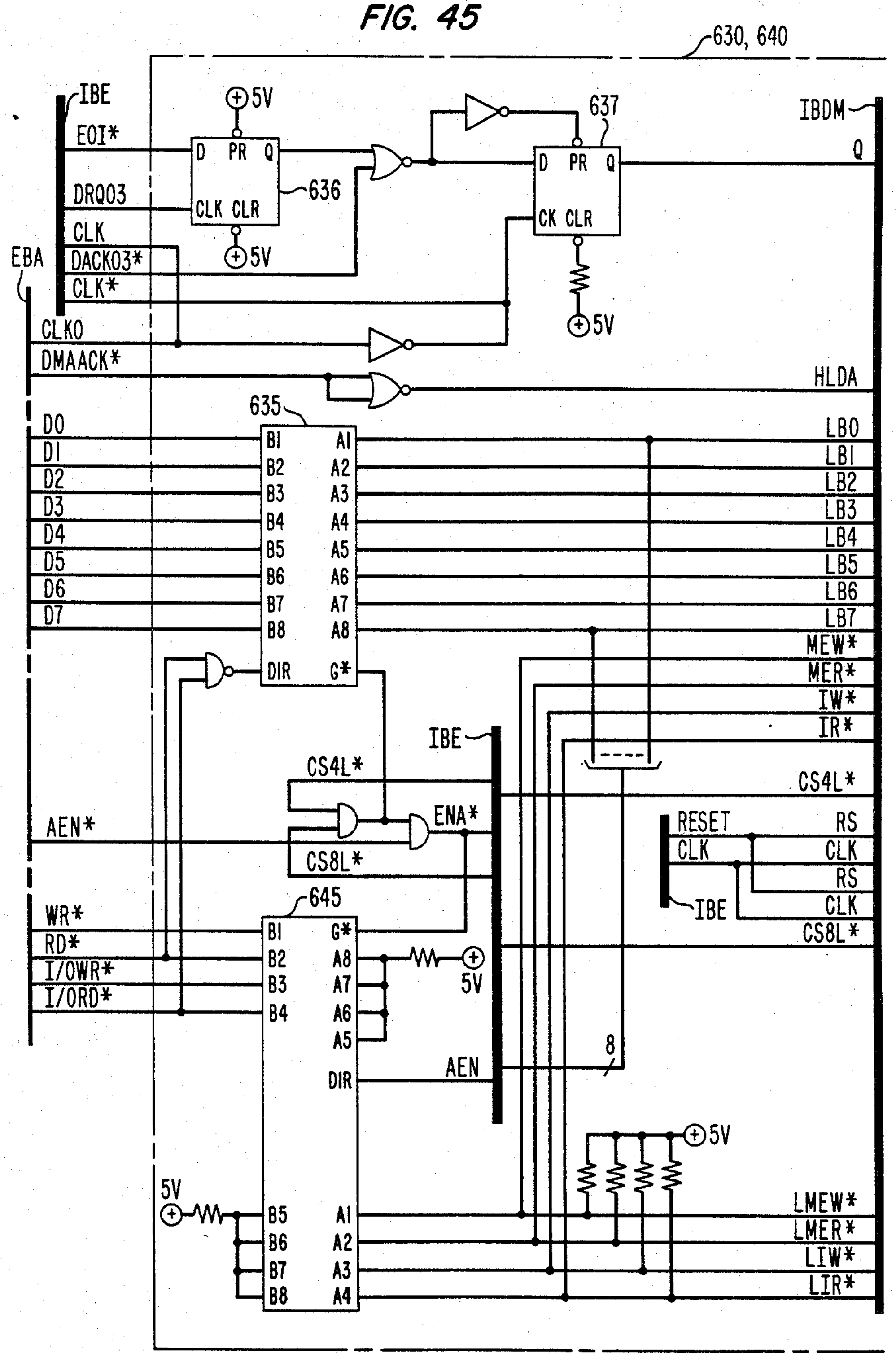
Figure 46:
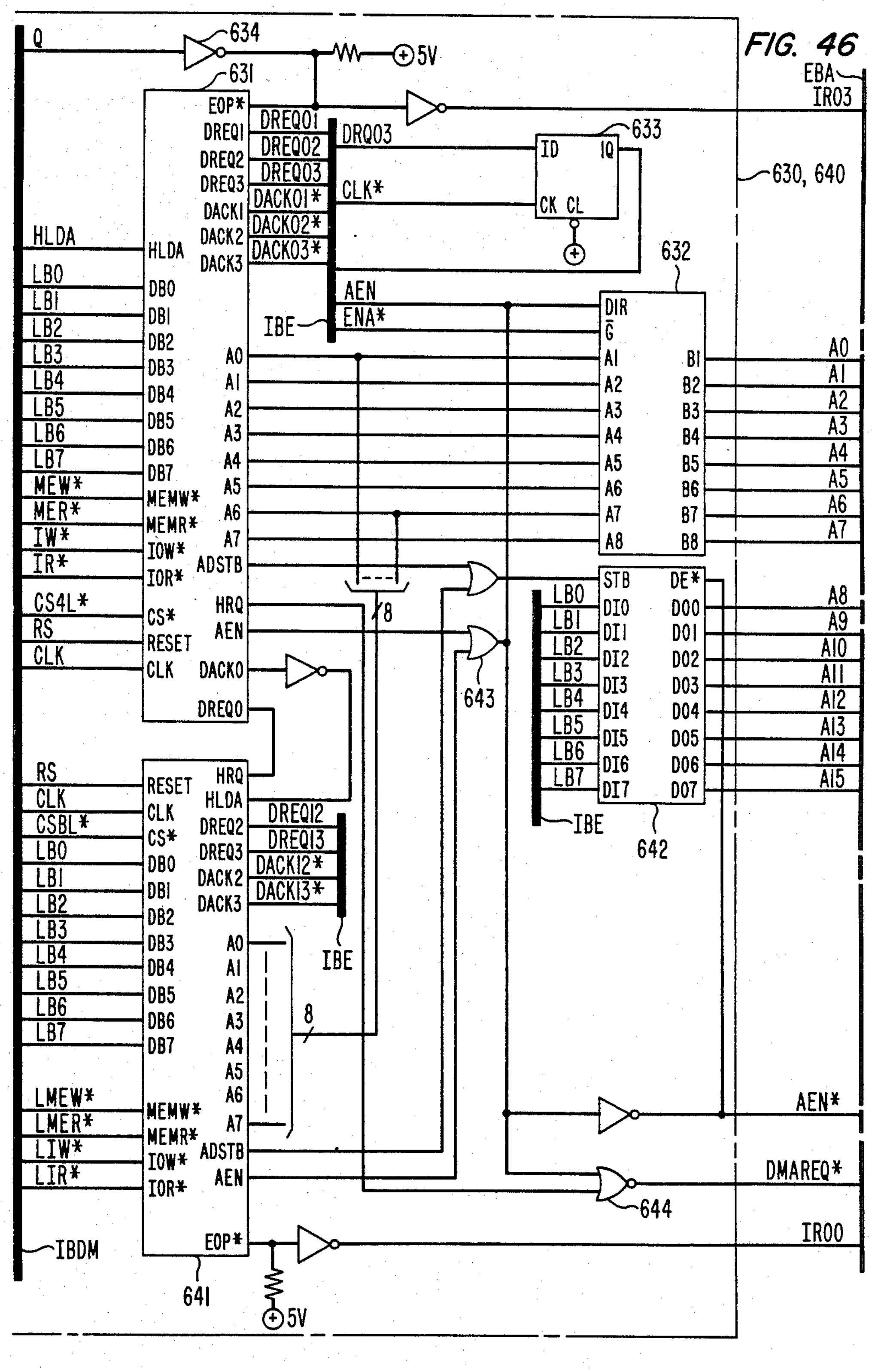

DMA circuits 630 and 640 of FIG. 30 allow GPIB data transfers to occur at a rate of approximately 200,000 bytes/second. The circuitry associated with the DMA arrangements is shown in FIGS. 45 and 46; these two figures should be considered in juxtaposed relation, with FIG. 45 on the left, to properly visualize the DMA circuitry. The internal bus IBDM couples the portion of the DMA circuitry in FIG. 45 to the remaining DMA circuitry of FIG. 45.

Two Advanced Micro Devices AM9517A DMA controllers, shown as elements 631 and 641 in FIG. 46, form the basis of the DMA implementation. A total of five externally accessible DMA channels are realized, two for each SDLC data links 9201 and 9202 (SERI1 and SERI2 busses), and one for GPIB channel 14101. A sixth channel is used internally by controllers 631 and 641 for alternating DMA cycles between controllers. During a DMA cycle, DMA circuits 630 and 640 (FIG. 30) cooperate to place the 16-bits A0–A15 on the address bus. Bits A8–A15 are latched into octal latch 642, an Intel 8282 device, whereas bits A0–A7 are buffered by LS245 device 632. The RD*, WR*, I/ORD* and I/OWR* leads are asserted during a DMA cycle, and LS245 latch 645 of FIG. 45 buffers these leads. The AEN signals from controllers 631 and 641 are logically OR'ed in gate 643 to determine the propagation direction of elements 645 (DIR) 632 (DIR) and 642 (OE*) as well as the control signal AEN* that disables processor 550 (FIG. 29) address and data buffers. LS245 device 635 isolates the external data bits D0–D7 from internal bus bits LB0–LB7.

In order that DMA request signals do not coincide with the rising edge of the clock and because GPIB device 621 asserts its request lead synchronously, gate 633, a LS273 supplied by Texas Instruments, latches the request on the falling edge of the clock. Also with respect to timing, since the local AEN signal of controller 631 is asserted until a DMA cycle is finished, the local HRQ signal of controller 631 is NOR'ed with AEN in NOR gate 644 to produce an inverted, trailing edge generated signal for DMAREQ*.

The internal EOP* signal of controller 631 is a bidirectional "end of transfer" signal. During output transfers of the GPIB type, when the last byte of a message has been sent, EOP* is asserted low. The inverted version of EOP* produces an interrupt on IR03 of EBA. During input transfers of the GPIB type, the "end of transfer" signal is generated by inverter 634. This is accomplished by latching the EOI* signal generated by GPIB circuit 620 into D type flip-flop 636 by the rising edge of the internal DREQ signal (externally on DRQ03) of T/L device 621. When a DMA cycle is granted for GPIB circuit 620, EOP* of controller 631 is pulled low by inverter 634, thereby disabling the GPIB channel of controller 631 and generating an interrupt on IR03. D type flip-flop 637 is used to lengthen the pulse of device 636 to conform to the timing requirements of controller 631.

Figure 47:
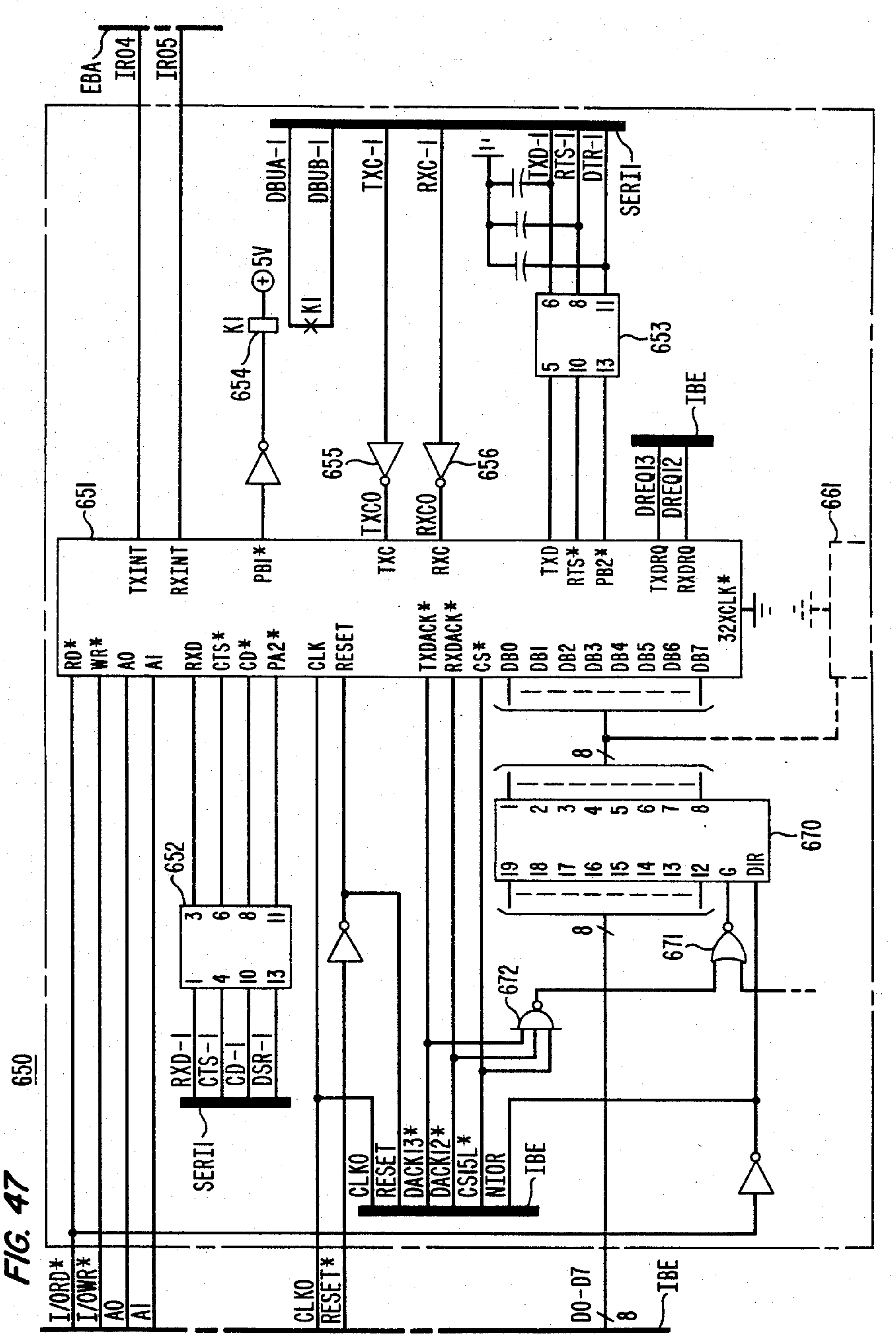

Focusing now on FIG. 47, the two high-speed data links SERI1 and SERI2, of which SERI1 is representative, are provided by two Intel 8273 SDLC controllers 651 and 661. Each 8273 controller handles the low-level data link functions and only interrupts processor 550 upon completion of an input or output operation. The actual data transfers between SDLC circuits 650 and 660 to ROM 601 take place through DMA cycles.

The EIA/RS232 input levels are converted to TTL levels in device 652, which is type 1489A furnished by Motorola. Moreover, output TTL levels from controller 651 are converted to EIA/RS232 levels in device 653, which is type 1488 supplied by Motorola. Normally open relay 654 provides contact closure K1 for controlling external Dial-Back-Up (DBU) devices over DBUA-1 and DBUB-1 leads.

Controller 651 operates in the synchronous mode wherein the external modem provides both the transmit and receive clock. These external clocks appear on leads TXC-1 and RXC-1, respectively, of SERI1, and they are converted to TTL levels by inverters 655 and 656, respectively. Controllers 651 and 661 are isolated from bus EBA with data buffer 670, which is a type 8304. Buffer 670 is enabled when either controller 651 (or 661) is selected by processor 550, via CS15* (or CS9*) or during DMA transfers via DACK12* or DACK13* leads (or DACK01* or DACK02*). Gates 671 and 672 logically process these signals to enable buffer 670; its direction is determined by I/ORD applied to port DIR.

Figure 48:
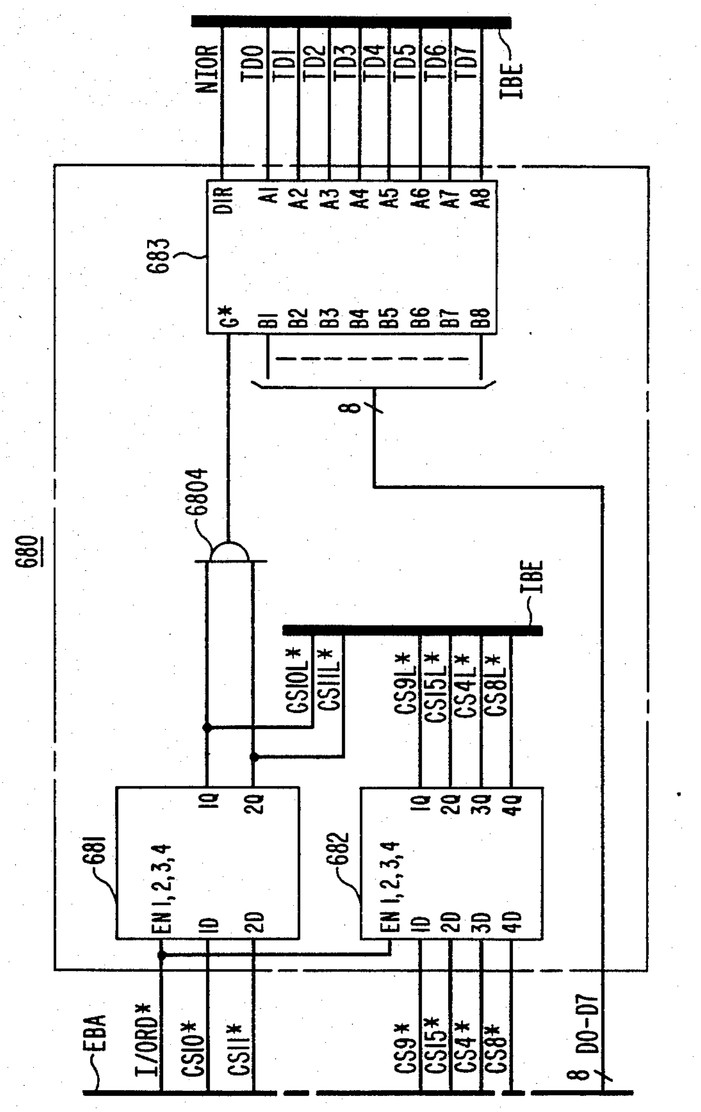

The final circuit of FIG. 30 remaining to be discussed, chip selector 680, is shown in FIG. 48. Gates 681 and 682, each of which is type LS75, buffer external chip select leads CS4*, CS8*-CS11* and CS15* and produce local equivalents of these chip selects. Chip selects CS10L* and CS11L*, the local signals relating to GPIB activation, are AND'ed by gate 684 to enable bus buffer 683, which is type LS245.

Figure 56:
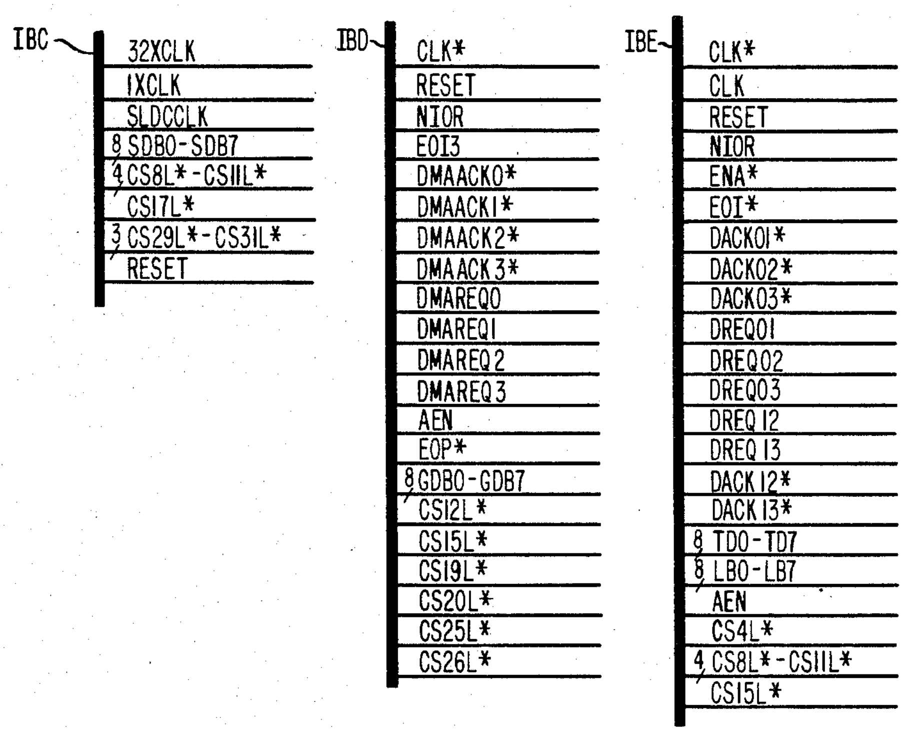

It should be noted here that FIG. 56 summarizes the signals appearing on bus IBE of FIG. 30.

Figure 31:
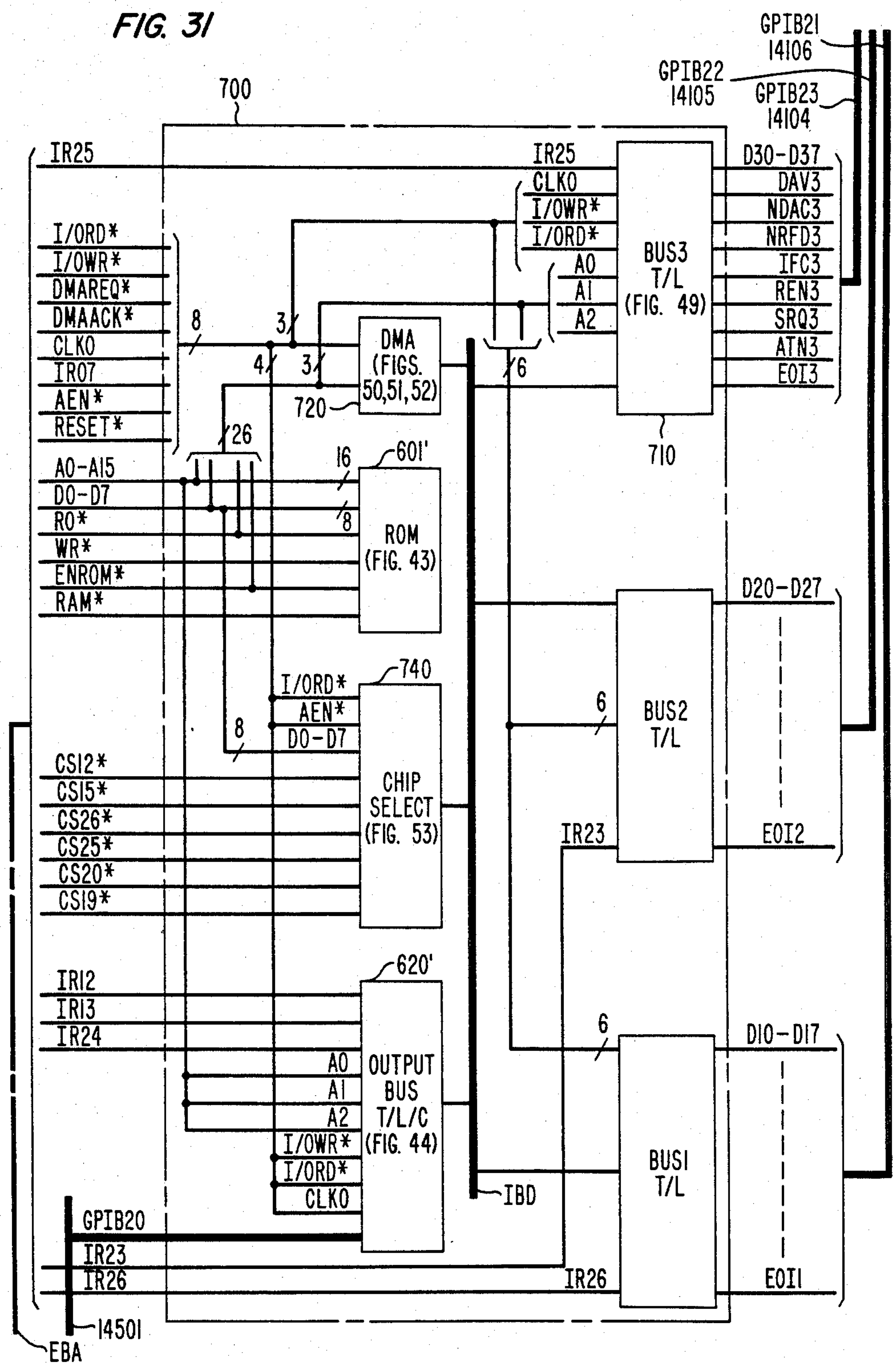
FIG. 31 is a representation in block diagram form of the parallel-to-parallel communication circuitry of a tier 2 interface.

Referring again to FIG. 28, it is seen that tier 2 interface 1421 (FIG. 3), which is also representative of interfaces 1422–1468, comprises basically two networks, namely, the same CPU circuitry of FIG. 29 and the I/O circuitry of FIG. 31.

With reference to FIG. 31, I/O circuitry 700 is comprised of: ROM 601', which is basically the same as ROM 601 of FIG. 30; output bus circuit 620' of the GPIB T/L/C type which has basically been described above with reference to T/L/C 620 of FIG. 30; bus circuit 710 (GPIB23) providing a GPIB talker/listener (T/L) interface (GPIB21 and GPIB22 are essentially the same as GPIB23, so it is taken as representative); high-speed DMA circuit 720; and chip select circuit 740.

Figure 49:
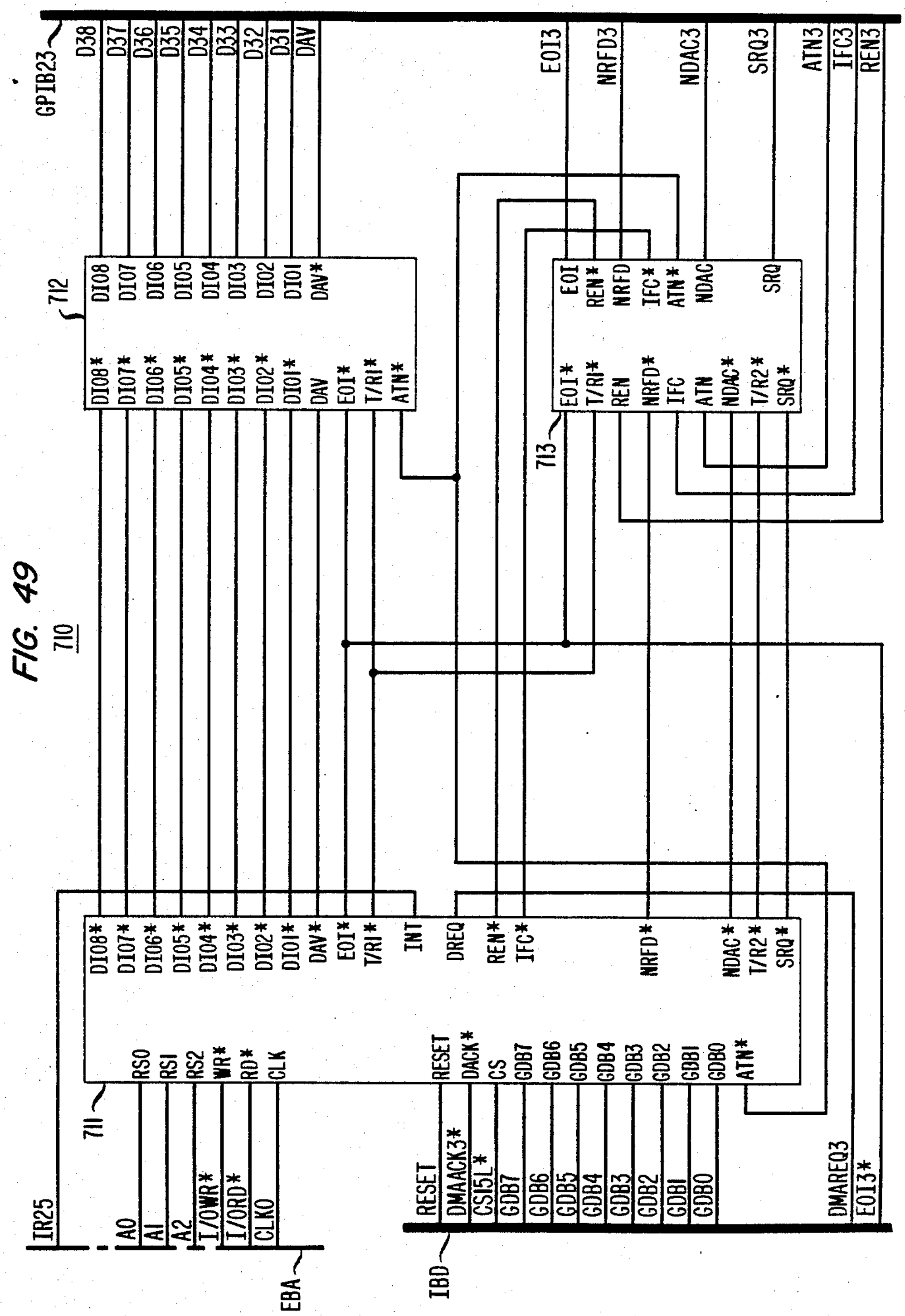
FIGS. 49 through 53 are schematics of the sybsystems cooperating to form the parallel-to-parallel portion of a tier 2 interface shown in FIG. 31 and include, respectively: talker/listener interface; direct memory access circuitry; and chip select circuitry.

The GPIB talker/listener circuit 710 shown in FIG. 49 comprises an 8291 Talker/Listener device 711 and two GPIB buffers 712 and 713 of the 8293 type. Buffer 712 is arranged to operate in IEEE standard implementation Mode 1 whereas buffer 713 is connected as per Mode 0. These buffers are accessed via their respective chip selects as well as I/ORD*, I/OWR* and address bits A0–A2 on bus EBA. When a particular T/L circuit (GPIB23, GPIB22 or GPIB21) is selected to transfer data by master controller 620', an interrupt is generated via the respective interrupt lead (IR25, IR23 or IR26).

Figure 50:
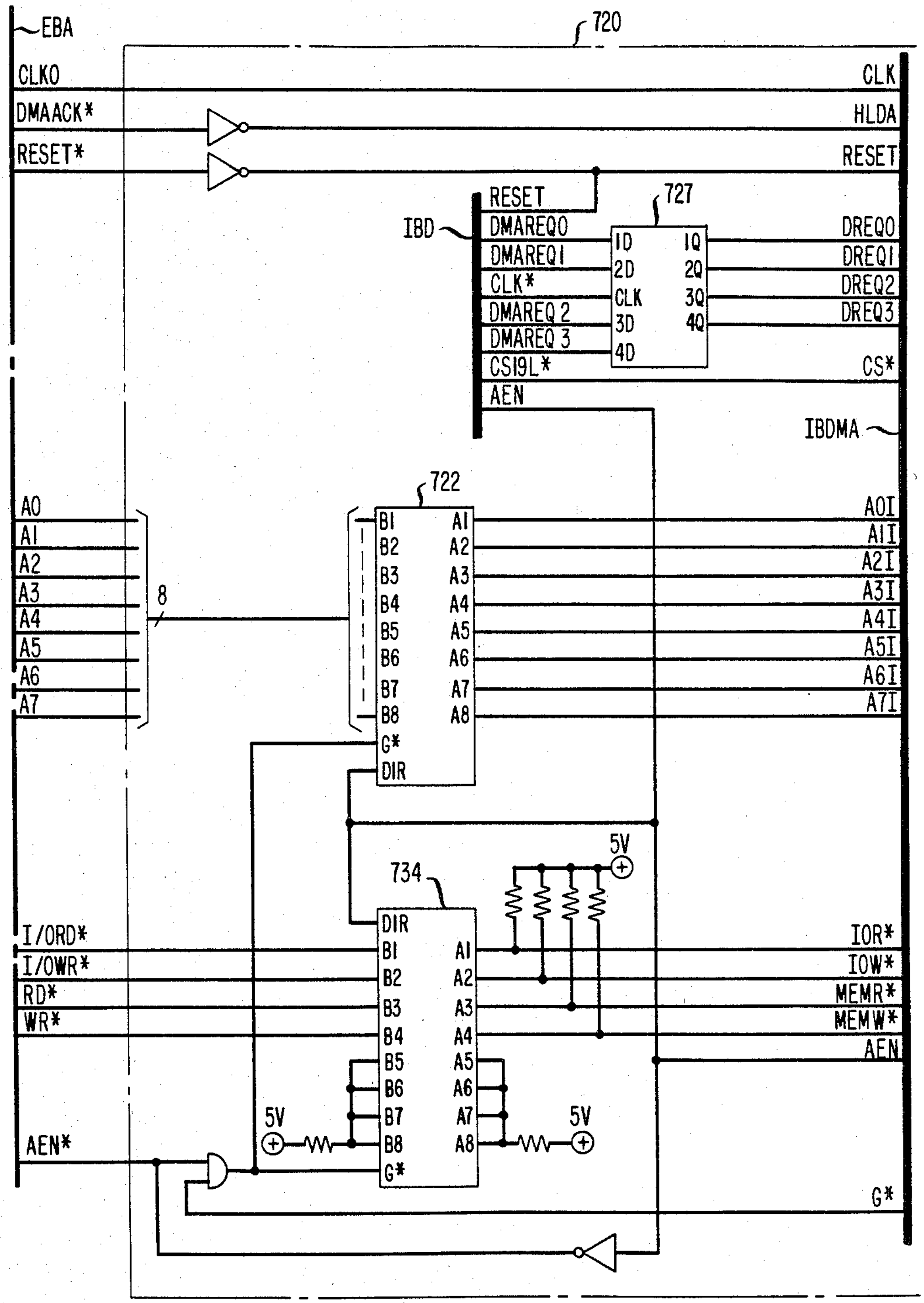
Figure 51:
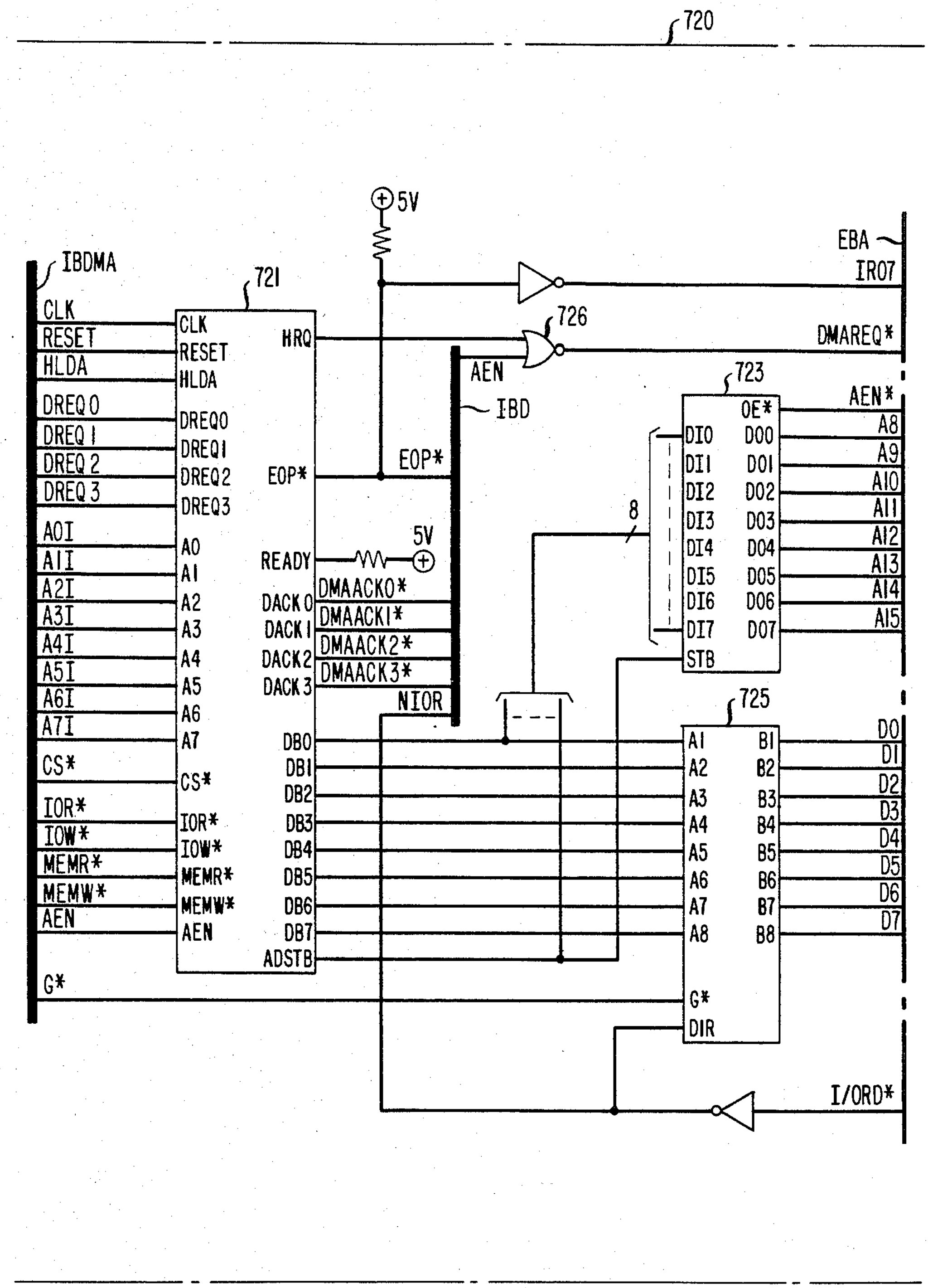

DMA circuit 720 is depicted by arranging FIGS. 50 and 51 in side-by-side fashion. The internal bus IBDMA at the output of the circuitry of FIG. 50 serves as the input to the circuitry of FIG. 51. A 9517A DMA controller, shown as device 721 in FIG. 51, forms the basis of the embodiment. Four high-speed DMA channels are provided, one for each of the four GPIB circuits. During a DMA cycle, DMA circuit 720 places a 16-bit address A0–A15 on EBA. Address bits A8–A15 are latched into device 723, an 8282 latch, whereas bits A0–A7 are buffered by device 722 of FIG. 50; this latter device is a LS245 buffer. The RD*, WR*, I/OWR* and I/ORD* signals on EBA are also asserted during a DMA cycle, and gate 734, also a LS245, buffers these four signals. The AEN signal from controller 721 controls the direction of devices 722 and 723, and AEN is inverted and placed on EBA to disable processor 550. A LS245, shown as device 725 in FIG. 51, serves to isolate bits D0–D7 on EBA from controller 721 input ports DB0–DB7.

Figure 55:
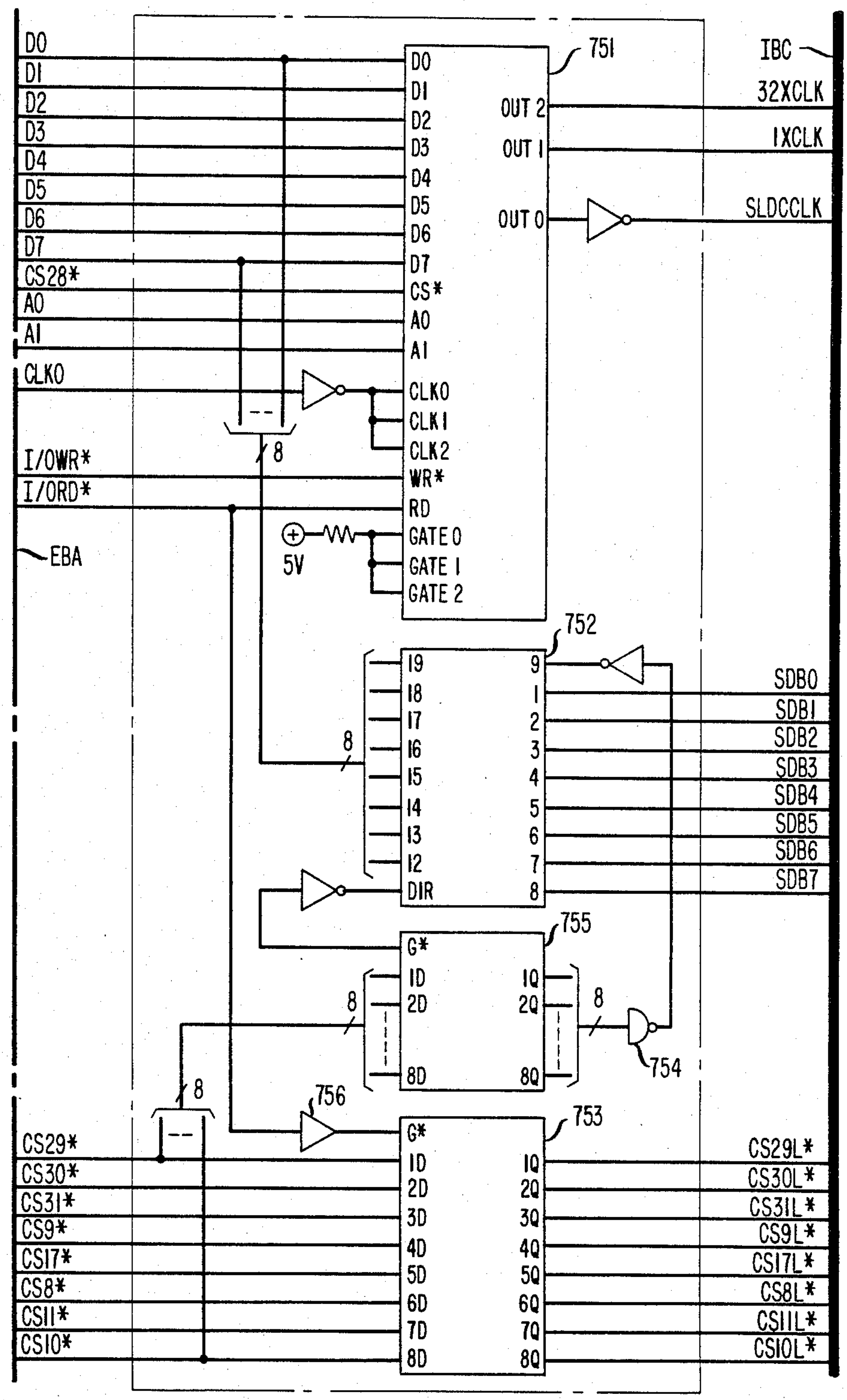

In a manner similar to the timing generation circuits of FIGS. 44 and 55, that is, devices 635, 636 and 633, circuit 727 (a LS175 supplied by Texas Instruments) and gate 726 of FIGS. 50 and 51, respectively, serve to latch GPIB requests on the falling edge of the clock as well as producing an inverted, delayed signal for DMAREQ*.

Figure 52:
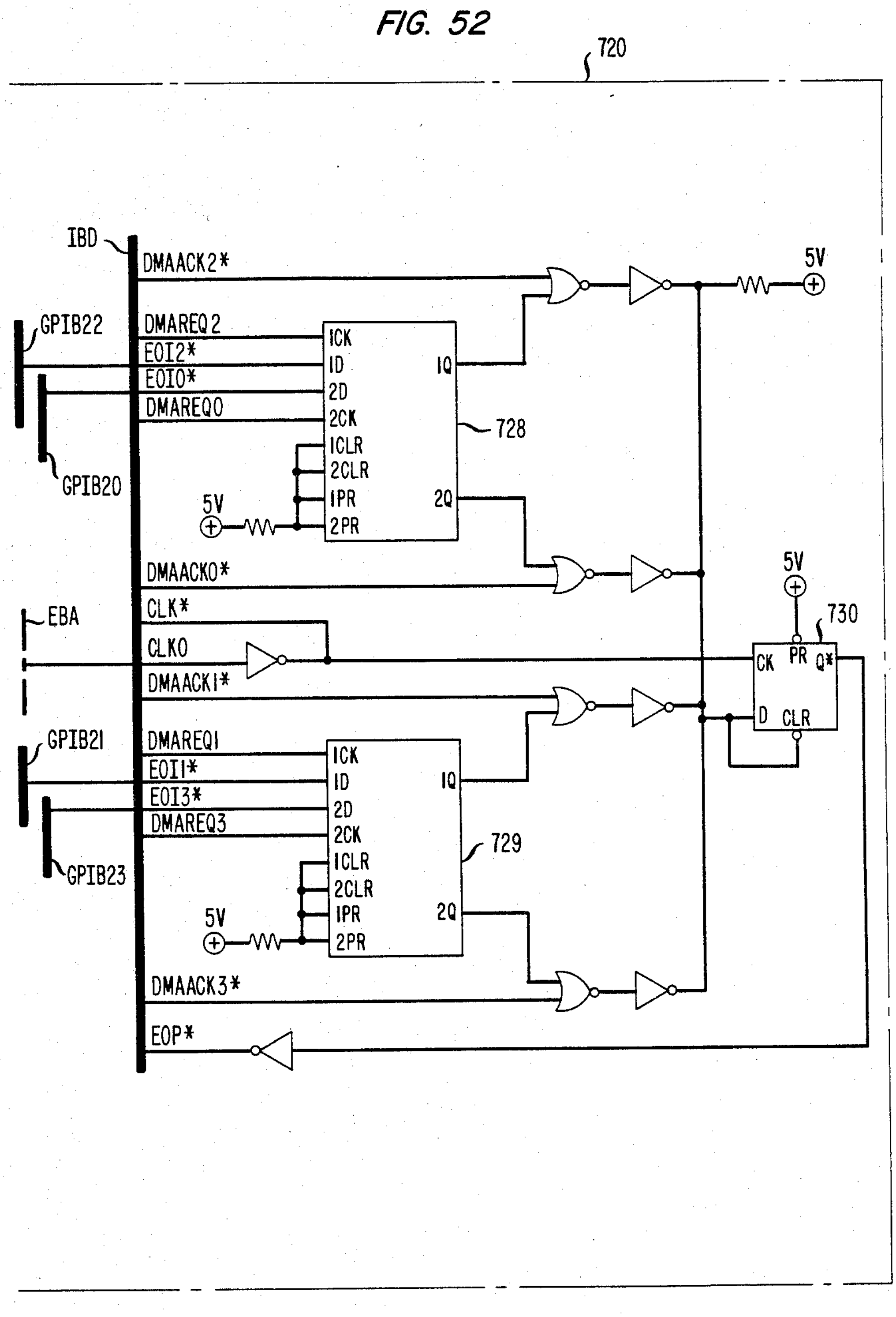

The internal EOP* signal of controller 721 is a bidirectional "end of transfer" signal. During output transfers, when the last byte of the GPIB message has been sent, EOP* is asserted low. This assertion is inverted and produces an interrupt on IR07. During input transfers of the GPIB type, the "end of transfer" signal is generated, as per FIG. 52, by devices 728, 729 and 730 as well as the associated OR and inverter circuits. Each device 728, 729 or 730 is a LS74 furnished by Texas Instruments. The EOI* leads associated with the various GPIB busses, that is, EOI0*–EOI3* corresponding to the T/L/C, first T/L, second T/L and third T/L (FIG. 49), respectively, are latched into device 728 or 729 by each rising edge of the DREQ lead from the respective GPIB controller. When the channel that is finished is granted its DMA cycle, EOP* is pulled low by device 730, thereby disabling the proper DMA channel and generating an interrupt on IR07. Device 730 is also used to lengthen the pulse to conform to the timing requirements of DMA controller 721.

Figure 53:
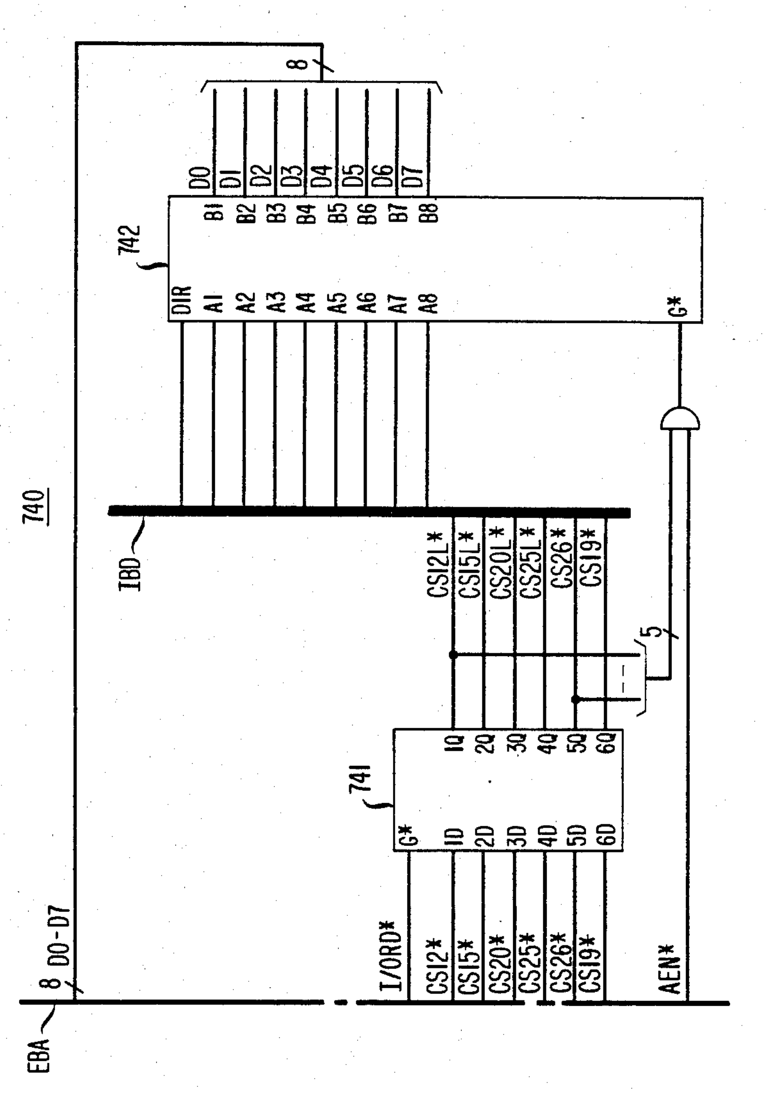

FIG. 53 depicts the chip selector circuit 741, a LS373 furnished by Texas Instruments, which basically transforms external bus chip selects to internal bus chip selects. In addition, bidirectional driver 742, of the LS245 type, is enabled whenever any GPIB related activity is requested. All of the signals on internal bus IBD, including the chip selects, are shown in FIG. 56.

Figure 32:
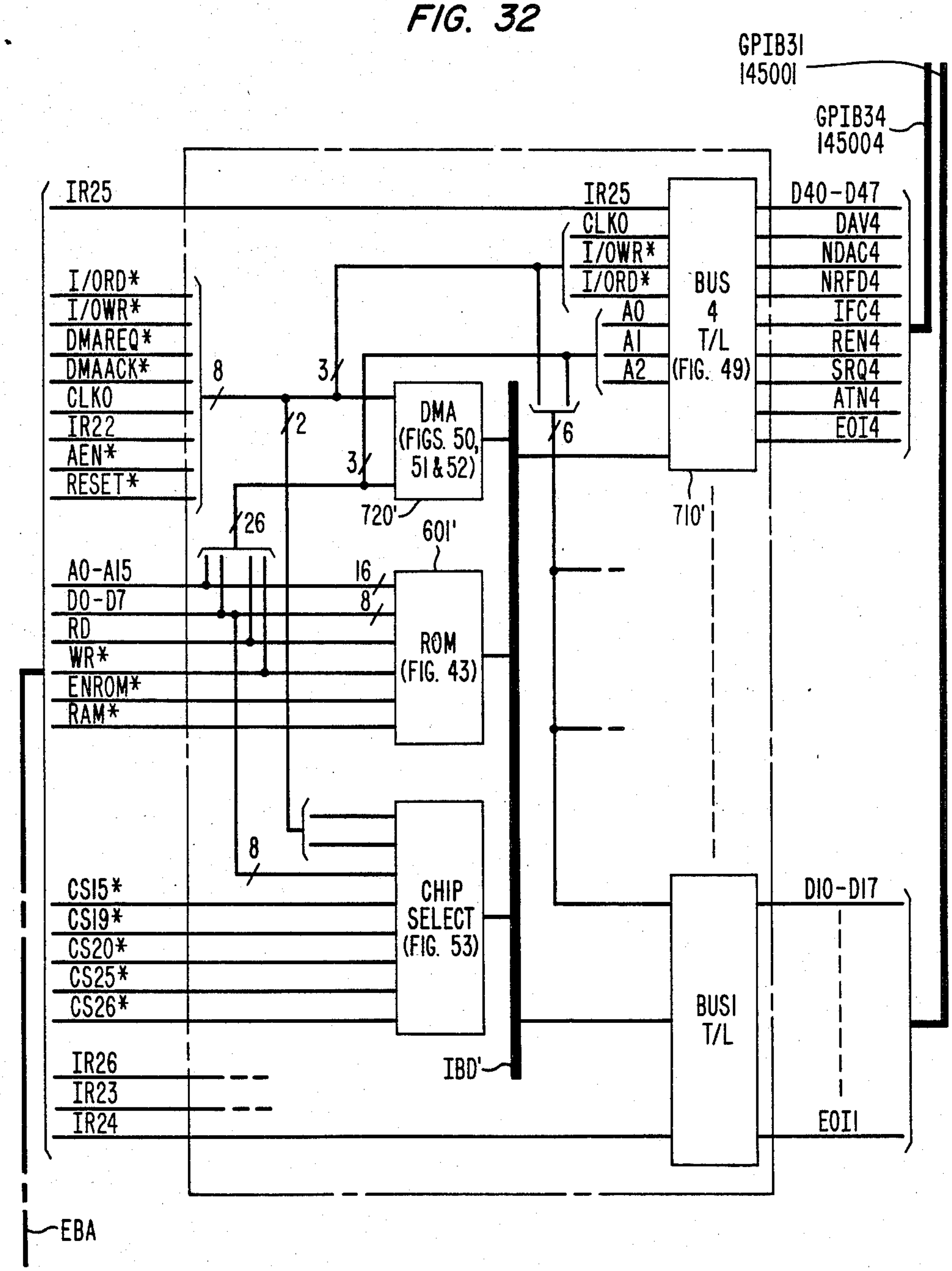
Figure 33:
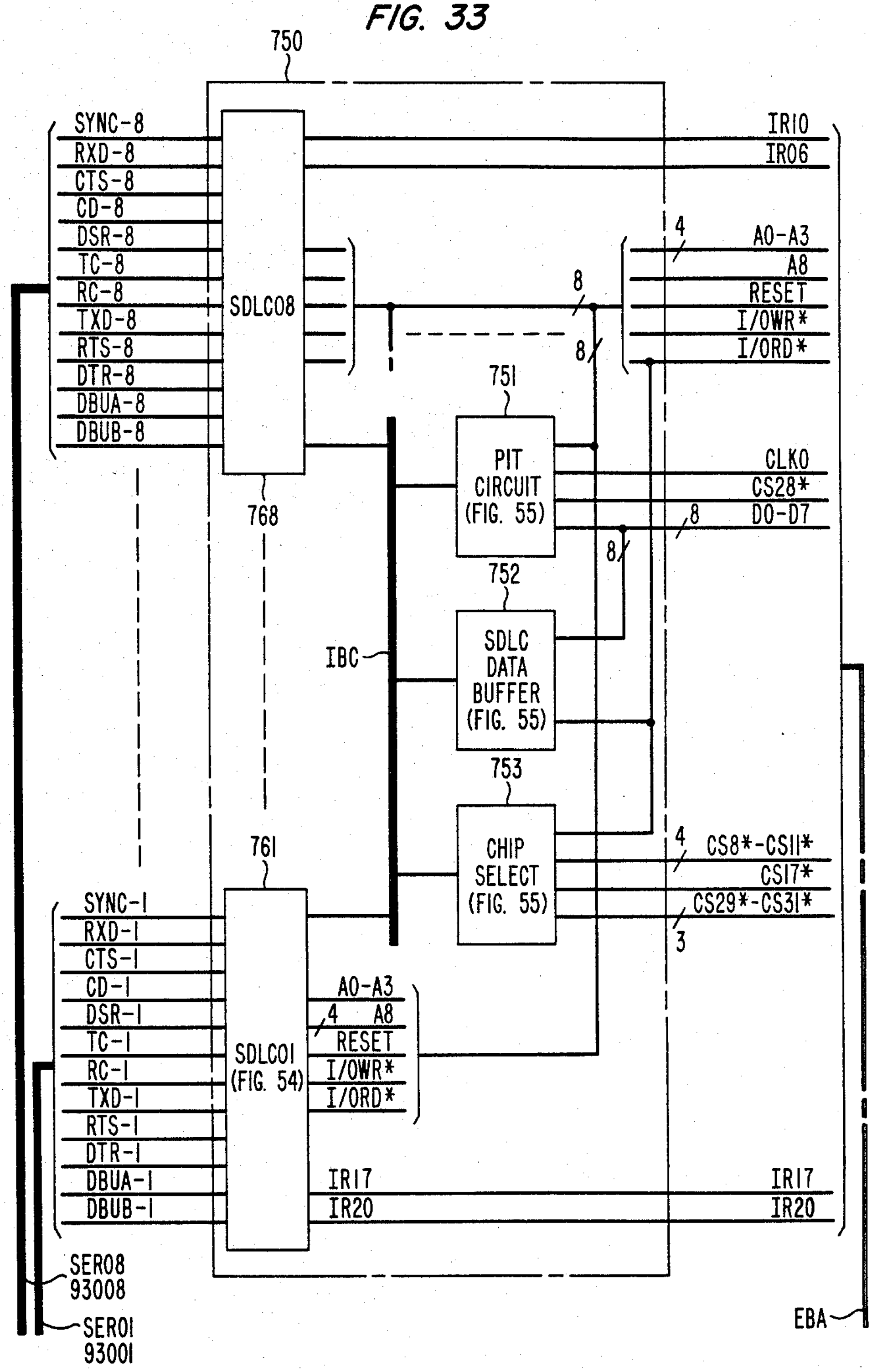
FIG. 33 shows the serial-output portion of each tier 3 circuit.

Referring back to FIG. 28, tier 3 circuit 14001, (FIG. 3), which is considered as representative of circuits 14002–14096, comprises primarily three networks, namely, the same CPU circuitry of FIG. 29, the input circuitry of FIG. 32 and the output circuitry of FIG. 33.

With reference to FIG. 32, the composition of the input circuit 700′ is basically the same as structure 700 of FIG. 31 just discussed. The main difference is that, whereas FIG. 31 included one GPIB T/L/C and three GPIB T/L circuits, FIG. 32 includes four GPIB T/L circuits. Accordingly, FIG. 32 requires no additional discussion since the realization is straightforwardly implemented from the implementation of FIG. 31.

Thus, the final circuit of DCN 140 requiring discussion is that depicted as output circuitry 750 of FIG. 33; it implements eight low-speed SDLC data links 761–768 capable of operating with either synchronous or asynchronous datasets. Auxiliary circuits, namely, programmable interval timer (PIT) circuit 751, data buffer 752 and chip select 753 support data link transmissions.

Figure 54:
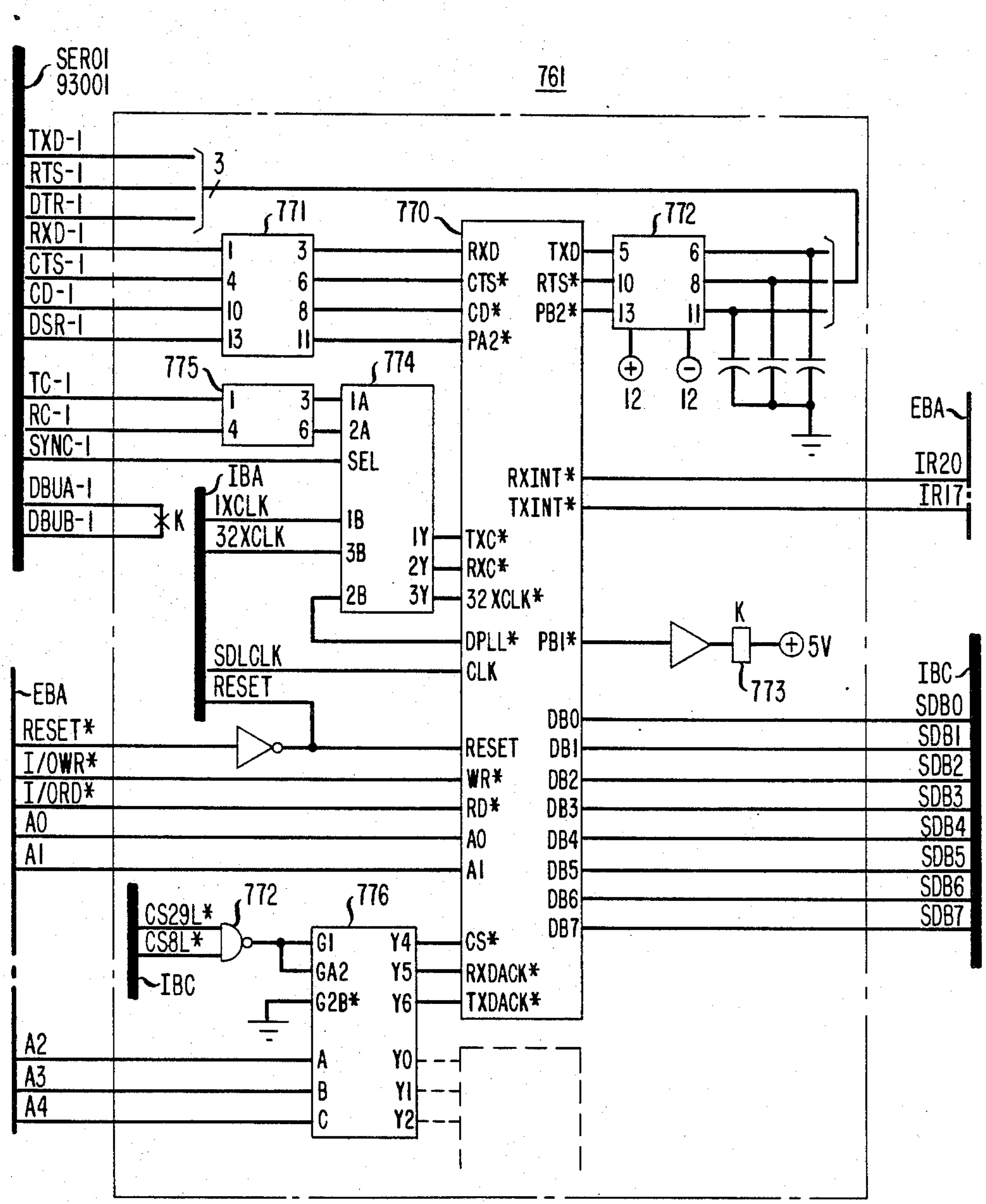
FIGS. 54 and 55 are schematics of the serial output portion and the programmable interval timer portion, respectively, of a tier 3 circuit shown diagrammatically in FIG. 33.

Focusing on data link circuit 761 of FIG. 54, which is representative of the remaining seven SDLC circuits, an 8273 SDLC controller 770 handles the low-level data link functions and only interrupts processor 550 upon completion of an input or output operation. Data transfer between controller 770 and RAM 540″ of tier 3 (basically the same as RAM 540 of tier 1 shown in FIG. 39) takes place through transmitter or receiver interrupts. The EIA/RS232 input levels are converted to TTL levels by device 771, which is type 1489 circuit. Output TTL levels from device 770 are converted to EIA/RS232 levels by device 772, a type 1488 circuit. Relay 773 provides contact closures for controlling external Dial-Back-Up (DBU) device connected to the far-end of serial data bus SER01. This relay is driven by output port PB1* of controller 770 and is normally deenergized.

In the synchronous mode, circuit 770 is driven by an external modem which provides both the transmit and receive clock. In the asynchronous mode, no external clock is provided. An internally generated clock drives the transmitter, and the receiver is driven with an internally generated clock derived from the incoming data stream by a phase-lock-loop circuit within controller 770. Selector 774, which is a LS157 furnished by Texas Instruments, determines the clock configuration for the data link SER01. The external clock is converted to TTL levels by device 775, also a 1489-type circuit, and passed through selector 774 in the synchronous mode. In the asynchronous mode, the internal clocks are selected. Lead SYNC-1 on link SER01, when strapped to ground, selects the synchronous mode.

Each controller 770 requires three select signals, namely, one for accessing its registers, one for transferring output data, and one for accepting input. Address leads A0 and A1 select the registers within controller 770. Address leads A2, A3 and A8 control decoder 776, a SN74LS137J produced by Texas Instruments. Two controllers can be supplied by one decoder 776, via CS*, RXDACK* and TXDACK* of each controller 770; one controller is shown in phantom in FIG. 54. Gate 777 activates decoder 776 when one of the controller pairs requires servicing.

Auxiliary circuit 751, a 8253 PIT, shown in FIG. 55, provides local timing signals. Circuit 751 is accessed from EPA by asserting CS28* or I/ORD* or I/OWR*. Address leads A0 and A1 are used to select the various internal registers of the PIT. Three programmable outputs are available. The signal on OUT0 is used as a divide-by-two circuit to insure a 50% duty cycle for clock SDLCCLK. OUT1 is used as the 1XCLK clock source for SDLC's 761–768 when used in the asynchronous mode; OUT2 is used as the 32XCLK clock source for the internal phase-locked-loop of controller 770.

The eight SDLC's 761–768 are isolated from external bus EBA by bidirectional driver 752, an 8304 buffer. Driver 752 is enabled when any of the eight SDLC's are selected. Gate 754, a NOR circuit, logically enables driver 752; its direction is determined by I/ORD*. Latch 755, a LS373 type, latches the eight chip selects at its input to insure driver 752 stays enabled for the desired time interval.

Because of hold-time limitations on controller 770, all chip selects are latched into latch 753, also a type LS373, with a signal generated by stretching the I/ORD* signal with interposed gate 756.

FIG. 56 summarizes the signals appearing on internal bus IBC. The buffered chip select signals CS9L*–CS11L*, CS17L*, CS30L* and CS31L* enable the SDLC controllers 761–767, not shown in FIG. 33, just as CS29L* and CS8L* enable controller 770 and is mirror-image counterpart.

3.1.2 DCN Programs

A listing of the programs for operating the microprocessors comprising tiers 1, 2 and 3 of the illustrative embodiment of DCN 140 is included as a set of appendices in Rubin (Ser. No. 399,177, since matured as U.S. Pat. No. 4,446,341 on May 1, 1984, filed on even dated herewith, since matured as U.S. Pat. No. 4,446,341 on May 1, 1984 as indicated in the Cross-Reference to Related Applications Section. In particular, Appendices A, B and C of Rubin U.S. Pat. No. 4,424,479 present the programs, as well as supplemental information, which will aid one skilled in the art to program and operate, respectively, each tier 1, tier 2 and tier 3 microprocessor. These microprocessors are represented by the one discussed with reference to device 551 of FIG. 36. The information presented by an Appendix A, B or C Ser. No. 399,177 is divided into the following parts: (1) a table of program names in alphabetical order as per source code name; (2) the listing for each source program; (3) routines for associating related source code and for organizing the memory space; and (4) the memory map.

The majority of the programs are written in the C language; these are recognized by ".c" at the end of each program name (e.g., TLCtask.c in Appendix A Ser. No. 399,177, the GPIB Talker/Listener/Controller task program which implements PARALLEL OUTPUT task 11407 of FIG. 7). The C language is a well-known high-level language that is comprehensively described in a book entitled "The C Programming Language" as authored by B. W. Kernighan and D. R. Ritchie and published by Prentice-Hall in 1978.

Some programs are written in the assembly language of the BELLMAC-8 microprocessor. These programs may be recognized by the ".s" suffix in a program name (e.g., boot.s). This assembly language is patterned after the C language and, in fact, possesses many of its high-level language constructs. One skilled in the art of C programming may readily program in the BELLMAC-8 microprocessor language once it is understood that certain register designations in register-related instructions are located in RAM (as compared to on-board, hardwired registers). In particular, there are two register sets, one 8 bits in length and the other 16 bits. Moreover, each set comprises 16 registers and the low-order 8-bits of a 16-bit register actually comprises one of the corresponding 8-bit registers and, therefore, may be separately addressed.

Other programs, although written in the C language, do not appear with the ".c" suffix, but rather have a ".h" or ".H" appended to the name (e.g., gpib.h or nadmintask.H in Appendix A Ser. No. 399,177). In the C language, these are known as "include" files and are basically library files. These programs are generally called upon by many users. If each separate user had a private copy, then each time a change was made, all users would have to be so advised and each user would be required to incorporate the change to remain current. To mitigate potential errors in such a procedure, the subject program is placed in a source library and only the library copy is altered. The numerous users call upon the library copy during a program activity with the assurance that the library copy is up-to-date.

The three remaining entries in the tables, namely, dcnj.mk, dcn.j.i and dcnj.out MAP, j=1, 2 or 3, have the following meanings; (1) dcnj.mk is a so-called "make" file. It indicates to the system which prepares object code from source listings the source code files that are to be concatenated to derive a particular object code file; (2) dcn.j.i indicates to the system where in memory the object code is to be located. Memory has three main partitions—text (.text), data (.data) and block storage (.bss); (3) dcnj.out MAP presents the memory location of the various object modules for an executable program.

In Section 2.1c, six tasks were discussed. Five of these tasks applied to tier 1 software, and these included: SERIAL DATA; PARALLEL OUTPUT; ADMINISTRATION; BROADCAST; and DUMP MEM. With reference to the table of program names for Appendix A Ser. No. 399,177 the following relationships between generic task names and actual software implementation for the illustrative embodiment may be identified; ×25task.c implements the SERIAL DATA task; TLCtask.c corresponds to PARALLEL OUTPUT; nadmintask.c is the ADMINISTRATION task; broadcast.c is the BROADCAST task; and DUMP MEM corresponds to dumpmem.c. Similar correspondences may be made for tier 2 and tier 3 tasks by referring to Appendix B and C Ser. No. 399,177, respectively.

The actual high-level data link protocol implemented by SERIAL DATA or ×25task.c is a subset of Level 2 of CCITT X.25 protocol. This protocol is described in a reference entitled "CCITT X.25 Packet Switching Interface", published in February, 1978 by the DATAPRO Research Corporation of Delran, N.J. The particular subset is designated the BX.25 and is described in AT&T *Technical Reference Publication* 54001 entitled "Operation Systems Network Communication Protocol Specification BX.25", Issue 2, made available to the public in 1981.

The SERIAL DATA task in each tier 1 device 1401–1412 controls serial data links 9201–9224 arriving at the input of DCN 140. These serial data links are generally operated at a high speed, typically 9.6 Kbaud or greater, to achieve the desired throughput. It is evident from the three-tier nature of DCN 140 that serial data links 93001–93768 emanating from tier 3 circuits 14001–14096 are decoupled from links 9201–9224. Thus, the SERIAL DATA task of tier 3, although substantially the same as SERIAL DATA of tier 1 in terms of source code, operates at a different baud rate (4.8 Kbaud or less) because of differing clock rates between tier 1 and tier 3 hardware. It is clear then that DCN 140 effects baud rate conversion.

It will also be appreciated by one having ordinary skill in the art that DCN 140 may also effect protocol conversion. Although in the illustrative embodiment the BX.25 protocol is utilized on entering as well as exiting data links, the decoupling between tiers 1 and 3 allows for independent protocol realizations. Thus, links 93001–93768 could be operated asynchronously in a different environment, or some links may implement the SDLC protocol and the remaining ones as asynchronous protocol. Even if both implemented a BX.25 protocol, it is possible to have a nonreturn-to-zero (NRZ) convention on the input links and a NRZ inverted (NRZI) on outgoing links. This arrangement is also considered one of protocol conversion.

To improve the efficiency of GPIB transmissions, a technique already alluded to in Section 2.1d has been devised. The GPIB interface software is separated into two parts, namely, software for the Talker/Listeners of tiers 2 and 3, and software for the Talker/Listener/-Controller of tiers 1 and 2. For example, with reference to FIG. 57, which depicts circuitry of FIGS. 30 and 31 recast for the present discussion, T/L/C 620 (FIG. 30) is representative of a tier 1 controller, whereas circuitry 710 (FIG. 31) is indicative of one of twelve listeners loading tier 1 output bus 14101. The T/L/C software supervises transactions on the appropriate GPIB bus, watches for errors and determines which bus transactions should occur at any given time. Both software implementations provide throttling in case of buffer depletion, check for errors, retransmit messages received incorrectly and provide message transfer timeouts.

Figure 57:
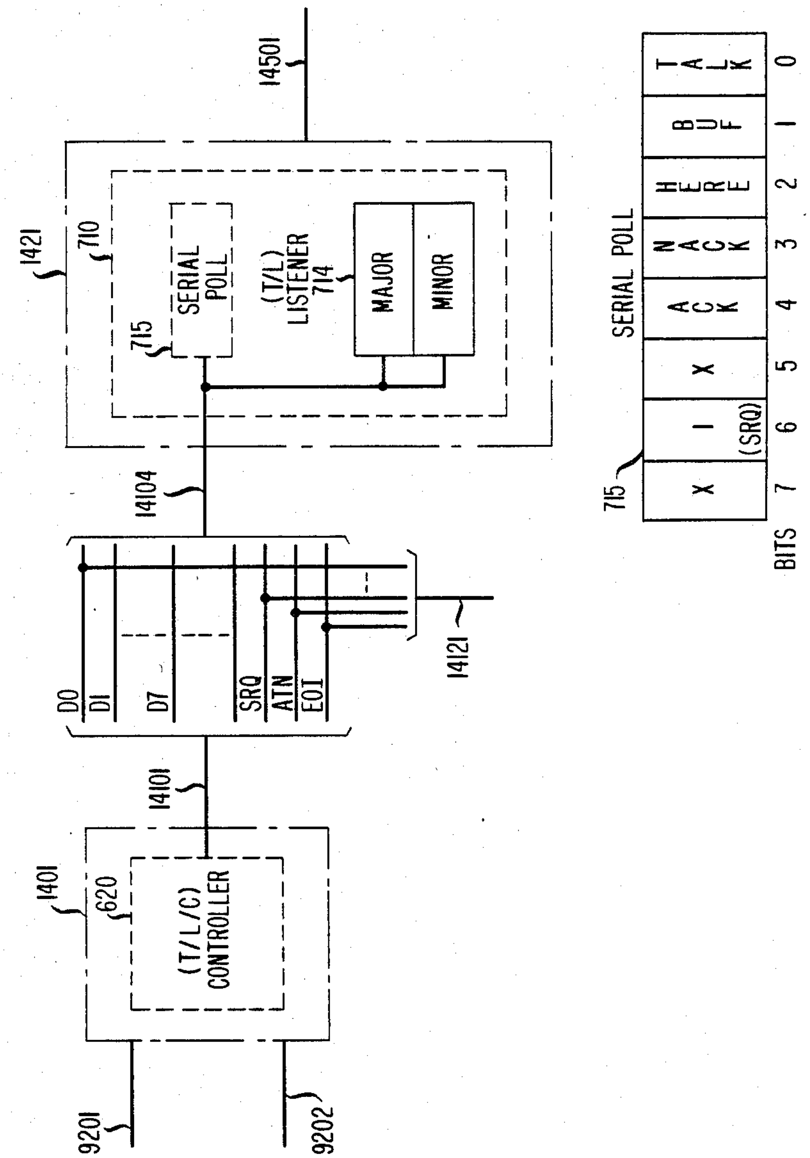
FIG. 57 is a depiction of the interconnection between a controller and listener explicitly setting forth the serial poll register contents and the major/minor addressing capability of the general purpose bus.

Within the framework of the GPIB protocol, a controller (sender) and listeners (receivers) communicate via a second-level protocol. The diagram of FIG. 57 is utilized to explain this secondary parallel bus protocol. Messages transferred over the GPIB data lines D0–D7 comprise a check word (CRC-8 polynomial in the illustrative embodiment) followed by the series of data bytes comprising the actual message. After the entire augmented message has been received by a listener or listeners, the receiving software computes a check value and compares it to the check word in the message. If the word and value match, a positive-acknowledgement (ACK) is transmitted to the sending side. If there is no match, some data error occurred and a negative acknowledgement (NACK) is transmitted to the sending side.

The T/L/C side transmits an ACK to the T/L side by sending a single zero byte (0×00) to the minor address of the T/L, shown as part of device 714 in FIG. 57. The minor address is computed by adding a preselected value to the major address; in the illustrative embodiment, this value is sixteen. A NACK is transmitted by sending a single nonzero byte to the minor address.

The T/L side transmits positive and negative acknowledgements via its serial poll register, represented by devices 715 in FIG. 57. One bit is assigned to each type of acknowledgement and these are depicted by bit positions 4 and 3, respectively, in poll register 715. The controller software responds to the ACK/NACK message when it polls each T/L circuit 710 in the usual fashion as set forth in the GPIB protocol standard (IEEE-488).

Each Talker/Listener also maintains in its associated serial poll register a bit (e.g., bit position 1) indicating the presence of an empty receive buffer. Each time a change is made to the serial poll register, such as an arrival of a free receive buffer or an ACK/NACK, a service request (SRQ) is made (as per the IEEE-488 standard). The T/L/C maintains a queue of empty buffers. It will not allow any T/L device to transmit messages if no buffers are available. In addition, the T/L/C will not transmit any messages to a T/L device that does not have a receive buffer available. If a listener has a message to be transmitted, it sets a designated bit (e.g., bit position 0 of serial poll register 715) and issues a service request.

Each controller maintains a copy of the poll registers of its associated listeners. The copy is updated every time a poll is taken. Another poll register bit (bit position 2) indicates to the controller the on-line status of each listener. For each T/L receiver, a queue of outgoing messages is maintained as well as a time stamp for the top message on that queue. If the top message is not transmitted successfully within the timeout interval, the T/L device is queried via special error-recovery software. One or more outgoing messages may be discarded or rerouted, depending on the severity of the problem.

3.2.1 LTS Controller Implementation

With reference to FIG. 11 in the way of recapitulation, LTS controller 2000 provides the following functions:

(1) control of communications over serial data link 930 between LTS 160 and DCN 140;

(2) control of GPIB communication bus 20001 over which PMU's 2101–2103 and port controller 2200 transmit data to and receive data from LTS controller 2000;

(3) scheduling of PMU's 2101–2103 and their connection to an accessed loop 180–184;

(4) control of DDD network, via DDD circuit 2400, and the interactive testing arrangements;

(5) transmission of test requests to PMU's 2101–2103 and port controller 2200;

(6) collection of test results from these same entities; and (7) timing of all requests.

Figure 58:
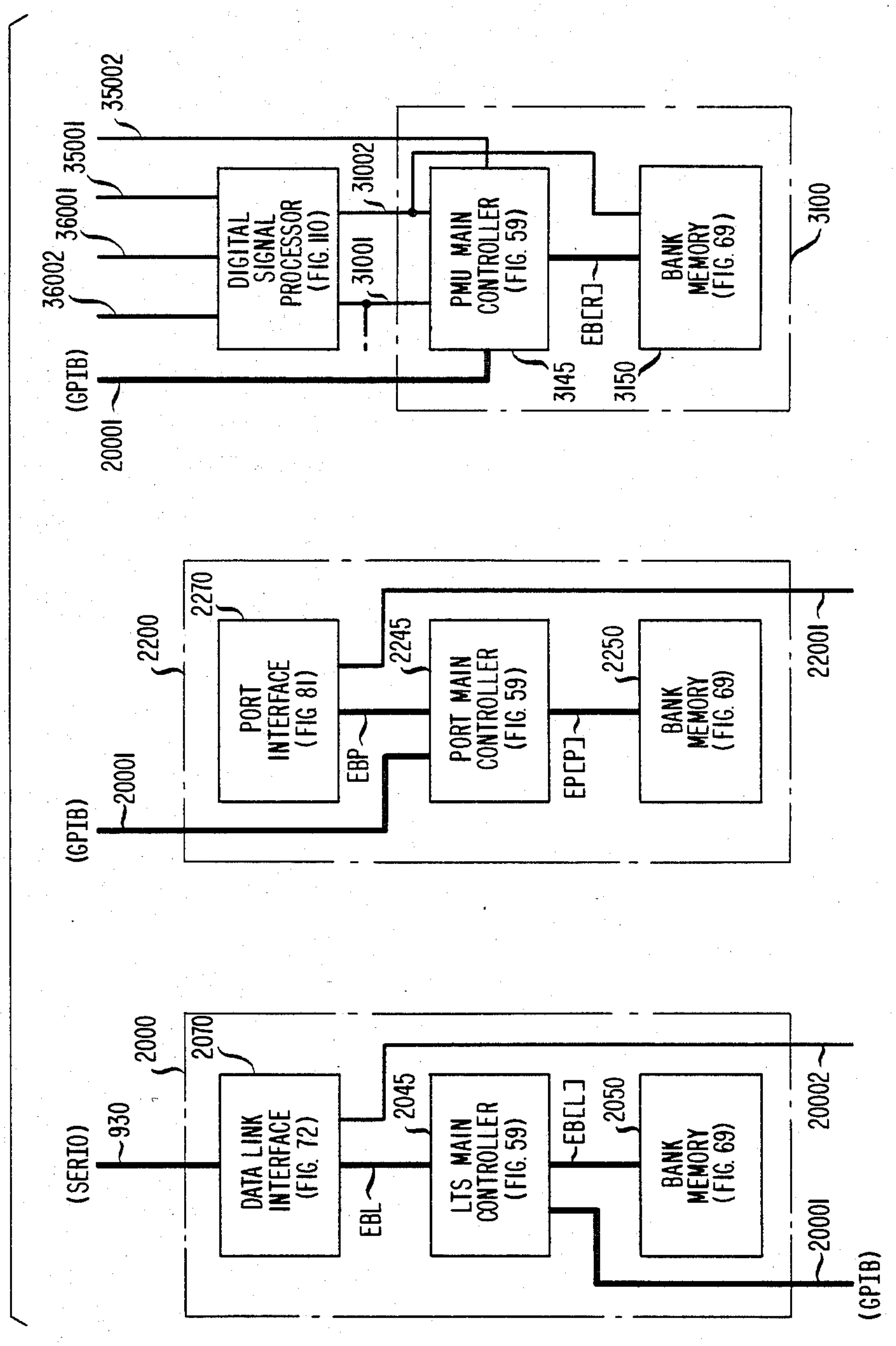
FIG. 58 indicates that: the LTS controller of FIG. 11 is comprised of the circuitry depicted in FIGS. 59, 69 and 72; the port controller of FIG. 11 is a composite of the circuitry shown in FIGS. 59, 69 and 81; the PMU controller of FIG. 17 is formed from the circuitry illustrated in FIGS. 59 and 69; and the digital signal processing circuitry of FIG. 17 is depicted by the block diagram of FIG. 110.

As depicted in the leftmost portion of FIG. 58, LTS controller 2000 comprises basically three networks, namely, main controller 2045, bank memory 2050 and line interface 2070. In fact, as indicated by the block diagrams of FIG. 58 relating to port controller 2200 and PMU controller 3100, controller 2045 of FIG. 59 and bank memory 2050 of FIG. 69, with minor variations, are implementations adaptable to these three controllers embedded within LTS 2000.

3.2.1a LTS Main Controller Circuitry

Figure 59:
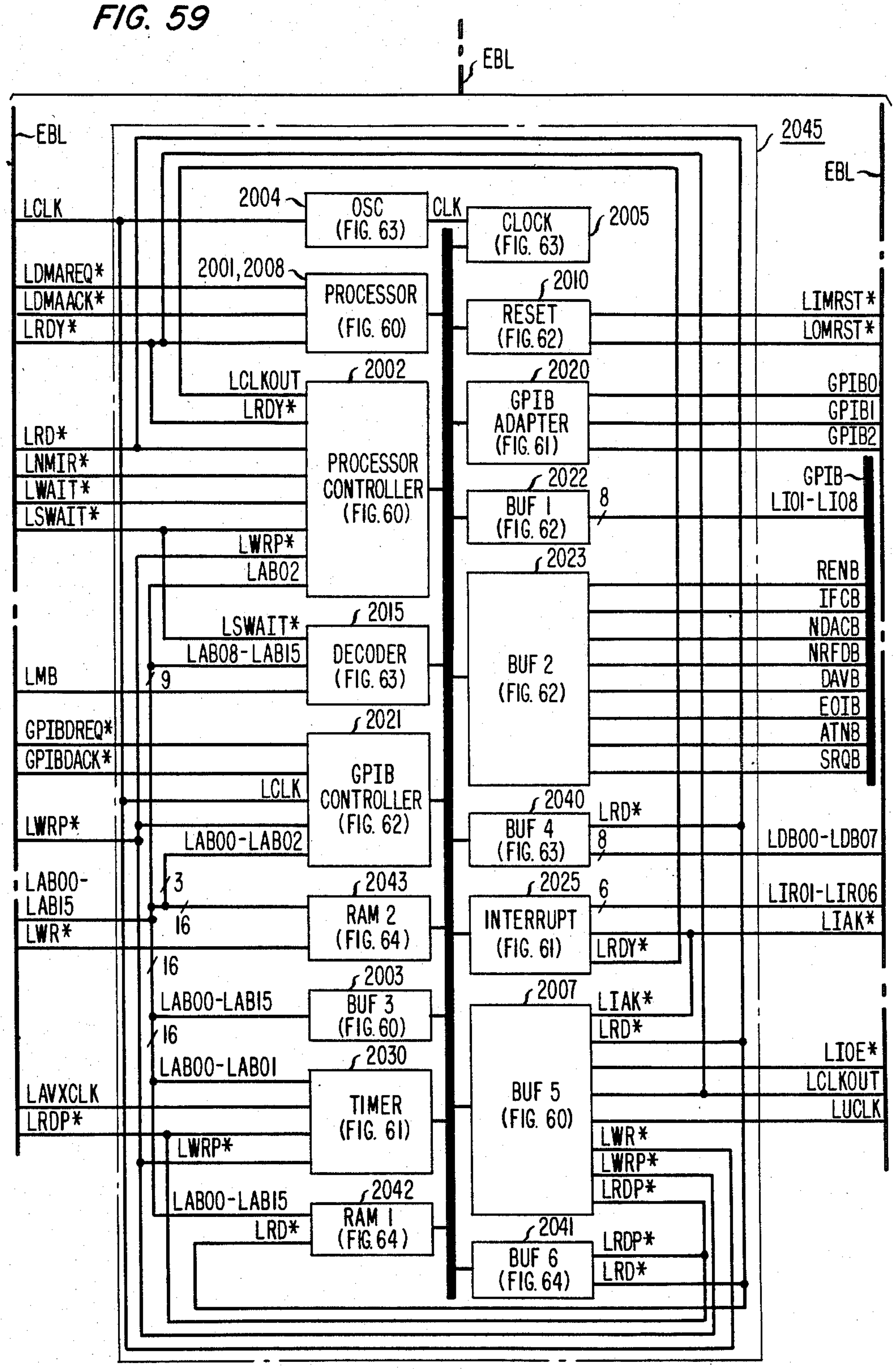
FIG. 59 is a block diagram representation of the CPU circuitry utilized to implement either the LTS main controller, port main controller or the PMU main controller.

Now with reference to FIG. 59, the circuitry of LTS main controller 2045 comprises: microprocessor devices 2001 and 2008 and associated processor controller 2002; GPIB interface circuitry including adapter 2020 and controller 2021; clock and timing circuitry including oscillator 2004, clock divider 2005, timer 2030 and reset 2010; memories 2042 and 2043 as well as chip select decoder 2015; interrupt circuitry 2025; and numerous data, address and control buffers 2003, 2007, 2022, 2023, 2040 and 2041. Each of the networks depicted by the block diagram of FIG. 59 is now discussed in more detail.

Figure 60:
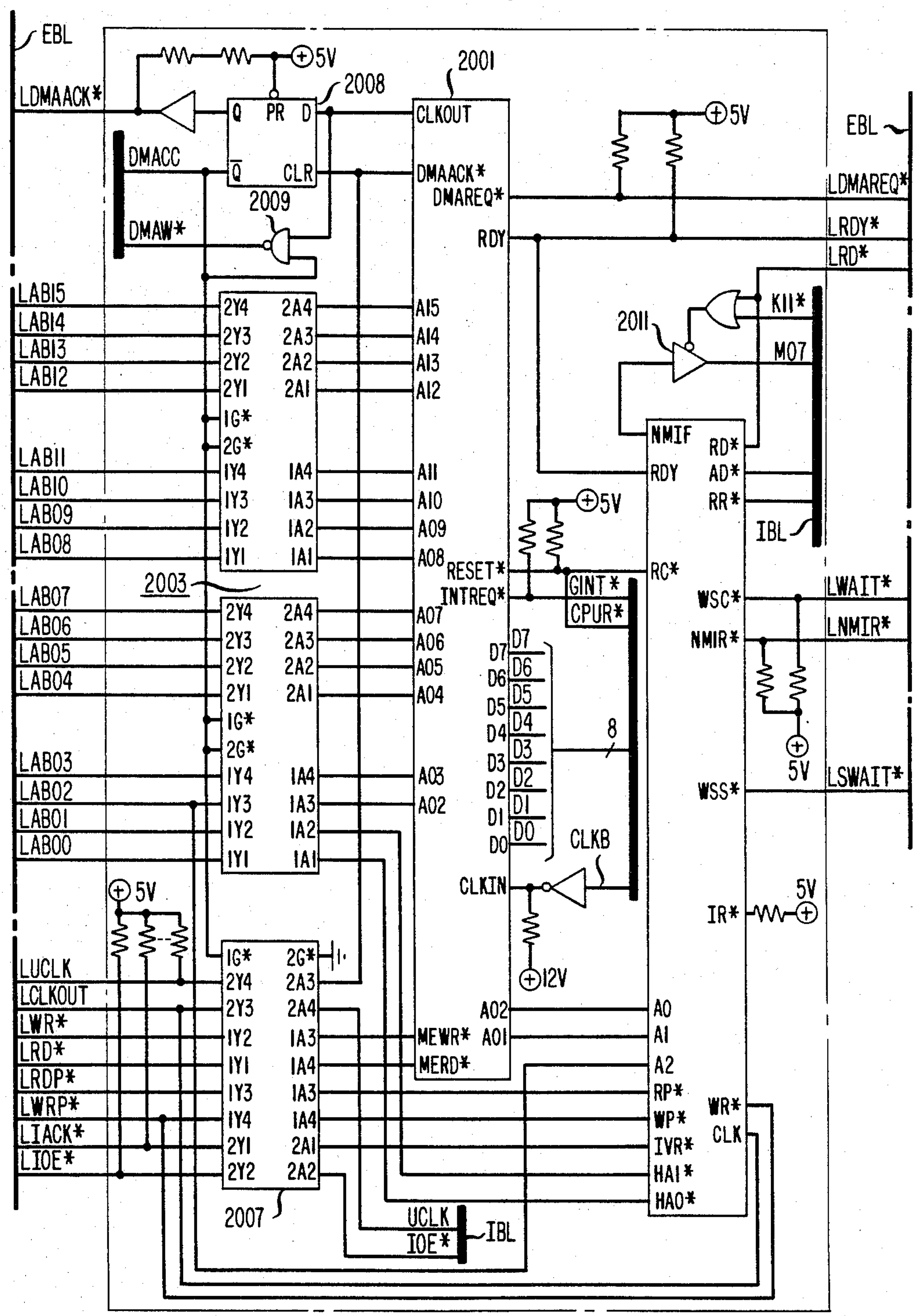
FIGS. 60 through 64 are schematics of the different modules forming the basic main controller as depicted by FIG. 59 and include, respectively: the microprocessor and its associated controller as well as bus buffers; timer and bus adapter; bus controller and associated buffers as well as system reset; system oscillator and clock divider; and two types of random access memory.

Referring now to FIG. 60, device 2001, in the preferred embodiment, is also a BELLMAC-8 microprocessor and its associated process controller 2002 is a type 129CY timing generator. Internal address leads A00–A15 of device 2001 are transformed into external bus address leads LAB00–LAB15 via buffer 2003 (BUF3), although address leads A00 and A01 are latched into controller 2002 before connection to buffer 2003. A pair of S244 line drivers cooperate to form buffer 2003. The buffered address leads LAB00–LAB15 serve as inputs to other circuits of FIG. 59 as well as appearing on the external bus EBL.

Figure 61:
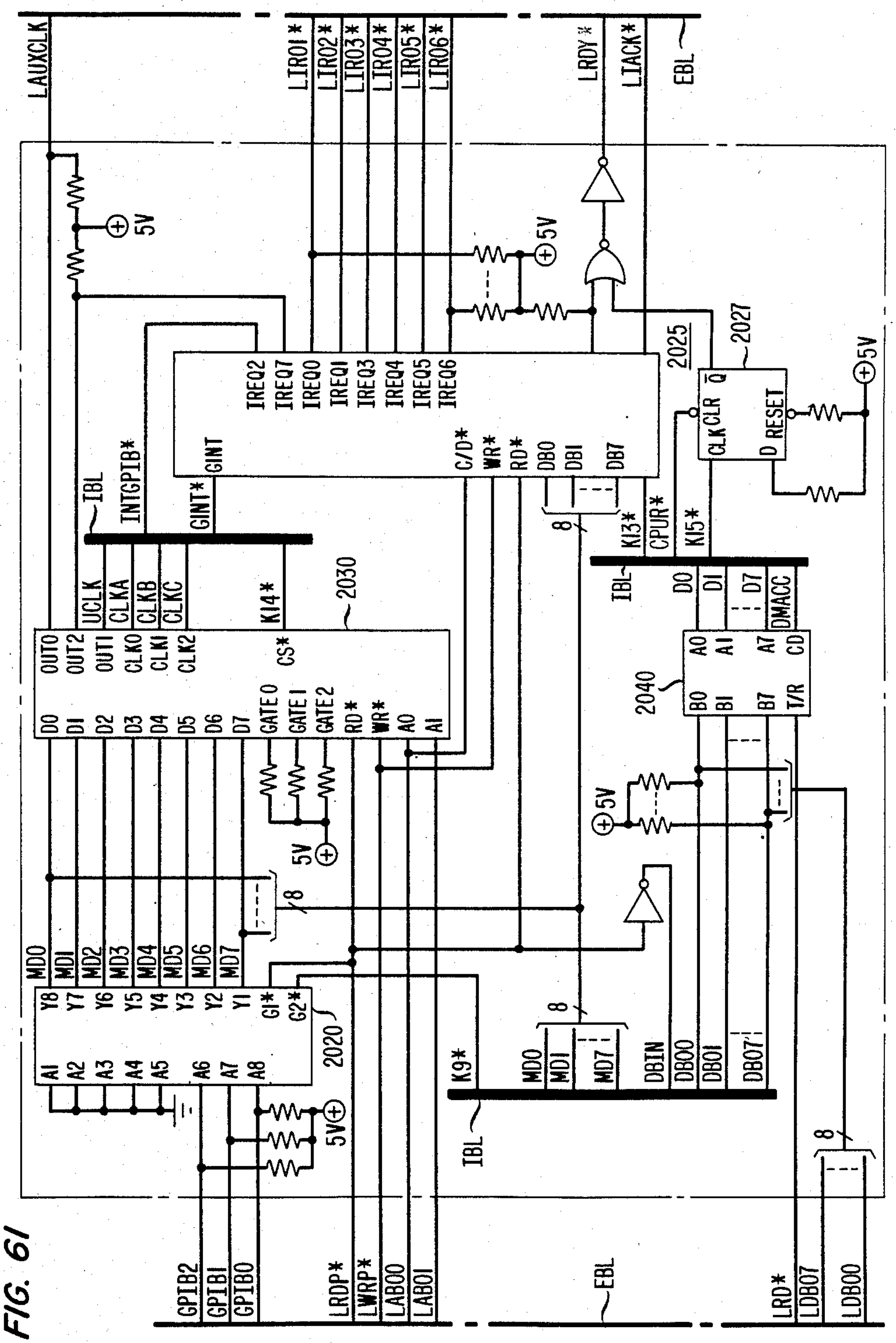

Internal data leads D0–D7 originating on device 2001 connect to buffer 2040 (BUF4) of FIG. 61 via internal bus IBL. Buffer 2040 is a type 8304 transceiver and the direction of propagation of logic signals through buffer 2040 is controlled by the READ signal designated LRD*. The data bits appear on bus EBL as bits LDB00–LDB07. In addition, since data bits LDB00–LDB07 are utilized for memory accessing information, these bits are buffered from RAM1 2042 and RAM2 2043 of FIG. 64 by transceiver 2041 (BUF6), another type 8304. Device 2041 is enabled via the CD* signal and its direction is controlled by the AND'ing of the LRD* and LRDP* signals.

Figure 63:
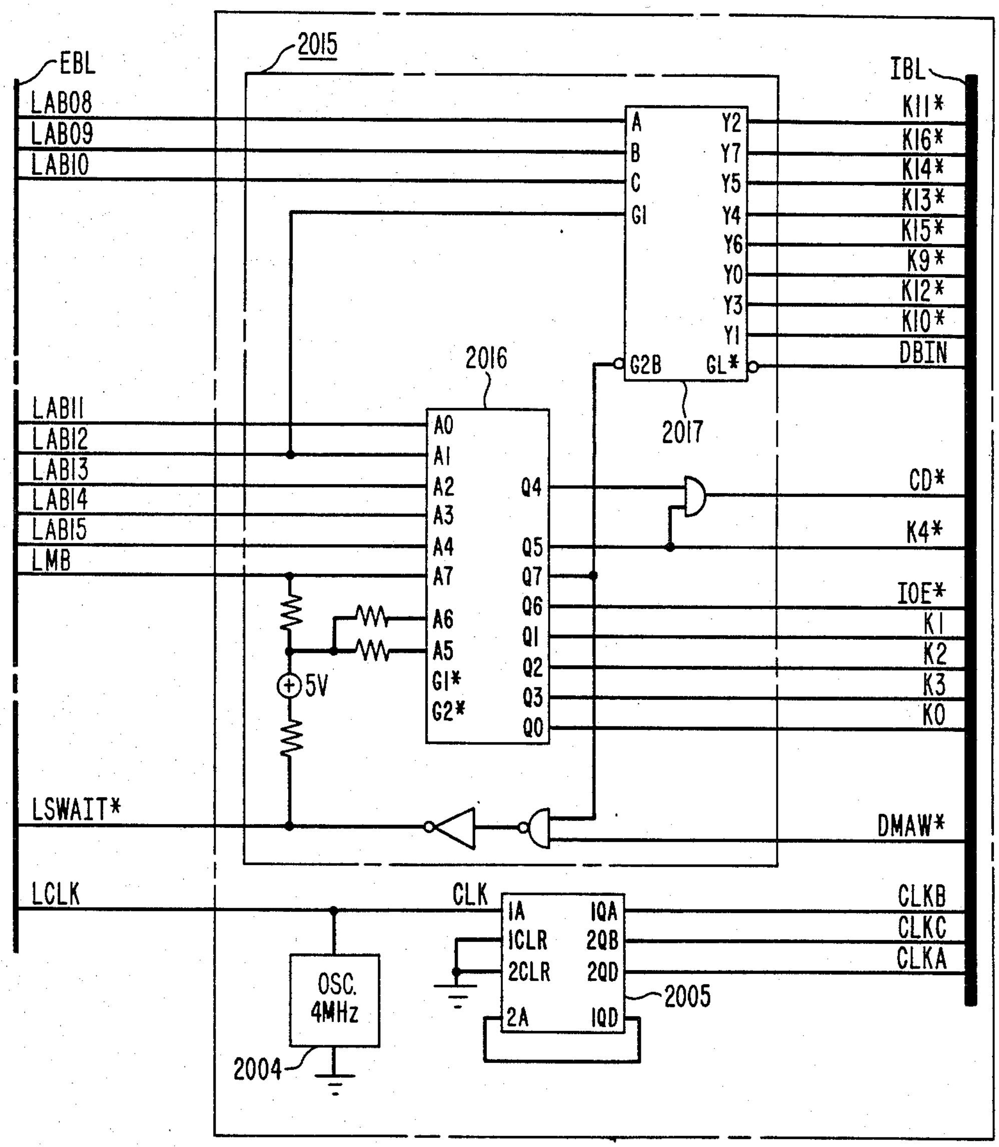

The clock signal for timing device 2001 is derived from oscillator 2004 and clock divider 2005 of FIG. 63. Oscillator 2004 produces a square-wave output with a frequency of 4.0 MHz. Clock divider 2005 is an eight stage counter, but only three outputs are selected. In particular, CLKA, CLKB, and CLKC correspond, respectively, to 15.625 kHz, 2 MHz and 62.5 kHz. CLKB is buffered and transmitted over IBL to drive device 2001 at its resonator input (CLKIN); inverter 2006 connected between CLKB and CLKIN raises the clock signal level to that required by device 2001.

Figure 62:
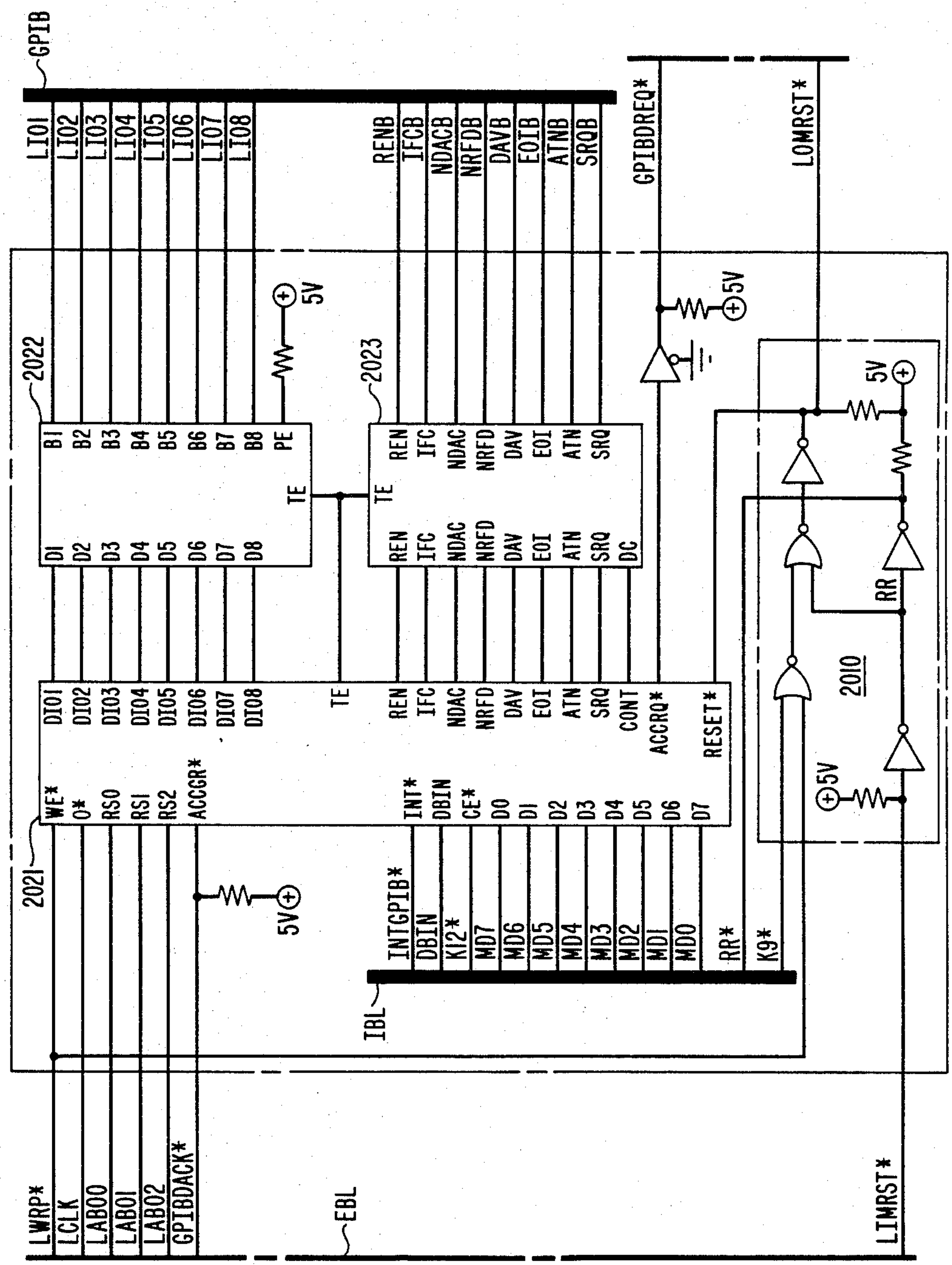

Microprocessor 2001 has its reset input (RESET*) connected to the RC* output of controller 2002. Thus, a reset is generated whenever a low-going signal is applied to the RR* or NMIR* ports of controller 2002. As depicted in FIG. 62, the RR* signal is basically a buffered version of the master reset input (LIMRST*). The master reset output (LOMRST*) is developed from NOR'ing the RR signal and the software reset signal; the latter is generated whenever a write operation is performed to a particular memory location, which is chosen as 0×F800 in the illustrative embodiment.

Controller 2002 generates write and read signals LWRP* and LRDP* , respectively, for use with standard peripheral devices. These signals are buffered via line driver 2007 (BUF5) of FIG. 60; driver 2007 is also a S244 device. Controller 2002 causes the DATA READY (RDY) lead of device 2001 to go low for one clock cycle whenever the WSS* of controller 2002 is brought low. The insertion of a wait state (WSS*) is required in order to generate the LWRP* and LRDP* signals.

The control of direct memory access is provided by flip-flop device 2008 and NAND gate 2009 of FIG. 60. This arrangement produces a delayed LDMAACK* signal whenever a LDMAREQ* is asserted. Additionally, the DMA circuitry causes the insertion of a wait state into the cycle time of device 2001 following the end of a DMA operation. This occurs whenever a LDMAREQ* is asserted and device 2008 provides the delayed LDMAACK* since buffers 2003, 2007 and 2040 are placed into the tri-state condition until the end of the DMA access cycle when LDMAACK* goes high.

Decoder 2015 of FIG. 59 is comprised of PROM 2016 and latching 3-8 decoder 2017 shown in FIG. 63. PROM 2016 is Texas Instrument type 28L22 programmed so that all addresses A0–A7 in the range 0×00 to 0×F5 have data bits that are all 1's, whereas addresses 0×F6–0×FF have the following hexidecimal data, respectively: CF, CF, EE, ED, EB, E7, BF, BF, BF and 6F. Outputs K0–K3 are the chip select signals for RAM1 2042 of FIG. 64. The IOE* output is converted to the system input/output enable LIOE* via buffer 2007 of FIG. 60. The K4* output is the chip-enable signal for RAM2 2043. The K4* signal is AND'ed with the signal appearing on Q4 of PROM 2016 to provide the CD* signal which enables buffer 2041 of FIG. 64. Finally, output Q7 of PROM 2016 is the decoder enable signal for decoder 2017. The Q7 output also forces WSS* of controller 2002 low to cause the generation of a peripheral access cycle via LSWAIT*.

Decoder 2017, typically a LS137, provides local decoding information. For instance, K9* is utilized for software reset (FIG. 62) and to enable GPIB adapter 2020 of FIG. 61. The DBIN signal, which is an inverted, buffered version of LRDP* (FIG. 61), is used to latch the outputs of decoder 2017 to avoid changing chip selects until LRDP* has become invalid.

The GPIB interface circuitry comprises adapter 2020 of FIG. 61, controller 2021, data bus transceiver 2022 (BUF1) and control transceiver 2023 (BUF2), the latter three elements being depicted in FIG. 62. Adapter 2020 serves as the GPIB address register and is type 81LS95 supplied by National Semiconductor. The GPIB0–GPIB2 status leads on bus EBL correspond to inputs A8–A6, respectively. Adapter 2020 is selected by a read from a specific memory location, in this case 0×F800, which generates the K9* signal. As suggested above when FIG. 58 was discussed, the circuitry of FIG. 59 serves as a foundational element for LTS (2000), port (2200) and PMU (3100) controllers. Selection of the proper configuration in the specific environment is effected by the status of leads GPIB0–GPIB2. For instance, if the circuitry of FIG. 59 is to serve as LTS main controller 2045, the GPIB0–GPIB2 leads are grounded. In terms of a bit pattern, the status may be summarized as '000'. If the circuitry serves as port main controller 2245, a '001' bit pattern describes the state of leads GPIB0–GPIB2 with GPIB2 being the high or '1' bit.

Controller 2021, which is a 9914 supplied by Texas Instruments, can be programmed to operate as a Talker, a Listener or Controller or any combination of each depending on the environment. For the LTS, it is a T/L/C. Chip enable is supplied by K12* and register select lines RS0–RS2 by leads LAB00–LAB02 from bus EBL. Transceiver 2022, a SN75160 device furnished by Texas Instruments, buffers controller 2021 from bits LI01–LI08 on the GPIBL bus. Similarly, transceiver 2023, a SN75161 device also furnished by Texas Instruments, buffers the conventional GPIB control leads appearing on bus GPIBL to controller 2021.

Interrupt control section, depicted by block 2025 in FIG. 59, comprises interrupt controller 2026 (a PIC 9519) and D-type flip-flop 2027 (a LS74 type device) both shown in FIG. 61. Controller 2026 is selected by K13* and enabled by address lead LAB00. The interrupt requests appear on leads LIR01*–LIR06* emanating from bus EBL. Internal interrupt request lines IREQ2 and IREQ7 are serviced by GPIB controller 2021, via the INTGPIB* lead, and timer 2030 via its OUT2 port. Device 2027 is the PIC enable circuit which insures that the PAUSE output is disabled until a software initialization has occurred. This flip-flop is reset any time a CPUR* feeds its CLR input; CPUR* is generated whenever process controller 2002 outputs a reset (RC*). To enable PAUSE, an access of location 0×FE00 must be performed. When controller 2026 receives any interrupted request at any of its interrupt ports, it generates a GINT* signal. This signal serves to interrupt device 2001 and thereby causes devices 2001 to perform an interrupt vector read of location 0×FFFF. The LIACK* signal is generated by device 2001 when a read operation is performed on any locations from 0×FF00 to 0×FFFF. A low LIACK* with a valid LIR01*–LIR06* causes the PIC to place an eight-bit interrupt vector onto its DB0–DB7 ports. During this sequence, PAUSE will go low to allow the PIC to determine the priority and vector corresponding to the associated LIR01*–LIR06* input. There is also a nonmaskable interrupt facility provided by controller 2002 and gate 2011 of FIG. 60. If LNMIR* is brought low, then the NMIF port of controller 2002 goes high and an RC* signal is generated. The NMIF output can be read by accessing location 0×FA00 where bit 7 contains the NMIF state.

Interval timer 2030 of FIG. 59 is PIT device 8253 of FIG. 61. This timer is selected by K14* and address leads LAB00 and LAB01. The PIT contains three independent sixteen bit counters with CLK0, CLK1 and CLK2 serving as the input ports to these counters. CLKA, CLKB and CLKC provide the input drive to these clock ports. The output of the first counter, on OUT0, provides nonbuffered clock output LAUXCLK. The output of the second counter, on OUT1, is buffered by device 2007 and appears on bus EBL as LCKLOUT. The third counter output, OUT2, generates an interrupt pulse every 100 msec. to provide timing for the software operating system.

Figure 64:
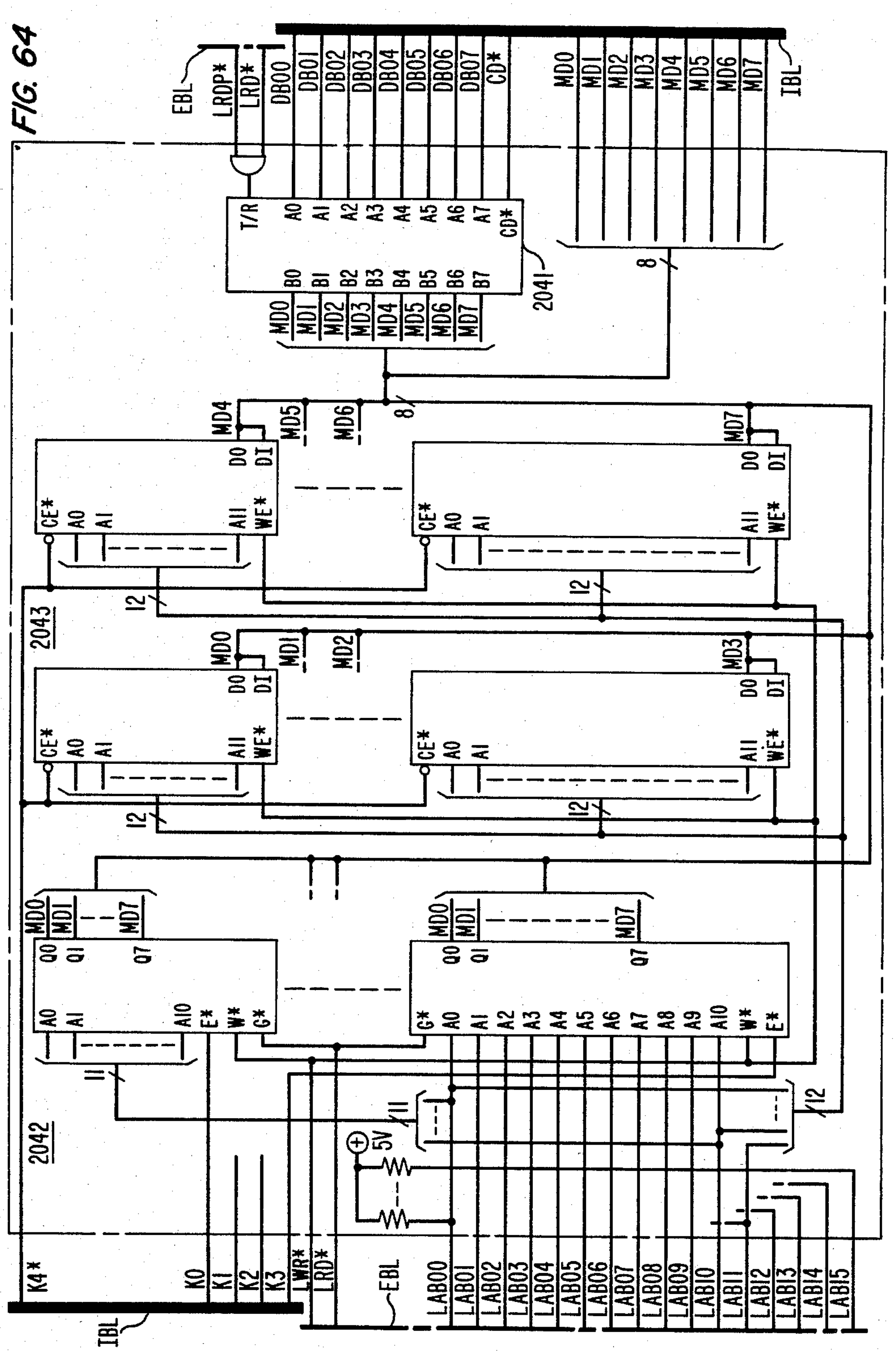

The memory section of FIG. 64 depicted by RAM1 2042 comprises four 2K×8 RAM devices 61A, which are selected (E*) by K0-K3, respectively, are written with LWR*, read by LRD* and addressed by LAB0-0-LAB10. An additional 4K of RAM is provided by RAM2 2043 comprising eight 4K×1 static devices 39A furnished by the Western Electric Co. Each output bit from the eight devices comprising RAM2 is grouped with the other output bits to form data bits MD0–MD7. The combination of RAM1 and RAM2 provides 12K bytes of RAM which is memory-mapped in the range 0×B000–0×DFFF. A more detailed memory map will be discussed shortly.

Figure 65:
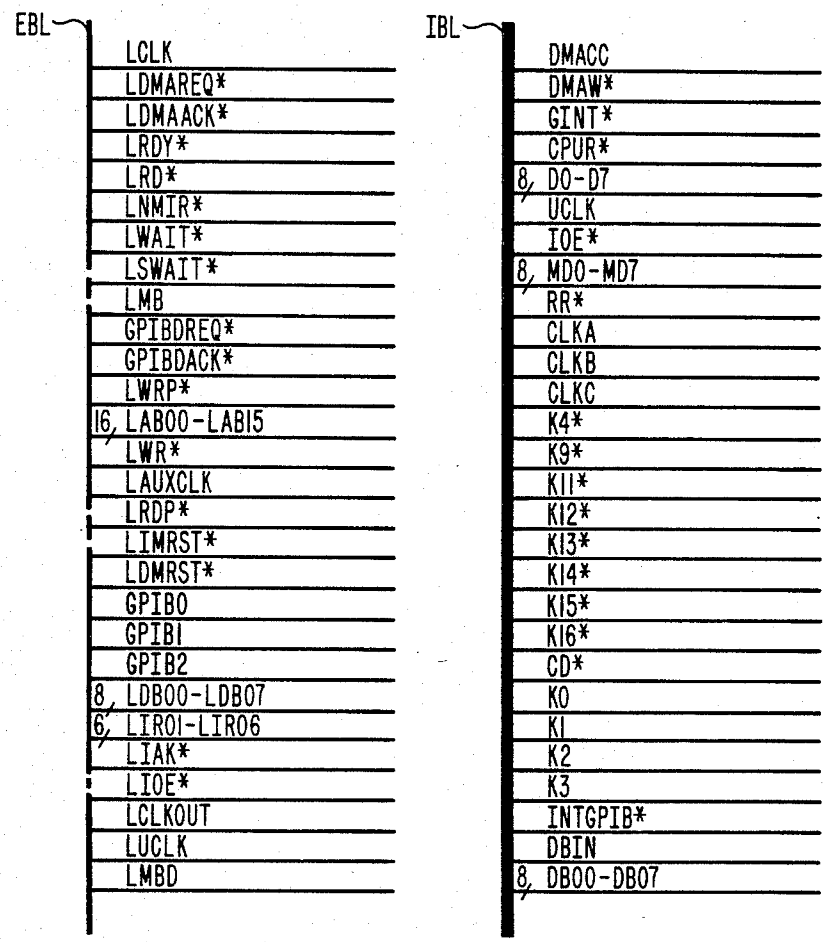
FIG. 65 depicts the signal leads comprising the external and internal busses shown in FIG. 60.

A summary of the signals appearing on both external bus EBL and internal bus IBL is presented by line diagrams of FIG. 65.

3.2.1b LTS Universal Memory

Figure 66:
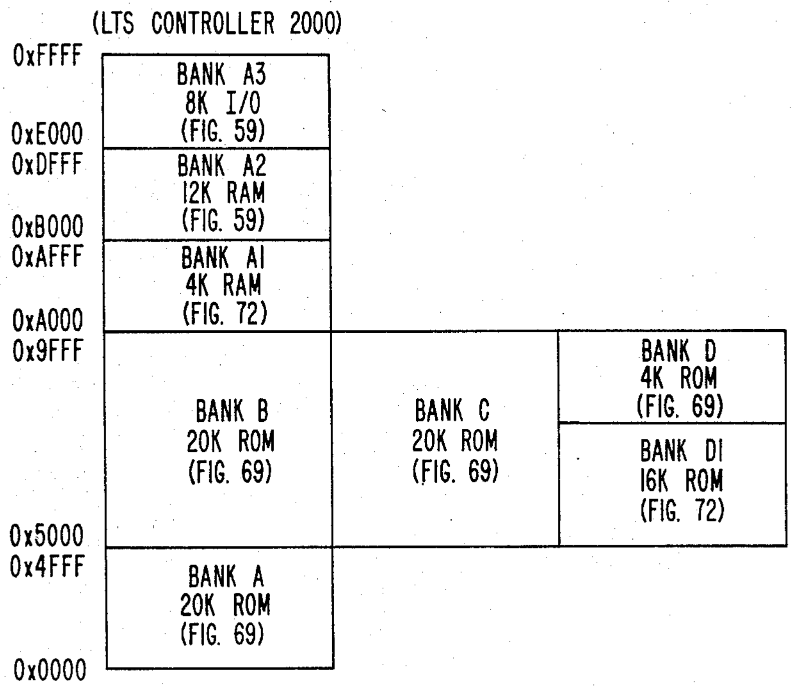
FIGS. 66 through 68 indicate the memory allocation, including those bank-switched portions, for the LTS controller, the port controller and PMU controller, respectively.
Figure 69:
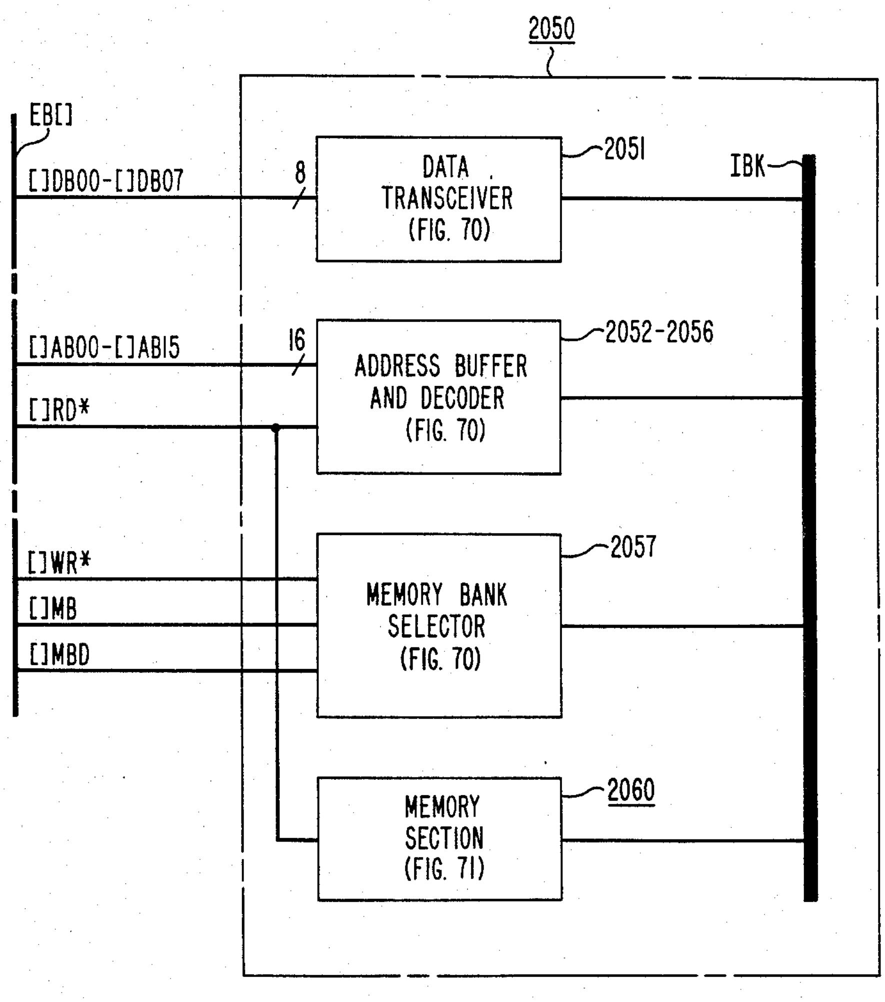
FIG. 69 is a block diagram of the universal memory board which indicates that FIG. 70 provides the schematic diagrams for the data transceiver, address buffer and decoder as well as the bank selector portions of the universal memory whereas FIG. 71 provides the arrangement of memory devices.

Universal memory 2050, shown in block diagram form in FIG. 69, is used for three different applications in LTS 160 (FIG. 11); it proves expedient to discuss them at this point and later discussion need only mention them in passing. Memory 2050 supplies LTS controller 2000, port controller 2200 or PMU controller 3100 (FIG. 17) with 64K bytes of ROM. This memory is divided into banks that are dynamically mapped into the address space of an individual controller as needed. For instance, FIG. 66 depicts 64K of addressable memory space (0×0000–0×FFFF) in the ordinate direction. The 20K of memory from 0×B000–0×FFFF, combining BANK A2 with BANK A3, is provided by LTS main controller 2045 of FIG. 59, as discussed above. Of this 20K, BANK A3 is allocated to I/O functions.

Figure 67:
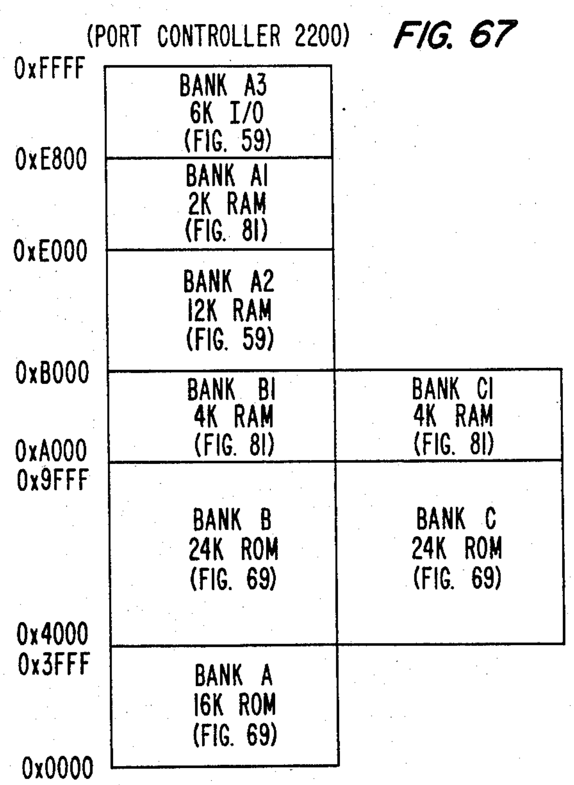
Figure 68:
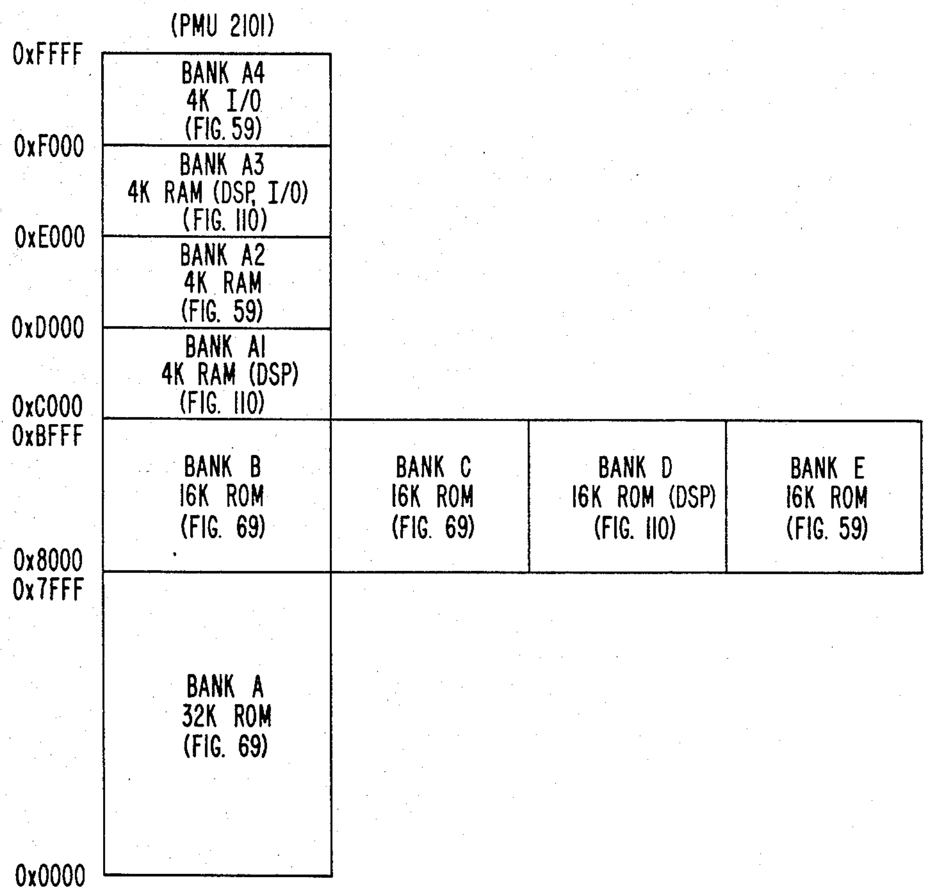

The memory from 0×0000–0×4FFF, shown as BANK A, represents 20K of ROM provided by universal memory 2050. This bank is never switched. However, the memory space 0×5000–0×9FFF, at any given time, may be provided by BANK B, BANK C or the combination of BANK D and BANK D1. The former three banks are located on universal memory 2050 and are switched according to the particular task requiring processing. BANK B and BANK C are both 20K, but BANK D is only 4K. Thus, whenever BANK D is switched, a simultaneous switch is made to BANK D1, which is 16K of ROM located on data line interface circuitry 2070 of FIG. 72 (to be discussed shortly). The final 4K of memory, from 0×A000–0×AFFF, is RAM provided by interface circuitry 2070 of FIG. 72. FIGS. 67 and 68 show memory allocation and provisioning for port controller 2200 and PMU 2101, respectively, and these allocations will be discussed later.

Now with reference to FIG. 69, universal memory 2050 is composed of data transceiver 2051, address buffer/decoders 2052–2056, memory bank selector 2057 and ROM memory section 2060.

Figure 70:
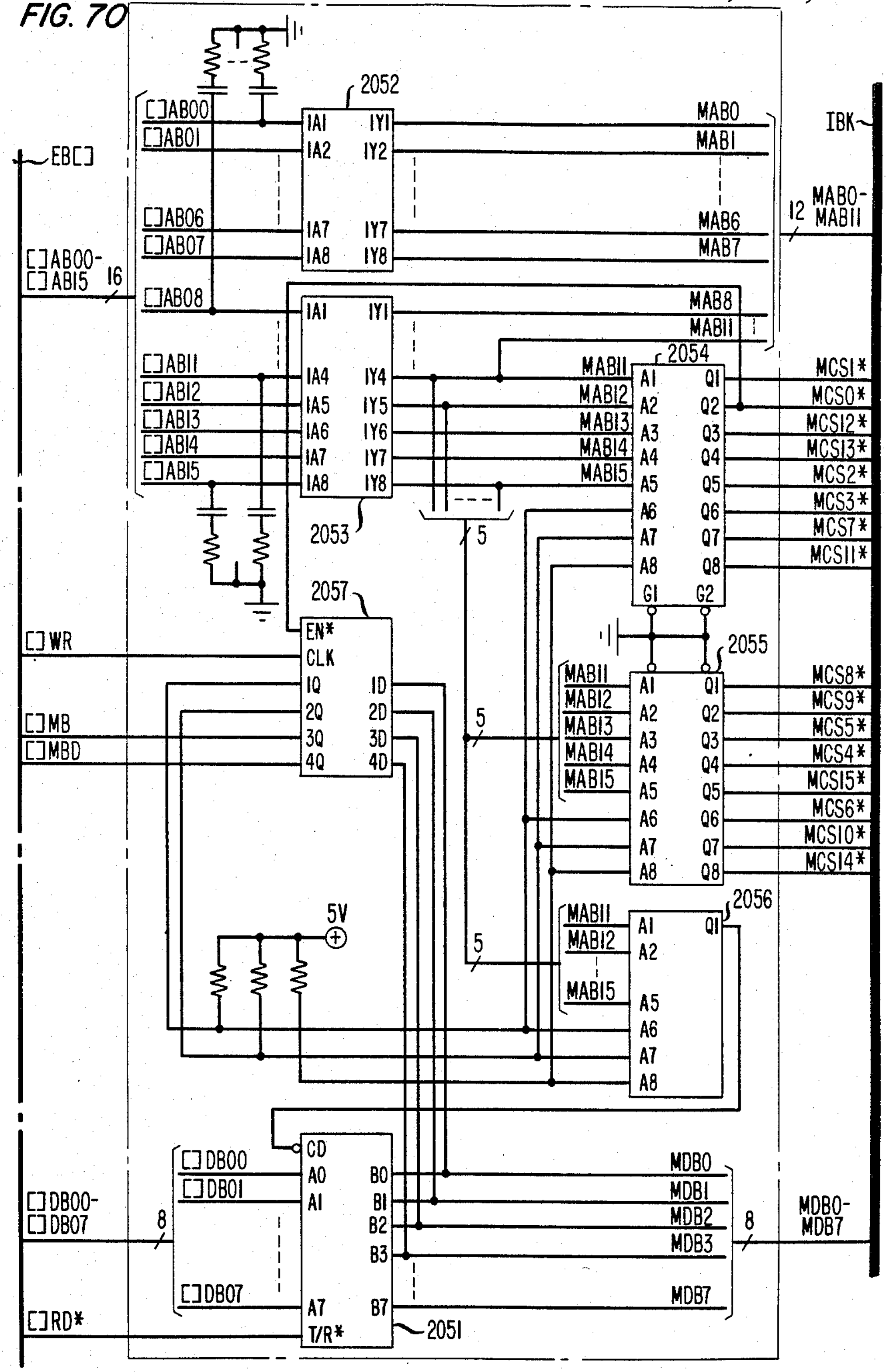

As depicted in FIG. 70, data transceiver 2051, a 8304 type device, provides buffering and bidirectional drive for the system data lines []DB00-[]DB07. (The brackets [] indicate that the controller designation is inserted where applicable; thus, for LTS controller 2000, L is substituted for []; a P applies to port controller 2200; and R applies to PMU controller 3100). The direction of propagation is determined by the system read lead []RD* appearing on external bus EBM.

For each application of memory 2050, a unique decoding format is contained in the three PROM's 2054–2056; these PROM's are type 28L22 in the preferred embodiment. In particular, for LTS operation (L substitutes for []), one particular chip select in the range MCS0*-MCS4* is activated for BANK A operation, a chip select MCS5*-MCS9* for BANK B, a chip select MCS10*-MCS14* for BANK C, and chip select MCS15* for BANK D.

Figure 71:
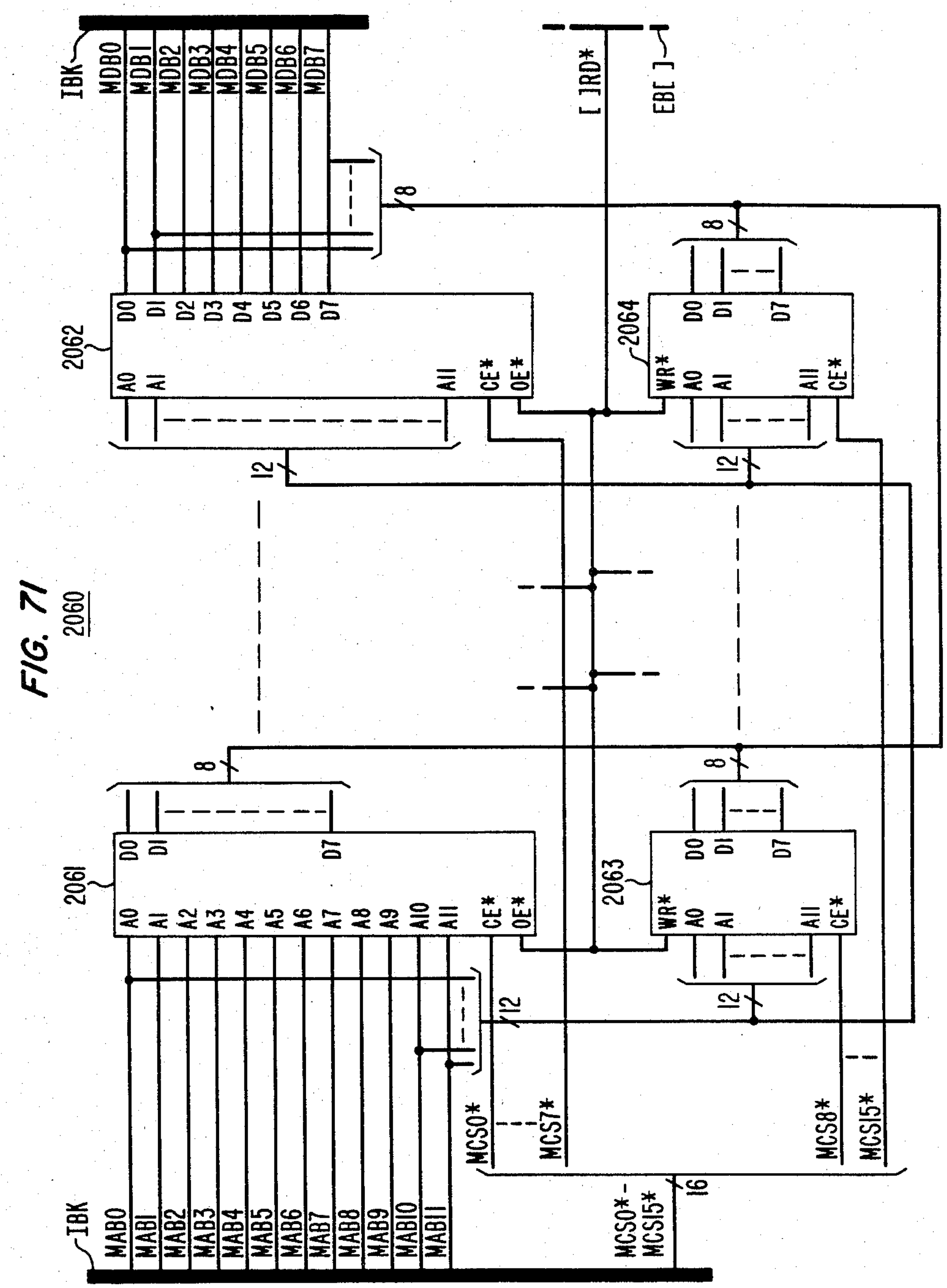

There are two types of operations that involve accessing memory 2050. These operations are "memory read" and "bank select". Both operations begin by placing an address on memory address leads []AB00-[-]AB15. The address bits on these leads are buffered by line drivers 2052 and 2053, which are S244 type devices. If a memory read is required, the address may range from 0×0000 to 0×FFFF. On the other hand, if a bank select is desired, the address supplied is 0×0000. Address leads []AB00–[]AB11 are presented, via lines MAB0–MAB11, directly to memory section 2060 of FIG. 71. This section 2060 comprises sixteen 4K×8 ROM devices of the type 2732A supplied by Intel. Four such ROM devices are depicted in FIG. 71. ROM 2061 is enabled by chip select MCS0* so it forms a portion of BANK A. ROM 2062 is a portion of BANK B and it is enabled by MCS7*. The sixteenth device, ROM 2064, is assigned to BANK D and it is enabled by MCS15*.

The remaining address lines MAB12–MAB15, as well as MAB11, are presented to decoder devices 2054–2056. Devices 2054 and 2055 generate the one-in-sixteen chip selects whereas device 2056 generates the enable for transceiver 2051. When a bank select operation is desired, the []WR* signal is pulled low. This forces transceiver 2051 into the write mode and upon the rising edge of the write pulse, the lower four bits of data bus []DB00–[]DB07 are latched by selector 2057, a 74LS379 supplied by Texas Instruments. Bits MDB0 and MDB1 are presented to decoders 2054–2056 for selection of the appropriate BANK (B, C or D) to be associated with BANK A. In addition, MDB2 and MDB3 are buffered by selector 2057 and appear on bus EB[] as []MB and []MBD, respectively; these two signals enable memory within LTS main controller 2045 and data line interface 2070.

If a memory read operation is desired, the read line []RD* is pulled low, thereby enabling memory section 2060 to output data bits MDB0–MDB7 and forcing transceiver 2051 into the read mode. Thus, the contents of the addressed memory location are available on []DB00–[]DB07.

3.2.1c LTS Serial Data Line Interface

Figure 72:
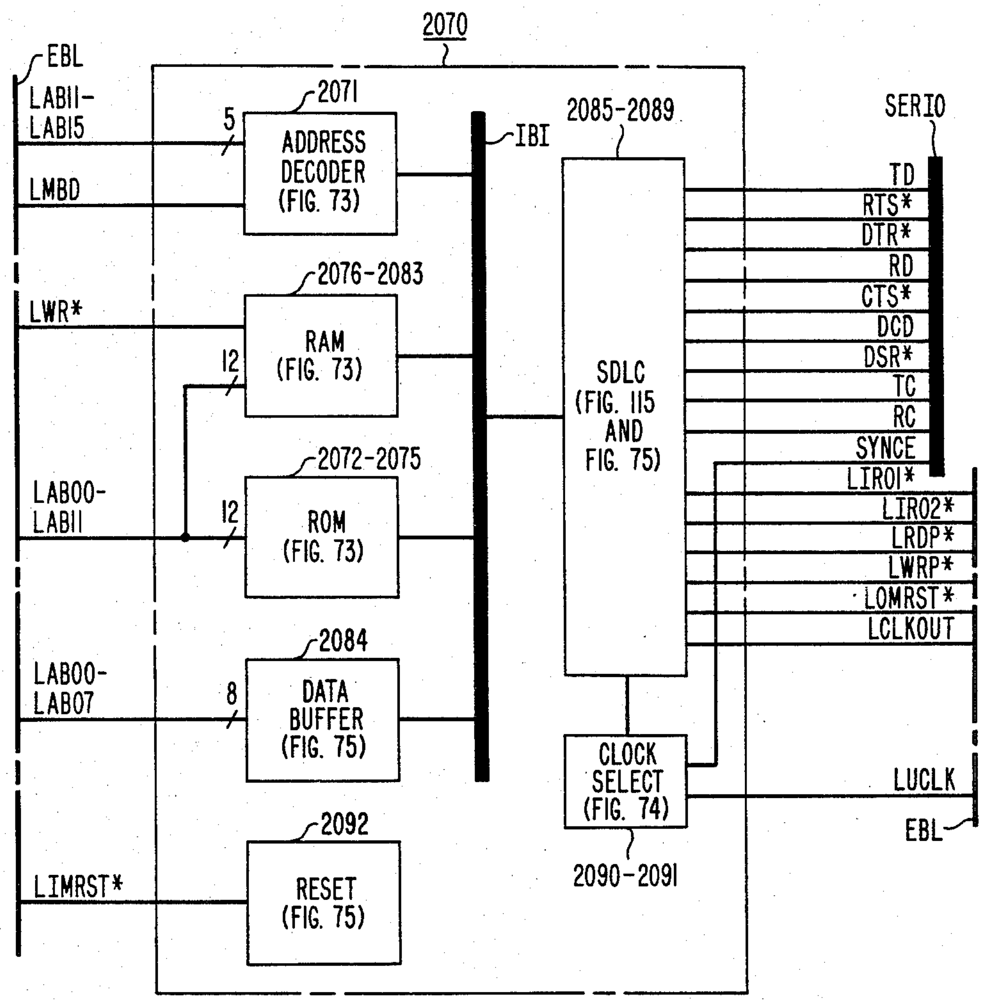
FIG. 72 is a block diagram of the data line interface associated with the LTS conroller of FIG. 58.

Data line interface circuitry 2070, shown in block diagram form in FIG. 72, provides the primary functions of (1) interfacing full-duplex serial communication link 930 connecting DCN 140 and LTS controller 2000, (2) furnishing 4K of RAM required by BANK A1 (FIG. 66) and 16K of ROM for BANK D1, and (3) generating numerous enable signals for talk circuits 2301–2306, direct distance dialer 2400, ringing distributor 2500 and access network 2070. As depicted in FIG. 11, these enable signals are delivered to the various circuits via bus 20002.

Figure 73:
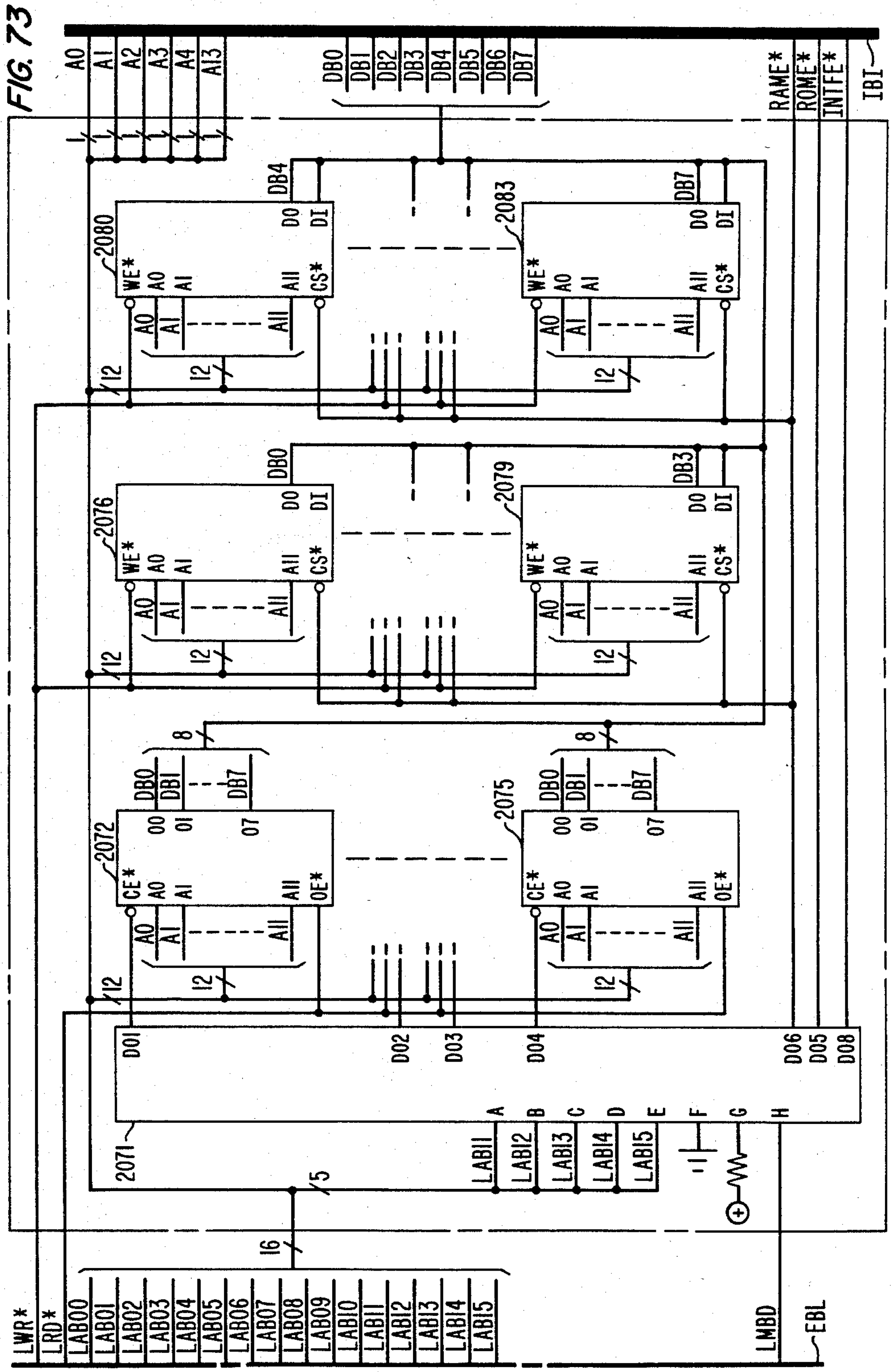
FIGS. 73 through 75 are schematics of the subcomponents comprising the data line interface of FIG. 72 and include, respectively: read-only memory and random access memory realizations as well as address decoding for these memories; synchronous data link protocol controller and associated clock; an reset and data buffer circuitry.

Referring now to FIG. 73, decoding for interface circuitry 2070 is provided by device 2071, a 28L22 bipolar PROM. Decoded outputs appear on ports D01–D08 of device 2071, which is coded as follows: all memory locations contain 0×FF except locations 0×6C–0×6F, which contain hexidecimal EE, EE, ED and ED, respectively; 0×70–0×75 contain hex EB, EB, E7, E7, DF, DF; 0×7C and 0×7D, as well as 0×FC and 0×FD, contain hex BF and 7F, respectively, and, finally, 0×F4 and 0×F5 both contain 0×DF.

ROM devices 2072–2075, which are 4K×8 EPROM's, provide the 16K bytes of memory designated BANK D1 in FIG. 66; in the preferred embodiments, these devices are type 2732A. Decoder outputs D01–D04 are the corresponding chip select signals, and system line LRD* furnishes the read signal. Bits DB0–DB7 combine to form the desired output byte. This data byte is buffered from the system data bus bits LDB000–LDB07 by transceiver 2084 of FIG. 75, which is a type 8304 device.

RAM devices 2076–2083, which are 4K×1 fully static RAM's, provide the 4K bytes of memory designated BANK A1 of FIG. 66; in the preferred embodiment, these devices are type 39A. Decoder output D06 provides the appropriate chip select and line LWR* enables a write operation. Each one-bit input or output from these devices is grouped to form internal data bus bits DB0–DB7.

Figure 74:
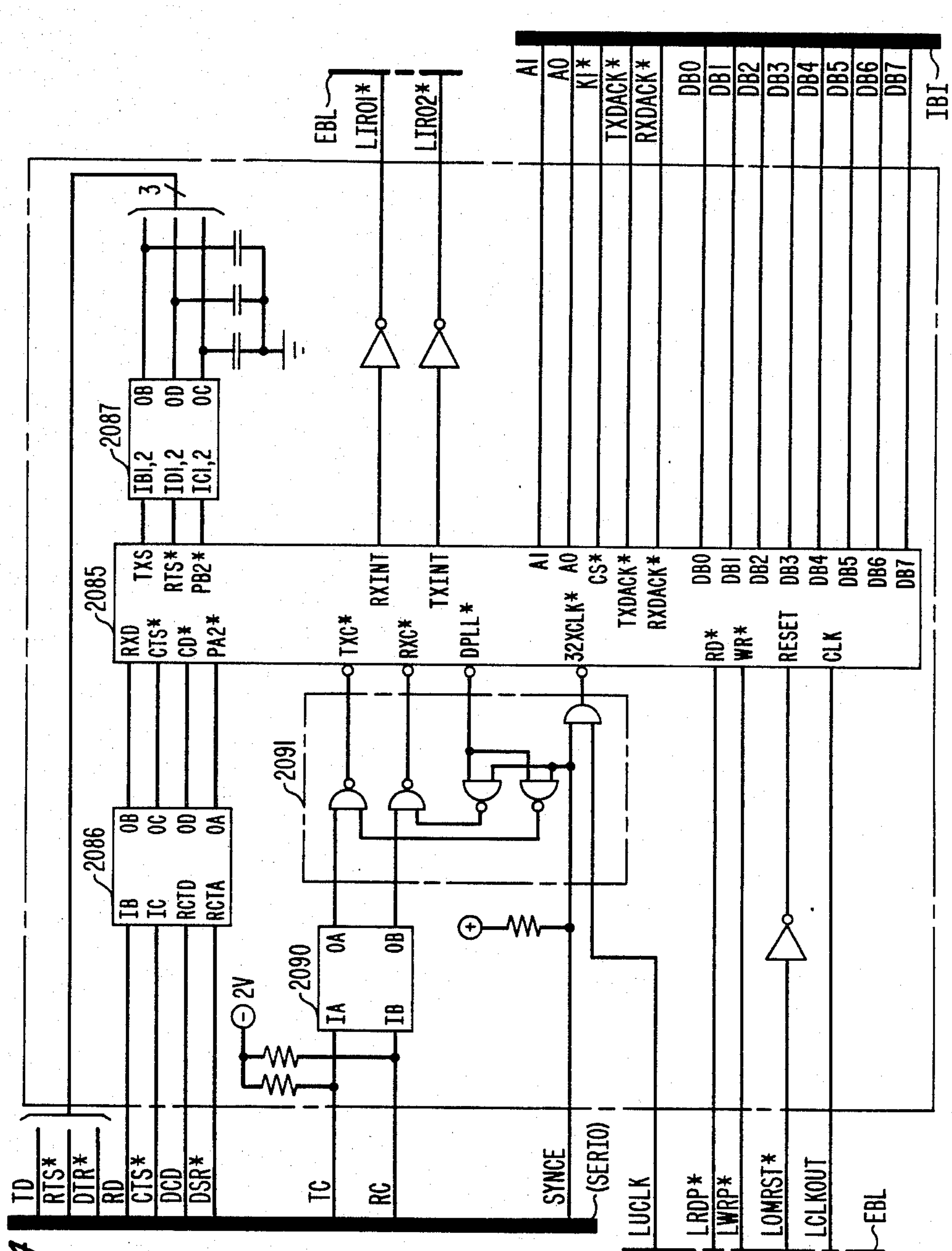
Figure 75:
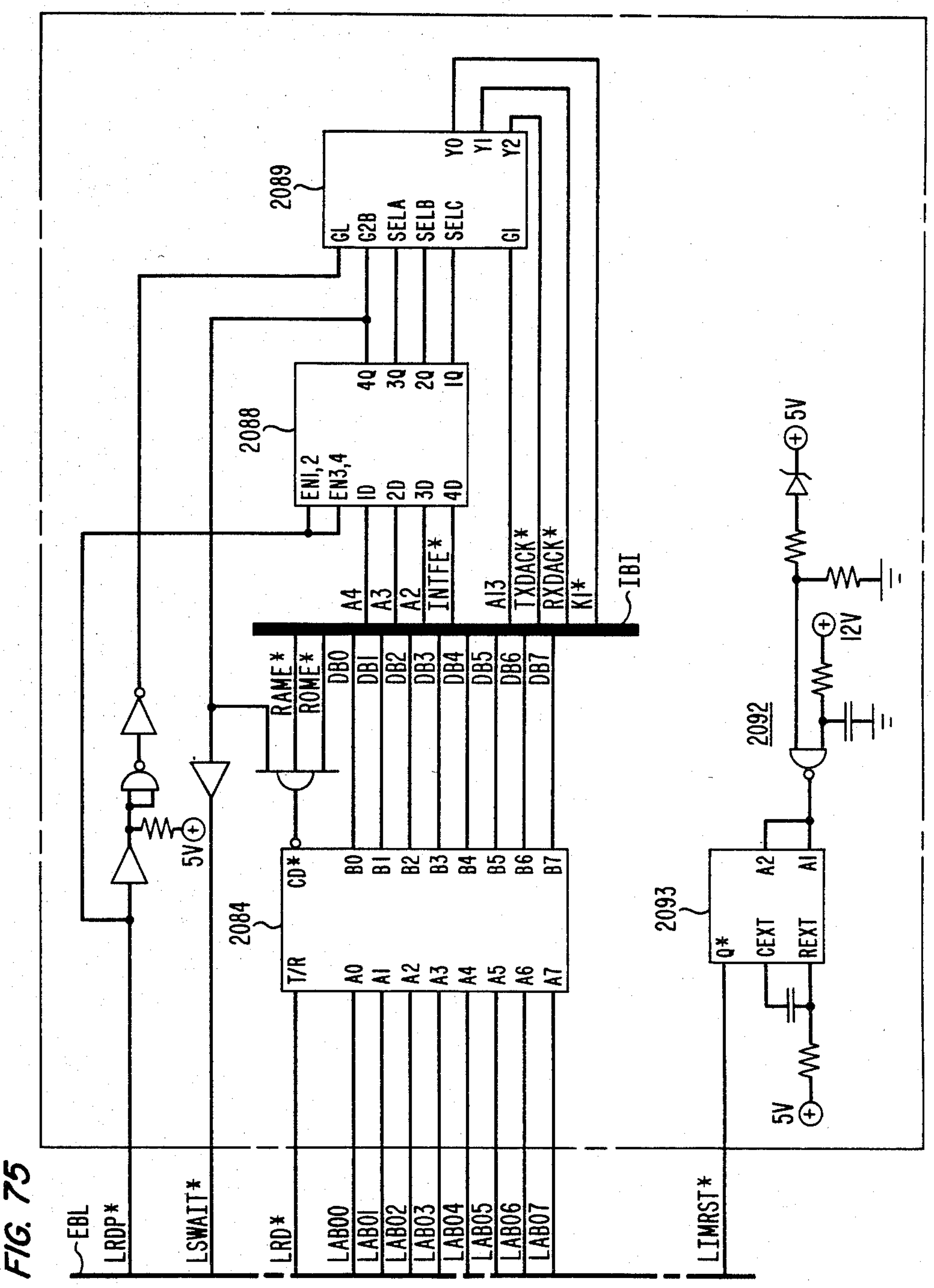

The SDLC circuit comprises devices 2085–2089 of FIGS. 74 and 75 as well as clock select circuit 2090–2091 of FIG. 74. In FIG. 74, controller 2085 is an Intel 8273 type device. Controller 2085 is addressed by the K1* signal. Latching device 2089 of FIG. 75, a LS137, is a latching decoder used to generate K1* as well as RXDACK* and TXDACK* control signals. Device 2088 of FIG. 75, a LS75, latches address inputs A2–A4 and chip-enable INTFE*. The LRDP* signal is used to latch the outputs of decoders 2088 and 2089 thereby eliminating address changes during a valid LRDP*. Buffer devices 2086 and 2087 of FIG. 74 perform RS232-TLL and TTL-RS232 level conversions, respectively. In the preferred embodiment, these devices are types 1489 and 1488, respectively.

Device 2090 and gate network 2091 form the baud clock select circuit. If synchronous data set operation is desired, SYNCE is grounded and clocks TC and RC from the data set (not shown) are converted by circuits 2090 and 2091 to corresponding clock inputs TXC* and RXC* for controller 2085. Transmit and receive interrupt requests for data communication are furnished by LIR01* and LIR02*, respectively, appearing on external bus EBL.

Reset circuit 2092 of FIG. 75 provides the system master reset signal LIMRST*. When both positive supplies reach their respective potentials, monostable 2093 triggers, thereby generating LIMRST*.

Not explicitly shown in data line interface circuit 2070 of FIG. 72 are the decode circuits providing enables signals for talk circuits 2301–2306, DDD circuit 2400, ringing distributor 2500 and access network 2700 of FIG. 11. Basically, address leads LAB06–LAB10 provide one-in-twenty individual decode signals which function as chip selects for twenty ancillary control registers. Each talk circuit, the DDD circuit, the ringing distributor or access network 2700 is controlled by appropriate chip selects. (General operation of the switching matrix will be discussed shortly). The twenty decode signals comprise bus 22001 of FIG. 11.

3.2.1d LTS Programs

A listing of the programs for operating the microprocessor within the illustrative embodiment of LTS controller 2000 is included as Appendix D Ser. No. 399,177. This microprocessor is the one represented by device 2001 of FIG. 60. The same format employed in the presentation of program information for DCN 140, that is, Appendices A, B and C Ser. No. 399,177, is utilized therein for Appendix D also. Thus, the table of contents, the listings themselves, the utility routines and the memory map may be gleaned from the material of that Appendix D.

3.2.1e Tests Sequences

As summarized in Section 2.2.1c, system test requests are controlled by LTS 160 although they are actually performed by PMU 2101, 2102 or 2103. The test circuit configuration established by LTS 160 as a result of these requests is discussed in detail in the following material. Item (i) in each case is the test definition whereas item (ii) presents the measurements performed.

1. AC3TY—AC Thevein Admittance Test (i) This test applies an AC voltage and measures the real and imaginary parts of the TIP-to-GROUND (T-G), RING-to-GROUND (R-G) and TIP-to-RING (T-R) current flow. Using these measurements, application programs in FE computer 220 or 221 evaluate the real and imaginary parts of the three terminal AC admittance. FE computer 220 or 221 specifies in the test request the AC voltage and frequency to be used during the measurements. Usually, these parameters are 10 V AC rms and 24 Hz (5 V AC rms for key telephones).

(ii) In test A, the requested AC voltage is applied to both TIP and RING and the real and imaginary parts of T-G and R-G currents are measured.

In test B, the requested voltage, at the same frequency of test A, is applied to the RING while the TIP is grounded. The real and imaginary parts of the T-G current are measured. (If this test is run at the same time as the DCT, to be discussed below, the voltage is applied to the same conductor as required in test C of DCT).

A final step in this sequence is to short TIP and RING to GROUND through 8K ohms for a period of 100 msecs, in order to discharge the line so as not to interfere with subsequent tests.

The following test results are returned;

| | |
|---|---|
| Test A: | 'icosA_TG' - real part of T-G rms current; |
| | 'isinA_TG' - imaginary part of T-G |

-continued

| | |
|---|---|
| | rms current; |
| | 'icosA_RG' - real part of R-G rms current |
| | 'isinA_RG' - imaginary part of R-G rms current; |
| Test B: | 'icosB' - real part of T-R rms current; |
| | 'isinB' - imaginary part of T-R rms current; |
| Parameters: | VAC - voltage applied in tests A and B; |
| | FREQUENCY - frequency used in tests A and B. |

2. ACDC_I—Short-circuit DC and AC Longitudinal Current

Short-circuit DC and AC rms (0–3k Hz) currents are measured T-G and R-G. If saturation occurs because the peak of T-G or R-G current exceeds b 125 ma, a 4:1 current division network is inserted and the test is repeated.

(ii) The longitudinal DC and AC rms currents with the near-end shorted to GROUND are measured in the TIP and RING, with or without th current division, as required. Corrections for current division are made in the appropriate PMU, and the following data are returned: 'DC-TG', 'DC-RG', 'AC-TG', 'AC-RG'.

3. BAL—Longitudinal Balance (i) A longitudinal voltage between 0 Hz and 2550 Hz is applied to both TIP and RING, and the resulting metallic voltage is measured. The usual frequency is 200 Hz.

Figure 76:
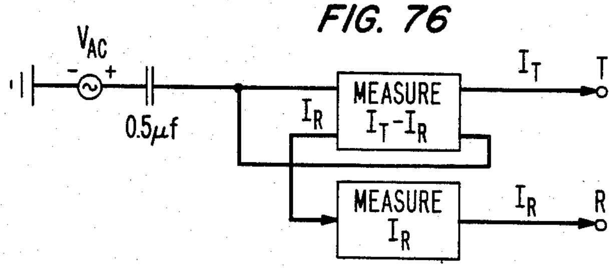
FIG. 76 is a block diagram representation of circuitry arranged to effect a measurement of loop balance.

(ii) A voltage $V_{AC}=50$ V AC rms is applied longitudinally as depicted in FIG. 76 and the resulting metallic $(I_T-I_R)$ and RING $(I_R)$ rms conductor currents are measured. The following data are returned: $(I_T-I_R)^2$ and $I_R^2$.

In FE computer 220 or 221 the positive square root of the current data is taken and the loop balance is obtained as follows:

if ($I_R \leqq 10.5$ ma), $K=900\text{-}800{,}000\ I_R/V_{AC}$;
if ($I_R>10.5$ ma), $K=1300\text{-}2712{,}000\ I_R/V_{AC}$;
$BAL=20\log_{10}(V_{AC}(K|I_T-I_R|))$ dB.

4. DCT—Regular DC Thevenin Test (i) This test measures the DC and AC logitudinal short-circuit currents in the TIP and RING conductors, as well as the currents that flow when specified DC voltages are applied T-G, R-G and T-R. The requesting FE computer determines the DC resistance T-G, R-G and T-R, and also determines the values of any DC sources attached to the loop under test.

(ii) In test A, the same measurements as in ACDC_I are made. If the AC results of this test exceed a threshold of 12.5 ma rms, no further tests are performed because the loop is considered too noisy.

In test B, a DC voltage is applied both T-G and R-G and the TIP and RING DC currents are measured. The DC voltage applied is +70.4 V if the DC short circuit currents of test A are less than or equal 2 ma. If the 2 ma threshold is exceeded, the voltage applied is ±35 V DC. The polarity of this voltage is chosen to oppose the larger of the two DC currents measured in test A. If the DC current results in saturation (exceeds 125 ma DC), test B is repeated at successively lower voltages of 35 V and 12.6 V DC. If the current still exceeds 125 ma, DCT testing ends and the THEV test, which will be discussed shortly, is run. The THEV test is the default test whenever DCT results in saturation.

In test C, the same voltage arrived at in test B is applied to either TIP or RING, depending on which conductor had the larger short circuit DC current flow in test A; the other conductor is shorted to GROUND. The DC currents in TIP and RING are measured. If saturation occurs, the voltage is again successively reduced.

The final step in this sequence is to short TIP and RING to GROUND through an 8K ohm resistor for about 100 msec.

The information returned to the FE computer is as follows, depending on the test status:

TST_NOISY—only the short circuit DC and AC rms noise currents appear in the test results.

TST_SAT—no results are returned to the FE computer and the complete results of the THEV test replace the DCT tests.

TST_FL—measuring equipment failure so no data returned.

TST_OK or TST_DSPTO—the complete set of test results as follows:

'iDC_TG'—TIP conductor longitudinal short circuit DC current of test A;

'iDC_RG'—RING conductor longitudinal short circuit DC current of test A;

'iNSQ_TG'—TIP conductor longitudinal short circuit noise current of test A in rms-squared;

'iNSQ_RG'—RING conductor longitudinal short circuit noise current of test A in rms-squared;

'ioB_TG'—TIP conductor longitudinal current of test B;

'ioB_RG'—RING conductor longitudinal current of test B;

'ioC_TG'—TIP conductor longitudinal current of test C;

'ioC_RG'—RING conductor longitudinal current of test C;

'VDCA'—the magnitude and polarity of the DC source applied to the TIP and RING in test A (for DCT, this is always zero);

'VDCB'—the magnitude and polarity of the DC source applied to both TIP and RING of test B;

'VDCC_TG'—magnitude and sign of the DC source applied T-G in test C;

'VDCC_RG'—magnitude and sign of the DC source applied R-G in test C;

A TST_DSPTO (DSP Time-out) status indicates that the measurement did not settle before a PMU timeout occurred and that the accuracy of the data is questionable.

5. DC3TY—Thevenin Tests for DC and AC Simultaneously (i) This test combines AC3TY and DCT described separately above.

(ii) In test A, test A of DCT is performed.

In test B, test A of AC3TY and test B of DCT are performed sequentially.

In test C, test B of AC3TY and test C of DCT are performed sequentially.

The final step is to dissipate stored energy.

6. DTA—Dial Tone Analysis (i) This test determines whether dial tone can be drawn, whether dial tone is slow, and whether dial tone can be broken. The FE computer requesting the test indicates the test configuration to be used, that is, which loop conductor is to be grounded in order to draw dial tone or whether TIP and RING should be joined together.

Figure 77:
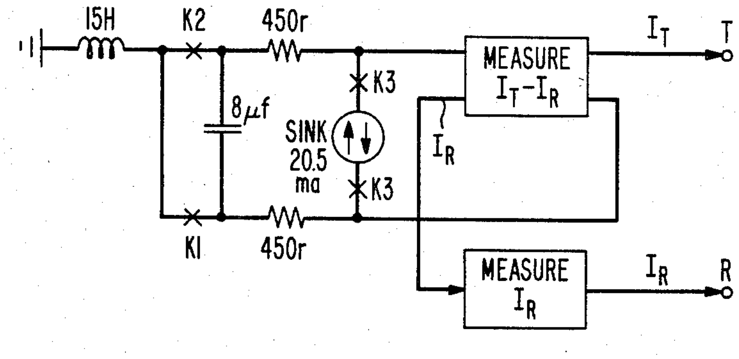
FIG. 77 incorporates both schematic and block diagram illustrations to indicate the procedure for measuring metallic noise in LOOP, RING ground and TIP ground start central offices.

(ii) In test A, the metallic noise current $I_T - I_R$ of FIG. 77 is measured as follows:

LOOP START: relay contacts as in FIG. 77;
RING GROUND START: close relay contact K2;
TIP GROUND START: close relay contact K1.

If the noise level exceeds a pre-set threshold, no further tests are performed.

In test B, dial tone is drawn by operating relay K3 and closing K3 contacts to connect the 20.5 ma current source as follows:

LOOP START: close relay contacts of K3;
RING GROUND START: K3 and K2 contacts closed;
TIP GROUND START: K3 and K1 contacts closed.

The length of time it takes to draw dial tone and the level of dial tone relative to the noise level measured in test A is determined by measuring $I_T - I_R$ and comparing this result with predetermined time and level thresholds. If dial tone cannot be drawn, test C is not executed. Dial tone must be continuous for at least one second to be a valid dial tone. If it is present for less than one second, it is interpreted as a one second burst.

In test C, after dial tone has been drawn for more than one second, relay K3 is released and the breaking of dial tone is measured.

One of the following test results is returned to the FE computer:

CAN DRAW, CAN BREAK
CAN DRAW, CANNOT BREAK
SLOW TONE, CAN BREAK
SLOW TONE, CANNOT BREAK
CANNOT DRAW
TOO MUCH NOISE
DENIAL DETECTED

7. FREQ_DETECT—Generalized Test for a Single Frequency Tone (i) This test is performed to determine the presence of a tone whose frequency is specified via an input parameter. One use of this test is to determine the presence of the 480 Hz tone that is used to identify lines on intercept in ESS offices.

Figure 78:
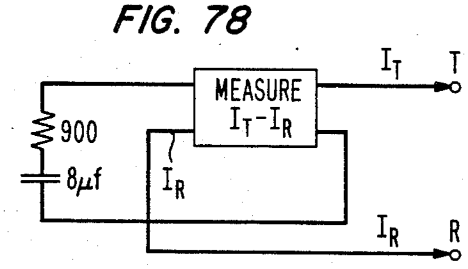
FIG. 78 indicates an arrangement for detecting a single frequency tone on a subscriber loop.

(ii) Using the measurement circuit of FIG. 78, the rms-squared of $I_T - I_R$ in an 8 Hz band around the specified frequency is measured.

8. THEV—DC Thevenin for Low Resistance (i) Develop a Thevenin circuit for a circuit with low DC resistance.

(ii) After the line is discharged, in test A the T-G and R-G current through 100 K ohm resistors are measured and corresponding T-G and R-G voltages are computed.

In test B, a DC voltage is applied to TIP and RING through 8 K ohm resistors; the voltage applied depends on the voltages measured in test A as follows:

| Test A<br>Test A Minimum Voltage (DC) | Test B<br>Voltage (DC) |
|---|---|
| less than −60 | −35 |
| −60 to −35 | −121 |
| −35 to −15 | −83.05 |
| greater than −15 | −52.8 |

The T-G and R-G currents are measured and returned to the FE computer.

In test C, the voltage value of test B is applied to the conductor having the largest negative voltage in test A through 8 K ohm and the other conductor is connected to ground through 8 K ohms. The T-G and R-G currents are returned to the FE computer and then the line is discharged.

9. OCFEMF—Open Circuit Foreign EMF (i) Open circuit DC and AC rms currents are measured T-G and R-G.

(ii) A 100K resistor is connected between TIP and GROUND as well as RING and GROUND. Longitudinal DC currents are measured simultaneously on TIP and RING and then AC rms current is measured on the TIP followed by a RING measurement. The following data is returned: 'DC_TG', 'DC_RG', 'ACSQ_TG' and 'ACSQ_RG', where the latter two measurements occur with a 0 to 3200 Hz bandwidth.

10. PBX3TY—PBX Thevenin Tests for AC and DC Simultaneously (i) This test is identical to DC3TY except for restrictions on applied DC voltages so as not to alert the PBX attendant.

(ii) In test A, the longitudinal DC and AC rms (0-3.2k Hz) currents with the near-end TIP and RING shorted to GROUND are measured, without or with 4:1 current division, as required. If the AC results of this test exceed a threshold of 12.5 ma rms, no further tests are performed because the loop is considered too noisy for meaningful results.

In test B, specified AC voltage is applied to both T-G and R-G and the real and imaginary parts of T-G and R-G are measured. Then a DC voltage of −40 V is applied both T-G and R-G and the TIP and RING DC currents ae measured. If the results of these DC measurements exceed a fixed threshold, no further tests are run because the PBX trunk is too noisy.

In test C, the specified AC voltage is applied, at the given frequency, to the RING while the TIP is grounded. The real and imaginary parts of the T-G current are measured. Then −40 V DC is applied to either the TIP or RING, depending on which conductor had the larger short circuit current flow in test A, the other conductor is shorted to GROUND. The DC currents in TIP and RING are measured. If saturation occurs, no further testing is run.

A final step is to remove energy stored in the line.

11. PBXDCT—DC Thevenin Test for PBX Equipment (i) This test is similar to the DCT test except for restrictions on applied voltages to prevent alerting the PBX attendant.

(ii) In test A, the AC rms short circuit currents with −40 V DC applied T-G and R-G are measured in TIP and RING. If the results exceed a fixed threshold, no further tests are run due to noisy trunk conditions.

In test B, −59.95 V DC is applied T-G and R-G and TIP and RING currents are measured. If more than 125 ma flows, saturation occurs, and no further measurements of PBXDCT are run. The default test THEV is then run and the results for only the THEV test are returned.

In test C, TIP and RING DC currents are measured with −20 V DC applied to the TIP and the RING shorted to GROUND. If more than 125 ma flows, the PBXDCT test ends, and only THEV is run.

The final step is to dissipate stored energy on TIP and RING.

12. RCNT—Ringer Count (i) This test determines the number of ringers T-G, R-G and T-R by measuring the magnitude of the current T-G, R-G and T-R when a voltage of 3.75 V AC rms at 5 Hz, 200 Hz, and in some cases of long loops, 85 Hz is applied to the loop.

(ii) In test A, an AC voltage is applied T-G and the magnitude of the current in the R-G path is measured for each of the three frequencies—5 Hz, 85 Hz and 200 Hz. If the magnitude of the 200 Hz current measurement is below a threshold, only 5 Hz and 200 Hz data are returned; otherwise, 5 Hz and 85 Hz data are returned.

In test B, the AC voltage is applied both T-G and R-G and the magnitudes of the R-G and T-G currents are measured at 5 1 Hz and at either 85 Hz or 200 Hz depending upon the evaluation of results of test A.

The following data are returned to the requesting FE computer:

'i5_TR'—peak T-R current at 5 Hz;

'iA_TR'—rms-squared T-R current at 85 Hz or 200 Hz;

'i5_TG'—peak T-G current at 5 Hz;

'i5_RG'—peak R-G current at 5 Hz;

'iB_TG'—rms-squared T-R current at 85 or 200 Hz;

'iB_RG'—rms-squared R-G current at 85 or 200 Hz;

'FREQUENCY'—frequency not discarded after test A and used for test B (85 or 200 Hz).

The FE computer evaluates the ringer count from these data to estimate the number of ringers.

13. RDA—Rotary Dial Analysis (i) This is an interactive test requiring the interactive mode to be enabled. The customer is instructed to dial a zero after hearing a dial tone burst generated by the PMU. Pulse count, dial speed and percent break are measured during the return of the dial to the rest position.

Figure 79:
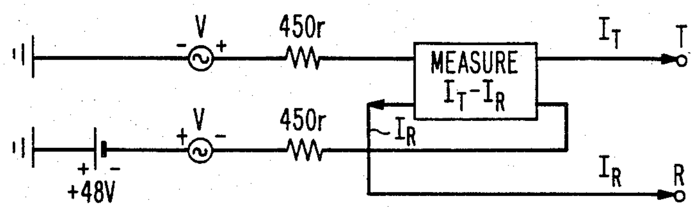
FIG. 79 presents circuitry for rotary dial analysis.

(ii) The metallic current $I_T - I_R$ is measured as shown in FIG. 79 until ten pulses have been counted, but not for longer than 2 seconds. LTS 160 or 161 processes the information and returns the following, as will be discussed in the section relating to signal processing: dial speed in pulses per second; percent break; and one of the following status messages. The messages include: Dial Speed and Percent Break OK; Good Speed, Bad Percent Break; Bad Speed, Good Percent Break; Bad Speed, Bad Percent Break; wrong pulse count; cannot measure because loop resistance too high or dial speed too slow.

14. ROH_RLS_TNK—Release of Permanent Signal Holding Trunk in SXS Offices (i) This test is run prior to the receiver-off-hook (ROH) test on lines that are busy without speech in order to release the permanent signal holding trunk in SXS offices.

(ii) A −40 V DC source is applied both T-G and R-G through 450 ohm resistors. The T-G and R-G currents are measured and compared with a fixed threshold value to determine whether both TIP and RING have become open circuits. Since the conductors may be pulsed for a time between open and nonopen states, the current measurements must be timed to determine that a true open exists. The test ends when a true open is measured or when an open does not occur before a preset timeout; the corresponding status is returned to the FE computer.

15. ROH_SPUR—Spurious Energy at the ROH Measurement Frequencies (i) This test measures offsets to be applied to the ROH test results.

(ii) The rms-squared values of the T-R current at 800 Hz and 1200 Hz are measured with 900 ohms connecting TIP and RING.

16. ROH_TEST—Receiver-off-hook Test (i) This test determines if a receiver associated with customer equipment is connected across the loop.

Figure 80:
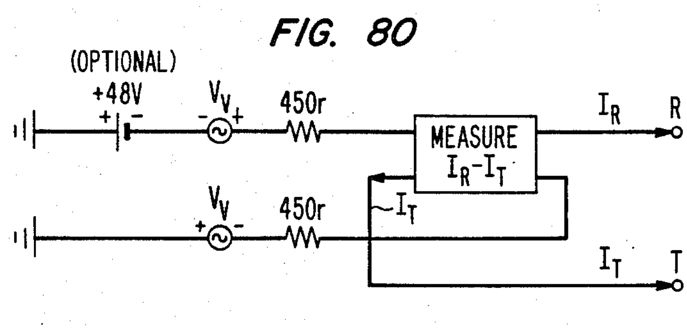
FIG. 80 is a representation of a circuit utilized to test for receiver off-hook conditions.
Figure 90:
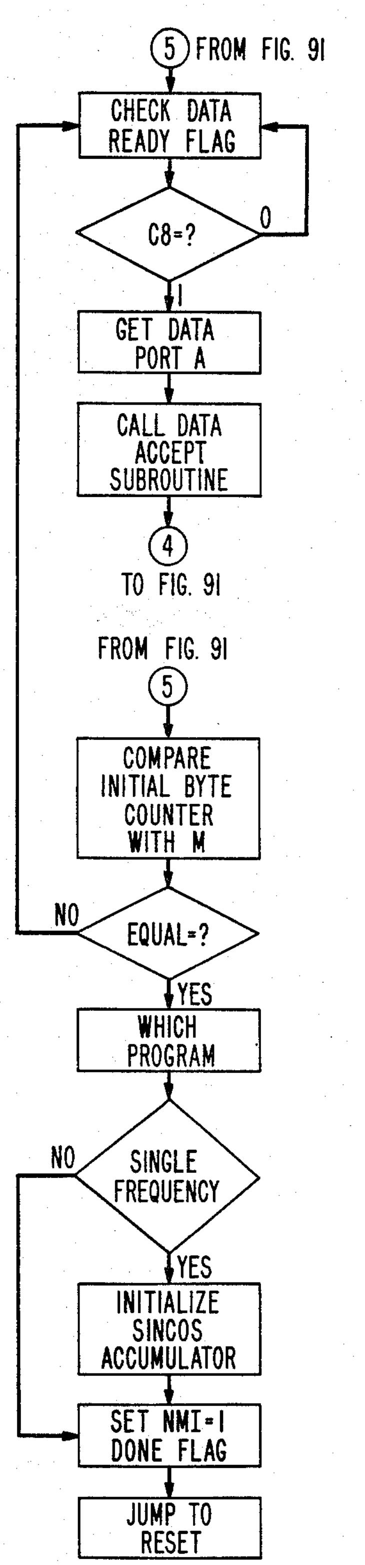

(ii) A 400 Hz signal is applied T-R and the level of harmonic current at 800 Hz and 1200 Hz is measured as per FIG. 80. From the configuration of FIG. 90*e*, $V_V$ is a parameter supplied by the FE computer within the range 0.6 V to 5 V. Since $V_V$ is applied with opposite phase to TIP and RING, the total rms metallic voltage is between 1.2 V and 10 V. A bias of −48 V DC may be applied to the RING when requested. The following are returned to the FE computer requesting the measurements: 'i_met_800' and 'i_met_1200' in rms-square.

The final step is to short TIP and RING to ground for about 50 msec to discharge the line.

17. ROH_VFB—Measurement of Loop Length With Possible ROH Line Condition (i) This test determines the level of 400 Hz voltage to be applied during the ROH test.

(ii) A 100 Hz, 1.2 V rms signal is applied metallically through a pair of 450 ohm resistors as shown in FIG. 80, that is, $V_V$=0.6 V rms. A bias of −48 V DC may be applied to the RING when requested. The value 'i_met_100' or the rms-squared value of current is returned. This value is used to evaluate the 400 Hz tone to be applied in the ROH test so the level at the far-end of the loop is relatively independent of loop length.

The final step is to short TIP and RING to GROUND through 8K ohms for about 100 msec to discharge the line.

18. SOAK—Attempt to Vary Resistance of a Fault (i) This test determines whether a resistive fault is constant, dried out or swinging as a result of applying a DC voltage.

(ii) A DC voltage specified in the request is applied both T-G and R-G and the TIP and RING currents are measured at 0.5 second intervals for 3 seconds. If a prior OCFEMF test indicates a positive foreign DC voltage, this test applies a negative voltage, and vice versa. If the magnitude of the larger of the two DC voltages measured during OCFEMF exceeds 80 V DC, then a 40 V DC source is supplied during this test. If the voltage measured is less than 80 V DC, and 80.3 V DC source is supplied.

Twelve current readings are returned to the FE computer for analysis, namely, six T-G and six R-G from measurements at the end of six intervals. The T-G and R-G resistance values are computed for all twelve currents; the spread in the computed resistance values determines the characteristics of the fault.

19. THERM—Thermistor Identification (i) This tests determines whether a thermistor is in the T-G, R-G or T-R paths by applying a specified voltage and measuring the current flow. A change of current over a prescribed interval of time indicates the presence of a thermistor.

(ii) In Test A, a 24 Hz, 32.4 V rms signal is applied longitudinally to both TIP and RING and the current in the TIP and RING is measured after 0.45 seconds have elapsed.

In test B, the currents are again measured 1 second later. If the difference in RING current measured on test A and test B exceeds a threshold, a R-G thermistor is present. Similarly differencing and comparing determines if a T-G thermistor is present.

If a thermistor is not detected from test A and test B, then test C is run to test for a T-R thermistor. In this test, the T-G path is supplied with a series 30 V AC source, and the RING is GROUNDED. The current flow in the TIP is measured at 0.4 seconds and 2.05 seconds. If the difference in the two currents exceeds a threshold, a T-R thermistor is presumed to be present. YES/NO information regarding each path is returned to the requesting FE computer.

20. SSRFAULT—Single-sided Resistive Fault Sectionalization (i) This test is used to determine the position of a resistive fault relative to a craftsperson at a field location. Thus, this is an interactive test requiring the presence of personnel in the field to place a shorting strap on the pair under test. This fault location strategy, as well as a double-sided fault location technique, have been disclosed in an earlier filed U.S. patent application Ser. No. 308,417, dated Oct. 5, 1981, by J. M. Brown (Case 4), and assigned to the same assignee as the present application; the single-sided strategy is exemplary of the disclosed subject matter.

The SSRFAULT test is utilized whenever a fault is found on only one conductor of the pair comprising the loop under test. The craftsperson at the customer end of the loop shorts TIP and RING after disconnecting all customer equipment.

(ii) In test A, a DCT test is run initially to insure the fault lies between the point of testing and the point of the short.

In test B, a DC voltage $V_S$ is applied both T-G and R-G. The total current on the nonfaulted conductor is measured as well as the current differential between the current flow on the faulted conductor minus the current flow on the nonfaulted conductor. The value of $V_S$ depends on the resistances-to-ground measurements from the DCT test. $V_S$ is initially about 70 V DC, but saturation could cause the applied voltage to be reduced to 50 V or 12.5 V DC.

In test C, a DC voltage is connected between the nonfaulted conductor and ground and the faulted conductor is grounded. The two conductor currents are measured. The voltage is initially 50 V DC, and saturation results in a 12.5 V DC measurement voltage.

The four current values are returned to the requesting FE computer as well as the voltages used in tests B and C. The loop resistance between the fault and the customer end may be computed from the four currents and the voltage of test C. The resistance is converted to distance on the basis of the resistance per length of standard gauge telephony conductors.

21. CN_DTF—Dial Tone First Totalizer Detection (i) Determine the series resistance of the pair serving the coin station.

(ii) In this test, a DC voltage is applied to the RING through 2K ohms and the TIP is grounded. The DC applied is +30 V for DTF and −30 V for Post Pay. Both the RING current and longitudinal mode current as detected on the TIP are measured. A longitudinal current indicates a possible relay failure in the coin station. As soon as the DC voltage is applied, the presence of any coin tones is monitored to indicate premature homing. The FE computer receives the two current values and a YES-NO flag depending on the results of coin tone measurement.

22. CN_TOT_DTF—Coin Totalizer Homing for Dial Tone First (i) This test homes a totalizer that is off-home and checks its peformance while doing so. A good totalizer will home with 18 ma or less and will return metallic tone bursts of 1537 or 1700 Hz as well as 2200 Hz.

(ii) The FE computer sends six arguments to the LTS—three voltages, a threshold current and two arguments relating to options to be taken during testing. The testing commences by applying the first voltage R-G and measuring the RING current as well as monitoring the metallic current for tone bursts. The amplitude and frequency of the coin oscillator and duration of the tone bursts are not measured precisely; the critical concern is the presence or absence of the tones. If no tone bursts are detected, the RING current is less than 17 ma and one option, called threshold, is YES, then the applied voltage is increased to provide 18 ma within ±1 ma and the test is repeated. The second option argument designates whether the second voltage passed between the FE computer and the LTS is to be used or whether the PMU is to calculate the voltage necessary to cause 18 ma flow. All voltages, either transmitted or computed, rely on results of the previous CN_DTF for the DC resistance of the loop. If no tones are detected, then the third voltage (if nonzero) is applied and the RING current will be measured while monitoring for tones.

If the threshold argument is NO, then the voltages as transmitted will be repeatedly applied until tones are detected (or timeout occurs); the RING current corresponding to each applied voltage is measured concurrently.

Information returned from the LTS to the FE computer includes: the number of attempts to home before tones are detected; the voltage applied for the final attempts; the RING current measured both at the start and at the end of the final attempt; and the RING current at the end of the test. In addition, information relating to the frequencies detected and type of tone is returned as follows: BURST (1537 or 1700 or 2200 Hz); NO_F; CONT_TONE (continuous tone); and BURST—TONE as well as the number of bursts.

Tone bursts can have durations between 20 and 150 msec. Intervals between bursts can be between 15 and 250 msec. If the first tone is not detected within one second after application of a voltage, then the next voltage is applied. If, after the first tone is detected, no tone occurs within 250 msec. of applying the next voltage, or a tone is continuous for more than 250 msec., or if tone bursts continue for more than 10 seconds or 38 tones, the test is terminated with a corresponding result returned to the requesting computer.

23. CN_CF—Coin First Totalizer Datection (i) Determine resistance of coin totalizer.

(ii) In this test, a 26 V DC source is applied to the TIP through 2K ohms and the TIP and RING currents are measured and returned to the FE computer.

24. CN_TOT_CF—Coin Totalizer Homing for Coin First (i) Home a totalizer while checking its performance.

(ii) The sequence of tests performed with this test procedure is substantially the same as in the test above (CN_TOT_DTF). The primary difference is that all voltages are applied to the TIP.

25. CN_RDET—Coin Relay Circuit Detection (i) This test is made to determine if the T-G path through the coin relay is closed.

(ii) First, a low DC voltage (about 15 V) is applied T-G and the TIP current is measured. The DC voltage is chosen so as not to operate the coin relay circuit. If the T-G resistance is between 1800 and 3000 ohms, representing a possible "stuck coin" condition, then an AC voltage, at 24 Hz, is then applied to differentiate between a stuck coin or a T-G short. The AC test voltage selected exceeds the DC voltage applied in the first test. The real part of the TIP current is compared to the DC TIP current and a short is probable if the AC resistance exceeds the DC resistance. Also supplied to the FE computer is the magnitude of the second harmonic AC current flow to determine if the "initial rate" relay contacts are open.

26. CN_RCR—Coin Relay Collect/Refund (i) Determine if the collect/refund relay is operational as well as monitoring its performance.

(ii) The FE computer supplies three voltage arguments, a threshold argument and a current threshold, typically 41 ma. Collecting or returning a coin is controlled by the polarity of a DC voltage applied T-G. The DC voltage level is determined by the FE computer from results of the CN_RDET DC loop resistance measurement.

Three voltage arguments are supplied. The first voltage argument is applied. If the measured current does not reach the threshold and the relay does not operate, then the PMU applies the second voltage argument. If the relay still does not operate and the third argument is nonzero, then the third voltage is applied and the timeout is set to two seconds. Besides returning the number of attempts until the relay operates as well as the value of the TIP current on the final attempt, the time until relay operation occurred on the last attempt is also transmitted. This so-called coin relay operate time is nominally less than 700 msec. for a nonfaulty relay.

27. CN_GRFV—Coin Ground Resistance (i) This test determines the ground path resistance for a coin set.

(ii) The TIP, RING and ground terminals must be shorted at the coin station. In part A, the TIP is connected to ground through 100K ohms and the TIP current is measured. In part B, the RING is connected to ground through 100k ohms and the TIP is driven with 125 V DC through 1000 ohms. Both the TIP and RING currents are measured. The three current measurements are returned to the FE computer where the ground resistance ($R_G$) is estimated as follows:

$$R_G = 100K(I_{RB} + I_{TA})/I_{TB}.$$

3.2.2 Port Controller Implementation

With reference to FIG. 11 by way of brief review, port controller 2200 provides the following primary functions:

(1) control of ports 2801–2816, sleeve lead device 2950, busy speech detector 2600, trunk dialer 2650 and EAN 2700 to perform access to testing trunks; and (2) control of the application of tracing tone source 2900 to a loop 180–184 under test.

As depicted by the block diagram in the center of FIG. 58, port controller 2200 comprises basically three networks, namely, main controller 2245, bank memory 2250 and port interface 2270. As already indicated above in Section 3.2.1 when LTS controller 2000 was discussed, port main controller 2245 and LTS main controller 2045 have substantially the same circuit realizations. LTS main controller 2045 is depicted in block diagram form in FIG. 59 and is discussed in detail with reference to FIGS. 60–65. Port controller 2245 is realized by incorporating two minor variations in the circuitry of FIG. 59. These include the reassignment of status leads GPIB0–GPIB2 of adapter 2020 and the selection of different clock signals at the output of clock divider 2005. With respect to the status leads, GPIB2 is connected to logic 1 whereas GPIB0 and GPIB1 remain at logic 0 (or, in terms of a bit pattern, the status leads become '001'). Since port controller 2200 is connected to bus 20001, this unique status lead identifier, when combined with LTS identifier '000', and PMU identifiers '010', '011' and '100', allows for unambiguous communication on the single GPIB bus. With regard to outputs from clock 2005, CLKC remains the same, CLKB is set for 31.25 kHz operation and CLKA is not utilized.

The memory allocation for port controller 2200 is shown in FIG. 67. The 12K RAM memory space designated BANK A2 is provided by port main controller 2245 in the same manner this bank was provided by LTS main controller 2045. However, the addressable I/O space from 0×E000–0×FFFF, rather than being fully allocated to main controller 2245, is partitioned so that 2K of the 8K is assigned to port interface 2270. In addition, BANK B1 and BANK C1 are mutually exclusive memory banks occupying A000–AFFF on a switched basis; these latter 4K banks are also provided by port interface 2270, as will be discussed. The three remaining memory banks, BANK A, BANK B and BANK C, are provided by universal memory 2150, as now discussed.

As presented above, in the discussion of Section 3.2.1b relating to universal memory 2050, it was stated that the universal implementation would be adopted for port controller 2200. This is depicted in FIG. 58, wherein bank memory 2250 and port main controller 2245 are foundational elements for port controller 2200. Bank memory 2250 is also depicted, in block diagram form, by FIG. 69 and in detail by FIGS. 70 and 71. However, since BANK A now comprises 16K bytes and BANK B and BANK C require 24K bytes each (as compared to three 20K byte segments for LTS controller 2000), PROM's 2054–2055 of FIG. 70 are programmed so that MCS0*–MCS3* select BANK A, MCS4*–MCS9* select BANK B and MCS10*–MCS15* select BANK C. The latter two chip-select ranges are mutually exclusive, but one or the other range is always operational with the range associated with BANK A.

Figure 81:
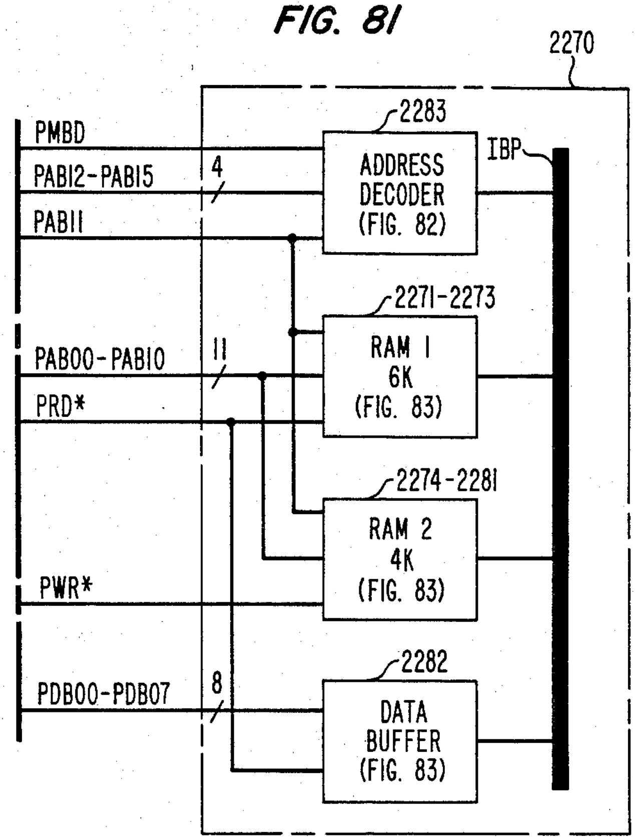
Figure 82:
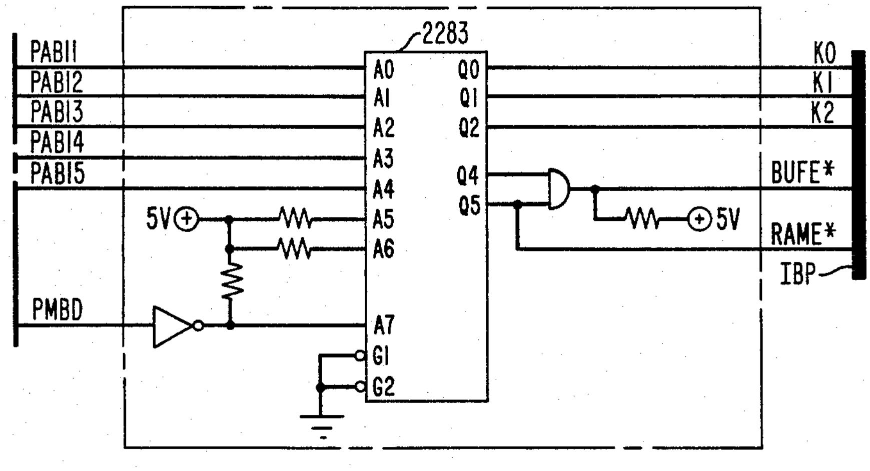
Figure 83:
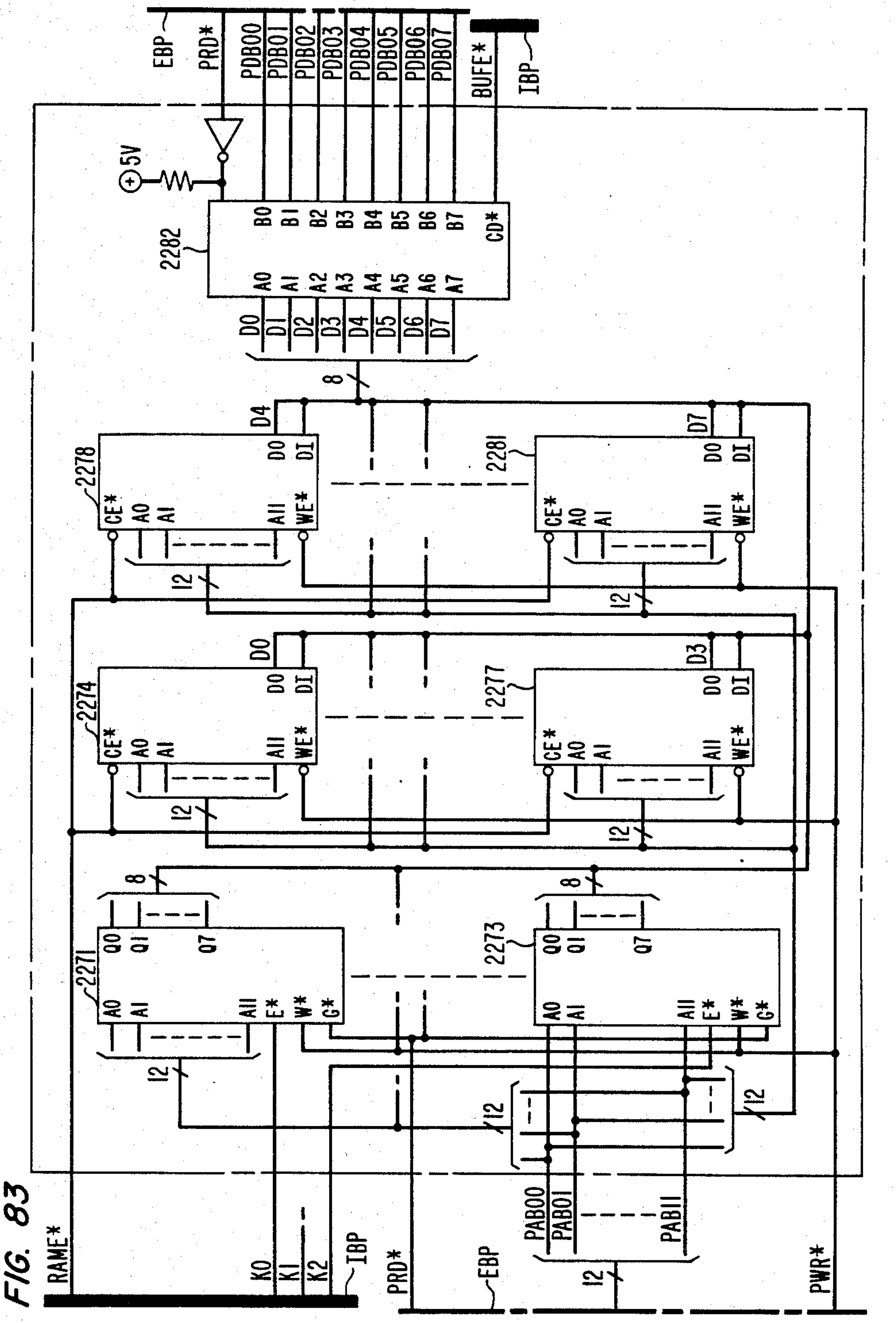
FIG. 83 presents random access memory realizations.

The block diagram of FIG. 81 and the details of FIGS. 82 and 83 disclose the primary purpose of port interface 2270, which is to provide memory complementing that already provided by main controller 2245 and universal memory 2250. The memory serving as BANK B1 in FIG. 67 is depicted in FIG. 83 by eight 4K×1 devices 2274–2281. These static RAM devices are type 39A. FIG. 83 also depicts the memory serving as both BANK A1 and BANK C1 in FIG. 67; in particular, three 2K×8 devices 2271–2273 provide the required 6K bytes of memory. These devices are type 61A.

Decoding for RAM1 and RAM2 memories is provided by PROM 2283 of FIG. 82. This PROM, also a type 28L22, is coded as follows: all memory addresses are 0×FF except address 0×75, which has hex EE as data; 0×76 has 0×ED; 0×F5 and 0×F6 have 0×DF; and both memory ranges 0×7D–7F and 0×FD–FF have, respectively, 0×EB, 0×7F and 0×7F. Address leads PAB11–PAB15 serve as input to device 2283 as well as bank lead PMBD. A logic one on this lead disables RAM1.

Data transceiver 2282 of FIG. 83, an 8304 device, buffers system data leads PDB00–PDB07 from internal data leads D0–D7 which access both RAM1 and RAM2.

Not explicitly shown in port interface circuit 2270 of FIG. 81 are the decode circuits providing enable signals for ports 2801–2816, sleeve lead device 2950, tracing tone source 2900, busy/speech detector 2600, trunk dialer 2650 and EAN 2700 (FIG. 11). Basically, address leads PAB00–PAB11 provide one-in-thirty six individual decode signals which function as chip selects for thirty-six ancillary control registers. These chip selects are transmitted over bus 22001 of FIG. 11.

Also not shown is circuitry realizing tracing tone source 2900. This circuitry is basically conventional in that an approximately 500 Hz source is amplitude modulated by a 1 Hz signal and when, enabled, is applied to the loop under test.

A listing of the programs for operating the microprocessor within the illustrative embodiment of port controller 2200 is included as Appendix E Ser. No. 399,177. Again, the format of Appendices A, B and C Ser. No. 399,177 is utilized to present the program information.

3.2.3 PMU Implementation

3.2.3a DSG Circuitry

Figure 84:
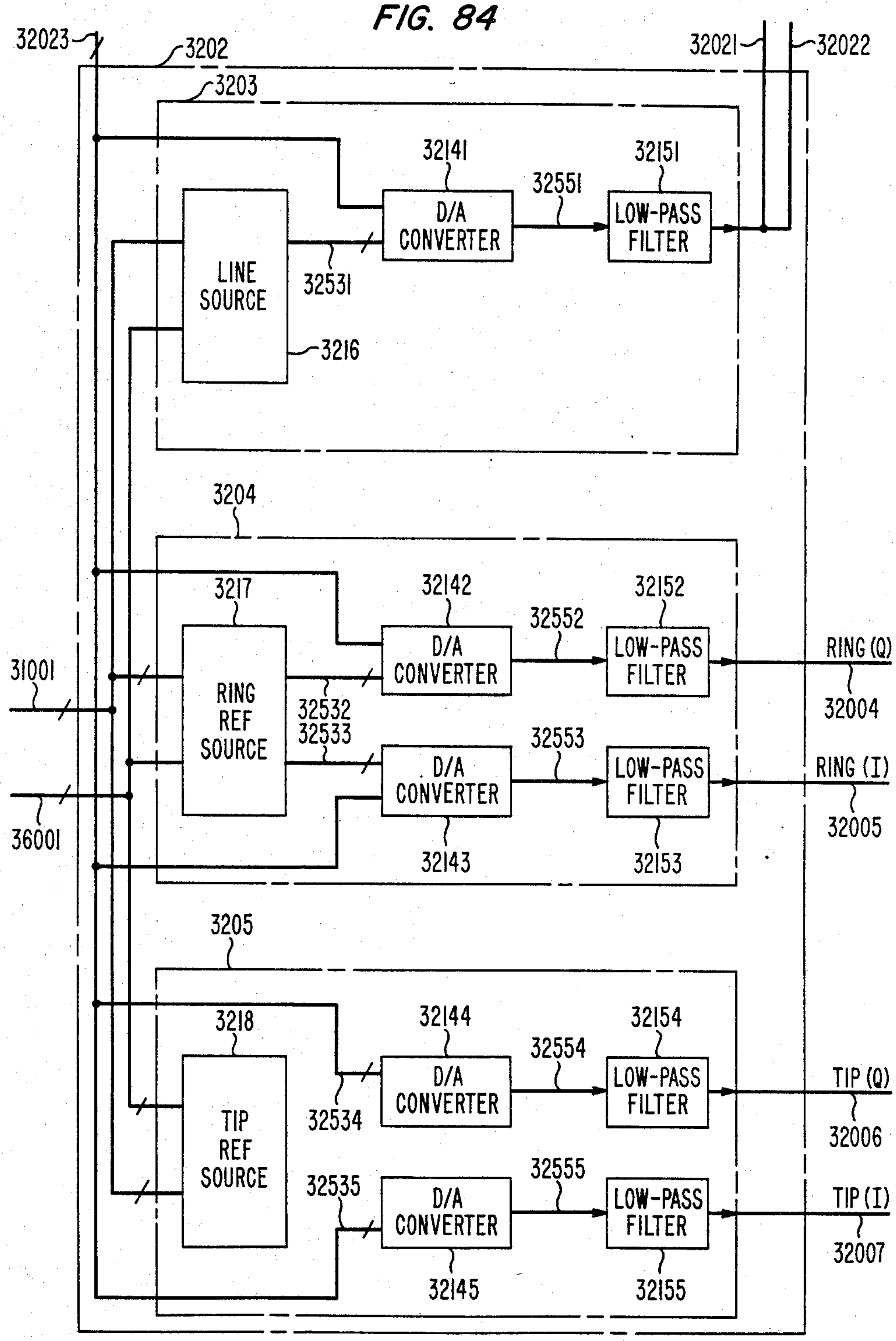
FIG. 84 is a block diagram depiction of circuitry comprising the AC portion of the source generator of FIG. 18.

By way of brief introduction, the MLT system utilizes AC signals to measure frequency sensitive loop parameters. Three separate source generators implement a synchronous, quadrature detection arrangement. One source generator supplies voltages to the loop under test, whereas the other two source generators supply quadrature detector signals. With reference to FIG. 18, AC source generator 3202 depicts, in general block diagram form, the three-generator arrangement. A more detailed block diagram representation of generator 3202 is shown in FIG. 84, wherein the three generators are depicted by elements 3203, 3204 and 3205. Line generator 3203 supplies loop voltages, via leads 32021 and 32022, to the TIP and RING, respectively. Ring reference generator 3204 supplies in-phase and quadrature signals for synchronous detection of the signals appearing on the RING, where tip reference generator 3205 performs the counterpart operation on the TIP.

Figure 85:
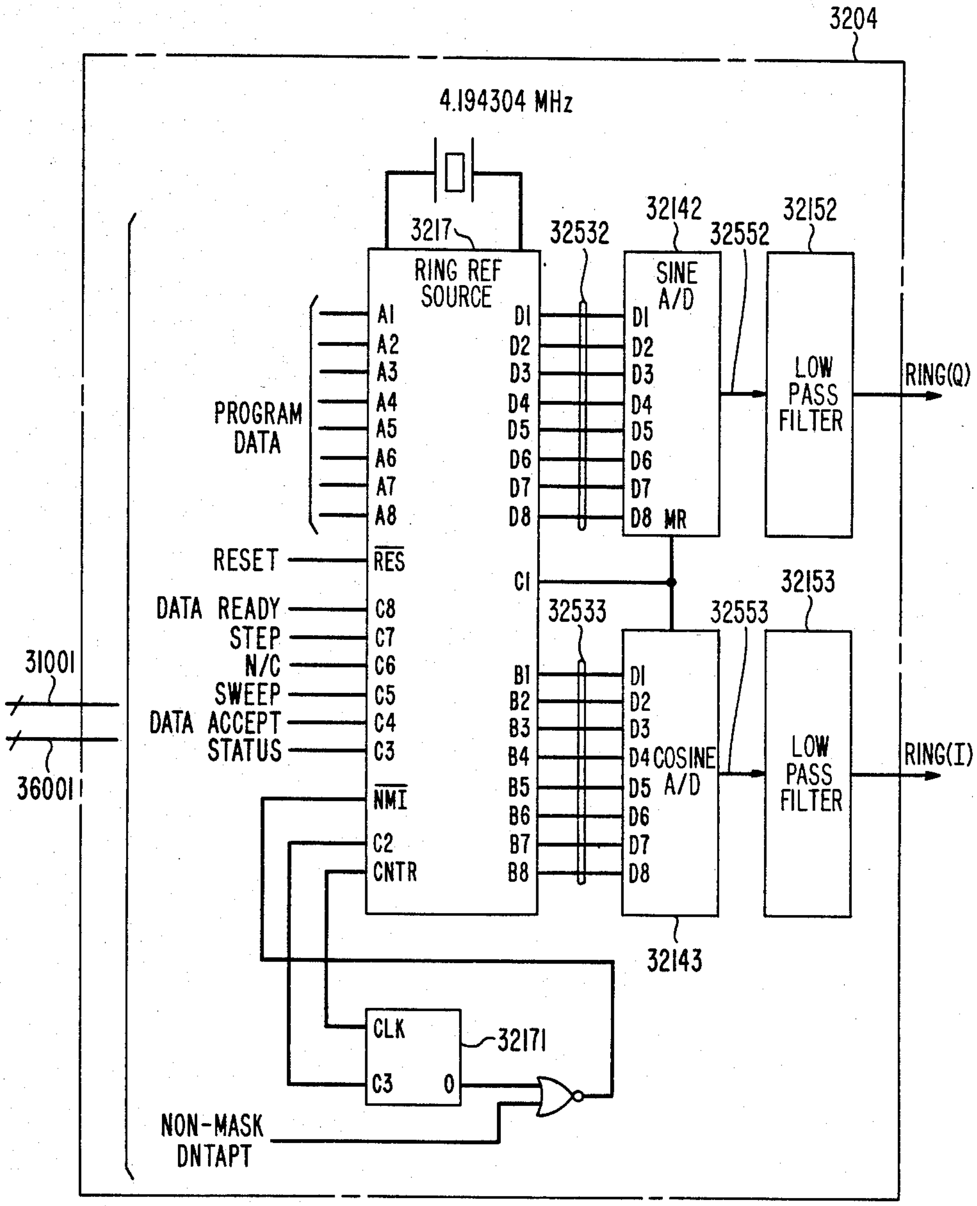
FIG. 85 is a more detailed representation of one AC reference signal generator depicted in FIG. 84.

In that all three generators 3203–3205 operate in basically the same manner, ring reference generator 3204 is the only generator to be described hereinafter in detail. This description proceeds with the aid of FIG. 85, which depicts the major circuit components comprising generator 3204.

Ring reference source 3217 is implemented with a microcomputer; for the illustrative embodiment, this microcomputer is the Rockwell R6500/1AC type described in detail in the following two documents: "R6500 Programming Manual" published by Rockwell International in August, 1978 as Document No. 29650 N30; and "R6500 Hardware Manual" published by Rockwell International in August, 1978 as Document No. 29650 N31. The R6500 is a 40-pin device comprised of: a central processing unit (CPU) that runs at half the external reference frequency of 4.194304 MHz; a ROM of 2048 bytes; a RAM of 64 bytes; and various interface circuitry. This interface circuitry (not shown in FIG. 85) includes: a 16-bit programmable counter/latch, with four operating modes; four 8-bit input/output ports (Port A, B, C, D of FIG. 85); five interrupt lines; and a counter input/output line. Communication with PMU controller 3100 and DSP 3600 (FIG. 17), via busses 31001 and 36001, respectively, is accomplished through Port A, a portion of Port C and two of the five interrupt lines, shown as RES and NMI in FIG. 85.

Program information is transferred to generator 3204 from PMU controller 3100 via Port A, that is, leads A1–A8 of source 3217. Port C (C1–C8) is split as an input/output control port. Leads C5–C8 are manipulated by PMU controller 3100 to control source 3217. The remaining four leads are under control of generator 3204 itself. Leads C3 and C4 inform PMU controller 3100 as to the operating state of generator 3204, while C2 turns external counter 32171 on or off. Lead C1 is used to strobe the digital output data appearing at Ports B and D into 8-bit Multiplying Digital-to-Analog Converters (MDAC) 32143 and 32142, respectively. A representative MDAC which may be used to implement both elements 32143 and 32142 is supplied by Analog Devices. The device is numbered AD7524 and is described on pages 317–321 of the "Data Acquisition Products Catalog" prepared by Analog Devices, Inc. in 1978.

Low-pass filters 32152 and 32153, which suppress aliasing, are implemented in the illustrative embodiment as sixth order, Chebychev, low-pass, RC filters. Filter cutoff is set at 3230 Hz and peak-to-peak passband ripple is 0.001 dB.

In the illustrative embodiment, microcomputer generator 3204 is programmed to provide a selection of output signals representing either single or multiple tone test frequencies. The possible output signals include:

Single Frequency—generates the AC source cosine test signal and the quadrature AC reference signals. The output is selectable in 1 Hz increments from 1 Hz to 3200 Hz.

Burst Single Frequency—provides for timed sine/cosine pulses of a chosen frequency within the 1 Hz to 3200 Hz band. The duty cycle of the pulses is programmable.

Sequence Single Frequency—generates both sine and cosine of up to 20 individually programmable frequencies within the 1 Hz to 3200 Hz band. Sequencing is under direct control of PMU controller 3100.

Frequency Sweep—steps through the 1 Hz to 3200 Hz band in either the upward or downward direction. The starting frequency and upward or downward increment is programmable. Both sine and cosine are generated, and stepping as well as choice of direction is under direct supervision of PMU controller 3100.

Multifrequency—generates the cosine sum of any two frequency pairs between 1 Hz and 2000 Hz.

Sequence Multifrequency—generates a sequence of timed, multitone cosine bursts within the 1 Hz to 2000 Hz band. Capability includes the sequencing of up to 10 individual frequency pairs with the time-on and time-off periods being programmable.

Burst Multifrequency—provides for a timed cosine pulse of a selected frequency pair within the 1 Hz to 2000 Hz band. The duty cycle of the burst is programmable.

In addition to these seven so-called output functions, miscellaneous functions to aid self-diagnostic testing are included in the program repertoire.

3.2.3a.1 DSG Software Considerations

Figure 86:
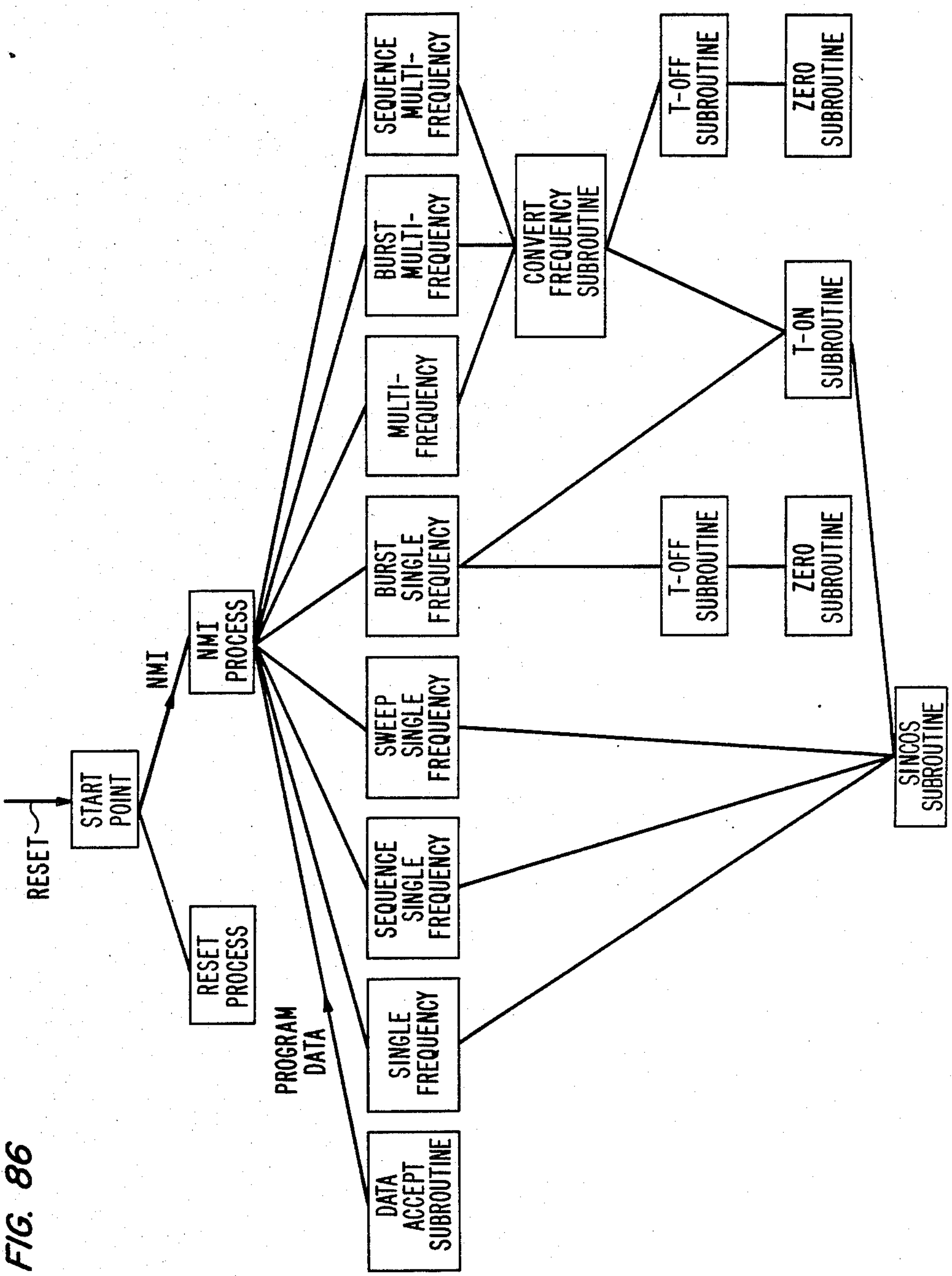
FIG. 86 is a structure chart indicating the calling linkages among the various processes, output functions and subroutines comprising the programs of the AC generators of FIG. 84.

The software structure for Rockwell-based source 3217 (see FIG. 85) is depicted in FIG. 86. The RESET PROCESS acknowledges the reset signal and initializes source 3217 to a predetermined state via a signal on the RES lead. A nonmaskable interrupt (NMI) causes the NMI PROCESS to direct the transfer of all program data from PMU controller 3100 into source 3217; the NMI PROCESS operates in response to signals on the NMI lead. This latter process calls on the DATA ACCEPT subroutine which is invoked to insure the data has been properly transferred from PMU controller 3100. Moreover, the NMI PROCESS also performs the necessary "bookkeeping" in preparation for entry into the actual signal generation subroutines. As FIG. 86 depicts, all seven output functions defined above are dependent upon the SINCOS subroutine. It is through this subroutine that the actual samples required by each output function are selected.

The separate modules of FIG. 86, that is, the PROCESS, output function and subroutine blocks, are now explained in depth.

(I) RESET PROCESS

Figure 87:
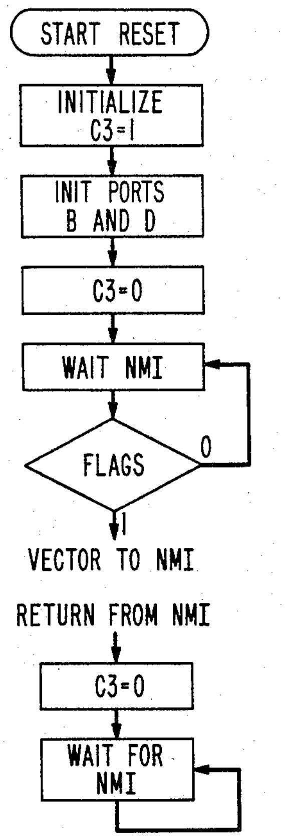
FIGS. 87 and 91 are flow charts for the RESET process and the DATA ACCEPT subroutine depicted in FIG. 86, whereas FIGS. 88 through 90 provide the flow chart for the NMI process.

As indicated above, the purpose of this process is to initialize generator 3204 to a known state. A flowchart for this process is given in FIG. 87. The process is entered by placing the reset lead (RES) at logic 0 and then returning it to logic 1. This interrupt signal places all input/output lines at a logic 1 level. It also directs microcomputer 3217, via address information stored in its ROM, to the beginning of the process. In addition, microcomputer 3217 is set for the binary mode of operation, the stack pointer is set and temporary memory is loaded with zeros. Finally, both Ports B and D are loaded with a value indicative of 0. volts (e.g., hex 80), and this value is strobed to converters 32142 and 32143 via Port C bit 0 (C1). These converters translate the value and produce zero volt outputs. Upon completion of the above, the process brings C3 to logic 0. This flag indicates to PMU controller 3100 that the reset cycle has been completed. It also signifies that generator 3204 is now waiting for data entry to indicate a request for an output function.

(II) NMI PROCESS

This process has two main purposes: (1) control data transfer between PMU controller 3100 and generator 3204 and (2) initiate program execution. A flowchart for this process is given in FIG. 34. The NMI lead is an edge-sensitive input line. This means that whenever a high-to-low transition occurs on this line, microcomputer 3217 automatically sets an internal flag. This flag halts all internal processing and permits program execution to be vectored, via address data stored in ROM, to the NMI PROCESS.

Upon entering this process, microcomputer 3217 is directed to check an internal register named FLAGS. The state of this register determines exactly what microcomputer 3217 is to do next. There are four possible states for this register:

State 1: FLAGS=0 signifies that this is the first pass through the program so data is to be collected, via Port A (A1–A8), from PMU controller 3100.

State 2: FLAGS=1 indicates that all program data has been collected and that execution of an output function is to commence.

State 3: FLAGS=2 indicates that the T-ON subroutine is to be invoked to generate timed bursts of frequencies.

State 4: FLAGS=3 indicates that the T-OFF subroutine is to be invoked to generate time bursts of frequencies.

Assuming, initially, that FLAGS=0, microcomputer 3217 sets the STATUS flag (C2) to logic 1. This informs PMU controller 3100 that the NMI PROCESS has been started and that microcomputer 3217 is now awaiting data. Microcomputer 3217 now sits in a "tight" loop, polling C8 (DATA READY). When C8 is raised to a logic 1 by PMU controller 3100, the first program data byte is available at Port A.

The first data byte received is always a program identification (id) number. Upon receiving this id, a validity check is executed. Reception of an invalid program id causes a restart (C3=0).

When a valid program id has been received, microcomputer 3217 accesses an internal table containing the starting addresses of the various output functions. Another internal table is also addressed to determine a program byte count, that is, how many data bytes must be received before function execution may begin.

Figure 91:
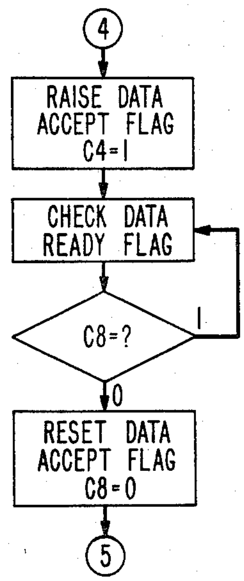
Figure 88:
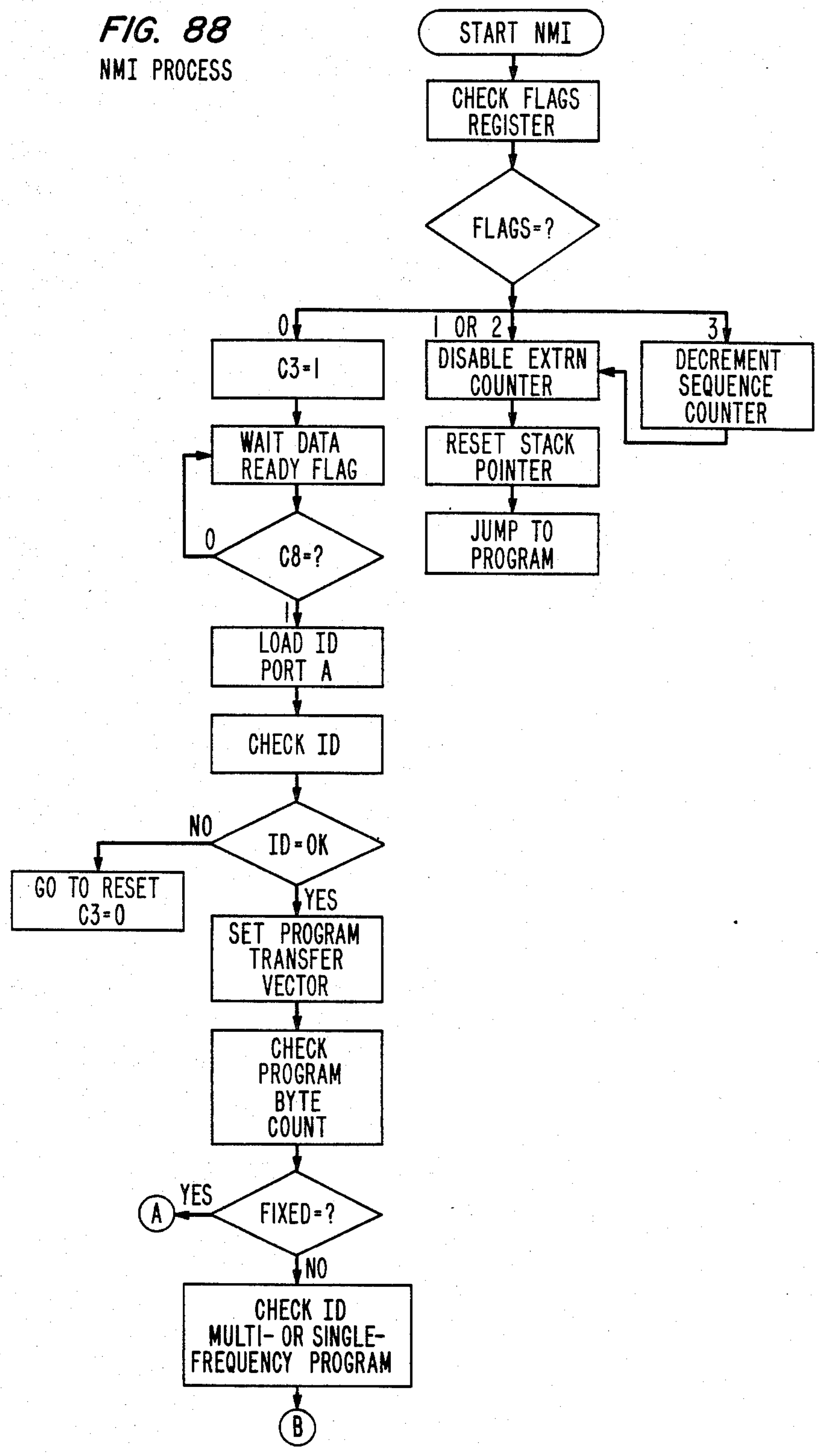
Figure 89:
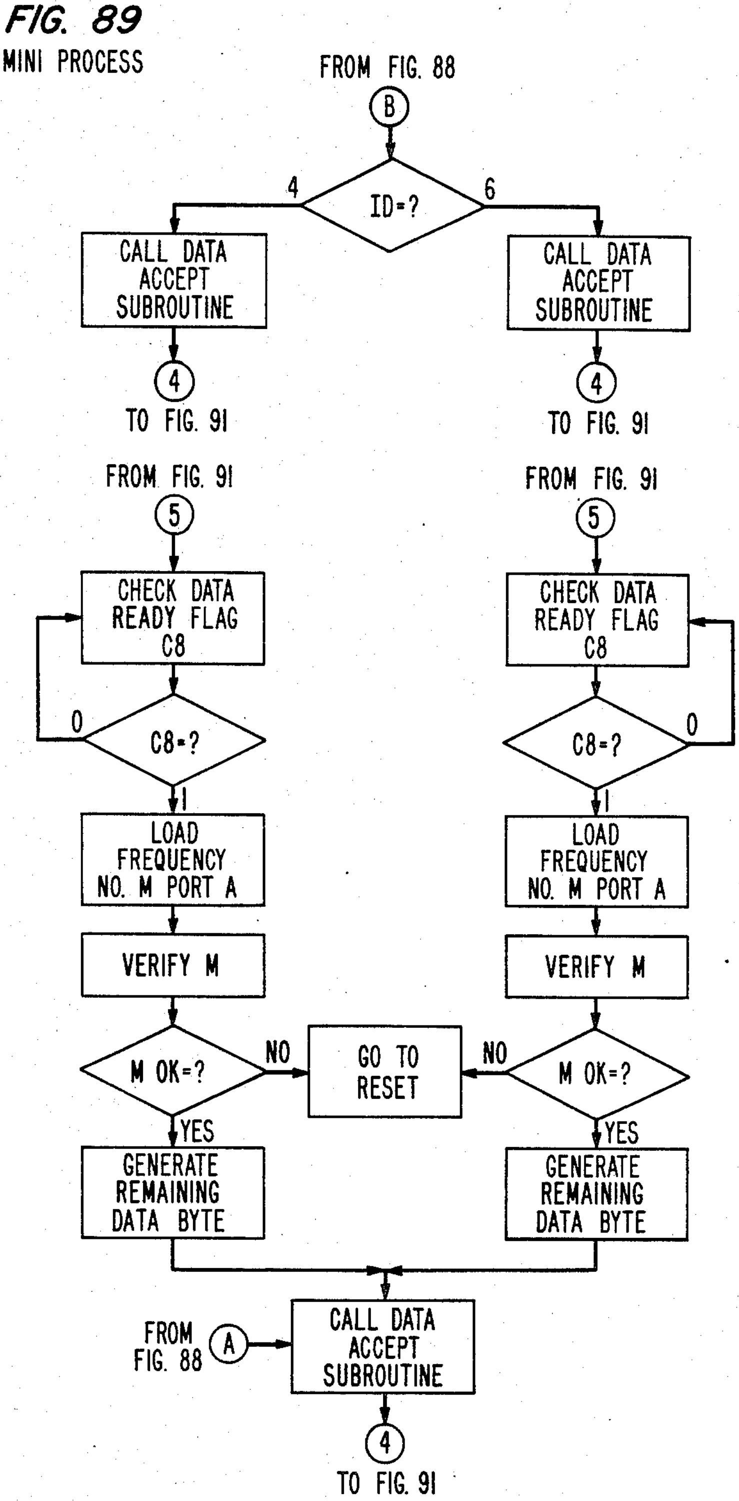

The byte count can be either fixed or a variable, depending upon which output function is to be produced. If the byte count is fixed based upon the program id, microcomputer 3217 signifies acceptance of the id byte through a "handshaking" protocol. This handshaking protocol is accomplished with a subroutine called DATA ACCEPT (see FIG. 86); a flowchart of this subroutine is shown in FIG. 91.

A variable input byte count causes microcomputer 3217 to determine which of two variable output functions (Sequence Single Frequency or Sequence Multifrequency) is to be executed. Acceptance of the program id byte is then made through the handshake protocol of subroutine DATA ACCEPT. The next byte transmitted indicates how many more data bytes can be expected. A check is made to insure that the expected number of data bytes does not exceed a known maximum limit. If this limit is exceeded, a reset is initiated (C3=0). A valid check allows the remaining data bytes to be transferred via the DATA ACCEPT subroutine.

Figures 92, 93:
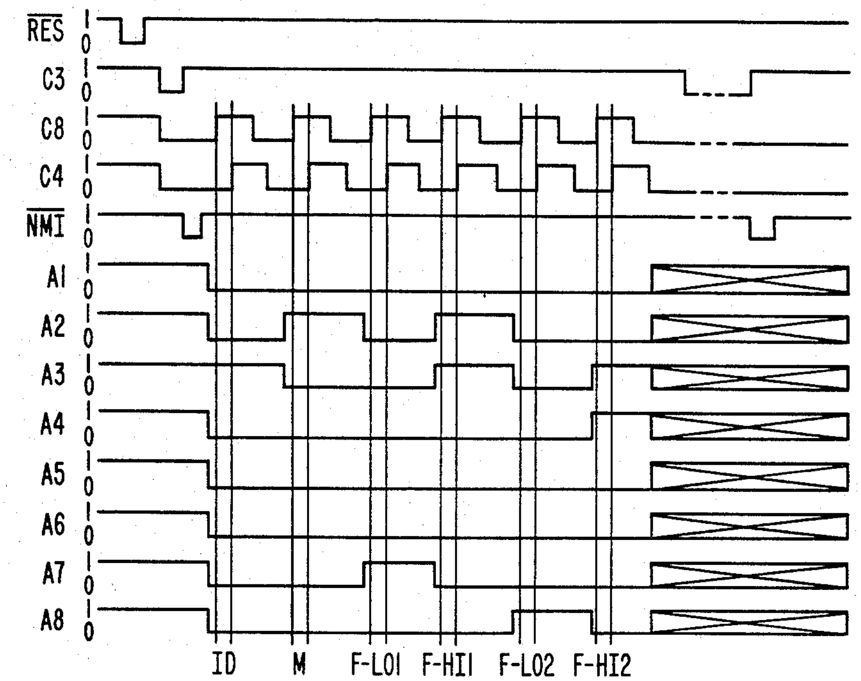
FIG. 92 illustrates the data transfer sequence for a variable byte count relating to providing information to the Sequence Single Frequency output function.
FIG. 93 depicts the bit weights to be assigned to the hexidecimal data values for digital signal generation.

FIG. 92 illustrates the data transfer sequence for a variable byte count relating to the Sequence Single Frequency output function. The data transfer indicates that this output function (id byte=hex 04) is to sequence two (M=hex 02) frequencies of 100 Hz (F-lo1=hex 40 and F-hi1=hex 06) and 200 Hz (F-lo2=hex 80 and F-hi2=hex 0C). FIG. 93 indicates the bit weights to be accorded the hexidecimal data values; the use of F-lo and F-hi values will be discussed shortly. FIG. 94 indicates the number and order of transmission of bytes for the various output functions.

The handshaking sequence (FIG. 91) for the data transfer depicted in FIG. 36 begins with PMU controller 3100 raising C8 to a logic 1. This signals microcomputer 3217 of the availability of the program id data byte at Port A. Microcomputer 3217 indicates acceptance of this byte by setting C4 to logic 1. PMU controller 3100 responds to this by placing C8 at logic 0, whereupon microcomputer 3217 responds by making C4 a logic 0. The handshake for the first data byte is now completed. Each remaining data byte is then transferred in a similar manner.

When all data transfers have been completed, microcomputer 3217 sets the FLAGS register to State 2 (FLAGS=1) and is instructed to jump back into a wait loop located within the RESET PROCESS. Upon entering this process, the STATUS flag is reset by placing a logic 0 on C3. This indicates to PMU controller 3100 that the first pass through the NMI PROCESS has been completed.

Upon receiving the second NMI signal, microcomputer 3217 is again vectored into the NMI PROCESS. Here, the state of the FLAGS register is once again checked. This time it is found to be equal to 1, thereby setting C3=1 and causing a jump, via the previously accessed program vector address, into the desired output function. Execution of the output function commences at this time.

Rather than discussing each output function in detail at this point, two functions—Single Frequency and Sequence Multifrequency—are chosen as representative and are elucidated in the sequel. This selection allows discussion of the significant considerations relating to signal generation as well as the situations in which FLAGS may take on the values of 2 or 3.

(III) Single Frequency Function

Figure 95:
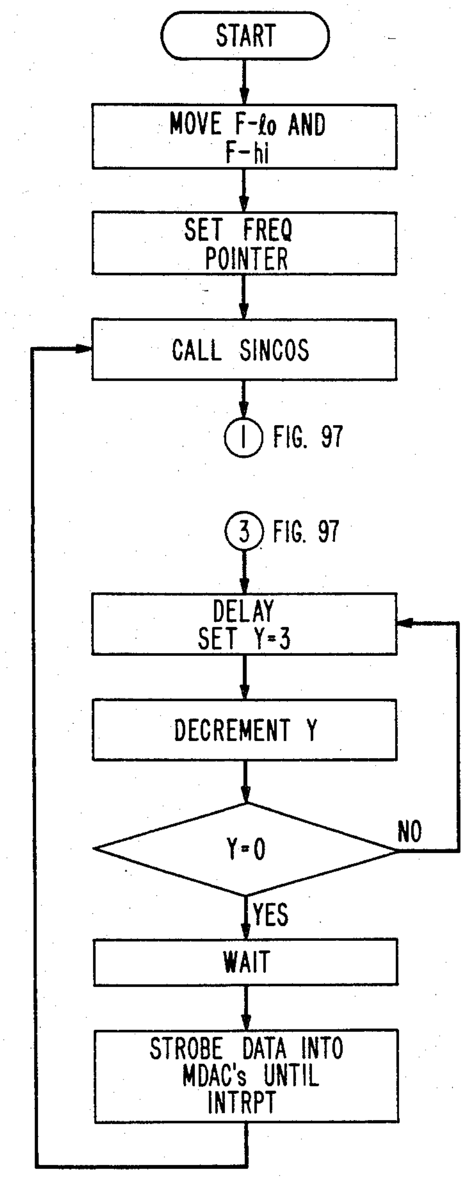
FIG. 95 is a flow chart of the program implementing the Single Frequency output function.
Figure 96:
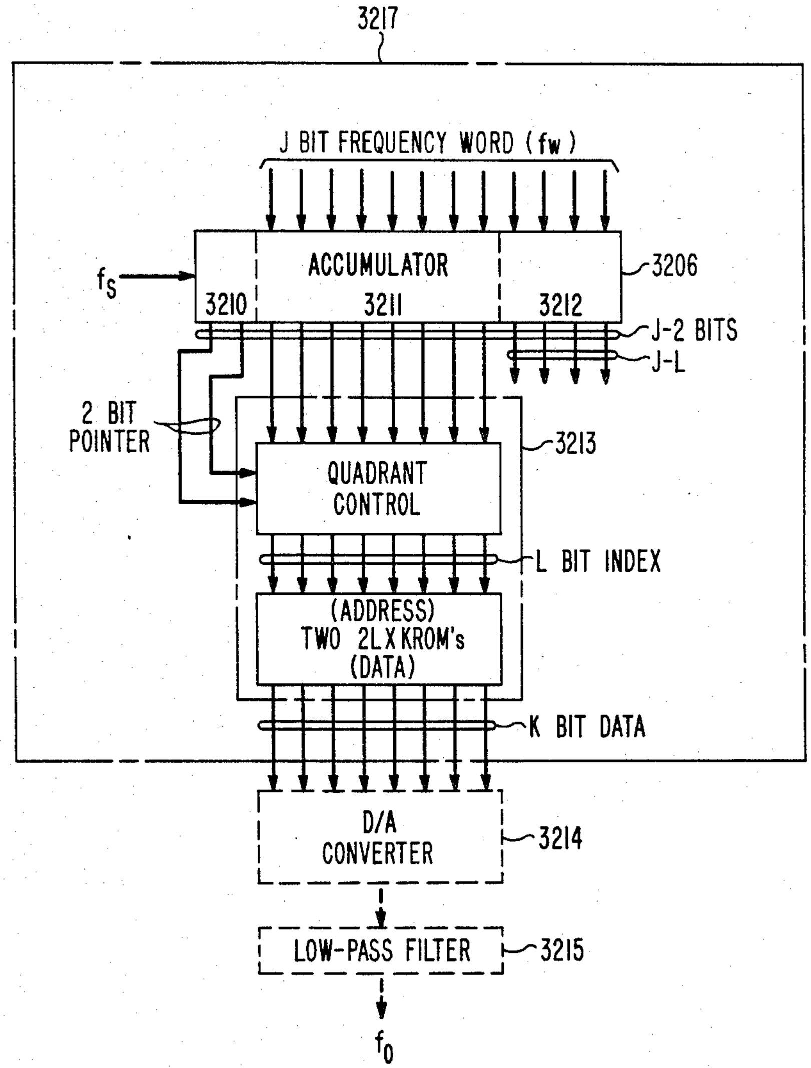
FIG. 96 is a recasting of FIG. 20 in view of the circuit details presented for the source generator.

The flowchart of the program realizing this function is shown in FIG. 95. This program generates a single tone from 1 Hz to 3200 Hz in 1 Hz increments. The generation technique synthesizes a cosinusoidal waveform in the manner broadly described above in Section 2.2.1a with reference to FIG. 19. FIG. 96 represents FIG. 19 recast for purposes of the present discussion.

Basically, normalized values of $\pm\cos\theta$ are stored in the ROM associated with microcomputer 3217, and different frequencies are produced by cycling through the ROM at different rates. The technique operates by keeping the present phase, designated $\theta(n)$ for the nth phase sample where $\theta(n)=2\pi n/2^{L+2}$, in (J+2)-bit (J>L) phase accumulator 3206. At each sampling instant occurring at the rate $f_s$ Hz, the value in accumulator 3206 is used to index the table values in sample selector 3213. Between sampling instants, the accumulated phase is incremented by the J-bit frequency word, designated $f_w$, received from PMU controller 3100.

Since $f_w$ is added to accumulator 3206 at the sampling rate $f_s$, a relationship exists between $f_s$, $f_w$ and the output frequency generated, designated $f_o$. The (J+2)-bit wide accumulator 3206 rotates through 360 degrees at a rate $$f_o=f_wf_s/2^{J+2}. \tag{3}$$

For example, if J=12 bits and $f_s=2^{14}$ Hz, then $f_o=f_w$. Greater output frequency resolution relative to $f_w$ is possible by using a larger J-bit amount. For instance, if J=16 and all else remains the same, then $f_o=f_w/16$. For the MLT system, the values are chosen so that there is a one-to-one correspondence between $f_w$ and $f_o$; thus $f_s=2^{14}$ Hz and J=12.

Generation of cosinusoidal waves by sample selection requires that more than two samples per cycle be produced or, equivalently, that the rate of sample production ($f_s$ Hz) be at least twice the highest frequency generated. The rate of sample production for the illustrative embodiment of the MLT system has been set at 16.384 kHz ($2^{14}$ Hz); this is more than five times the highest frequency (3200 Hz) to be produced. Program timing is carefully controlled. Each program has exactly $\frac{1}{2}^{14}$ seconds in which to produce a sample. Since a machine cycle is equal to twice the clock period of microcomputer 3217, that is, each machine cycle is $2^{21}$ Hz, each program must take no more than $2^7=128$ machine cycles to produce the next sample. If a program step requires less machine time, then delay must be inserted. If a program takes more machine time, then a reduction in the upper frequency limit of 3200 Hz must occur, along with other complications to be explained shortly.

Referring again to FIG. 95, it is seen that the Single Frequency function calls the SINCOS subroutine (designated by CALL SINCOS in FIG. 95); this call sequence is also depicted in FIG. 86. The SINCOS subroutine is a fast software realization of the table lookup technique. In this realization, accumulator 3206 of FIG. 96 is actually comprised of one full byte (register 3211) and two partial bytes (registers 3210 and 3212) of memory. Triple precision addition is used to add $f_w$ to accumulator 3206. The three-byte register arrangement allows the portion of the accumulator that is used as a sample selection index, that is, register 3211, to fall on a byte boundary. Also, since the frequency word $f_w$ actually comprises two bytes (F-hi and F-lo of FIG. 93), triple precision addition occurs by adding F-hi and F-lo, considered as one 12-bit addend, to registers 3210, 3211 and 3212, considered as a 14-bit addend, with the sum being stored as a 14-bit result in accumulator 3206. The memory arrangement is such that the four-high order bits of F-lo align with register 3212, and all bits of F-hi align with register 3211. Finally, the two least significant bits of register 3210 provide quadrant information, with '00' representing the first quadrant, '01' the second quadrant, and so forth.

Figure 97:
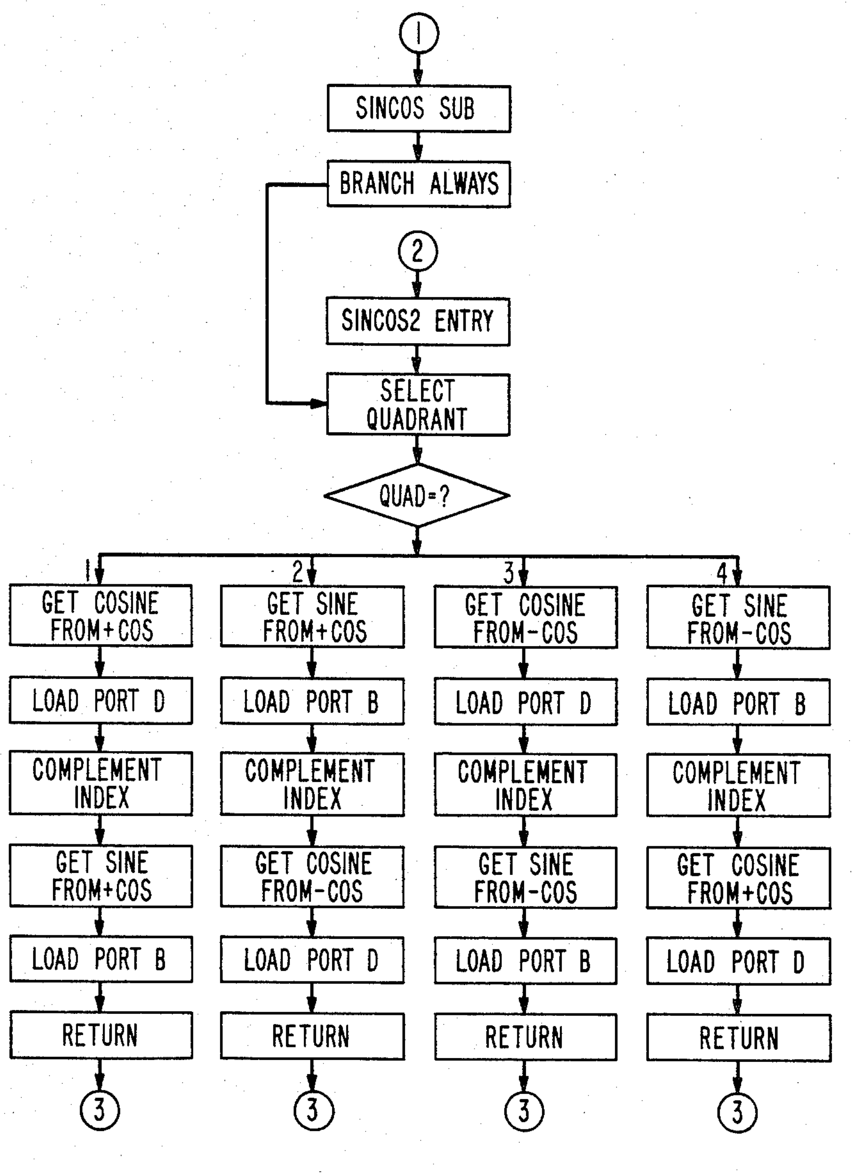
FIG. 97 is a flow diagram for the SINCOS subroutine.

A flow diagram for the SINCOS subroutine is shown in FIG. 97. Once a sample index and quadrant pointer have been determined in the calling program (in this case, Single Frequency), the correct sample value in one of two tables must be accessed. Indexing the appropriate table with either the sample index directly or its complement yields the desired sine or cosine value. As alluded to in Section 2.2.3a, each table contains 256 bytes of data values. One table has the values of $+\cos\theta$ the other $-\cos\theta$. Both cover 0 to 90 degrees with 0.3516 degrees spacing. The values within the tables are related by the two's complement. This relationship increases the speed of the subroutine and allows for frequency generation up to 3200 Hz since the computation time which would be needed to perform a two's complement operation on data from a single quadrant is eliminated. Once the sine and cosine values corresponding to a sample index have been attained, the proper sign is inserted and the samples are load into Port B (sine port) and Port D (cosine port). The proper sign is produced as follows: if the sample is positive, shift right and "OR" with hex 80. If the sample is to be negative, shift right and "AND" with hex 7F. This produces an offset binary code from the two's complement table values which is directly compatible with the format required by D/A converters 32142 and 32143 in ring generator 3204 (see FIG. 85). It is apparent that while the 512 table values are stored with 8-bit precision, the above steps of shift right and prefix the correct sign actually results in 7-bits of magnitude precision.

It is helpful to note at this point that, besides accumulator 3206, there is a substantially identical accumulator (not shown) that is utilized whenever multitone output functions are requested. The second sine/cosine generator, based on a second frequency word ($f_{w2}$), is nested within the SINCOS subroutine and is designated by SINCOS2 entry point in FIG. 97.

The assembly language program listed on pages 1-4 of Appendix F Ser. No. 399,177 illustrates one embodiment of a software implementation for the SINCOS subroutine. Cycle time through each quadrant is equal to 82 machine cycles. An equivalent object listing of the SINCOS subroutine is embedded within the listing on pages 7-11 of that Appendix F. Pages 7-11 provide the object code listing of all programs controlling microcomputer 3217. The object code for the SINCOS subroutine starts on page 11, line 2 with 0×18A5 and continues until line 11 and ends with 0×8160. For the Rockwell microcomputer utilized in the illustrative embodiment, the location of ROM begins at absolute hexidecimal address 0800; the SINCOS subroutine therefore occupies addresses 0E7E through 0F0F inclusive.

The assembly language program listed on pages 5 and 6 of Appendix F Ser. No. 399,177 presents the software for implementing the Single Frequency output functions. The machine cycle count for this program is 46 cycles. An object code listing of the Single Frequency Function is given as part of the listing in that Appendix F. In particular, the code starting on page 9, line 5 with 0×A508 and continuing until line 9 and ending with 0×7D0B, between hexidecimal addresses B73 to BB4, is the pertinent object code.

(IV) Sequence Multifrequency Function

Figure 98:
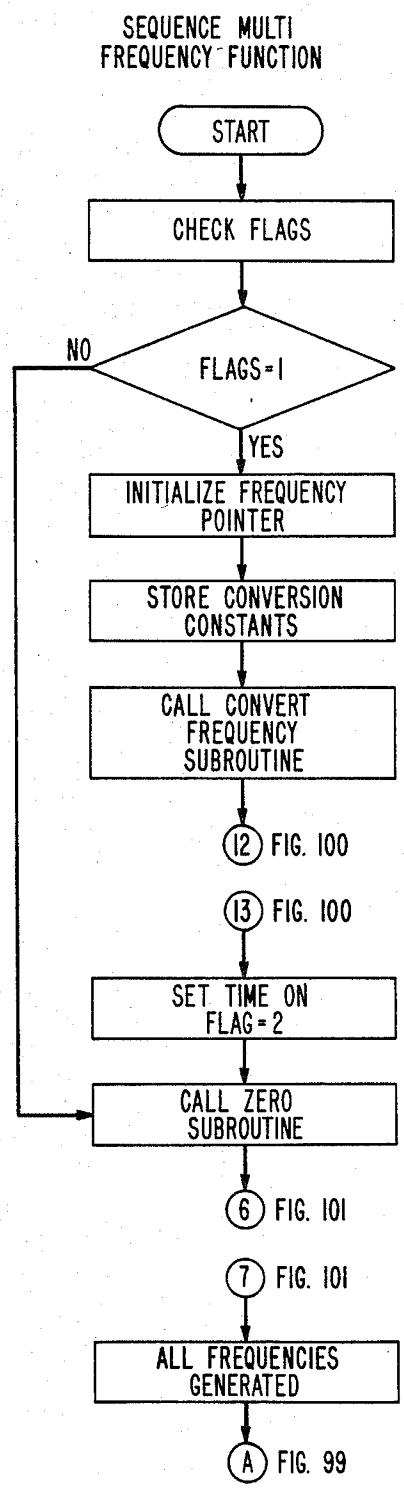
FIGS. 98 and 99, in combination, present the flow chart for the Sequence Multifrequency function.
Figure 99:
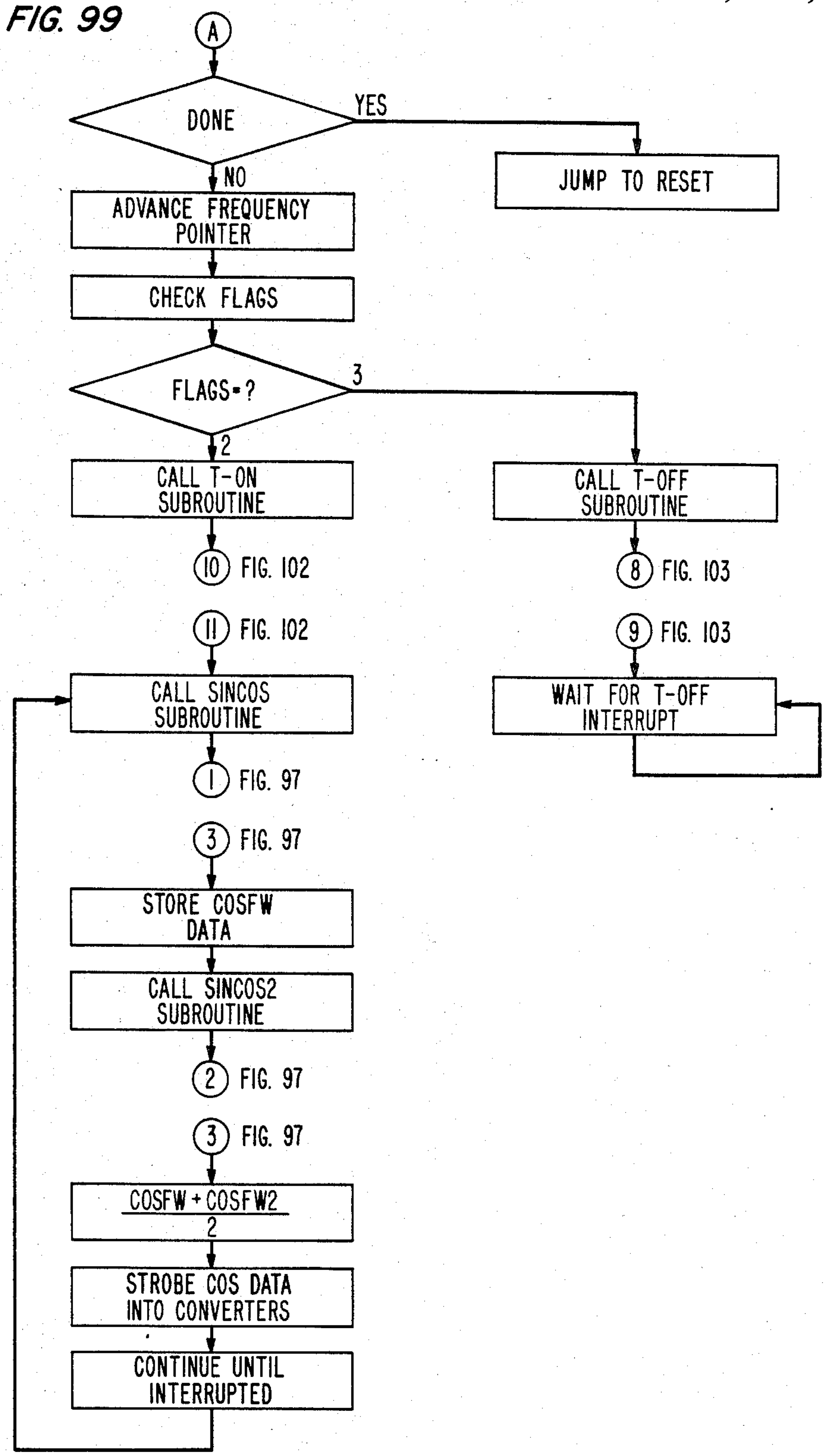

The flow diagram for the program realizing this function begins on FIG. 98 and continues on FIG. 99. This program generates a sequence of timed, multitone cosine bursts within the 1 Hz to 2000 Hz band. A sequence of up to 10 frequency pairs with a programmable duty cycle can be produced.

The reduction in upper frequency limit (3200 to 2000 Hz) is due to the longer time needed to extract the pair of samples. The computation path of the program requires 208 machine cycles to produce a sample. This means that an output is available for strobing to the cosine D/A converter after 208 machine cycles rather than every 128 machine cycles. Thus, the sample rate at the converter output is effectively (208/128) 16.384 kHz=10.08 kHz. Even though strobing occurs at a 10.08 kHz rate, microcomputer 3217 continues to operate at the 16.384 kHz rate. From sampling theory concepts, the samples of a cosine having a frequency $f_w$ and sampled at rate $f_s$ are the samples of a cosine of frequency $f_c$ sampled at a rate $$f_r=(f_wf_s)/f_c, \text{ or } f_c=(f_wf_s)/f_r.$$

Therefore, in order to utilize the existing $\pm\cos\theta$ tables, a scaling factor is used to convert $f_w$ to a value of $f_c$ according to the relation $$f_c=f_w(208/128). \quad (4)$$

Since the scaling factor (208/128) is greater than 1, and the table values in conjunction with the low-pass filter arrangement are useful to a frequency of about 3200 Hz, $f_w$ must be limited to approximately 2000 Hz in the multitone generation arrangement.

In addition, since the factor (208/128) in equation (4) is not an integer, $f_c$ has a fractional part even though $f_w$ is an integer. Thus, in binary, $f_c$ requires more bits for its representation and these additional bits fill the least significant bits of the F-lo byte (see FIG. 93). These four least significant bits are used during triple precision addition, but these, as well as the four most significant bits of register 3212, are not used in selecting the sample index.

Figure 100:
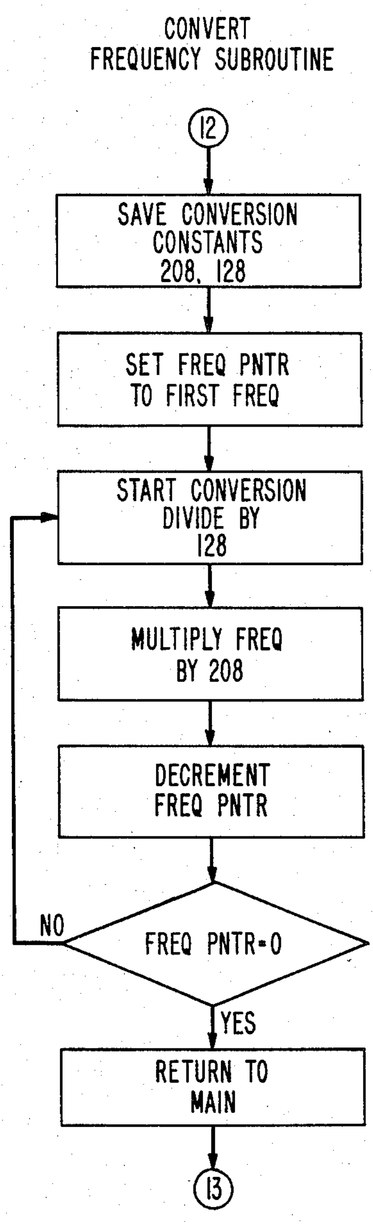
FIGS. 100 through 103 are flow charts for, respectively, Convert Frequency, Zero, T-ON and T-OFF subroutines of the source generator.

The conversion of the frequency number takes place in a subroutine called Convert Frequency; a flowchart of this program is shown in FIG. 100.

Figure 101:
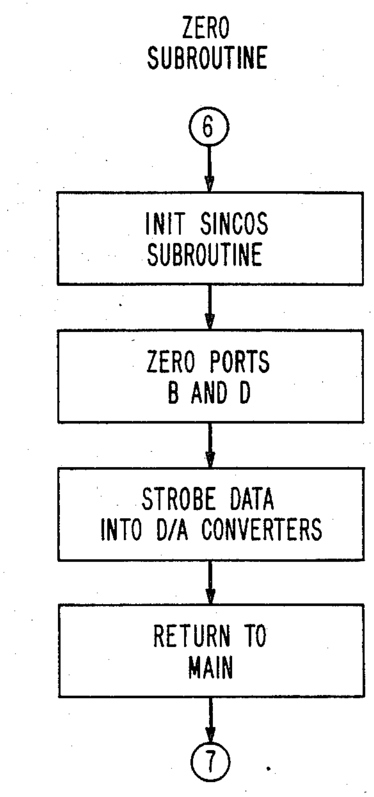

With reference to the flow diagram of the Sequence Multifrequency function in FIGS. 98 and 99, it is seen that once the program is entered, a check of the FLAGS register is initiated. The state of this register determines whether or not this is the first entry into the program. If entry has not been previously made, then the down-loaded frequency bytes are converted through the Convert Frequency subroutine, the time-on flag is set and a frequency sequence counter is zeroed by the Zero subroutine. A flowchart for the Zero subroutine is shown in FIG. 101. If entry has previously been made, then all registers and outputs are initialized via the Zero subroutine and no output is, as yet, generated.

Figure 102:
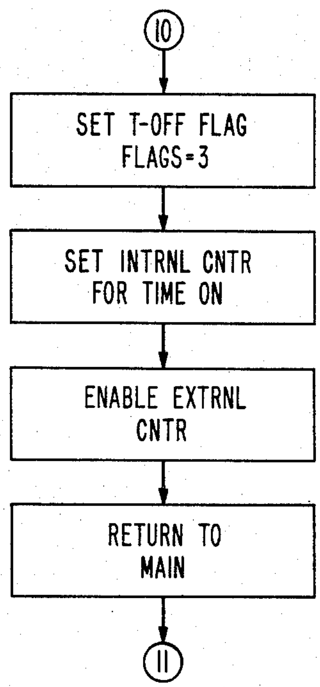
Figure 103:
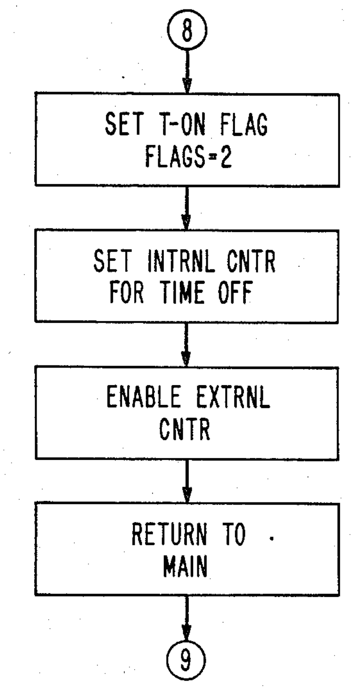

Both paths resulting from the FLAGS=1 test converge on a check of the sequence counter. This check determines if all the desired frequencies have been generated. If they have not, then the frequency pointer increments to the next frequency in the sequence. Once again, the FLAGS register is checked to determine whether the T-ON or T-OFF subroutine is to be executed. The flow diagrams of FIGS. 102 and 103 represent the T-ON and T-OFF subroutines, respectively.

When the T-OFF subroutine is invoked (FLAGS=3), no output is generated for the specified time period. Once the off time has elapsed, the Sequence Multifrequency program is entered again via the NMI PROCESS. All necessary checks are executed and the appropriate output is prepared for generation. The T-ON subroutine is invoked whenever FLAGS=2. Also, since two frequencies are to be generated, the SINCOS subroutine is executed at both the SINCOS2 entry point level as well as at the subroutine entry level. Cosine samples for both frequencies are extracted from the tables, added and then divided by two to maintain unity magnitude. The normalized cosine value is then loaded into the cosine port and strobed into cosine path D/A converter. Cosine samples continue to be generated for the specified on-time interval. Once this time has elapsed, a NMI signal is generated and the sample generation ceases. The program is reentered and the various checks done to determine the next response. This sequencing continues until all frequency pairs have been generated. Once the last pair is generated, output function execution halts and microcomputer 3217 resets (C3=0).

FIG. 104 indicates that the object code for the Sequence Multifrequency output function is located at addresses CD0 through CFD. The tabular data in FIG. 104 presents the memory map for the output functions stored in ROM as well as the RESET and NMI processes and all subroutines. In addition, the assignment of storage in RAM, of input/output ports and so forth is also summarized in FIG. 104.

The Gain program (address B4E–B60) simplifies the gain alignment of the multiplying converters 32142 and 32143. Upon command, the program loads Ports B and D with a binary zero. This value is then strobed into the converters. When the converters respond to this value, their output becomes equal to their reference (multiplying) gain. If the output does not match the anticipated gain, a manual adjustment may be effected.

The Sample program (BC1–B6F) produces a sine and cosine value for a preselected sample index and is used for self-diagnosis.

The Sanity program (D28–E70) is used to check the internal registers, external counter/timer and computation of an internal memory check sum for self-diagnosis. All internal registers are alternately loaded with ones and zeros and then read back. If the retrieved value does not agree with the loaded value, then "sanity" fails and reset is initiated (C3=0). If all registers pass, then the program sums all internal memory and compares this to a known, stored value. A correct comparison results in the internal counter being loaded with a predetermined count. The external counter is then turned on and a software timer is started. If the software timer times out before an NMI signal is generated, then sanity fails and C3 is set to zero. If an NMI signal is generated before the software timer becomes zero, then a check is made to insure that the NMI signal was not premature. When all checks have passed, PMU controller 3100 is notified via the handshaking protocol of the Data Accept subroutine.

The "Program Transfer Table Low" and "Program Transfer Table High" entries in FIG. 104 (addresses A00–A09 and A0A–A13, respectively) contain the low address byte and high address byte of the output functions and Gain, Sample and Sanity programs. The "Inbyte Table" entry basically summarizes FIG. 94. The "Initialization Index Table" contains information for initializing the input byte count.

Referring again to FIG. 84, source microcomputers 3216, 3217 and 3218 all operate according to the same object code listed on pages 7-11 of Appendix F of Rubin Case 4. Information on the signals to be developed for the various output leads 32021, 32022 and 32004 through 32007 is provided by PMU Controller 3100 via bus 31001. If leads 32021 and 32022 are presumed to carry a signal denoted cos $2\pi f_w$, then, typically, lead 32005 also carries cos $23\pi f_w$ and lead 32004 carries sin $2\pi f_w$. It is possible, however, to phase offset the latter two signals from the former by loading accumulator 3206 of source 3204 with a nonzero initial value corresponding to, say, cos $\phi$. Then the signals on leads 32005 and 32004 become cos $(2\pi f_w+\phi)$ and sin $(2\pi f_w+\phi)$, respectively. The desired offset information is also provided by PMU controller 3100. Moreover, it is possible to have source 3217 develop signals having a frequency that differs from the frequency of source 3217. Then, while leads 32021 and 32022 may carry cos $2\pi f_w$, leads 32005 and 32004 may carry, say, cos $2\pi(2f_w)$ and sin $2\pi(2f_w)$. In this way, harmonics on TIP and RING may be detected.

3.2.3a.2 DSG Hardware Considerations

Referring now to FIG. 18, the composite AC-DC signals used to energize TIP lead 32002 and RING lead 32003 are supplied with summation amplifiers 3207 and 3208, respectively. Each amplifier 3207 or 3208 is supplied with an AC signal from generator 3202 and a DC signal from DC source generator 3201. The accuracy and stability of all digital data conversion in AC generator 3202 and DC signals derived in DC generator 3201 depend upon a stable DC reference voltage found within generator 3201. The device of the illustrative embodiment satisfying accuracy and stability requirements is a monolithic voltage regulator, number MC 1723CL, produced by Motorola, Inc. and described in its "Linear Integrated Circuits Data Book", dated December, 1972.

Suitable operational amplifier circuitry, coupled to the regulator, provides the various DC voltages required. The levels of the AC signals also derive from the regulator. The reference voltage produced by the regulator is translated to one of a finite number of levels (typically 256) in a multiplying digital-to-analog converter (MDAC) of the type deployed in AC generator 3202 (FIG. 84). The appropriate level to be selected is down loaded from PMU controller 3100. The output level selected is supplied to MDAC's 32141 through 32145 of AC generator 3202 via bus 32023. The digital sines and cosines are converted to analog form with the regulator-derived level to provide the desired signal strengths.

3.2.3b Magnetic Current Sensor Circuitry

As already briefly discussed in Section 2.2.3b with reference to FIGS. 20, 22 and 21, ring current-to-voltage converter 3402 provides measurement circuitry which is arranged to produce an output voltage only when RING lead current is other than zero. The discussion hereinafter amplifies on the foregoing discussion with the aid of FIG. 105; this figure combines the circuitry of FIGS. 20 and 21 which is essential to the operational description.

Figure 105:
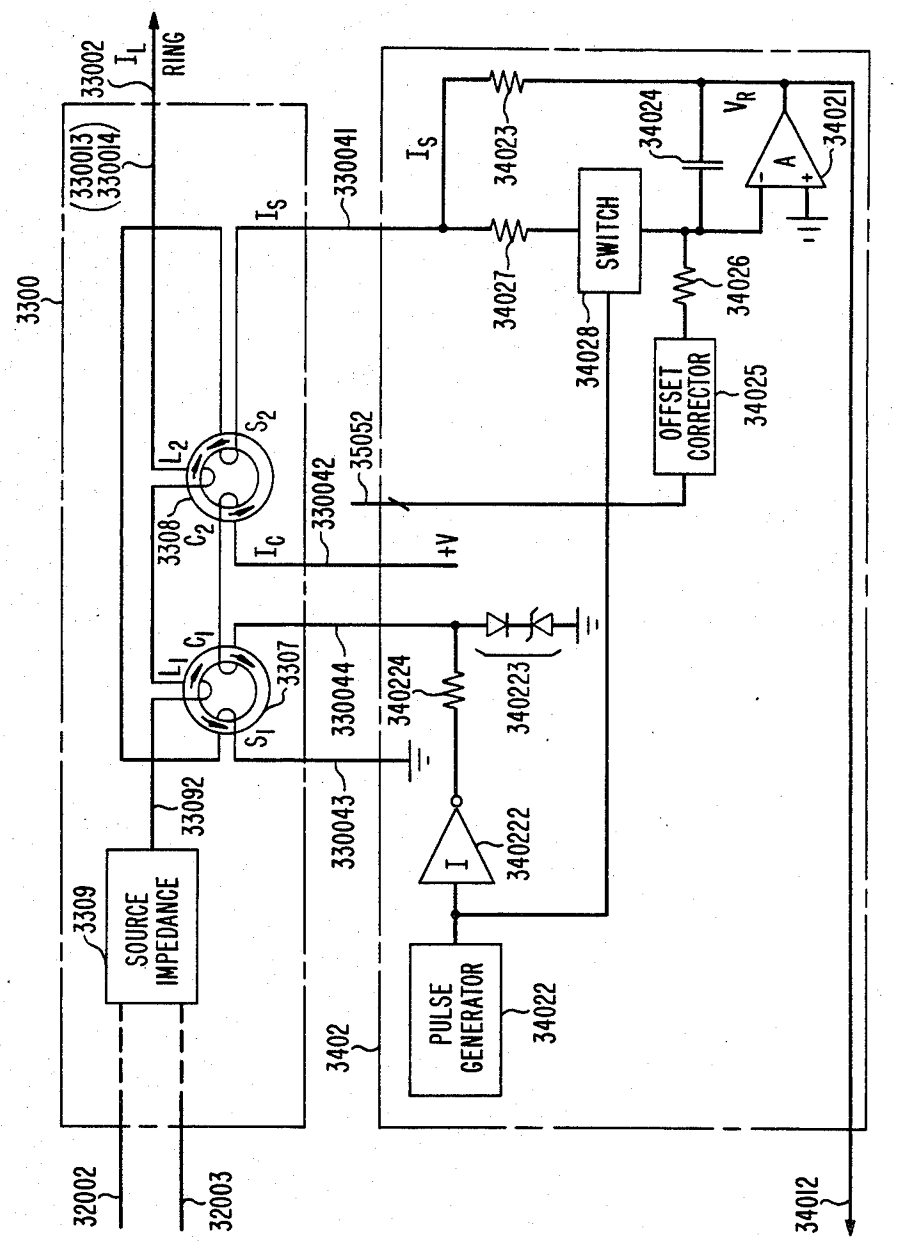
FIG. 105 combines the circuitry of FIGS. 20 and 21 which allow a full elucidation of the operation of the magnetic current sensor circuitry.

FIG. 105 depicts how two matched magnetic cores 3307 and 3308 are connected to circuitry for measuring line current, designated $I_L$, flowing on RING lead 33002 as a result of voltage impressed through source impedance 3309. Lead 33002 forms line winding $L_1$ on core 3307 and line winding $L_2$ on core 3308. Windings $L_1$ and $L_2$ are wound to produce essentially equal amounts of magnetizing field intensity (H) on cores 3307 and 3308. For instance, if $I_L$ flows from source impedance 3309 towards the RING lead, then the field intensity is clockwise on both core 3307 and core 3308.

Figure 106:
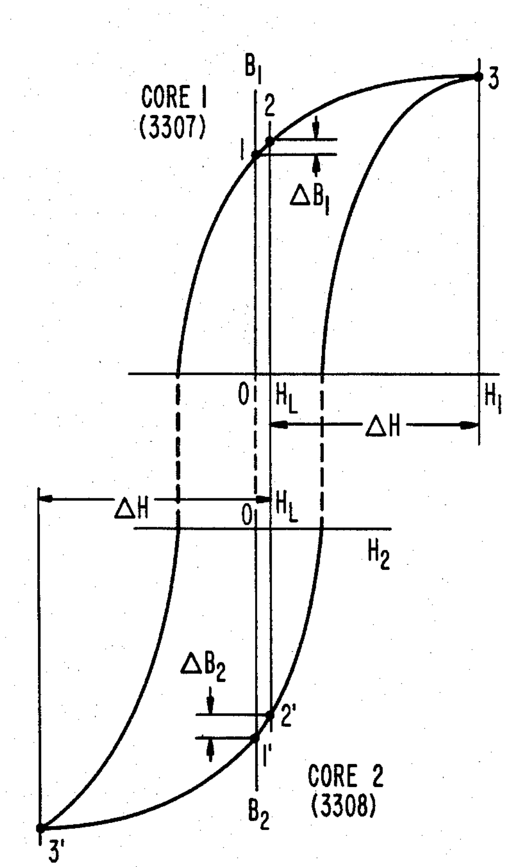
FIGS. 106 and 107 present a portion of major saturation hysteresis loop for two magnetic structures implementing a current sensor for matched and mismatched conditions, respectively.

Ideally, cores 3307 and 3308 are of matching characteristics such that the hysteresis curves mapping flux density B versus field intensity H for each core are congruent. FIG. 106 depicts the upper-half of the B-H curve for core 1 (3307) and the lower-half for core 2 (3308) in vertical relationship. Point 1 of core 1 indicates the intersection of the major saturation hysteresis loop on the B axis for a zero H field. Point 1' depicts the similar intersection for core 2. If the cores are temporarily presumed to possess identical characteristics and the windings ($L_1$, $L_2$, $C_1$, $C_2$, $S_1$ and $S_2$ of FIG. 105) are not energized, then the flux densities are equal in magnitude for H=0. Points 1 and 1' may also be considered the quiescent points resulting from application and then removal of field intensity. For example, if $H_L$ represents the field strength caused by current $I_L$ flowing in line winding $L_1$, then point 2 (point 2') depicts the new operating point on the B-H curve for core 1 (core 2). Whenever $I_L$ is reduced to zero, a minor saturation hysteresis loop is traced back to point 1 (point 1') to reestablish quiescent conditions. Because windings $L_1$ and $L_2$ are wound in the same directions and the B-H characteristic is nonlinear, a change in operating conditions between points 1 and 2 on core 1 causes a corresponding flux density change of $\Delta B_1>0$, whereas the same swing between points 1' and 2' causes a variation of $\Delta B_2>0$ on core 2. The total overall change, designated $\Delta B$, is defined as $\Delta B=\Delta B_1+\Delta B_2$. The objective of the current measuring circuitry of FIG. 105 is to force $\Delta B$ to zero using an appropriately fed back current, shown as current $I_S$, which is derived from a voltage directly proportional to $I_L$.

To derive the required voltage that supplies feedback current, cores 3307 and 3308 have control windings $C_1$ and $C_2$, respectively, connected to circuitry, as will be explained, whereby a succession of control current pulses causes current to flow in windings $C_1$ and $C_2$. Moreover, cores 3307 and 3308 have sense windings $S_1$ and $S_2$, respectively, connected to circuitry, as will be explained, whereby changes in flux density may be electromagnetically detected.

Control winding $C_1$ is wound so that current flowing in the direction $I_C$ in FIG. 105 causes a clockwise magnetizing field in core 3307. With reference to FIG. 106, current $I_C$ causes the B-H curve to be traversed from point 1, through point 2 towards 3 whenever $I_L$ is zero, or from point 2 to point 3 whenever $I_L$, causing a field $H_L$, flows. The measure of the field strength for movement along the B-H curve between points 2 and 3 is denoted $\Delta H$. Control winding $C_2$ is wound so that current $I_C$ generates a counterclockwise field strength in core 3308. Whenever $I_L$ is zero, current $I_C$ causes B-H curve traversal from point 1' beyond point 3', whereas whenever a current $I_L$ flows, the path of traversal is from point 2', through point 1' to point 3'. Again, $\Delta H$ is a measure of the field strength between points 2' and 3'.

Sense winding $S_1$ is wound so that for a current flow $I_S$ as depicted in FIG. 105, a counterclockwise magnetizing field obtains in core 3307. On the other hand, $I_S$ causes a clockwise magnetizing field in core 3308. In steady-state operation, the field strength induced by current $I_S$ is to be equal and opposite the field strength due to current $I_L$ in each core 3307 and 3308. When this condition occurs, $\Delta B_1=\Delta B_2=0$, thereby yielding $\Delta B=0$.

Before steady-state operation is achieved, a transient period occurs wherein a voltage is developed from electromagnetic pick-up on sense windings $S_1$ and $S_2$. As suggested above, this voltage drives current $I_S$. Since $I_S$ cancels the effects of $I_L$ in steady-state, then the developed voltage, designated $V_R$, is proportional to RING current in steady-state.

The transient period begins whenever $I_L$ changes to a new value requiring measurement. For purposes of the immediate discussion, it is assumed a new $I_L$ generates field strength $H_L$ of FIG. 106. Pulse generator 34022 of FIG. 105 continually operates at about 50 kHz to produce 55 percent duty cycle, unipolar, square-wave pulses. At the output of inverter 34022, the pulse is low for about 9 usec., allowing sufficient time for cores 3307 and 3308 to saturate from current $I_C$ flowing from the positive voltage on lead 330042 through resistor 340224. In FIG. 106, with $I_S$ equal to zero initially, the core operating points move from points 2 and 2' to points 3 and 3', respectively, during saturation. The pulse is high for about 11 μsec. to allow time for cores 3307 and 3308 to recover or flyback from the saturation condition. During flyback, diode-zener diode pair 340223 becomes conductive. As cores 3307 and 3308 return to operating points 2 and 2', $\Delta B$ is generated. This differential flux induces a voltage on the series-aiding sense windings $S_1$ and $S_2$. Since switch 34028 is closed during flyback, this induced voltage is applied to the differential inputs of high-gain amplifier 34021 through series resistor 34027. Capacitor 34024, which is connected between the output of amplifier 34021 and its inverting input (−), in conjunction with amplifier 34021, form a voltage integrator. During the low interval of each pulse, switch 34028 is opened and current $I_S$ is provided to sense windings $S_1$ and $S_2$. The value of this current is determined by the voltage stored on capacitor 34024 and the resistance of resistor 34023.

Over a succession of pulses from generator 34022, amplifier 34021 and capacitor 34024 will cumulatively integrate successive voltages induced on sense windings $S_1$ and $S_2$ so as to gradually change the output voltage of amplifier 34021, which appears on lead 34012. The voltage on lead 34012 eventually achieves the steady-state value of $V_R$, whereupon the amount of feedback signal cancels field $H_L$ in core 1 and core 2. At this point, $\Delta B$ becomes zero and $V_R$ is a measure of the amplitude and polarity of current $I_L$ which initiated the transient period. In the illustrative embodiment, the turns ratio of sense winding to line winding and the value of resistance 34023 is chosen so that $V_R=62.5\ I_L$ for $V_R$ in mv and $I_L$ in ma.

Figure 107:
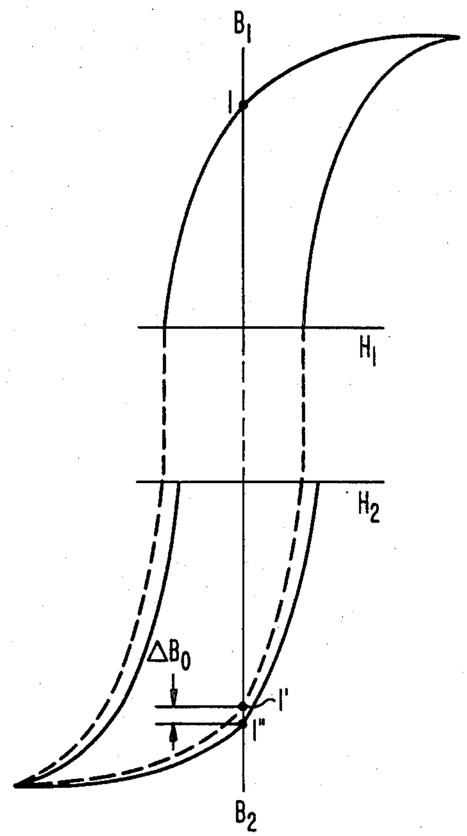

The description of this section has, to this point, presumed identical core characteristics for cores 3307 and 3308. In practice, there exists a DC offset as well as dynamic offsets in core characteristics due to the inability of the cores to directly track, especially with temperature. The effect of the DC offset may be readily explained with reference to FIG. 107. In this figure, the top B-H characteristic is the same as that depicted for core 3307 in FIG. 106, that is, core 1. On the other hand, the bottom portion of FIG. 107 shows core 2 of FIG. 106 dashed, and the actual characteristic as a solid line. The disparity occurs because of drift. It is apparent that, even with $H_L=0$, a voltage proportional to $\Delta B_o$ will be generated by the sense circuitry of FIG. 105. To compensate for the DC portion of this error, offset corrector 34025 provides a small bias voltage which is converted to a small bias current via series resistance 34026 and supplied to the inverting input of amplifier 34021. The voltage to be provided by corrector 34025 results from measurements on core pair 3307,3308 during a calibration period which occurs at periodic intervals. During calibration, $I_L$ is set to zero by opening leads 33092 and 330013 so that, in effect, the RING presents an open circuit and source driver 3302 (FIG. 20) is disconnected. Voltage on lead 34012 of amplifier 34021 is then measured as if a normal measurement was being processed. Since $I_L=0$, $V_R$ should be zero. If $V_R$ is not zero, then PMU 3100 feeds adjustment information to corrector 34045 via bus 34052 emanating from detector controller 3405 (FIG. 22). In the illustrative embodiment, corrector 34025 is an 8-bit digital-to-analog converter. Thus the D/A output can range over 256 steps corresponding to input codes of hexidecimal OO to FF. At system start-up, D/A corrector 34025 and amplifier 34021 are statically set so that loading a midrange binary number into D/A corrector 34025, typically hexidecimal 80 from corrector 34025, causes $V_R$ to be zero. As drift occurs, this midrange number no longer zeros out $V_R$, and another binary number is supplied to effect a zero reading for $V_R$. Since $V_R$ (ma)=62.5 $I_L$ (ma), each step of converter 34025 corrects for an error of about 0.4844 mv/step.

Besides the first-order error described above in terms of a DC offset, there also exists a second-order effect that causes a so-called dynamic error. This occurs when a finite impedance loads line windings $L_1$ and $L_2$ even though driver 3302 is still disconnected. For instance, with reference to FIG. 20, it is possible to operate source impedance 3309 and test termination 3310, via applique controller 3311, so that windings $L_1$ and $L_2$ are loaded with a test impedance-to-ground which is representative of typical longitudinal-mode impedances expected of the loops under test. Because cores 3307 and 3308 exhibit different minor hysteresis saturation characteristics, a nonzero $V_R$ may be measured even with corrector 34025 arranged to provide zero DC offset and even though $I_L=0$. One way to minimize the sensitivity of core pair 3307,3308 to the wide range of impedances exhibited by the loop population is that of adding an inductor in series with windings $L_1$ and $L_2$. This inductor is chosen so that at the frequency used to switch core pair 3307,3308, that is, the frequency of operation of pulse generator 34022, the loop impedance is small compared to the impedance of the inductor. In effect, core pair 3307,3308 is presented with a constant load at the pulse rate. On the other hand, the inductor must present a low impedance relative to the loop impedance over the range of measurement freqencies so as not to isolate the loop from core pair 3307,3308. The inductor is shown as element 3313 in FIG. 20 and typically has a value of 300 $\mu$h. A corresponding TIP inductor 3312 serves the same decoupling function for core pair 3305,3306.

Even with corrections for first- and second-order offsets, there is still the potential for significant error whenever a minute current (of the order of 1 ua) must be measured. This situation typically occurs in a differential current measurement mode wherein, say, the TIP and RING currents are essentially equal and the currents are routed through core pair 3305,3306 in opposing directions to measure TIP line current ($I_{LT}$) minus RING line current ($I_{LR}$) or $I_{LT}-I_{LR}$. In differential measurement situations, the third-order error is removed by performing an additional measurement. In this second measurement, the routing of both $I_{LT}$ and $I_{LR}$ through the apertures of core pair 3305,3306 is reversed. Since the error mechanism provides a bias of the same polarity to each measurement, the error is removed by subtracting the two measurement results in PMU controller 3100 and then forming the average to obtain the correct output voltage.

Again with reference to FIG. 22, the output voltages proportional to currents flowing on the specific loop conductor arrangement appear on leads 34011 and 34021 of TIP converter 3401 and RING converter 3402, respectively. Each of these voltages is processed in essentially the same manner within detector 3400, so only the processing of the voltage $V_T$ on lead 34011 is discussed in the sequel.

The voltage $V_T$ is passed through analog filter 3403 to restrict the bandwidth of the measured current to 3200 Hz. The low-pass filter portion of filter 3403 is a conventional sixth-order low-pass filter comprising three second-order sections in cascade. The passband is flat to within ±0.1 dB, the −3 dB corner frequency is 3200 Hz and signals are attenuated by at least 20 dB at frequencies above 4000 Hz. Filter 3403 also contains a 60 Hz notch filter that may be switched in-line or not depending on the type of test in progress and the presence of excessive 60 Hz noise influence on the loop under test. Normally the notch filter is on-line; PMU controller 3100, via detector controller 3405 and, particularly, the signal on lead 34053, controls the insertion and removal of the 60 Hz notch. The notch corner frequencies are 54 Hz and 66 Hz and a 60 Hz signal is attenuated by at least 20 dB. The filtered output voltage $V_{TF}$ from filter 3403 appears on output lead 34031.

The voltage $V_{TF}$ is split into two paths and, thereby, serves as inputs to both AC gain unit 3408 and DC gain unit 3410. Gain unit 3408 eliminates DC from voltage $V_{TF}$ by a 10 Hz second-order high-pass filter with a −3 dB frequency of 4 Hz. Each gain unit 3408 or 3410 is capable of providing either direct coupling to its output or a separately programmable gain of four. Normally, gain units 3408 and 3410 are set for maximum gain allowing for a peak current of 32 ma flowing on the TIP before a 8.000 volt threshold for $V_{TF}$ is exceeded.

Saturation detector 3406 has the outputs of gain units 3408 and 3410, on leads 34001 and 34003, respectively, as its inputs. Saturation detector 3406 signals PMU controller 3100 that one or both voltage thresholds have been exceeded. Detector 3406 is realized with absolute value comparator circuits on each of its inputs. Moreover, internal counter circuitry ensures that transient signals of less than 64 usecs. are ignored and responses are triggered only by permanent overloads. An AC overload condition is transmitted from detector 3406 via lead 34061 and a DC overload via lead 34062. The overload circuitry is of the latching type and, once tripped, remains in the logic state indicating overload until cleared by PMU controller 3100. Leads 34061 and 34062 combine to form multilead 34005 emanating from detector 3400. The interrupt operation occurs as follows. As per FIG. 17, overload signals are transmitted to measurement processor 3500, via lead 34005, and then to PMU controller 3100, via lead 35002. Acknowledgment of reception of the overload signals and action to be taken is transmitted from PMU controller 3100, over bus 31001, to detector controller 3405 of FIG. 22. Any gain adjustments required are transmitted to the appropriate gain units 3408 and 3410 via leads 34058 and 34057, respectively, and the clear signal to detector 3406 via multilead 34059. If the newly attenuated signal still causes overload, then attenuator 3303 of applique 3300 (see FIG. 20) is switched into TIP lead 33001 to effect a further reduction in the strength of the detected signal. The reduction is typically by a factor of four.

The signal indicating that attenuator 3303 is to be placed in-line is transmitted from PMU controller 3100 to applique controller 3311 over bus 31001 and, finally, to attenuator 3303 via multilead 33112. The TIP signals finally exiting detector 3400, on leads 34001 and 34003, are now within prescribed bounds and, if scaled, appropriate information as to scaling factors is stored in PMU controller 3100.

The signals on leads 34001 and 34003 serve as inputs to measurement processor 3500, as depicted in FIG. 23. The AC signal on lead 34001 is split into three paths. One path directly connects to port 1 of the 7-1 MUX in the upper-half of multiplexer 3501. The second path is one input to multiplier 3701 and the third path drives an input to multiplier 3702. The other inputs to multipliers 3701 and 3702 are the TIP(I) and TIP(Q) signals on leads 32007 and 32006, respectively. The operation of multiplier 3701, which is four-quadrant type AD 534 supplied by Analog Devices, is exemplary of the operation of both multipliers 3701 and 3702 and is now considered.

If the signal on lead 34001 is represented by $$r = A\cos(2\pi ft + \theta_1 + \theta_2)$$

where f is the test frequency,

A is directly related to the current flow on the TIP lead [$A = (62.5)\, I_L G$, with G being 4, 1 or ¼ depending on scaling], $\theta_1$ is a known phase shift due to magnetic current sensor and filter circuitry and is determined periodically during calibrate procedures, and $\theta_2$ is an unknown phase shift due to reactance of the TIP lead, and the signal on lead 32007 by $$s = \cos(2\pi ft + \theta_1),$$

then the output of multiplier 3701 is proportional to $$x = \cos\theta_2 + \cos[2\pi(2f)t + 2\theta_1 + \theta_2].$$

As expected, the output x comprises a DC component and a double frequency component.

The output x serves as input to two filters 3510 and 3511. Filter 3510 is a 10 Hz, second-order low-pass filter designed to remove the double frequency component, thereby passing only the DC term $\cos\theta_2$ proportional to the conductance part of the TIP admittance. Typically, filter 3510 is utilized whenever the frequency of the signal on the loop is explicitly known.

FIlter 3511 is employed whenever the frequency to be detected is unknown but can be approximated, as with in-band signaling. In this case, 350 Hz, second-order low-pass filter 3511 is used to reject the sum frequency and pass the difference up to the expected maximum variance in the uncertainity of the frequency.

The output of filter 3510 couples to port 2 of 7-1 MUX in the upper portion of multiplexer 3501, whereas filter 3511 connects to port 3. The output of multiplier 3502, which is proportional to loop susceptance, is also split to filter known and estimated frequencies via low-pass filters 3512 and 3513. These latter two filters are substantially the same as the former filter pair 3510 and 3511. Ports 4 and 5 of upper 7-1 MUX in multiplexer 3501 receive the outputs from filters 3512 and 3513, respectively.

The broadband output voltage on lead 34003 provides the remaining two inputs to upper 7-1 MUX in multiplexer 3501. Port 6 is directly coupled whereas port 7 receives the output of 10 Hz, second-order low-pass filter 3514. The input to filter 3514 is the voltage on lead 34003 so filter 3514 performs DC isolation. Port 6 is used for broadband noise measurements.

The voltages on RING leads 34002 and 34004, which are the counterparts to TIP leads 34001 and 34003, supply signals to the lower-half 7-1 MUX in multiplexer 3501 in the same manner. The function of multiplexer 3501 is that of selecting corresponding ports in its upper and lower 7-1 MUX's and connecting the signals arriving at the selected ports to sample-and-hold (S/H) circuits 3504 and 3505, respectively. Selection of the desired interconnection from input-to-output in multiplexer 3501 is under control of measurement interface 3508, via busses 35082 and 35083, respectively. The interconnect information is transmitted to interface 3508 from PMU controller 3101 on bus 31001. Multiplexer 3501 is enabled via two conductors forming part of multiple lead 35071 interconnecting controller 3507 with interface 3508. Enabling information is initially transmitted, via bus 31001, to controller 3507 for decoding. In the preferred embodiment, each of the upper and lower halves of multiplexer 3501 is standard device DG 508 supplied by Intersil Corporation.

The voltages selected for processing appear simultaneously on leads 35011 and 35012 from multiplexer 3501. Circuits 3504 and 3505 are unity gain S/H devices; lead 35073 from measurement controller 3507 puts the S/H devices in the hold mode. The sampled outputs appear on leads 35041 and 35051, and these leads serve as inputs to 2-1 MUX 3506. The sampled signals are routed, one at a time, through MUX 3506 to programmable gain amplifier (PGA) 3502 over lead 35061. A logic signal on lead 35074 linking measurement controller 3507 with MUX 3506 determines which sampled signal is to be routed to PGA 3502 for amplification; the timing of this logic signal will be examined shortly.

The four remaining circuit blocks of FIG. 23 not yet discussed, namely, PGA 3502, A/D converter 3503, measurement interface 3508 and measurement controller 3507, cooperate to perform the unitary operation of providing a series of 20-bit digital words to DSP 3600 of FIG. 17. As such, these circuits are highly interactive and critically timed. Initially, then, the discussion focuses on the basic function performed by this circuit group without concern for circuit details. Subsequent discussion elaborates on circuit details, where necessary, to complete the description.

Figure 108:
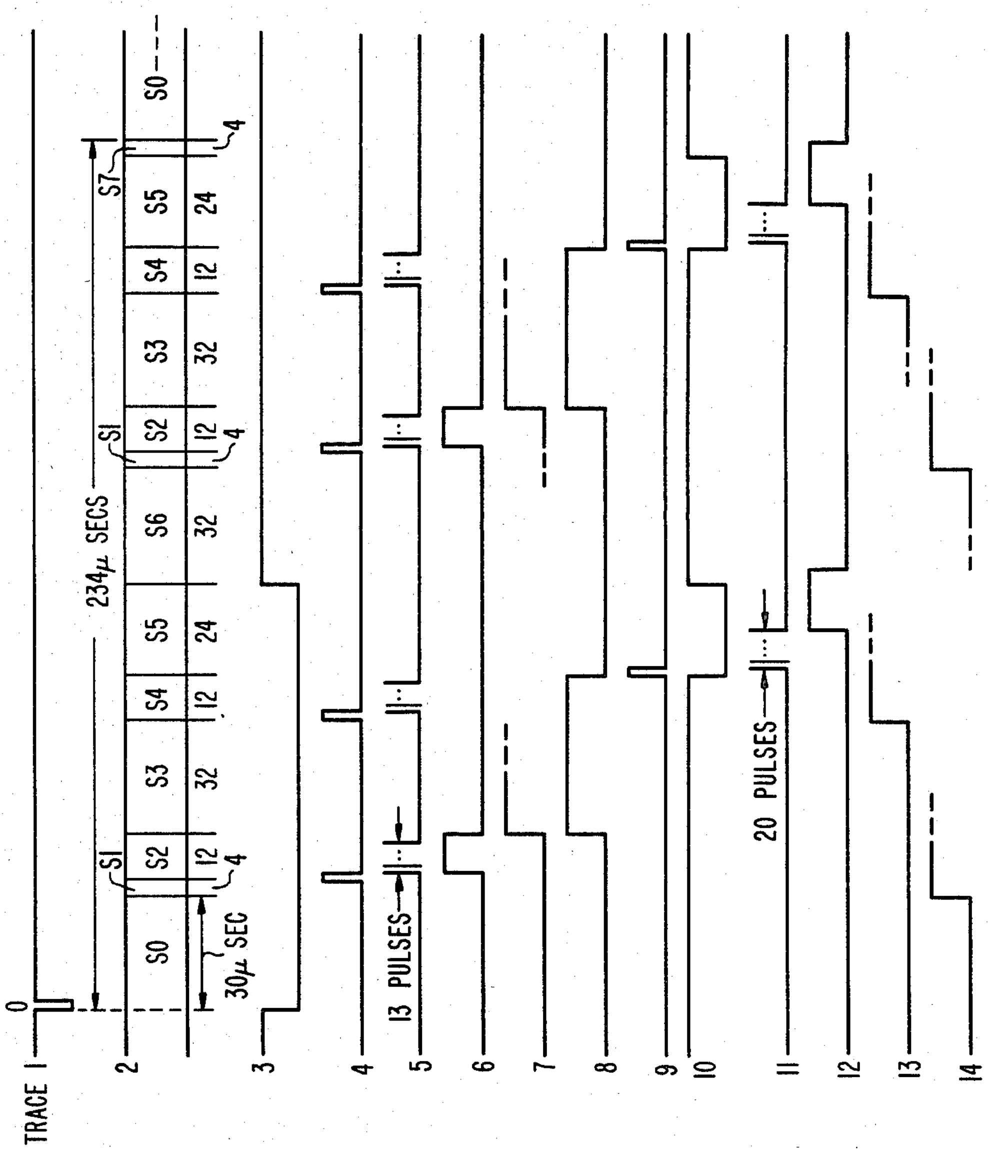
FIG. 108 is a diagram indicating the sequence of operations, as well as their relative timing, for generating a pair of data samples in the measurement processor of FIG. 11.

The instant discussion commences with reference to the timing diagram of FIG. 108. The upper trace in FIG. 108, designated Trace 1, depicts a negative-going pulse that serves as the "time zero" reference point. The pulse of Trace 1 initiates the production of one series of 20-bit words and the other thirteen traces of FIG. 108 indicate the unfolding of events for the first two words; remaining word pairs are processed similarly. Trace 1 is a "sample request" pulse transmitted from PMU controller 3100 over one conductor of bus 31001 of FIG. 23. A one megahertz signal is obtained as a result of a signal provided over a second conductor of bus 31001 to provide timing in multiples of 1 usec. The sample request pulse illustrated is generally one from a series of pulses transmitted whenever a series of data words is to be supplied for processing. Possible pulse rates include 100 Hz, 2000 Hz or 8000 Hz depending on the type of signal processing to be effected. The sample request pulse is transmitted after source generator 3200 is started, notch filters 3403 and 3404 have been switched in or out, gain units 3408-3411 have been set, and so forth and after a settling time of approximately 50 milliseconds has elapsed.

The negative-going edge of the pulse of Trace 1 triggers a state timing circuit. The states and the duration of each state are depicted by Trace 2. The initial state, designated State 0 (S0), lasts 30 usec.; the next state, called S1, consumes 4 usec.; S2 is of 12 usec. duration; and so forth. Progression through the thirteen states S0, S1, . . . , S5, S6, S1, . . . , S5, S7, requires 234 usecs. This cycle is utilized whenever in-phase and quadrature sample pairs are required, typically at the 100 Hz rate. If only a single in-phase sample is required, the cycle comprises seven states S0, S1, S2, S3, S4, S5 and S7 and is completed in 118 usec. Since a pulse rate of 8000 Hz is equivalent to sample production at a 125 usec. rate, then only a sequence of single samples, rather than sample pairs, can be produced at the 8000 Hz rate. For the purposes of the immediate discussion, it is presumed that a sequence of sample pairs is to be produced; this request is transmitted over data bus 31001 from PMU controller 3100 to measurement controller 3507. Signals indicating the presently active state—S0, S1, . . . , or S7—appear on bus 35072 of FIG. 23.

Trace 3 indicates the signal appearing on lead 35074 used to drive MUX 3506. A "low" on lead 35074 connects the output of S/H 3504, on lead 35041, to MUX 3506 whereas a "high" connects S/H 3505 to MUX 3506. The 30 usec. spent in S0 and the 32 usec. in S6 allows PGA 3502 time to slew down and settle before an analog-to-digital conversion commences in A/D 3503.

Prior to initiating a set of measurements via A/D 3503, it is possible that AC or DC saturation signals, arriving on leads 34005 and 34006 at the input to measurement controller 3507, may cause an interrupt pulse to be generated. This pulse is transmitted to PMU controller 3100 on lead 35002 and causes the state generator to remain in S1. The offending gain unit (3408–3411 of FIG. 17) is reduced in gain or the appropriate attenuator (3303 or 3304 of FIG. 20) is switched in-line to alleviate the saturation condition, as discussed earlier. State 0 is reestablished and the complete measurement cycle begins anew. Reset to S0 is transmitted by DSP 3600 over one conductor of bus 36001. Trace 14 indicates the timing of the saturation interrupt signal.

Presuming saturation has been eliminated and 30 usec. has elapsed, S1 is now activated and measurements may begin. Each in-phase and quadrature signal is measured twice; the first establishes the gain range and the second performs the actual measurement. The measurements are initiated by the signal of Trace 4, which depicts a so-called "A/D start" signal on lead 35085. One A/D start signal is timed to begin on the trailing edge of the S1 pulse whereas the other is synchronized with the end of S3. Each A/D start pulse lasts about 2 usec., and the trailing edge triggers an actual analog-to-digital measurement in A/D 3503. An actual measurement requires a maximum of 10 usec., so a measurement is completed before the end of S2 or S4. A/D converter 3503 is a successive approximation device and produces a serial data output one on lead synchronized by thirteen clock pulses on another lead. These pulses are illustrated in Trace 5, which depicts the twelve data bits on one conductor of multiple lead 35031 combined with the first or synch pulse on the clock conductor of lead 35031. During the last 10 usec. of S2, the number of leading zeros present in the data pulses are counted. This interval is depicted by Trace 6. Leading zeros are generally anticipated because the gain of PGA 3502 is small initially.

The gain of PGA 3502 is now reset based upon the number of leading zeros counted. This allows the full range of A/D 3503 to be utilized for maximum resolution of the signal being measured. The 32 usec. allocated to S3 affords the necessary adjust period in which the desired gain setting is transmitted to PGA 3502 and settling occurs. Trace 8 depicts the intervals in which the gain of PGA 3502 is adjusted from the starting value; this occurs during the "high" state wherein the appropriate gain data is transmitted over bus 35084.

For some digital filtering programs within DSP 3600 (see FIG. 17), it is desirable to incorporate zeros in the two least significant positions of a data word. This avoids a phenomenon called a "limit cycle", as will be described when DSP 3600 is discussed. In those situations requiring trailing zeros, PMU 3100 signals measurement interface 3508, via bus 31001, that so-called "psuedo-gain" is to be supplied. However, if there are less than two leading zeros in the data word upon the completion of the gain range measurement, that is, State 2 of Trace 5, then psuedo-gain may cause saturation. When this situation occurs, an interrupt is transmitted to PMU controller 3100, via lead 35002, and the state of the processing remains disabled in S3. DSP 3600 sends a reset signal on bus 36001 to begin the entire cycle again by returning to State 0 and psuedo-gain is disabled via a signal on bus 31001. The signal depicted by Trace 7 indicates the timing of the interrupt and restart as a result of the condition referred to as "psuedo-saturation".

Presuming there is no saturation due to psuedo-gain, the second pulse of Trace 4 indicates the second A/D measurement commences 2 usec. into S4. However, another interrupt condition may override this second measurement, and this is represented by Trace 13. If DSP 3600 is not ready to accept data because, primarily, it is still processing past data, a signal to this effect is transmitted over lead 36002. If this signal is prevent at the end of S3, an interrupt pulse is sent from measurement controller 3507, via lead 35002, to PMU controller 3100. The state generator latches into S4 until reset to S0 indicating a repeat of the entire cycle is required.

If it is assumed that DSP 3600 is ready to accept data, the results of the second measurement, depicted as occurring during S4 by Trace 5, are sent to measurement interface 3508 on one conductor of lead 35031 emanating from A/D 3503. Traces 9, 10 and 11 indicate the sequence of events occurring during S5. As per Trace 9, a synchronizing pulse is transmitted to DSP 3600, via one conductor of multiple lead 35001 emanating from measurement interface 3508, indicating data is ready to be transmitted. Trace 10 shows 24 usec. time windows in which DSP 3600 is "clear-to-read" A/D data; a "low" clear signal is transmitted over another conductor of lead 35001. Finally, Trace 11 depicts the timing of 20-bit data words to DSP 3600 via a series of pulses over a third conductor of lead 35001. The data word itself is transmitted on a fourth conductor of lead 35001 in synchronism with the pulses of Trace 11. After 20 bits have been received, an "input buffer full" signal is transmitted from DSP 3600 to measurement interface 3508 in order to discontinue transmission of the data. This buffer-full signal is illustrated by Trace 12 and appears on lead 36002.

Multiple conductor leads 35071 and 35081 convey appropriate signals derived in measurement controller 3507 to measurement interface 3508 and vice versa, respectively. The signals on lead 35071, besides the enable signals described earlier, include overall timing information, reset to State 0 pulse and request for "psuedo-gain". The signals on the two conductors of lead 35081 indicate that DSP 3600 is not ready to receive data and the psuedo-saturation condition enabling interrupt of PMU controller 3100.

Figure 109:
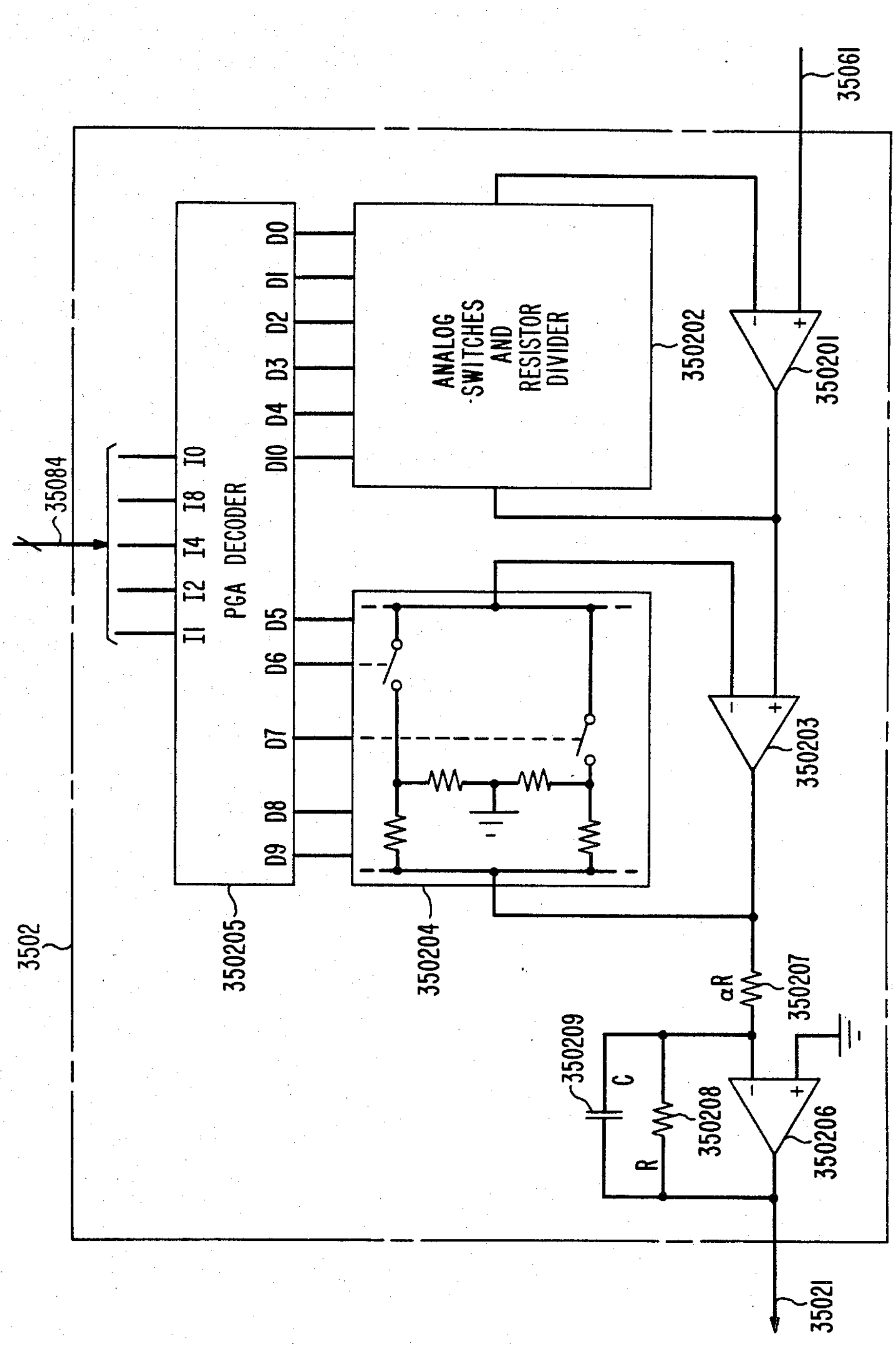
FIG. 109 depicts circuitry implementing a programmable gain amplifier for autoranging during a measurement cycle.

Focusing now on circuit particulars, FIG. 109 depicts circuitry implementing an illustrative embodiment of PGA 3502, which enables autoranging during measurements of the signal on lead 35061. Two measurements of a given signal are taken, namely, one with the gain of PGA 3502 set at 1.18 and the second with a gain, expressed in powers of two, such that the maximum possible signal delivered to A/D converter 3503 via lead 35021 does not exceed its input rating. The higher gain enables higher resolution by converter 3503 because a greater number of higher order bits will be significant. The amount of gain added is determined by the number P of leading zeros from the first measurement; the gain is $2^P$, $P \leqq 8$. Information about the detected value of P is transmitted from measurement interface 3508 (FIG. 23) over bus 35084, which serves as input to PGA decoder 350205.

Bus 35084 comprises five digital lines I1, I2, I4, I8 and I0. During the first measurement, I0 is a logic 1 and the other four lines are ignored. However, the logic states of lines I1, I2, I4 and I8 determine the amount of gain added during the second measurement when I0 is logic 0 and is basically ignored. For instance, if P=5 as a result of the gain range measurement, then I4 and I1 are logic 1 with I8 and I2 at logic zero. Decoder 350205 translates logic information on bus 35084 to a set of decoded states D0, D1, . . . , D10 wherein only one state in the range D5 through D9 is energized at any time and similarly for states D0 through D4 in combination with D10. Decoded states D0–D10 control the operation of switchdivider networks 350202 and 350204, which are the feedback path of operational amplifiers 350201 and 350203, respectively. By selectively switching in and out high precision resistors under control of states D5–D9, network 350204 sets the gain of amplifier 350203 and similarly for network-amplifier pair 350202,350201. For instance, with state D5 activated, the gain of amplifier 350203 is one, D6 corresponds to a gain of 2; and so forth. Tables summarizing this discussion are as follows:

AMPLIFIER 350201

| | | | | | GAIN IN STATE | | | | | |
|---|---|---|---|---|---|---|---|---|---|---|
| I0 | I8 | I4 | I2 | I1 | D0 | D1 | D2 | D3 | D4 | D10 |
| 1 | — | — | — | — | | | | | | 1.18 |
| 0 | 0 | 0 | 0 | 0 | 1 | | | | | |
| 0 | 0 | 0 | 0 | 1 | | 2 | | | | |
| 0 | 0 | 0 | 1 | 0 | | 2 | | | | |
| 0 | 0 | 0 | 1 | 1 | | | 4 | | | |
| 0 | 0 | 1 | 0 | 0 | | | 4 | | | |
| 0 | 0 | 1 | 0 | 1 | | | | 8 | | |
| 0 | 0 | 1 | 1 | 0 | | | | 8 | | |
| 0 | 0 | 1 | 1 | 1 | | | | | 16 | |
| 0 | 1 | 0 | 0 | 0 | | | | | 16 | |

AMPLIFIER 350203

-continued

| | | | | | GAIN IN STATE | | | | |
|---|---|---|---|---|---|---|---|---|---|
| I0 | I8 | I4 | I2 | I1 | D5 | D6 | D7 | D8 | D9 |
| 1 | — | — | — | — | 1 | | | | |
| 0 | 0 | 0 | 0 | 0 | 1 | | | | |
| 0 | 0 | 0 | 0 | 1 | 1 | | | | |
| 0 | 0 | 0 | 1 | 0 | | 2 | | | |
| 0 | 0 | 0 | 1 | 1 | | 2 | | | |
| 0 | 0 | 1 | 0 | 0 | | | 4 | | |
| 0 | 0 | 1 | 0 | 1 | | | 4 | | |
| 0 | 0 | 1 | 1 | 0 | | | | 8 | |
| 0 | 0 | 1 | 1 | 1 | | | | 8 | |
| 0 | 1 | 0 | 0 | 0 | | | | | 16 |

The first measurement is made with a gain of 1.18 to protect against switching in too high a gain during the second measurement and overloading A/D converter 3503 (FIG. 23). Thus the signal on lead 35061 is considered to be 18% higher than its actual value to reduce the actual amount of gain added. This alleviates an overload situation that may be exemplified as follows. It is supposed there is no 18% margin and the output of converter 3503 on the first measurement is 0011 1111 1111 or decimal 32527. This is just below the 0100 0000 000 or 36623 decimal level. With one leading zero, the gain is 2. If the second measurement was taken with a preturbation due to noise, the additional gain would cause an overflow. This results in an erroneous measurement and the test would be rerun. The margin of 18% includes a 13% allocation to the large step difference ($36623 = 1.13 \times 32527$) and 5% to other circuit tolerances.

A third amplifier stage comprising operational amplifier device 350206, inverting input resistor 350207, and RC parallel feedback combination 350208 and 350209 provides level shifting and filtering. Resistor 350207 has value $\alpha R$ so that the magnitude of the gain of this last stage is $1/\alpha$. The value of $\alpha$ is determined as the ratio of the maximum signal allowed on input lead 35061 to maximum of the signal on output lead 35021 for low frequencies. In the illustrative embodiment, $\alpha = 8/5$. Resistor 350208 and capacitance 350209 act as a first order low-pass filter with a cutoff of about 30 kHz; this bandwidth is sufficient to allow PGA 3502 to slew and settle within 32 usec., yet is narrow enough to reject high frequency noise. Moreover, operational amplifiers 350201, 350203 and 350206 have a high gain-bandwidth product and low offset. In the illustrative embodiment, operational amplifiers 350201, 350203 and 350206 are device LF 156 manufactured by National Semiconductor. In addition, A/D converter 3503 (FIG. 23) is manufactured by Burr-Brown and sold under the code ADC85.

3.2.3c Digital Processing and Control

As depicted by the righmost diagram in FIG. 58 and in view of the memory partitioning shown in FIG. 68 for PMU 2101, PMU controller 3100 and DSP 3600 are mutually dependent subsystems so it is advantageous, at this juncture, to discuss their implementations within the same context.

As alluded to above in Section 3.2.1 when LTS controller 2000 was discussed, PMU main controller 3145 and LTS main controller 2045, both depicted in block diagram form in FIG. 58, have substantially the same circuit realizations. LTS main controller 2045 is the one depicted by FIG. 59 and discussed in detail with reference to FIGS. 60–65. PMU main controller 3145 is realized by incorporating four minor variations in the circuitry of FIG. 59. These include the reassignment of status leads GPIB0–GPIB2 of adapter 2020, the selection of a different clock signals at the output of clock divider 2005, the reprogramming of decoder 2015 and, finally, the replacement of RAM1 memory 2042 with PROM. With respect to the status leads, if PMU controller 3100 forms a part of PMU 2101, then GPIB0 and GPIB2 are both connected to logic 0 and GPIB1 is connected to a logic 1. In a similar manner, PMU 2102 has status lead bits of '011', whereas PMU 2103 shows a bit arrangement of '100', where the first bit is GPIB0. Since PMU's 2101–2103 are connected to bus 20001, these unique status lead identifiers allow for unambiguous two-way communication. With regard to outputs from clock 2005, both CLKA and CLKC remain the same (15.625 kHz and 62.5 kHz, respectively) but CLKB becomes 500 kHz. Regarding memory accessing, PROM 2016 of decoder 2015 has OxFF in all addresses except the following: 0×70 and 0×71 have 0×E7; 0×72 and 0×73 have 0×EB; 0×74 and 0×75 have 0×ED; 0×76 and 0×77 have EE; and both 0×7A–0×7F and 0×FA–0×FF, have, respectively, hex data CF, CF, 3F, BF, BF, 6F. Finally, the four 2K×8 devices furnishing RAM1 2042 of FIG. 64 are replaced with 4K×8 2732A-type PROM's by providing LAB11 as an input in place of LWR* and grounding A5 of device 2016. This total of 16K of ROM becomes BANK E as shown in FIG. 68. BANK A2 is provided by RAM2 2043, as it was for LTS main controller 2045; BANKS A3 and A4 are 8K of addressable I/O space associated with PMU main controller 3145 of FIG. 58. Of the five remaining memory banks, BANK A, BANK B and BANK C are provided by universal memory 3150 and BANK D and BANK A1 are provided by DSP circuitry 3600.

As also indicated above, in the discussion of Section 3.2.1b with regard to universal memory 2050, it was pointed out that the basic memory implementation would also be utilized for PMU controller 3100. This is depicted in FIG. 58, wherein bank memory 3150 and PMU main controller 3145 cooperate to form PMU controller 3100. Bank memory 3150 is also depicted, in block diagram form, by FIG. 69 and in detail by FIGS. 70 and 71. However, since BANK A now comprises 32K bytes and BANK B and BANK C only 16K bytes each (as compared to three 20K bytes segments for LTS controller 2000), PROM's 2054–2055 of FIG. 70 are programmed so that MCSO*–MCS7* select BANK A, MCS8*–MCS11* select BANK B and MCS12*–MCS15* select BANK C.

The remaining three memory segments of FIG. 68, namely BANK A1, BANK A3 and BANK D, are either provided by or allocated to DSP 3600. The implementation of DSP 3600 in the preferred embodiment is shown in block diagram form by FIG. 110. ROM 3610, shown in detail in FIG. 111, comprises four 4K×8 PROM's; this total of 16K bytes of memory serves as BANK D. Also shown in FIG. 111 is RAM 3615, which comprises eight 4K×1 static RAM's serving as BANK A1. The arrangement of FIG. 111 is basically the same as that depicted in FIG. 73 for LTS main controller 2045 and may be implemented in the same manner.

Figure 112:
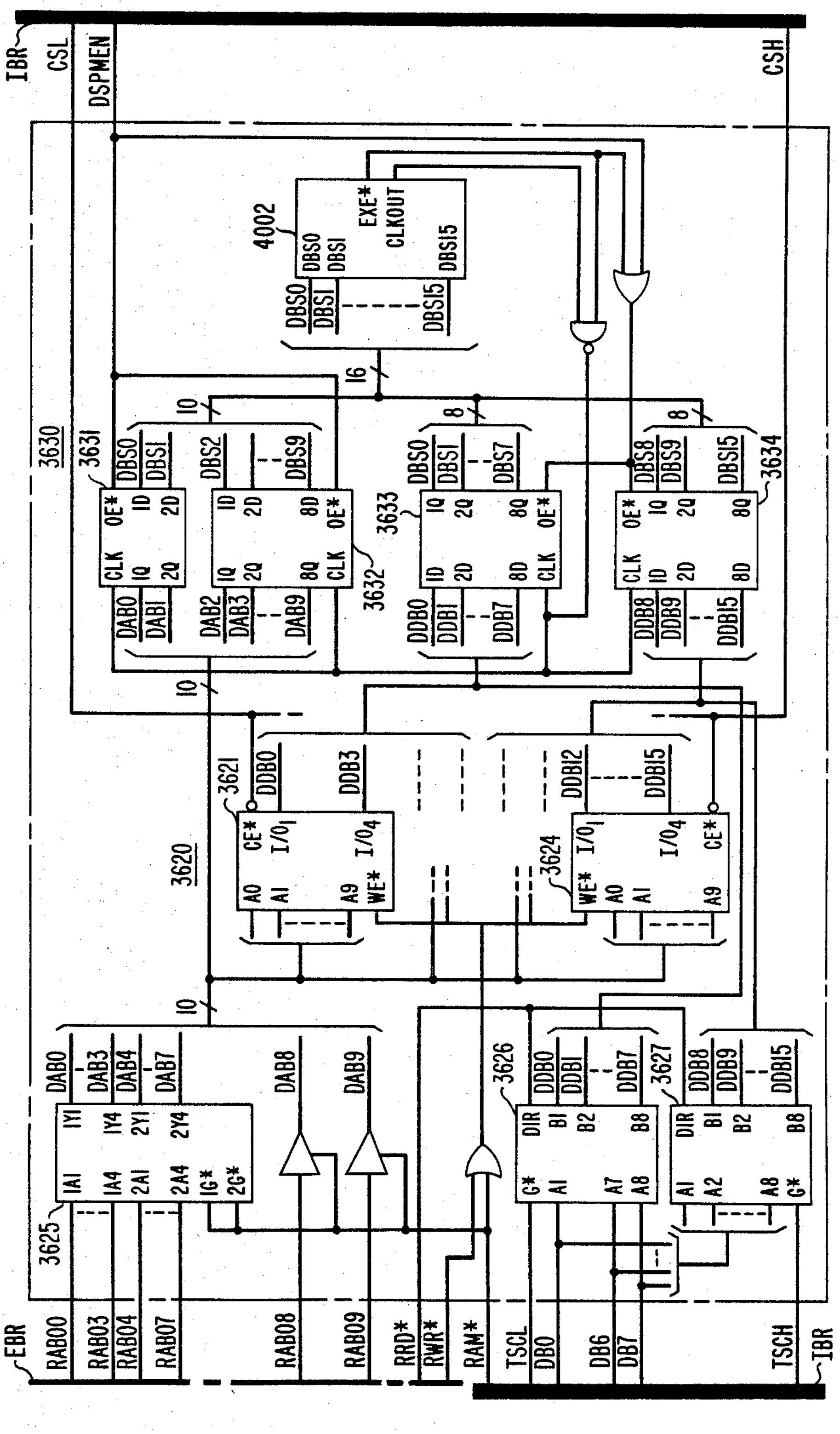

Of the final 4K of memory space remaining to be discussed, that is, BANK A3 which is assigned locations 0×E000–0×EFFF, the 1K from 0×EC00–0×EFFF is assigned to dual-port RAM (DPR) 3620, including devices 3621–3627, of FIG. 112. Memory 3620 functions for PSP 4000 as ROM memory, but with respect to PMU controller 3100, this same memory space appears as RAM. This allows PMU controller 3100 to store processing programs in its ROM and by downloading to locations 0×EC00–0×EFFF, any necessary filtering or processing functions can be performed. This feature is included because the special purpose processor implementing PSP 4000 can only access 1K of memory. Although each processing program is, by itself, less than 1K, it is necessary to include this feature so that a selection of algorithms is available for downloading depending on the analysis required. Moreover, this 1K is 16 bits wide rather than the 8 bits discussed to this point. As witnessed in FIG. 112, devices 3621–3624, each of which is 1K×4, are grouped in pairs to provide the upper byte (devices 3623 and 3624) and the lower byte (devices 3621 and 3622) of the 16 bit words. Devices 3621–3624 are, typically, type 40A supplied by the Western Electric Co.

Buffer transceiver 3525 in FIG. 112, a LS244 furnished by the Western Electric Co., interfaces address leads RAB00–RAB07 to dual-port RAM devices 3621–3624. The eight outputs DAB0–DAB7 from transceiver 3625, when combined with buffered versions of RAB08 and RAB09, that is, DAB8 and DAB9, provide ten address leads for one-in-1024 memory location decoding. These address leads select a unique memory location in RAM devices 3621–3624 when enabled by the RAM* signal. Bus transceivers 3626 and 3627, types LS245, interface internal data leads DB0–DB7 to RAM devices 3621–3624. In particular, transceiver 3626, when operated in conjunction with WE* and CE* of devices 3621 and 3622, stores 8-bit data into devices 3621 and 3622. Similarly, transceiver 3627 directs 8-bit data to devices 3623 and 3624. In this way, the program desired for a particular test request can be downloaded into devices 3621–3624. Transceivers 3625–3627 comprise one access port, designated Port A, to DPR 3620. With the four 1K×4 RAM's loaded with the program of interest, transceivers 3625–3627 may be deactivated and demultiplexing section 3630 activated to access the desired program.

Demultiplexing section 3630, comprising four LS374 flip-flops implementing gates 3631–3634 and buffer 4002 (a component comprising PSP 4000 as discussed shortly) directs the addressing and accessing of information stored external to PSP 4000. Gates 3621–3624 comprise the second port (Port B) of DPR 3620. During each processor cycle of PSP 4000, four memory addresses are generated. When external ROM is utilized, as in this illustrative embodiment, two of the addresses are available to external devices via leads DBS0–DBS15 emanating from buffer 4002. Then, during a typical cycle: gates 3631 and 3632 latch the first address generated, which is the address of an instruction, whereas gates 3633 and 3634 latch the instruction itself by reading the bit configuration on leads DDB0–DDB15 associated with devices 3621–3624; the next address generated selects a coefficient in assentially the same manner, that is, gates 3631 and 3632 first capture the 10-bit address off bus DBS0–DBS15, and then gates 3633 and 3634 transmit the latched coefficient bits onto the same bus during a later portion of the cycle. (The remaining two addresses that are generated direct data read and a data write to memory internal to PSP 4000).

Figure 113:
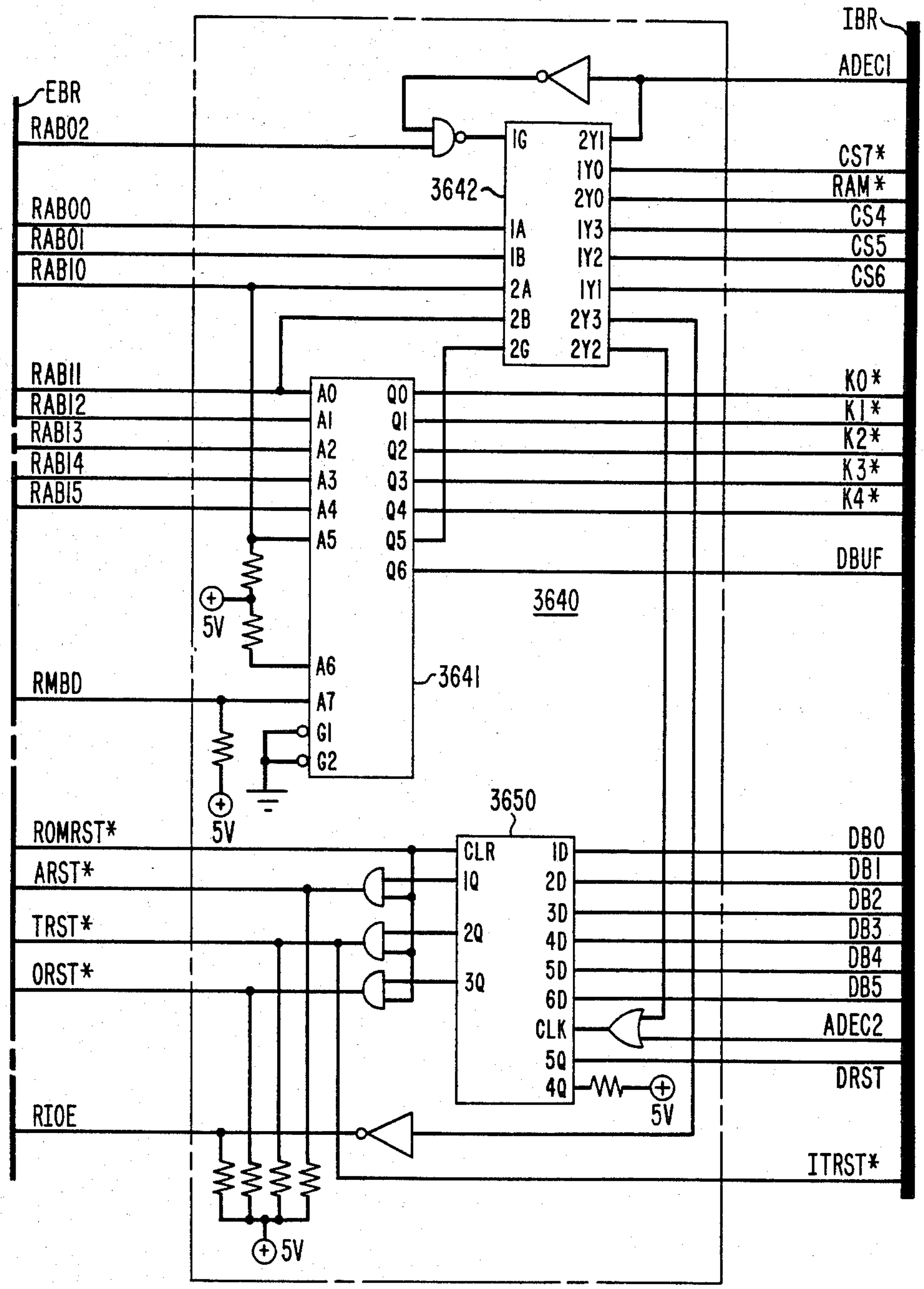

A 28L22 type device, shown in FIG. 113 as device 3641, is the primary means for address decoding within decoder 3640. Decoding is accomplished down to the 4K granularity level to provide the **K0*-K4* decode signals. Further chip-select address decoding is accomplished by using discrete logic in combination with dual 2-4 decoder 3642, a LS139 type device. Also serving as an input to decoder 3640 is bank switching lead RMBD which, when low, allows the memory space in the range 0×8000 to 0×BFFF (BANK D) to be addressed. The coding of fusible link PROM 3641** is as follows: all memory locations contain 0×FF except 0×10–0×17 which contain, respectively, BE,BE,BD,BD,BB,BB,B7,B7 in hex (similarly for 0×30–0×37, 0×50–0×57 and 0×70–0×77), 0×58, 0×59, 0×5C and 0×5D, which contain AF,AF,DF,9F in hex (similarly for 0×D8, 0×D9, 0×DC and 0×DD), and 0×78, 0×79, 0×7C and 0×7D, which contain AF,AF,9F,9F in hex (similarly for 0×F8, 0×F9, 0×FC and 0×FD).

Also included in FIG. 113 is reset logic 3650 which generates the resets for the associated PMU's 2101–2103. Parallel D flip-flop device 3650, a type LS174, forms the basis of the reset realization. The resets provided are ORST* (output reset) at bit 0 of address 0×E400, TRST* (test reset) at bit 1 and ARST* (acquisition reset) at bit 2.

Figure 114:
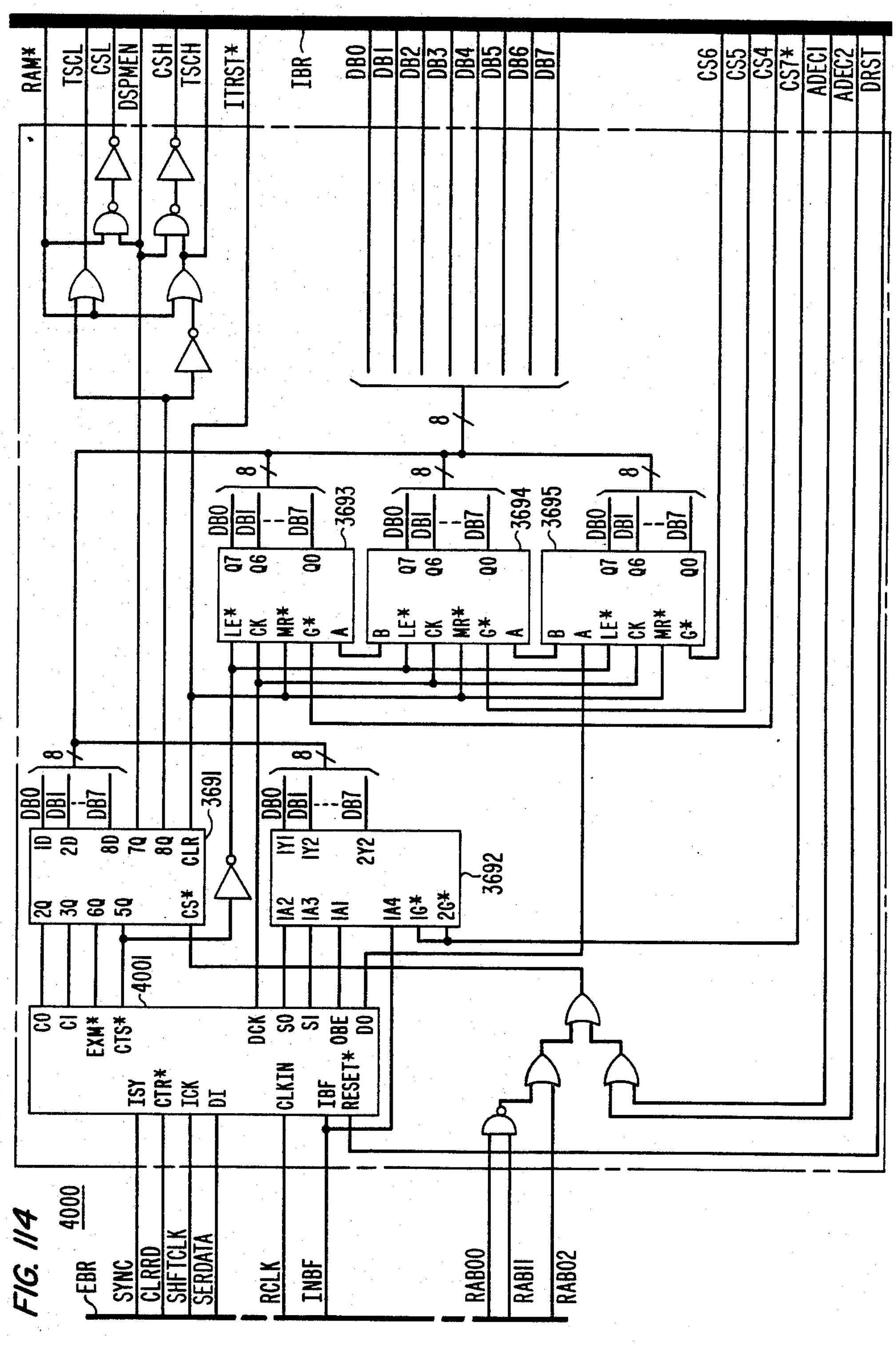

The latch circuitry comprising devices 3691–3695 in FIG. 114 resides in the DSP I/O memory space shown as BANK A3 in FIG. 68. In particular, latch 3691, a LS273, is associated with address location 0×E803. The data bits at this address have the following meanings: bit 7—if this bit is low, and PMU controller 3100 addresses memory between 0×EC00 and 0×EFFF, then the lower eight bits of dual-port RAM 3620 are enabled via TSCL. Otherwise, the upper eight bits are enabled via TSCH; bit 6 (DSPMEM)—when this bit is low, the chip select leads on demultiplexer gates 3631–3634 are enabled; bit 5 (EXM*)—when this bit is low, all instructions for PSP 4000 are fetched from the external address/data but EBR. In the illustrative embodiment, it is always low; bit 4 (CTS*)—a high on this bit inhibits outputs from DSP 3600. This bit is used to synchronize transmissions from PSP 4000 to PMU 3100; bits 2 (CO) and 1 (C1)—C1 is used for framing purposes during outputs from PSP 4000 and CO is used to demand outputs from PSP 4000.

In view of the above information, the operation of Ports A and B of DPR 3620 may be summarized as follows. PMU controller 3100 writes into DPR 3620 by setting DSPMEM high. The desired upper-half or lower-half of DPR 3620 is chosen by setting bit 7 of address 0×E803 appropriately. The selected half may then be accessed by addressing locations from 0×EC00 to 0×EFFF. Since DSPMEM is high, the appropriate CS[] and TSC[] signals are active low, depending on the sense of bit 7. In order for PMU controller 3100 to allow access through Port B, DSPMEM is set low. In addition, EXM* is always low. Then PSP 4000 may be signalled to start its processing. The EXE* and CLKOUT signals generated in device 4002 demultiplex the external 16 bit address/data leads emanating from Port B.

DPR 3620 provides more than a means for expanding the number of programs that PSP 4000 may execute. The program that is downloaded from PMU controller 3100 may be modified in a limited manner by changing data stored in DPR 3620 prior to execution by PSP 4000. The reason for such modifications was discussed in Section 2.2.3d with reference to changes to primitive table default values.

Devices 3693–3695, all being of the type 41KP furnished by the Western Electric Co., form a serial to parallel latch for a 20 bit output. They are accessible at address locations 0×E804–0×E806, respectively. The four most significant bits at address 0×E804 are the four least significant bits in the 20 bit output word from PSP 4000; bits 4–11 and 12–19 of the output word reside at 0×E805 and 0×E806, respectively.

Address location 0×E807 is buffered by latch 3692, a LS367 type device furnished by the Western Electric Co., and is used to read output signals from PSP 4000. Bit 4 (OBE) on latch 3692 indicates that an output is available from PSP 4000 when the bit is low. Bits 1 (S1) and 2 (S2) provide scaling information during an output cycle.

Any further discussion with respect to the portion of programmable signal processor 4000 shown in FIG. 114 as element 4001 is deferred to the next section so that the mathematical basis presented at the opening of that section may be integrated with the discussion of the various subcomponents comprising PSP 4000.

3.2.3d Digital Processing Considerations

Before continuing with the description of the illustrative embodiment of the present invention and, in particular, PSP 4000, it is informative to first consider one theoretical basis for the discrete-time processing techniques to be discussed in this section. This basis provides additional insight and allows for a full elucidation of the subject matter of the illustrative embodiment.

(The following discussion summarizes filtering concepts pertinent to signal processing in the MLT system. A thorough exposition of the digital processing field is contained, for example, in the text "Digital Signal Processing", by A. V. Oppenheim and R. W. Schafer and published by Prentice-Hall in 1975). In the art of discrete-time filtering, certain classes of filters may be represented by a linear difference equation (LDE) with constant coefficients:

$$y(n) = \sum_{k=0}^{N} a(k)\, x(n-k) - \sum_{j=1}^{L} b(j)\, y(n-j), \tag{5}$$

where $\{x(n)\}$ is an input sequence;

$\{y(n)\}$ is an output sequence;

a(k) and b(j) are fixed, real constants for each k and j, respectively; and

N and L are integers.

The elements x(n) and y(n) are not, in general, limited to a specific set of values, but may have a range defined over the real (or even complex) numbers. If the elements are limited to a specific set of values, the filtering is then referred to as digital filtering.

For purposes of the present invention, the input sequence generally arises from sampling a continuous time function x(t). The term "discrete-time" implies that the independent variable, time, is defined for only a discrete set of values (for example, n/100 for 100 Hz sample rate or n/8000 for 8000 Hz sample rate). Basically, then, the discrete-time filter of equation (5) linearly transforms one set of sample values or input sequence elements to another set of sample values or output sequence elements.

Again with respect to equation (5), certain other observations are pertinent: (i) y(n) is determined by only past elements of the output sequence so that equation (5) may be solved recursively; on practical grounds, this makes the system realizable in that present output elements do not rely on future output elements; and (ii) y(n) is determined by only present and past input elements so that real-time processing is possible, that is, all necessary processing can be accomplished during the interval between samples.

Two important cases of sampled data filters may be distinguished. The first is the so-called nonrecursive case which is obtained when all b(j) are zero in equation (5) (and, of course, at least one a(k) is not zero). The second is the recursive case which is obtained when at least one b(j) is not zero and at least one a(k) is not zero.

Focusing on the nonrecursive case, as exemplary, equation (5) may be rewritten to yield:

$$Y(N) = \sum_{k=0}^{N-1} h(k)\, x(n-k), \tag{6}$$

where h(k) has been substituted for a(k) and N has been replaced by N−1, that is, the filter is of length N. The set of elements h(k) is the impulse response of the nonrecursive filter and the form of equation (6) demonstrates that any output element is determined by the convolution of the impulse response elements with the input sequence elements. Similar remarks also apply to the recursive filter case, but the relation between k(k) and the a(k) and b(k) coefficients is not as straightforward as in the nonrecursive case.

Often it is advantageous to consider sequences and sequence manipulations from the viewpoint of a transform domain. This is particularly true in the case of a convolutional operation involving sequences since the operation may be converted to multiplication of transforms.

The transform most often utilized when dealing with sequences is the z-transform, where z is a complex variable. For a general sequence {f(n)}, the z-transform is given by $$F(Z) = \sum_{n=-\infty}^{\infty} f(n) z^{-n}. \tag{7}$$

In general, the summation of equation (7) converges over a certain region in the z-plane, this region being called the region of convergence (ROC). For sequences having a ROC including the unit circle in the z-plane (that is, a circle of radius one centered at the origin), then the transform may be written as $F(e^{j\omega})$. This obtains by substituting $z=e^{j\omega}$ *in equation (7) since* $ej\omega$ *is the expression for the unit circle in the z-plane; the expression* $F(e^{j\omega})$ is called the Fourier Transform of the sequence.

One important property of this Fourier Transform is its periodic nature, that is, the sequence transform repeats in ω-multiples of 2π, presuming the input signal is sampled at a normalized rate of one second. If the input signal is sampled at a rate ΔT seconds, then the Fourier Transform repeats in multiples of 2π/Δt.

Another property, mentioned earlier, is the conversion of a convolution in the sequence domain to a multiplication in the transform domain; thus, equation (6) may be written as $Y(e^{j\omega})=H(e^{j\omega})\,X(e^{j\omega})$ where $X(e^{j\omega})$, $Y(e^{j\omega})$ and $H(e^{j\omega})$ *are the Fourier Transforms of the input sampled signal, the output sampled signal and the impulse response, respectively. This conversion provides insight since it is generally easier to conceptualize multiplication instead of convolution.*

Yet another property of the sampling operation is that sampling of a continuous time signal at a particular clock rate causes the continuous-time spectrum of the signal to appear as sidebands about the clock frequency and all harmonics of the clock frequency.

Using z transform techniques, it is possible to express equation (5) in the form $$Y(z)=H(z)\,X(z), \tag{8}$$

where X(z), Y(z) and H(z) are the z transforms of the input, output and inpulse responses. H(z) is generally referred to as the transfer function of the particular filter characteristic and typically comprises a number of poles and zeros in the z plane. In the design of high-performance discrete filters, placement of the poles and zeros of the transfer function at any location in the z plane should not be constrained. This is equivalent to saying that the coefficients a(k) and b(k) may take on any values. However, when realizing the filter via computer processing, the coefficients are usually part of a computer program and they are stored as data in ROM. Hence, the coefficients are expressed with only a finite number of bits. In certain filter realizations, this finite word length may lead to a spurious response called a limit cycle.

The limit cycle phenomenon causes a nonrandom signal at the output of the digital filter system when the input signal level is near zero. For example, with an input signal equal to zero, a digital filter is likely to produce a nonzero output signal if the filter is given a nonzero initial condition. This occurs in recursive filters due to the presence of time delay in feedback paths and quantization of signal amplitudes to a finite number of bits. The potential for oscillations and nonlinearity generated by quantization cause the spurious output which, in steady-state, is designated a limit cycle. When examined closely, this phenomenon is quite complex; however, the amplitude of the spurious response can be reduced relative to full-scale signal amplitude by increasing the number of bits used to represent the signal or, whenever possible, by setting a number of least significant bits to zero.

With regard to PMU 2101 of FIG. 17, this latter technique of setting the two least significant bits to zero is employed. The result of A/D conversions in measurement processor 3500 is a 20-bit, 2's complement number of which 12 bits (11 data bits and the sign) are significant. A series of 20-bit numbers are passed to DSP 3600 from processor 3500 over bus 35001. A study of the filter realizations in DSP 3600, to be discussed in detail shortly, indicated that the two least significant bits would be masked by limit cycle operation. In the measurement of low TIP and RING currents, this masking would result in an inherent uncertainty of about 0.18 μa. To prevent this inherent error for low currents, the 11 data bits are left-shifted by 2 bits, which essentially provides a "pseudo-gain" of four. This insures that the two least significant bits are zero. For high currents, this shifting need not occur since the 11 data bits would already reside in the higher order bit positions. This procedure was discussed in Section 3.2.3b as one aspect of formatting the 12-bit A/D data into 20-bit words for transmission to DSP 3600.

Figure 110:
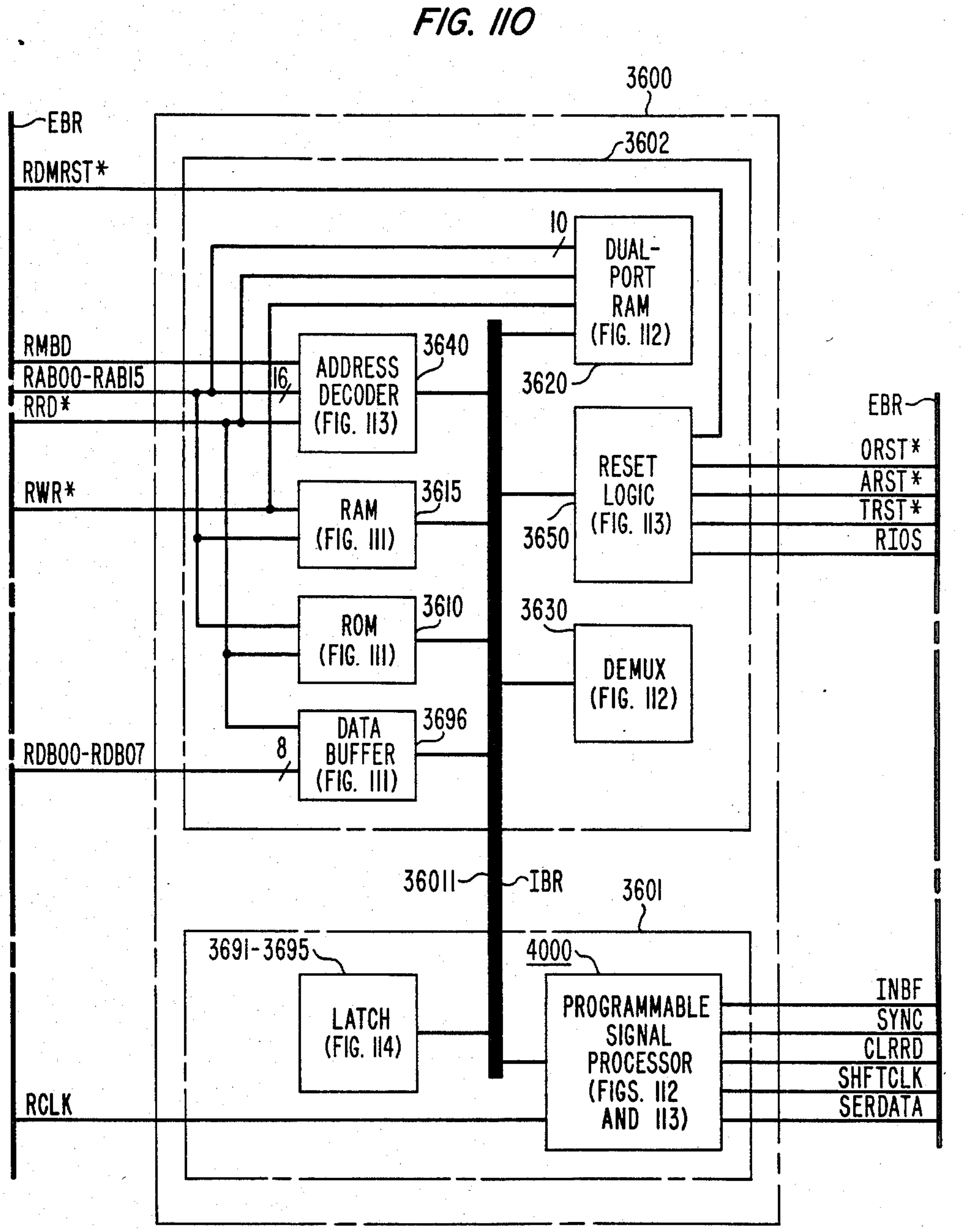
FIG. 110 is a block diagram of the digital signal processor depicted with reference to the PMU circuitry of FIG. 58.
Figure 111:
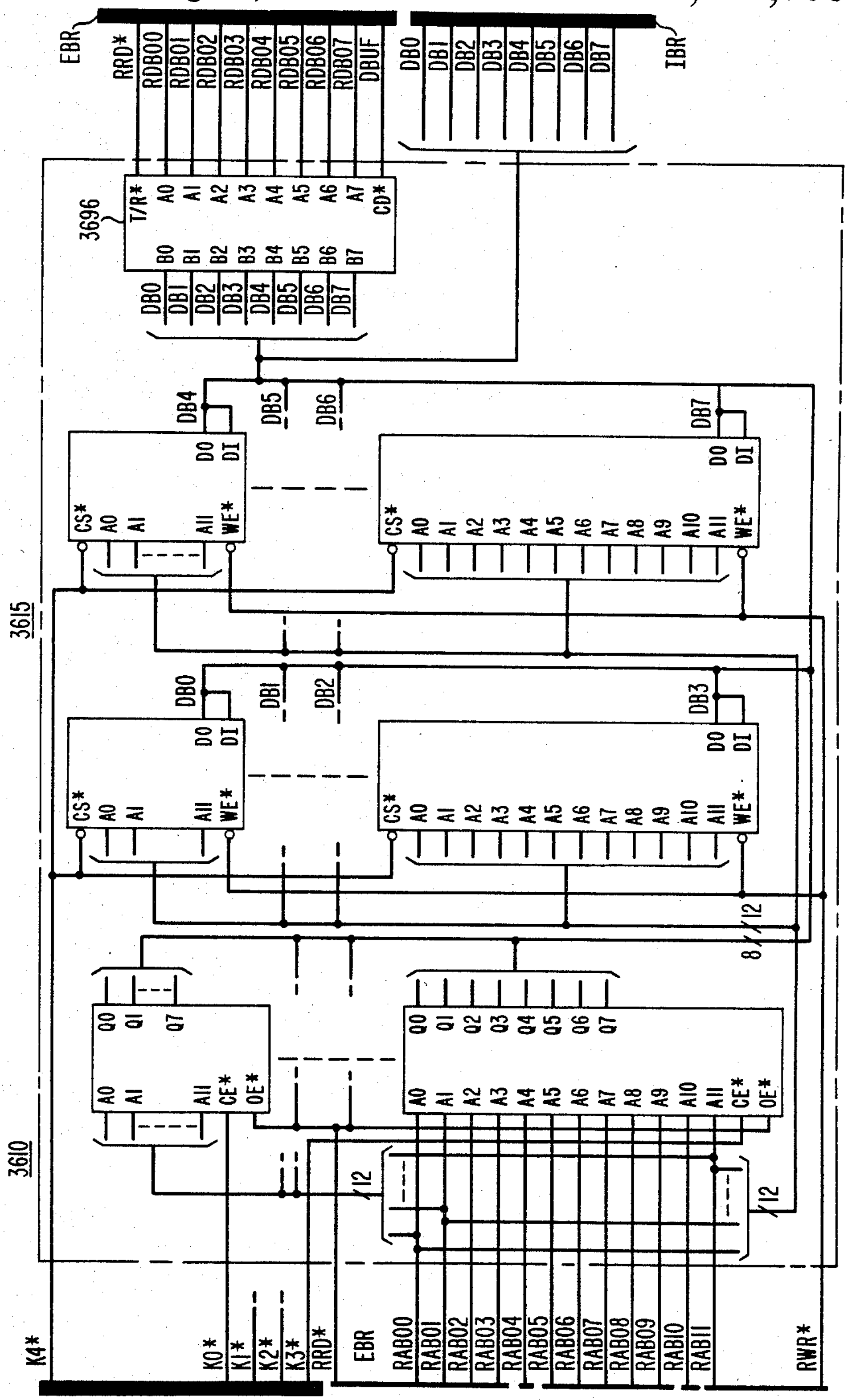
FIGS. 111 through 114 are schematics of the different subcomponents comprising the digital signal processor of FIG. 110 and they indicate, respectively: random access memory and read-only memory implementations; the dual-port RAM and demultiplexing circuitry to interface the PMU controller to the programmable signal processor of FIGS. 112 and 114; and address decoding circuitry.

The particular digital filters utilized in the illustrative embodiment of the present invention, especially within DSP 3600, are implemented in general purpose programmable signal processor (PSP) 4000 of FIG. 110. The architecture, the assembly language and uses of PSP 4000 in specialized applications have been presented in the September, 1981 issue of *The Bell System Technical Journal;* this issue was dedicated to an exposition of the PSP and the subject matter disclosed in that issue is incorporated herein by way of reference. However, to insure that the detailed description of DSP 3600 is basically self-contained, information on the PSP 4000 that is particularly relevant to the digital processing is included within the instant discussion. The basis for the discussion of PSP 4000 is the block diagram shown in FIG. 115.

The input to PSP 4000 arrives as a stream of bits in serial form over DI at input buffer (IBUF) 4011 where it is assembled into a parallel bit word in I/O device 4010. This input word is then transmitted in parallel to data bus 4031 for delivery to the appropriate location in processor 4000.

Data that is to form output from PSP 4000 is transmitted as a parallel-bit word over data bus 4031 to output buffer (OBUF) 4012, where it is decomposed and sent out as bits in serial form over lead D0.

Processor 4000 may be programmed to receive inputs and transmit outputs in a number of different word lengths; for purposes of the present invention, this length is 20 bits and is known as extended linear data. In any case, processor 4000 generates a signal over I/O control lead IBF to indicate when the programmed number of bits have been received.

Figure 115:
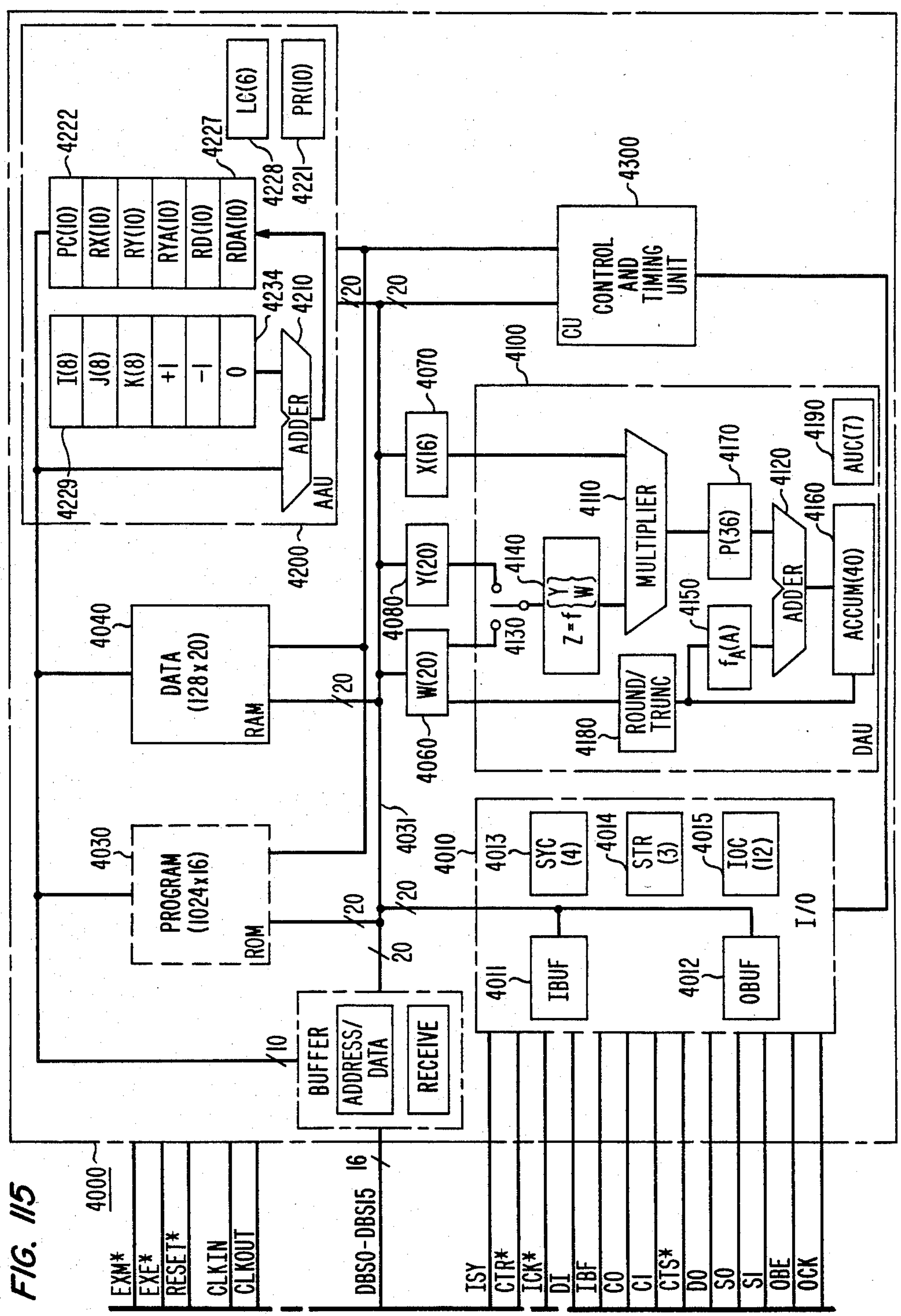
FIG. 115 shows the architectural arrangement for the special purpose signal processor implementing the down-loaded signal processing techniques.

As indicated in FIG. 115, there are 128 RAM locations in memory 4040; each location stores 20-bit words. RAM 4040 is used to store intermediate results of calculations and to store data that varies with time.

ROM 4030, shown in phanton view in FIG. 115, is an internal 1K×16 ROM memory. In the illustrative embodiment, only external ROM is used. Lead EXE* causes a bypass of ROM 4030 and controls external memory accesses.

Data-arithmetic unit (DAU) 4100 comprises multiplier 4110 and adder 4120 which perform two's complement arithmetic. Data is transferred to and from DAU 4100 by way of three registers 4060(W), 4070(X) and 4080(Y). Outputs from unit 4100 are always transmitted by way of the W register 4060. The contents of X register 4070 and Y register 4080 are inputs to multiplier 4110. In addition, switch 4130 permits the contents of W to be used in place of the contents of Y as one of the inputs to multiplier 4110. This feature is useful, for example, when nth order digital filter sections are cascaded and the output of one section serves as the input to the next section.

DAU 4100 is also capable of generating two nonlinear functions on the contents of W or Y; these function generators are represented by block 4140. One function is an absolute value generator and the other is a limiter operation.

Element 4150 in the feedback path between accumulator 4160 and adder 4120 represents a scaling selector. One scale factor from a set of factors can be applied to the contents of accumulator 4160 to keep signals within prescribed bounds.

Figure 116:
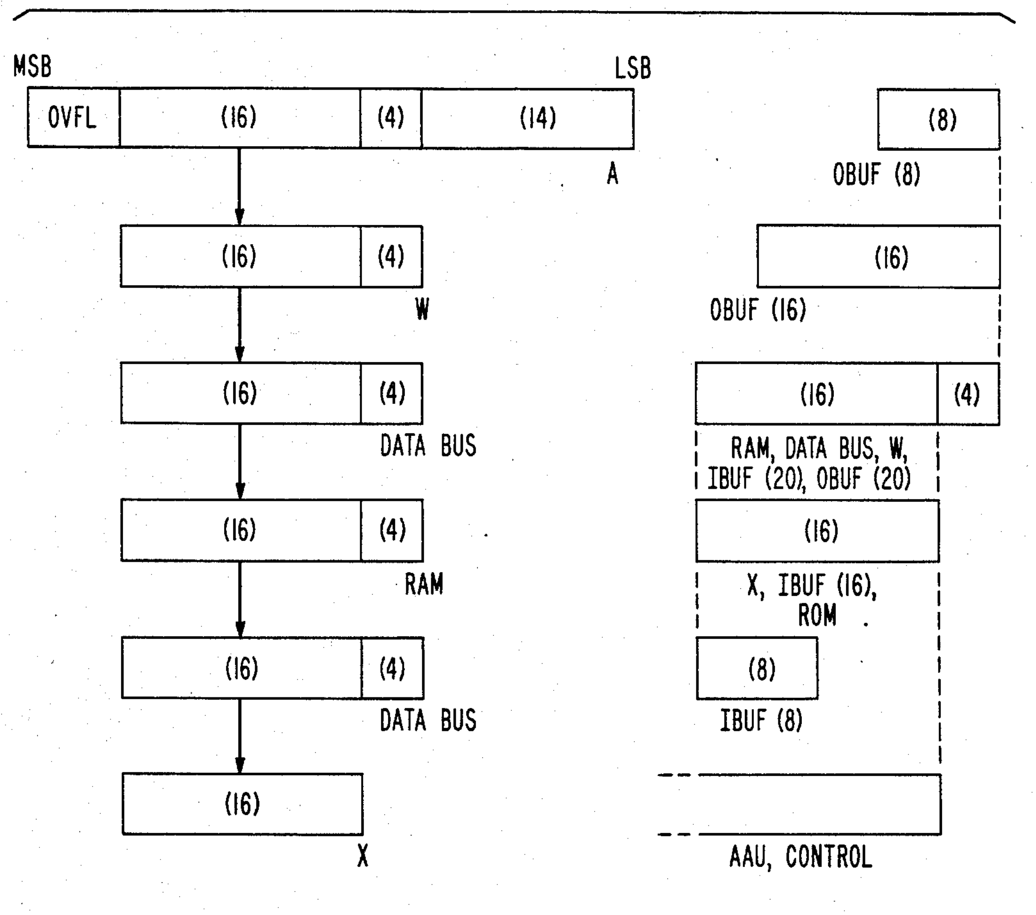
FIG. 116 illustrates the boundary alignment for the various registers and busses comprising processor of FIG. 115.

The product of the contents of the X register and the Y or W register produces up to 36 bits and these bits are stored in P register 4170. Accumulating a series of products within accumulator 4160 may generate carries, so 40 bits are provided for A register 4160. When accumulation is complete, the contents of A are transmitted to output W. Since W accommodates only 20 bits, the 20 bits depicted in FIG. 116 are selected. FIG. 116 illustrates how the transfer of data bits through PSP 4000 is accomplished.

As FIG. 116 shows, in transferring data from A to W, the 20 most significant bits are transferred and 14 bits are dropped. The contents of A can either be truncated or rounded, and the selected operation is performed by device 4180.

An understanding as to how data is transferred, is depicted by FIG. 116, is essential to writing processing programs. For example, since there are instructions in the assembly language to left and right-shift bits, it is possible to control the bits that are transferred.

Address-arithmetic unit (AAU) 4200 is shown in FIG. 115 as comprising adder 4210 and fourteen registers 4221–4234. All registers 4221–4234, except register 4228 (LC), hold memory addresses or numbers related to addresses. Register 4222 (PC) is the program counter, and it functions in the same manner as the PC in any stored-program digital machine. Register 4223 (RX) is a memory pointer for the X register; it points to a data source. Register 4224 (RY) is similar to register RX. Register 4225 (RYA) is also a Y register pointer but it points to an address in RAM 4040. Register 4226 (RD) is a destination memory pointer. Register 4227 (RDA) functions like RYA. Register 4228 (LC) is a loop counter. Register 4221 (PR) is a program return register for jump instructions. Register 4229 (I), 4030 (J) and 4231 (K) are used to automatically increment the contents of memory pointers associated with RX, RY and RD. Registers 4232–4234 (+1, −1, 0) are also autoincrement registers like I, J and K.

Buffer 4002 is a multiplexed address/data bus used to access external memory for instructions and coefficients for the X register. Its function as part of demultiplexer 3630 has been discussed with reference to FIG. 112.

Finally, the block diagram of FIG. 115 indicates that there are four control registers, namely, registers 4013 (synchronization control or SYC), 4014 (status output or STR), 4015 (I/O controls or IOC) and 4190 (arithmetic unit control or AUC). These registers are set by instructions in the processor program to establish the bit patterns needed to provide the desired operating mode.

With the foregoing overview, the instruction set presented in the above-mentioned set of articles published in the *Bell System Technical Journal,* particularly on pages 1495–1497, may be readily understood and utilized by one skilled in the art to write digital signal processing programs. As an additional aid, the following summarizes the functions of the externally accessible leads of PSP 4000 as presented in FIG. 115:

DBS0–DBS15 (Input/Output 3-State)—bus DBS alternates between transmitting 10-bit addresses (DBS0–DBS9) and receiving 16-bit instructions and X values. The data corresponding to a transmitted address must be placed on DBS following the output of the next address. When an address for an instruction is output, DBS15 is high.

EXE* (Output)—when combined with CLKOUT, allows the generation of signals used to latch addresses coming from DBS, latch data out of the external memory and enable data onto DBS.

EXM* (Input)—forces the use of internal ROM for instructions and X values when high; when low, fetches are from external memory via DBS.

ISY (Input/Output 3-State)—indicates the start of a data transfer to IBUF. If active mode is selected, this signal is generated by PSP 4000 and is an output. ISY is 3-stated whenever CTR* is high. If passive mode is selected, ISY is an input to PSP 4000 and is ignored while CTR* is high or while IBUF is full.

ICK (Input/Output 3-State)—used to shift data bits into IBUF. Data is latched on the rising edge of ICK. If active mode is selected, this signal is generated by PSP 4000 and is 3-stated whenever CTR* is high. In this mode, ICK is a burst and lasts only for the duration of the transfer. In passive mode, this signal is an input to PSP 4000 and either burst or continuous clocks are permitted. ICK is ignored whenever CTR* is high or IBUF is full.

DI (Input)—receives serial data for IBUF.

IBF (Output)—indicates the state of IBUF.

CTR* (Input)—enables data reception for both active and passive modes. While high, IBUF cannot be shifted and the signals ISY and ICK are in 3-state if active mode is selected. If passive mode is selected, the signals on ISY and ICK are ignored while CTR* is high.

OCK (Input/Output 3-State)—used to shift data bits out of OBUF. Data on DO changes after the falling edge OCK. If active mode is selected, this signal is a burst clock lasting for the duration of the transfer and is 3-stated whenever CTS* is high. In passive mode, it is an input and either burst or continuous clocks are permitted. OCK is ignored whenever CTS* is high or OBUF is empty.

DO (Output 3-State)—transmits serial data from OBUF. It is 3-stated whenever CTS* is high.

OBE (Output)—indicates the state of OBUF. OBE is cleared when PSP 4000 loads data onto OBUF and is set after the selected number of bits (8, 16 or 20) have been clocked out of OBUF.

CTS* (Input)—enables data transmission. While it is high, OBUF cannot be shifted and the signals OSY, DO and OCK are in 3-state if active mode selected. If passive mode is selected, the signals on OSY and OCK are ignored while CTS* is high.

S0, S1 (Output)—these are the outputs (high or low) of bits 0 and 1 of STR 4014.

C0, C1 (Input)—these inputs can be tested by a program in PSP 4000.

RESET* (Input)—when low, PSP 4000 suspends all operations. When brought high, the program counter, IOC, AUC, STR and SYC registers are cleared. I/O is terminated and IBF and OBE are set. The first two instructions following a reset must be auxiliary.

CLKIN (Input)—provides the rate of operation of PSP 4000 from an external clock.

CLKOUT (OUtput)—used as a system clock to synchronize external devices to DSP.

In view of the background information on the general characteristics of digital filters, including the need to protect against limit cycles, and the overview of the architecture and programming properties of PSP 4000 utilized to implement filters, certain ones of the filter functions alluded to in Section 2.2.3c may now be explained.

The first filtering operation, designated DC6_SET, runs from 1 to 6 DC channels within the duration of a sampling interval to determine the DC value present on each selected channel. Each channel is filtered with six second-order sections in cascade, and the overall response characteristic has a 3 dB cutoff of about 5 Hz and components are attenuated by 120 dB at 20 Hz. Separate outputs taps are available at intermediate filter points, normally at 40 dB and 80 dB at a frequency of 20 Hz or, equivalently, at the outputs of the second and fourth second-order filters in the cascade. Since the device cycle rate is significantly greater than the sampling rate, it is generally possible to time-share one second-order filter to realize the cascade. The input to each succeeding filter is merely the output of the preceding stage, and the input to the first stage is merely the sample sequence.

Presumably the signal undergoing filtering is a DC signal due to the prior synchronous demodulation in processor 3500. If there are not spurious AC components within the 20 Hz band, then the output from the 40 dB tap should settle within the first 320 msec. A settled output value is defined by a preselected number of consecutive samples having values within a prescribed range. The preselected number of the preferred embodiment is five samples and the prescribed range requires each of the five samples to be within ±1% of one another. Tapping at intermediate outputs points in the cascaded structure generally allows for a rapid determination of a settled value. The 120 dB of filtering is required on the basis of noise constraints for worst case conditions. Since the severe noise conditions are met in only a limited number of situations, the intermediate tapping technique reduces processing time for the majority of situations.

Since up to six channels may be processed in a sampling interval, separate channels have different settling times, each with a different settled output value. Even if one channel achieves a settled value, the other channels continue processing. If the data from these other channels does not settle after 320 msec., the 80 dB output tap samples are then monitored for the next 120 msec. A final switch to the full filter weight occurs after 440 msec. If all channels settle before a timeout signal, a settled condition is established. DSP 3600 transmits this status to PMU controller 3100 and controller 3100 interrogates DSP 3600 for the settled values during a scheduled activity.

In terms relating to PSP 4000, a settled value for one channel, or a settled condition when more than one channel is filtered, is indicated by the OBE lead being dropped low. Ingterrogation occurs when the C1 lead is pulled low, followed by the CTS lead; both are controlled through data bus 31002. Once CTS is low, the output buffer is transmitted. Once the data is fully latched in PMU controller 3100, C1 is raised, thereby precluding another transmission until controller 3100 is prepared to accept the data. Even if data is not settled, PMU controller 3100 can demand outputs of the partially-filtered data and such data will be transmitted. A demand for data is transmitted via the CO lead. After an interrogation or a demand, the particular filtering operation ceases.

Figure 117:
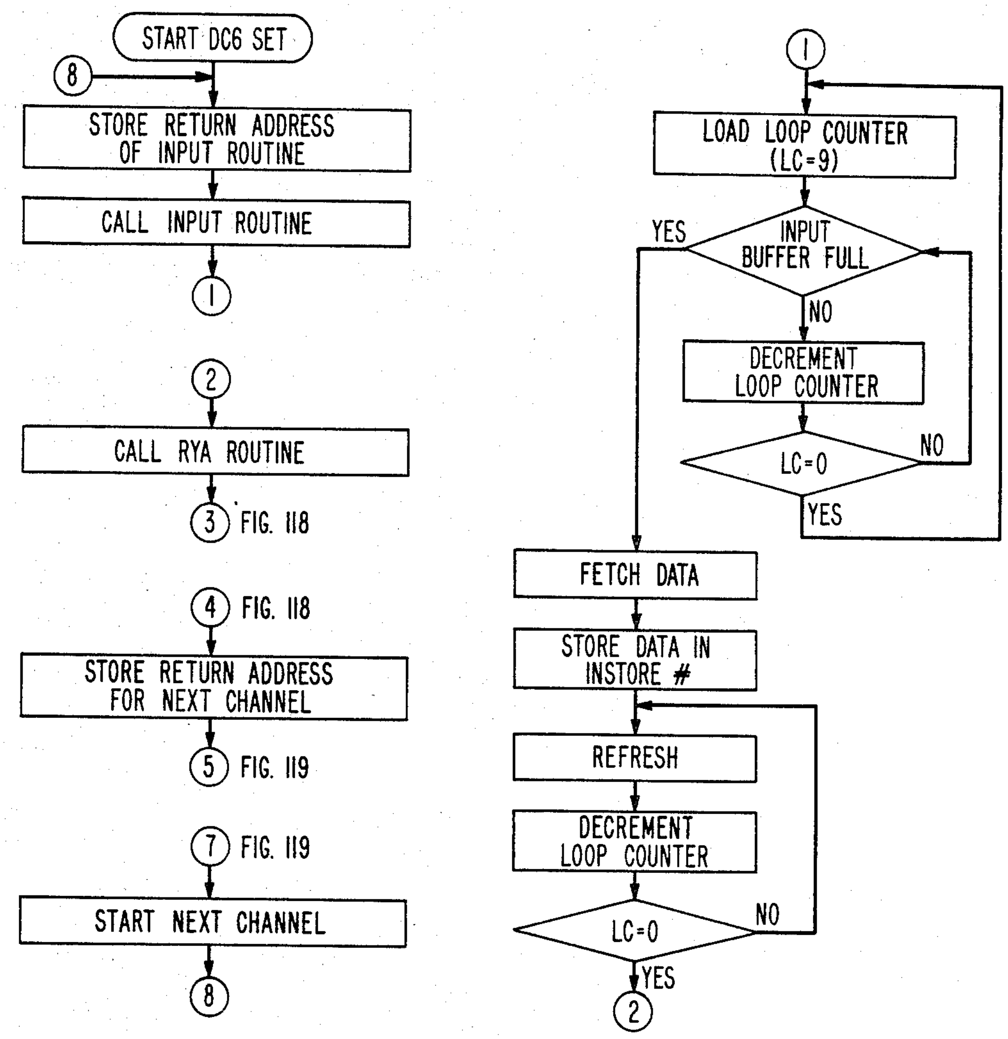
FIGS. 117, 118 and 119 depict the flow diagram of a program for digital filtering DC signals and thereby determine the settled DC values for one to six synchronously demodulated channels.
Figure 118:
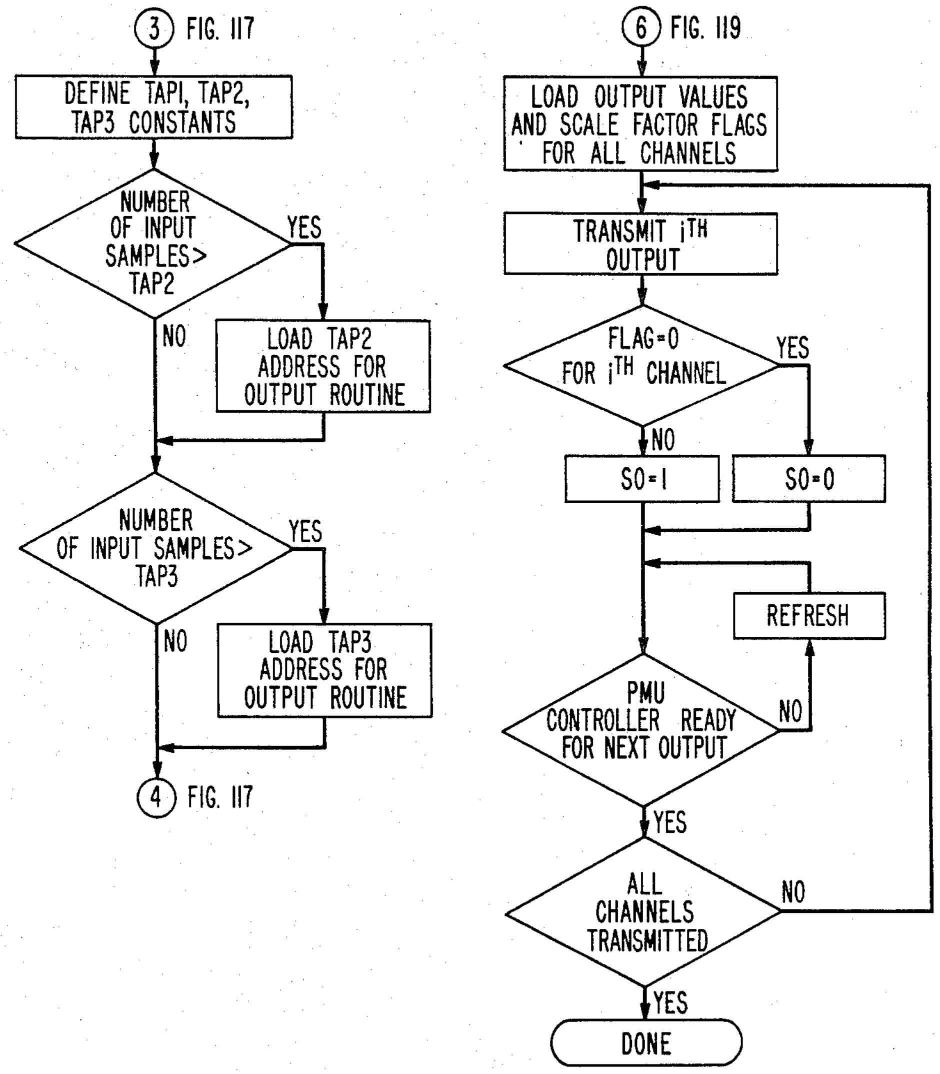
Figure 119:
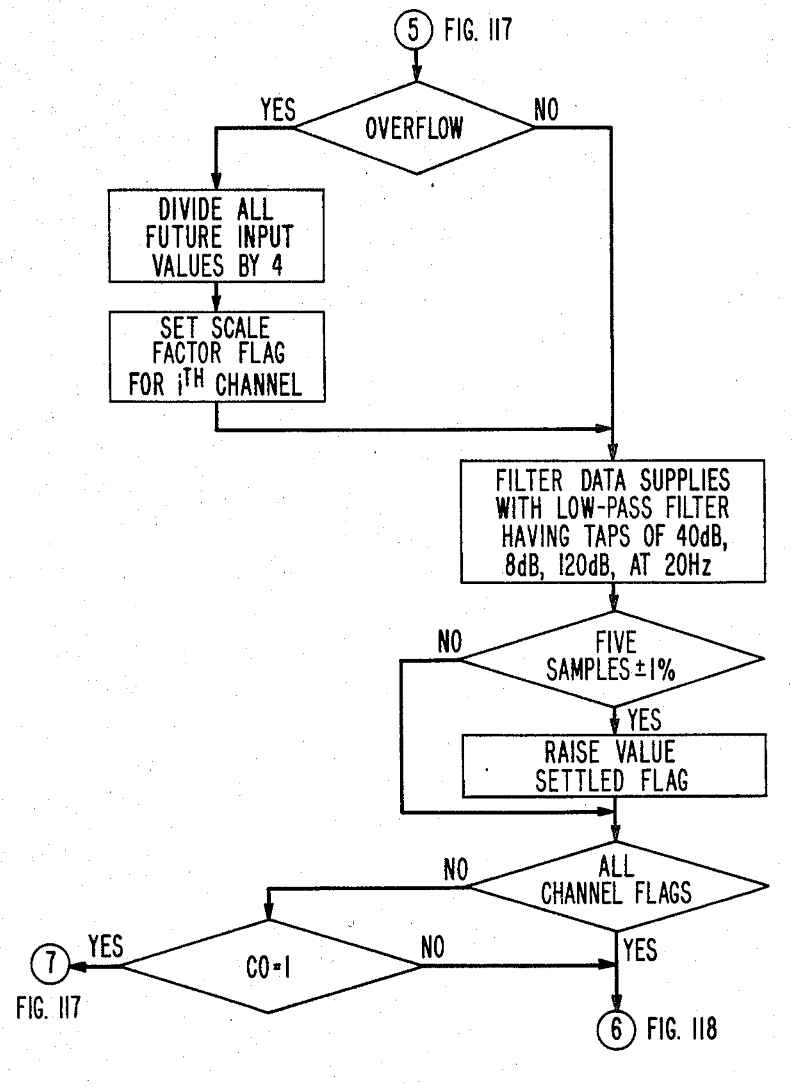

The flow diagram for the program utilized to control PSP 4000 during DC6_SET filtering operations is depicted in FIGS. 117, 118 and 119. The actual program, in terms of the instruction set of PSP 4000, is given in the attached appendix, pages 188 through 197. (This appendix is the same one that appears as Appendix G Ser. No. 399,177. In the INDEX associated with the appendix (pages 1004 through 1008), the program is designated "dc6_set.d" on page 1004. The suffix ".d" indicates that the program is to be executed by DSP 3600 and, in particular, PSP 4000. Although the program is shown in source form, the program is converted to PSP object form and is stored in ROM associated with PMU controller 3100. A downloaded copy is transmitted from controller 3100 to PSP 4000 by the procedure described earlier.

Another filtering operation, designated PULSE, performs an analysis on rotary dial pulses to establish the make/break pulse intervals. In low noise environments, each dial pulse is substantially a rectangular wave with some oscillatory behavior on the rising and falling edges due to the transient characteristics of the loop and energy storage elements. In a noisy environment, other spurious interference components may combine to mask pulse transitions. To mitigate false declarations of pulse level changes in the presence of interference, a procedure has been devised to focus on the fine structure of level changes while, at the same time, maintaining data initiated by the start of a potential level change. The procedure may be described as follows.

The signal composed of the dial pulse corrupted by noise is sampled at a rate significantly greater than the dial pulse rate, typically 8 kHz versus the standard 10 pulses per second for dial pulses. The sample sequence is presented to a comparator and each sample is classified as either a high level sample or low level sample by comparison to a threshold. Presuming a high-to-low transition is under investigation, the sequence from the classifier is monitored for the first occurrence of a sample classified as a low level sample. In one form of the procedure, a first register counts the samples beginning with this occurrence. The first register is incremented until a predetermined number, typically ten, samples have maintained the same level. If the level maintained is a high level, a false indication of a transition has occurred, so the first register is reinitialized and the next indication of a high-to-low transition is monitored. If the level maintained is a low level, a high-to-low transition is declared. The contents of the first counter are transferred to a second counter, the first counter is reinitialized and the second counter continues to count samples whereas the first register begins a search for a low-to-high transition. Once this latter transition is declared, an estimate to the time duration of the high level of the pulse is provided by the contents of the second register less the predetermined number. Transitions are monitored and time estimates presented to PMU controller 3100 until the pulse is fully analyzed or until a timeout occurs.

The source program for this procedure, in terms of the instruction set for PSP 4000, is given in the appendix. In the INDEX for the appendix, the program is designated "pulse.d".

Another filtering function, designated COIN, is available to process signals returned from coin phone totalizers. When a totalizer is energized with, typically, 18 ma DC, tone bursts are propagated along the loop and the number of bursts correspond to the type of coin deposited in the pay phone. The amplitude of the tones returned produces basically a ripple on the DC current and each burst may last between 20 and 150 msec. If the composite signal of tone plus DC is applied directly to a bandpass filter centered at the tone frequency, the transient effects of the large DC component oftentimes masks the minute AC within the time required for detection and, consequently, inconsistent detection results may be produced. To mitigate this, the following procedure has been developed.

Since it is known that approximately 18 ma DC is applied to a loop for coin testing (Section 3.2.1e), and the processing is to be effected digitally, a low-pass digitial filter is pre-loaded at its internal nodes with the samples necessary to produce the presumed value of 18 ma DC at the output of the filter. Thus, the filter generates sequence elements as if 18 ma DC had been flowing for a considerable period and steady-state was reached. Now the actual sequence of input samples, obtained by sampling the composite signal at a rate at least twice the highest frequency of said tone, is presented to the low-pass filter. In addition, the output of the filter is also subtracted from the input sequence and the difference sequence is presented to a digital bandpass filter. Because of the preloading, the first and subsequent sequence of elements emanating from the low-pass filter may be utilized without waiting for the low-pass filter to settle. For instance, if the DC applied to the loop is exactly the value stored as samples in the low-pass filter, the output from the subtraction operation is merely the tone bursts commencing with the first sample. On the other hand, if the DC on the loop is not exactly the value used to establish the non-zero initial conditions in the low-pass filter, the differencing operation reduces the DC from an unmanageable value to a tolerable value, even initially, and as the sampling operation unfolds, the output of the low-pass filter converges to the DC level of the input sequence. Thus, after the transient response time of the low-pass filter, the output of the subtraction operation is the sequence of tone bursts.

The actual detection operation is completed at the output of the bandpass filter. The resultant sequence from this filter is squared and then filtered with another digital low-pass filter to obtain a sequence of positive values whenever the tone is present. These sequence elements are then compared to a threshold, and if a preselected number of consecutive samples are above the threshold, the tone is declared as present.

Since it is possible that other spurious signals, particularly those having frequency components within the band of the bandpass filter, other precautions must be taken to preclude false indications. These precautions are similar to those devised for the PULSE technique, that is, false indications are basically precluded by monitoring for events that are defined when a predetermined number of consecutive samples have similar characteristics, such as all attaining a threshold value. For instance, to declare a 2200 Hz tone as being present, 72 consecutive samples at a 6 kHz sampling rate must be above the threshold. Moreover, to declare an interval of "no tone", 36 consecutive samples must lie below the threshold.

Figure 120:
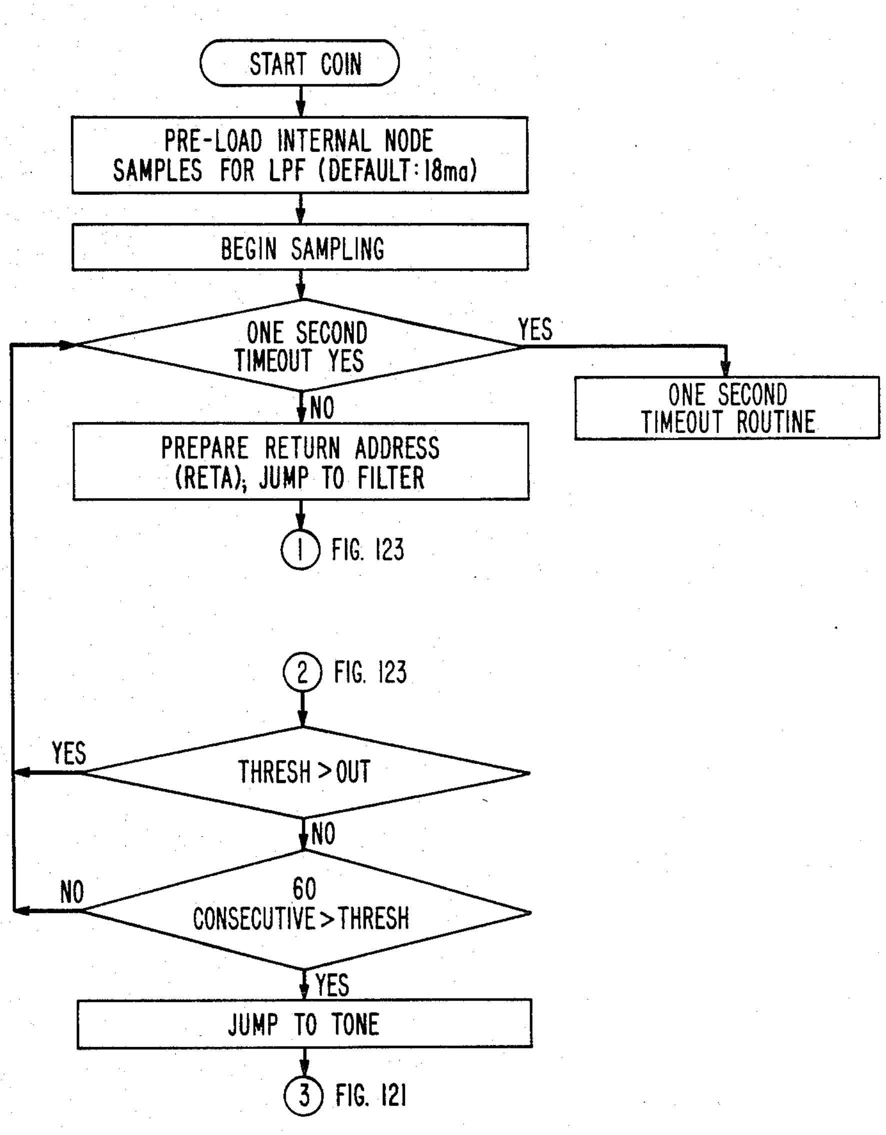
FIGS. 120 through 123 depict the flow diagram of a program for analyzing coin phone tone bursts in order to test a coin totalizer.
Figure 121:
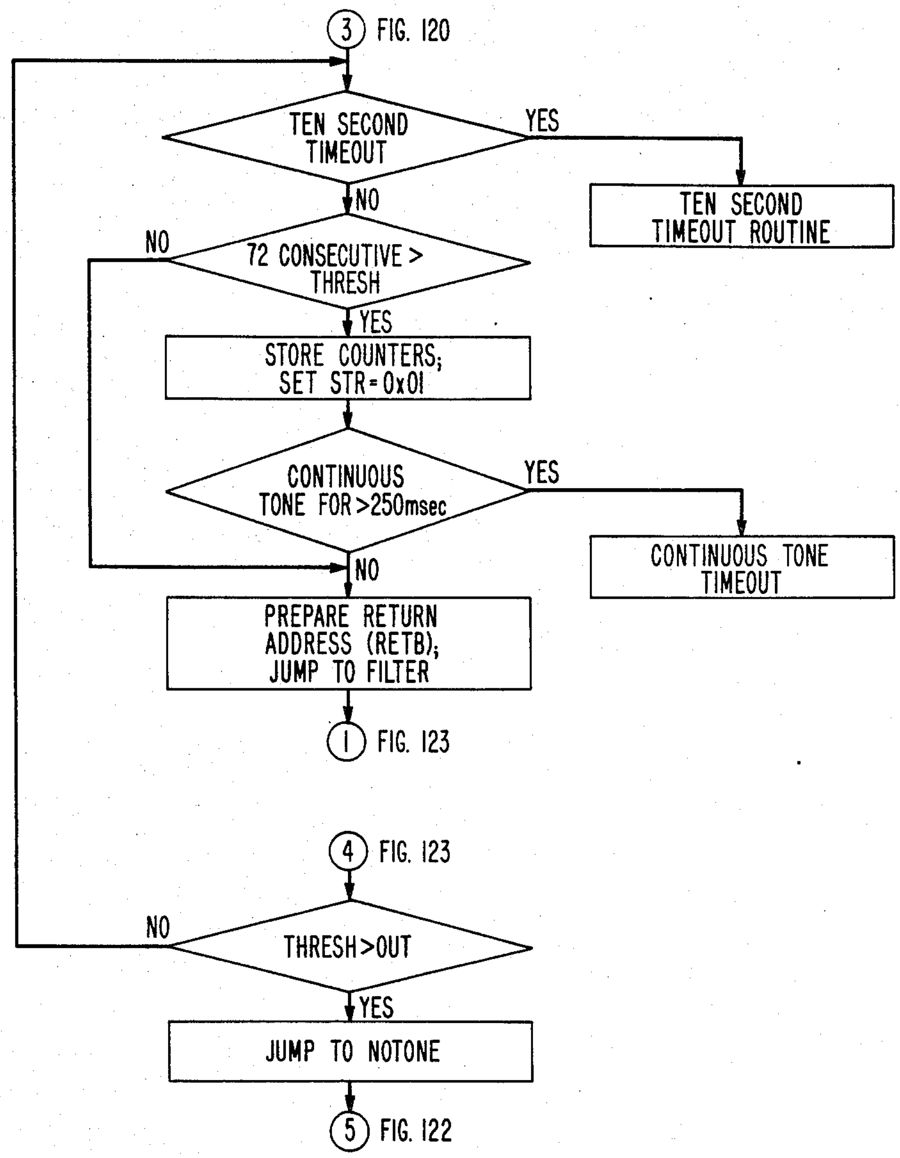
Figure 122:
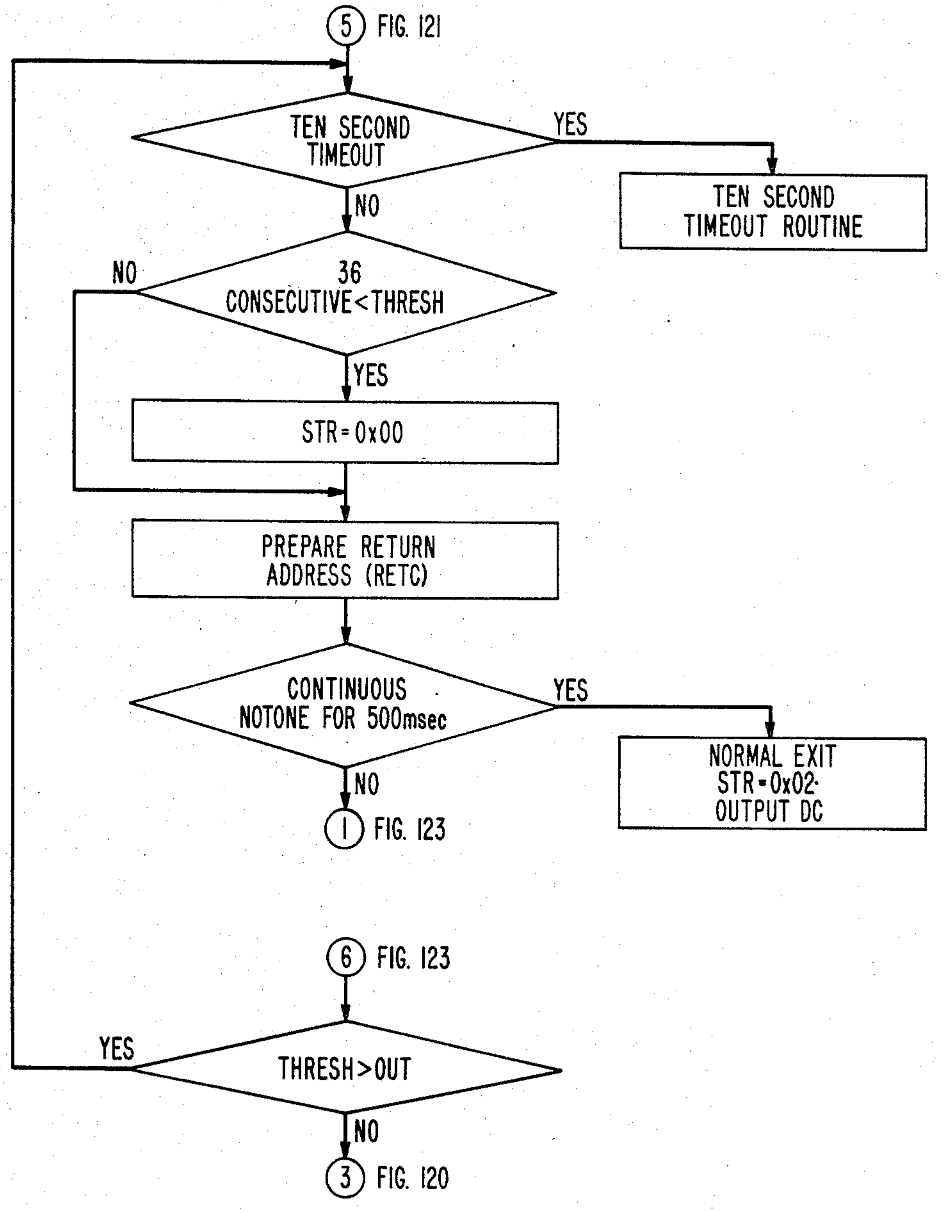
Figure 123:
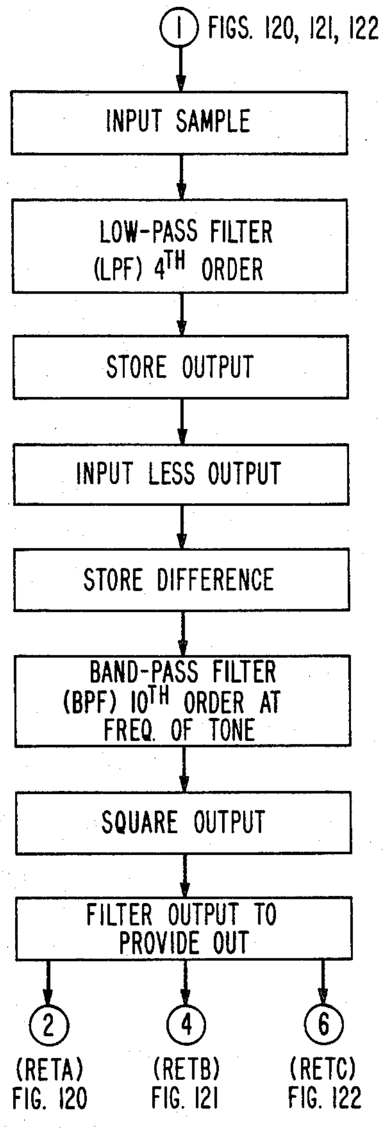

The source program for the coin phone checking procedure is given in the appendix and is entitled "coin.d". The flow chart for the routine is given in FIGS. 120 and 123.

The other PSP 4000 programs are listed in the INDEX as "bnd2_smp.d", "broad.d", "dc6_smp.d", "mag_set.d" and "peak.d"; these correspond to to the descriptions of the program functions listed under Section 2.2.3c as items (4), (6), (2), (3), and (5), respectively.

Listings of the programs for operating the microprocessor within the illustrative embodiment of PMU controller 3100 are also included as part of the appendix. Again, the same format of Appendices A, B and C of Rubin Case 4 is utilized to present the information for the programs operating the microprocessor within controller 3100.

3.2.4. Loop Connection Circuitry

In Section 2.2.4, a procedure for establishing an interactive communication path between a maintenance administrator and a customer selected by the administrator was discussed with reference to FIG. 11. In particular, the interaction of LTS controller 2000 and port controller 2200 was exemplified with respect to equipment access network 2700 and its associated port circuitry comprising P control section 2702, busy/speech detector 2600, trunk dialer 2650, port circuits 2801-2816 and sleeve lead control 2950, as well as the loop circuitry comprising L control section 2701, talk circuits 2301-2306, DDD circuit 2400 and ringing circuit 2500. The pertinent characteristics of the port circuitry and the loop circuitry required to sequence through the operation, from initiation to completion, may be readily ascertained by one skilled in the art since each component, by itself, has a well-known form in the telephone industry. In fact, the arrangement comprising EAN 2700 with P control section 2702 and the port circuitry is basically the same form utilized in loop testing frames 250,251 of the standard system described in the Background Section with reference to FIG. 1. The connection of port circuitry to EAN 2700 and the operation of P control section was discussed in some detail with reference to FIG. 27.

In the MLT system, the standard arrangement has been augmented to provide the capability of independent, therefore concurrent, access to loops connected via port circuits 2801-2816. This augmentation is effected primarily by L control section 2701 as directed by LTS controller 2000. L section 2701 serves the same basic function as P section 2702; in the illustrative embodiment, each section energizes relays which control crosspoints. A talk circuit 2301, . . . , or 2306 provides the capability of establishing a call over the national dial network, via DDD path 932 of FIG. 11, under control of LTS controller 2000 directly and, indirectly, from user interface 230,231. Each talk circuit is adapted to receive DDD circuit 2400 and ringing distributor circuit 2500 as inputs. The former circuit actually places the call to the maintenance administrator, via dial pulsing or multifrequency signaling, whereas the latter circuit may be directed to ring an accessed customer loop through ports 2801-2816. Again, circuits 2400 and 2500 are directed by LTS controller 2000.

3.3 FE System Considerations

The control software for the MLT system resides in FE computers 220,221 of FIG. 2 and this software provides high level traffic and algorithmic control of the testing process by deciding which tests are to execute and by analyzing the results of the tests. In addition, the control software provides the interface to users, via devices 230,231, and line records stored in computer 200.

In the illustrative embodiment, the MLT controller software (MLT_CNTLER) executes on a Digital Equipment Corporation PDP 11/70 computer. PDP is a registered trademark of the Digital Equipment Corporation. Up to twelve 11/70 computers are furnished with this software and these computers are interconnected via Parallel Communication Link 210. Some of these computers may serve as backup machines. The programs utilized to configure and operate the illustrative FE computer system are listed in Appendix H Ser. No. 399,177. These programs execute under the UNIX operating system. UNIX is a trademark of Bell Telephone Laboratories, Incorporated.

Two types of user interfaces 230,231 are supported by this particular software. These include a Teletype terminal Mod 40/4 or 4540 and a portable dial-up terminal having ASCII/Async/300 baud characteristics. Teletype is a registered trademark of the Teletype Corporation.

While the invention has been shown and described with reference to an illustrative embodiment thereof, it will be understood by those skilled in the art that changes in form and detail may be made therein without departing from the spirit and scope of the invention.

What is claimed is:

1. Circuitry for measuring a path current comprising
two magnetic structures (e.g., 3307,3308) with substantially identical hysteresis characteristics each having a line winding, a control winding and a sense winding,
means (34022) for providing control current pulses and for supplying said pulses to each said control winding to produce magnetic fields of opposite orientations in said structures,
means (330013) for coupling said path current to each said line winding,
said line winding and said control winding arranged on said structures to produce series-aiding field intensities in one of said structures and series-opposing intensities in the other of said structures in response to said path current and said control current, respectively,
means (34021,34024) for cumulatively integrating voltage induced in each said sense winding in the interval between each of said pulses to produce an output voltage,
means (34027,34028) for supplying a sense current, in proportion to said output voltage, to each said sense winding during each of said pulses, each said sense winding arranged to produce field intensities, in response to said sense current, to oppose said line winding induced field intensities, and
means (34025), coupled to said means for supplying, for reducing said output voltage to zero whenever said path is open-circuited to compensate for differences in said hysteresis characteristics.

2. Circuitry as recited in claim 1 wherein
said means for integrating comprises an operational amplifier having its noninverting input grounded and a capacitor connected between the inverting input and the output of said amplifier, and
said means for reducing comprises a current source connected between said inverting input and said output, the strength of said current source determined by opening said path and adjusting said current source strength to produce a zero voltage at said output of said amplifier.

3. The circuitry as recited in claim 1 wherein said means for providing pulses generates said pulses at a rate greater than twice the highest frequency component comprising said path current.

4. Circuitry for detecting path current comprising
two transformers (e.g., 3307,3308) having line, control and sense windings with corresponding ones of said windings being connected in series and arranged so that said control windings produce opposing field intensities, and line windings produce aiding and opposing intensities, respectively, relative to said control windings and said sense windings produce opposing intensities relative to said line windings, means (330013) for driving said line windings with said path current, means (34022), connected to said control windings, for periodically pulsing said control windings to saturate said transformers and for providing a current sink during flyback, voltage detection means (34021,34024), coupled to said sense windings, for cumulatively integrating voltage induced across said sense windings during flyback to produce an output voltage and for supplying a feedback current proportional to said output voltage to said sense windings during said pulsing, and calibration means (34025), coupled to said voltage detection means, for measuring said output voltage to obtain a calibrate signal by open-circuiting said path and for correcting said output voltage with said calibrate signal whenever said path current flows.

5. Circuitry for measuring path current comprising a first magnetic structure (3307) and a second magnetic structure (3308) having substantially identical major and minor saturation characteristics, said first structure having a first line winding, a first control winding and a first sense winding and said second structure having a corresponding second line winding, a second control winding and a second sense winding, a control source (34022) for producing a periodic signal having a first state for providing a control current to said first control winding in series with said second control winding and a second state providing a conduction path for current developed in said first control winding and second control winding upon removal of said control current, means (330013) for energizing said first line winding and said second line winding with said path current, wherein said first line winding and said first control winding are arranged to provide series-aiding magnetizing fields in said first structure and said second line winding and said second control winding are arranged to provide series-aiding magnetizing fields in said second structure in response to said path current and said control current, respectively, and voltages sensing means (34021,34024), responsive to said control source, for electromagnetically detecting and cumulatively integrating the voltage developed across said first sense winding in series with said second sense winding in the time period corresponding to said second state and for providing feedback current to said first winding in series with said second winding in proportion to said cumulatively integrated voltage during the time period corresponding to said first state, said first sense winding and said second sense winding arranged to provide magnetizing fields due to said feedback current opposing the magnetizing fields due to said path current, said voltage sensing means including offset correction means (34025) for reducing said integrated voltage to zero whenever said path is opened to compensate for differences in said saturation characteristics.

6. Circuitry for measuring path current comprising a first magnetic core (3307) and a second magnetic core (3308) having substantially identical induction versus intensity characteristics, said first core having a first line winding, a first control winding and a first sense winding and said second core having a corresponding second line winding, a second control winding and a second sense winding, a source (34022) of control pulses for providing a control current to said first control winding in series with said second control winding during the high state of each of said pulses and for providing a low impedance path during the low state of each of said pulses, means (330013) for exciting said first line winding and said second line winding with said path current, wherein the magnetizing intensities due to said path current and said control current aid in one and oppose in the other of said cores and said magnetizing intensites due to said control current are of opposing orientation in said cores, and voltage sensing means (34021,34025), including a switch responsive to said source and a voltage integrator, having a first operational mode corresponding to said low state wherein said switch connects the series arrangement of said first sense winding and said second sense winding to said integrator for cumulative, algebraic integration of the voltage developed across said series arrangement during lows in said pulses, and a second operational mode corresponding to said high state wherein said switch is opened and said series arrangement is supplied with a current proportional to said cumulatively integrated voltage, said series arrangement providing magnetizing intensities opposing the magnetizing intensities contributed by said path current, said voltage sensing means (34025) includes means for reducing said integrated voltage to zero whenever said path current is open-circuited to correct for differences between said characteristics.

7. The circuitry as recited in claim 6 wherein said voltage integrator comprises an operational amplifier having its noninverting input grounded and a capacitor connected between the inverting input and the output of said amplifier, said series arrangement is grounded on one of its free ends and the other end connects to said output through a feedback resistor and to said inverting input through an input resistor in series with said switch, and said means for reducing includes a current source (34025,34026) connected between said inverting input and said output, the value of said source being periodically determined by opening said path and adjusting said current source to produce zero voltage at said output of said amplifier.

8. The circuitry as recited in claim 6 wherein said voltage integrator comprises an operational amplifier having its noninverting input grounded and a capacitor connected between the inverting input and the output of said amplifier, said series arrangement is grounded on one of its free ends and the other end connects to said output through a feedback resistor and to said inverting input through an input resistor in series with said switch, and said means for reducing includes a compensation network comprising a digital-to-analog voltage converter in series with a compensating resistor, the input voltage to said converter being periodically determined by: disconnecting said network from said inverting input; opening said path; measuring the voltage at said output; applying a voltage at the input of said converter in correspondence to the measured output voltage; and connecting said network to said inverting input.

9. Circuitry for measuring path current flowing in a conduction path comprising:

a magnetic structure (3307,3308) having magnetic characteristics such that the slope of the hysteresis characteristic changes substantially as the magnetizing intensity H changes between a zero amount of H and a finite amount of H;

means (330013) electromagnetically coupling said conduction path to said magnetic structure so that a particular amplitude and polarity of said line current causes in the structure a corresponding finite amount and polarity of intensity $H_L$;

means (34022) for supplying a succession of control signals;

a control circuit (34022) controlled by each of said control signals so that a control current of a predetermined amplitude, duration and polarity flows in said control circuit in response to said each of said control signals;

means (330041,330043) for electromagnetically coupling said control circuit to said magnetic structure so that said control current causes a change in intensity $\Delta H$ of a particular amount and polarity, said change being such as to cause the magnetic induction B in said structure to undergo a corresponding change the amount and polarity of which are determined by the combined amount and polarity of $H_L$ and $\Delta H$;

means (34021,34024), controlled by a plurality of successive induced voltage signals, to perform cumulative algebraic integration of said induced signals and to provide a changing output voltage the amplitude and polarity of which are a measure of said cumulative integration, and means (34027,34028), controlled by said output voltage, for providing to said structure an amount of feedback H wherein the amount of said feedback H is according to the amplitude of said output voltage and the polarity of said feedback H is opposite to the polarity of said $H_L$ so that said amplitude of said output voltage becomes essentially constant when in said structure said amount of feedback H essentially equals $H_L$ and said amplitude and polarity of said constant output voltage are a measure of the amplitude and polarity of said path current, said means for providing includes offset correction means (34025) for reducing said constant output voltage to zero whenever said conduction path is opened to compensate for variations in said control circuit.

10. A method for measuring path current utilizing circuitry including two magnetic cores having substantially identical hysteresis characteristics, each of said cores having a line, sense and control winding, said method comprising the steps of supplying control current pulses to each said control winding to produce magnetic fields of opposite orientations in said cores, coupling said path current to each said line winding, arranging said line winding and said control winding on one of said cores to produce series-aiding field intensities and on the other of said cores to produce series-opposing intensities, cumulatively integrating voltage induced in each said sense winding in the interval between each of said pulses to generate a net output voltage, injecting a sense current in proportion to said net output voltage to each said sense winding during each of said pulses, arranging each said sense winding to produce field intensities, in response to said sense current, to oppose said intensities induced by said path current, open-circuiting, at specified periods, the path of said path current, minimizing said output voltage during each open-circuit interval with an offset current injected into each said sense winding, and supplying said offset current to said circuitry during the measurement of said path current.

* * * * *